(12) United States Patent
Mayer et al.

(10) Patent No.: US 8,158,532 B2
(45) Date of Patent: Apr. 17, 2012

(54) TOPOGRAPHY REDUCTION AND CONTROL BY SELECTIVE ACCELERATOR REMOVAL

(75) Inventors: Steven T. Mayer, Lake Oswego, OR (US); Mark L. Rea, Tigard, OR (US); Richard S. Hill, Atherton, CA (US); Avishai Kepten, Lake Oswego, OR (US); R. Marshall Stowell, Wilsonville, OR (US); Eric G. Webb, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 1261 days.

(21) Appl. No.: 11/602,128

(22) Filed: Nov. 20, 2006

(65) Prior Publication Data
US 2009/0277867 A1   Nov. 12, 2009

Related U.S. Application Data

(63) Continuation-in-part of application No. 11/544,957, filed on Oct. 5, 2006, now Pat. No. 7,799,200, application No. 11/602,128, which is a continuation-in-part of application No. 10/824,069, filed on Apr. 13, 2004, now Pat. No. 7,405,163, and a continuation-in-part of application No. 10/739,822, filed on Dec. 17, 2003, now Pat. No. 7,449,098, and a continuation-in-part of application No. 10/690,084, filed on Oct. 20, 2003, now Pat. No. 7,338,908, and a continuation-in-part of application No. 10/693,223, filed on Oct. 24, 2003, now Pat. No. 7,189,647.

(60) Provisional application No. 60/737,978, filed on Nov. 19, 2005, provisional application No. 60/724,209, filed on Oct. 5, 2005.

(51) Int. Cl.
*H01L 21/302* (2006.01)

(52) U.S. Cl. ........ 438/754; 438/692; 438/745; 438/759; 216/105

(58) Field of Classification Search .................. 438/700, 438/745, 750, 751, 754, 691, 692, 759; 216/100, 216/105
See application file for complete search history.

(56) References Cited

U.S. PATENT DOCUMENTS
3,183,176 A   5/1965   Schwartz
(Continued)

OTHER PUBLICATIONS

Silva, "Applied Hydrology to Fluidic Devices," email message received May 11, 2010, 7 pgs.
(Continued)

*Primary Examiner* — Lan Vinh
(74) *Attorney, Agent, or Firm* — Weaver Austin Villeneuve & Sampson LLP

(57) ABSTRACT

Plating accelerator is applied selectively to a substantially-unfilled wide (e.g., low-aspect-ratio feature cavity. Then, plating of metal is conducted to fill the wide feature cavity and to form an embossed structure in which the height of a wide-feature metal protrusion over the metal-filled wide-feature cavity is higher than the height of metal over field regions. Most of the overburden metal is removed using non-contact techniques, such as chemical wet etching. Metal above the wide feature cavity protects the metal-filled wide-feature interconnect against dishing, and improved planarization techniques avoid erosion of the metal interconnect and dielectric insulating layer. In some embodiments, plating of metal onto a substrate is conducted to fill narrow (e.g., high-aspect-ratio feature cavities) in the dielectric layer before selective application of plating accelerator and filling of the wide feature cavity.

70 Claims, 43 Drawing Sheets

U.S. PATENT DOCUMENTS

| | | | |
|---|---|---|---|
| 3,313,715 | A | 4/1967 | Schwartz |
| 3,393,134 | A | 7/1968 | Schwartz |
| 3,619,383 | A | 11/1971 | Eisner |
| 3,619,384 | A | 11/1971 | Eisner |
| 3,661,752 | A | 5/1972 | Capper et al. |
| 3,749,652 | A | 7/1973 | Eisner |
| 3,751,343 | A | 8/1973 | Macula et al. |
| 3,849,270 | A | 11/1974 | Takagi et al. |
| 3,904,489 | A | 9/1975 | Johnson |
| 4,119,499 | A | 10/1978 | Eidschun, Jr. |
| 4,227,986 | A | 10/1980 | Loqvist et al. |
| 4,363,711 | A | 12/1982 | Kuehnle |
| 4,452,684 | A | 6/1984 | Palnik |
| 4,592,808 | A | 6/1986 | Doubt |
| 4,738,756 | A | 4/1988 | Mseitif |
| 5,034,753 | A | 7/1991 | Weber |
| 5,096,550 | A | 3/1992 | Mayer et al. |
| 5,158,860 | A | 10/1992 | Gulla et al. |
| 5,169,514 | A | 12/1992 | Hendriks et al. |
| 5,203,955 | A | 4/1993 | Viehbeck et al. |
| 5,256,565 | A | 10/1993 | Bernhardt et al. |
| 5,277,785 | A | 1/1994 | Van Anglen |
| 5,378,346 | A | 1/1995 | Ashiru et al. |
| 5,453,174 | A | 9/1995 | Van Anglen et al. |
| 5,462,649 | A | 10/1995 | Keeney et al. |
| 5,486,234 | A | 1/1996 | Contolini et al. |
| 5,557,027 | A | 9/1996 | Kemp |
| 5,807,165 | A | 9/1998 | Uzoh et al. |
| 5,843,296 | A | 12/1998 | Greenspan |
| 6,056,864 | A | 5/2000 | Cheung |
| 6,056,869 | A | 5/2000 | Uzoh |
| 6,083,835 | A | 7/2000 | Shue et al. |
| 6,103,628 | A | 8/2000 | Talieh |
| 6,121,152 | A | 9/2000 | Adams et al. |
| 6,143,155 | A | 11/2000 | Adams |
| 6,152,586 | A | 11/2000 | Dealey, Jr. et al. |
| 6,153,521 | A | 11/2000 | Cheung et al. |
| 6,171,467 | B1 | 1/2001 | Weihs et al. |
| 6,176,992 | B1 | 1/2001 | Talieh |
| 6,207,572 | B1 | 3/2001 | Talieh et al. |
| 6,251,235 | B1 | 6/2001 | Talieh et al. |
| 6,315,883 | B1 | 11/2001 | Mayer et al. |
| 6,328,872 | B1 | 12/2001 | Talich et al. |
| 6,344,129 | B1 | 2/2002 | Rodbell et al. |
| 6,409,904 | B1 | 6/2002 | Uzoh et al. |
| 6,413,338 | B1 | 7/2002 | DiPalma |
| 6,447,668 | B1 | 9/2002 | Wang |
| 6,478,936 | B1 | 11/2002 | Volodarsky et al. |
| 6,482,307 | B2 | 11/2002 | Ashjaee et al. |
| 6,527,920 | B1 | 3/2003 | Mayer |
| 6,534,116 | B2 | 3/2003 | Basol |
| 6,592,742 | B2 | 7/2003 | Sun et al. |
| 6,630,059 | B1 | 10/2003 | Uzoh et al. |
| 6,638,411 | B1 | 10/2003 | Mishima et al. |
| 6,653,226 | B1 | 11/2003 | Reid |
| 6,709,565 | B2 | 3/2004 | Mayer et al. |
| 6,755,954 | B2 | 6/2004 | Mayer |
| 6,756,307 | B1 | 6/2004 | Kelly et al. |
| 6,766,817 | B2 | 7/2004 | da Silva |
| 6,793,796 | B2 | 9/2004 | Reid et al. |
| 6,797,132 | B2 | 9/2004 | Talieh et al. |
| 6,815,354 | B2 | 11/2004 | Uzoh et al. |
| 6,858,121 | B2 | 2/2005 | Basol |
| 6,863,795 | B2 | 3/2005 | Teerlinck |
| 6,867,136 | B2 | 3/2005 | Basol |
| 6,902,659 | B2 | 6/2005 | Talieh |
| 6,918,404 | B2 | 7/2005 | Dias da Silva |
| 6,919,010 | B1 | 7/2005 | Mayer |
| 6,921,551 | B2 | 7/2005 | Basol |
| 6,946,066 | B2 | 9/2005 | Basol et al. |
| 7,066,586 | B2 | 6/2006 | da Silva |
| 7,129,165 | B2 | 10/2006 | Basol et al. |
| 7,189,647 | B2 | 3/2007 | Patton et al. |
| 7,244,398 | B2 | 7/2007 | Kotary et al. |
| 7,285,255 | B2 | 10/2007 | Kadlee et al. |
| 7,405,163 | B1* | 7/2008 | Drewery et al. ............ 438/745 |
| 7,449,098 | B1 | 11/2008 | Mayer et al. |
| 7,531,079 | B1 | 5/2009 | Mayer et al. |
| 7,799,200 | B1 | 9/2010 | Mayer et al. |
| 2001/0006224 | A1* | 7/2001 | Tsuchiya et al. ............ 252/79 |
| 2001/0013472 | A1 | 8/2001 | Nakamura et al. |
| 2002/0066673 | A1* | 6/2002 | Rodbell et al. ............ 205/291 |
| 2003/0111354 | A1* | 6/2003 | Hara et al. ............ 205/291 |
| 2004/0226827 | A1* | 11/2004 | Matsuda et al. ............ 205/123 |
| 2005/0145484 | A1 | 7/2005 | Basol |
| 2005/0258046 | A1 | 11/2005 | Basol |
| 2006/0037855 | A1 | 2/2006 | Hanson et al. |
| 2006/0175202 | A1 | 8/2006 | Mazur |
| 2006/0260952 | A1 | 11/2006 | Mazur |
| 2007/0051619 | A1 | 3/2007 | Mazur |
| 2007/0051639 | A1 | 3/2007 | Mazur |
| 2007/0094928 | A1 | 5/2007 | Hunter |
| 2007/0131561 | A1 | 6/2007 | Wang et al. |
| 2007/0212281 | A1 | 9/2007 | Kadlee et al. |
| 2007/0292314 | A1 | 12/2007 | Effenhauser et al. |
| 2008/0015531 | A1 | 1/2008 | Hird et al. |
| 2009/0277867 | A1 | 11/2009 | Mayer et al. |
| 2009/0280649 | A1 | 11/2009 | Mayer et al. |

OTHER PUBLICATIONS

U.S. Office Action, mailed Nov. 2, 2007 for U.S. Appl. No. 10/824,069.

Contolini, et al., "Electrochemical Planarization for Multilevel Metallization", Lawrence Livermore National Laboratory, J. Electrochem Soc., vol. 141, No. 9, Sep. 1994, pp. 2502-2510.

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

Notification of ownership transfer of certain patents owned by NuTool, Inc., 2007.

Osterwald et al., "New Theoretical Ideas about the Action of Bath Additives During Cathodic Deposition", Galvanotechnik, vol. 66 (1975), No. 5, pp. 360-365.

Eisner, S., "Electroplating Accompanied by Controlled Abrasion of the Plate", Oct. 1971, pp. 993-996.

Osterwald, Jorg, "Leveling and Roughening by Inhibitors and Catalyst", Institute for Metallurgy of the Technical University of Berlin, vol. 17, No. 5, 1976, pp. 89-94.

Patton et al., "Sequential Station Tool for Wet Processing of Semiconductor Wafers", Novellus Systems, Inc., U.S. Appl. No. 10/693,223, filed Oct. 24, 2003, pp. 1-32.

Notice of Allowance, mailed May 15, 2008 for U.S. Appl. No. 10/824,069.

U.S. Office Action for U.S. Appl No. 10/739,822 mailed May 17, 2007.

U.S. Final Office Action for U.S. Appl. No. 10/739,822 mailed Nov. 27, 2007.

Office Action as mailed on Jun. 13, 2008 for U.S. Appl. No. 11/065,708.

U.S. Office Action for U.S. Appl. No. 11/065,708 mailed Dec. 12, 2007.

U.S. Final Office Action for U.S. Appl. No. 11/065,708 mailed Nov. 12, 2008.

Notice of Allowance for U.S. Appl. No. 11/065,708 mailed Mar. 3, 2009.

Notice of Allowance, mailed Jul. 10, 2008 and Allowed Claims for U.S. Appl. No. 10/739,822.

Notice of Allowance mailed May 20, 2010 and Allowed Claims for U.S. Appl. No. 11/544,957.

Mayer et al., "Selective Electrochemical Accelerator Removal" Novellus Systems, Inc., U.S. Appl. No. 12/860,787, filed Aug. 20, 2010.

Mayer et al., "Method for Planar Electroplating", Novellus Systems, Inc., U.S. Appl. No. 11/888,318, filed Jul. 30, 2007.

Office Action mailed Jul. 9, 2010 for U.S. Appl. No. 11/888,318.

Mayer et al., "Topography Reduction and Control by Selective Accelerator Removal" Novellus Systems, Inc., U.S. Appl. No. 11/602,128, filed Nov. 20, 2006.

Final Office Action mailed Oct. 20, 2010 for U.S. Appl. No. 11/602,128.

U.S. Office Action for U.S. Appl. No. 11/890,790 mailed Dec. 27, 2010.

US Final Office Action, dated Feb. 3, 2011, issued in U.S. Appl. No. 11/888,318.

* cited by examiner

TOPOGRAPHY REDUCTION AND CONTROL BY SELECTIVE ACCELERATOR REMOVAL

RELATED APPLICATIONS

This application claims the benefit under 35 USC 119(e) of U.S. Provisional Application Ser. No. 60/737,978, filed Nov. 19, 2005, by Mayer et al. This application is a continuation-in-part application, claiming priority under 35 USC 120, of co-owned and co-pending U.S. patent application Ser. No. 11/544,957, filed Oct. 5, 2006, by Mayer et al., which claimed the benefit of U.S. Provisional Application Ser. No. 60/724,209, filed Oct. 5, 2005, titled "Selective Electrochemical Accelerator Removal". This application is a continuation-in-part application, claiming priority under 35 USC 120, of co-owned and co-pending U.S. patent application Ser. No. 10/824,069, filed Apr. 13, 2004, by Drewery et al., having the title "Selectively Accelerated Plating of Metal Features". This application is also a continuation-in-part application, claiming priority under 35 USC 120, of co-owned and co-pending U.S. patent application Ser. No. 10/739,822, filed Dec. 17, 2003, by Mayer et al., having the title "Method for Planar Electroplating". This application is also a continuation-in-part application, claiming priority under 35 USC 120, of co-owned and co-pending U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage". This application is also a continuation-in-part application, claiming priority under 35 USC 120, of co-owned and co-pending U.S. patent application Ser. No. 10/693,223, filed Oct. 24, 2003, by Patton et al., titled "Sequential Tool for Wet Processing of Semiconductor Wafers". These prior patent documents are incorporated herein by reference for all purposes.

FIELD OF THE INVENTION

The invention relates in general to methods and systems for forming metal features in electronic equipment, and more particularly to the plating of embedded metal features in integrated circuits.

BACKGROUND OF THE INVENTION

Integrated circuits are formed on wafers by well-known processes and materials. These processes typically include the deposition of thin film layers by sputtering, metal-organic decomposition, chemical vapor deposition, plasma vapor deposition, and other techniques. These layers are processed by a variety of well-known etching technologies and subsequent deposition and polishing steps to provide a completed integrated circuit.

A crucial component of integrated circuits is the wiring or metallization layer that interconnects the individual circuits. Conventional metal deposition techniques include physical vapor deposition, e.g., sputtering and evaporation, and chemical vapor deposition techniques. More recently, integrated circuit and equipment manufacturers have developed electrochemical deposition techniques to deposit primary conductor films on semiconductor substrates.

Wiring layers traditionally contained aluminum and a plurality of other metal layers that are compatible with the aluminum. In 1997, IBM introduced technology that facilitated a transition from aluminum to copper wiring layers. This technology has demanded corresponding changes in process architecture towards damascene and dual damascene architecture, as well as new process technologies.

Conductive layers are typically deposited on a dielectric layer and typically comprise metals such as tantalum (Ta), tungsten (W), titanium (Ti), aluminum (Al), copper (Cu), and alloys thereof, and semiconductors, such as doped silicon (Si), doped polysilicon, and refractory metal silicides. The dielectric layer typically contains openings, or feature cavities, (e.g., vias and trenches) that are filled with conductive material to provide a path through the dielectric layer to previously deposited layers and to circuit devices. After the conductive layer is polished, only the conductive material filling the feature cavities remains in the dielectric layer.

A typical damascene or dual damascene process flow scheme for fabricating copper interconnects, such as copper lines and vias, typically includes: forming a trench pattern on a layer dielectric layer using an etch-resistant photoresist; etching a trench pattern; removing the photoresist; forming a via pattern on a dielectric material using etch resistant photoresist; etching vias; removing resist; depositing a barrier (e.g., tantalum, tantalum nitride, and combination of these) and a copper seed layer (e.g. using plasma vapor deposition, PVD); electroplating copper to fill the etched feature cavities; and polishing copper and barrier off the wafer face leaving copper-filled electrically isolated interconnect circuitry.

As the number of levels in an interconnect technology is increased, the stacking of additional layers produces more rugged and complex topography. Compounding this problem, electroplating bath additives are now commonly utilized to promote rapid "bottom-up" filling of high aspect-ratio features in damascene copper electroplating processes to ensure complete void-free metal fill of high aspect ratio features (features deeper than they are wide). Baths with good "bottom-up" filling characteristics fill high aspect ratio features more rapidly and without creating void or seam when compared to baths with less effective combinations of such additives. While the action of plating bath additives is still a subject or active investigation, it is generally now accepted that bottom-up filling of high aspect ratio features is controlled by the geometrical concentration of a strongly adsorbed plating bath "accelerator" bound within and on the walls of the feature. As the feature growths, the surface area decreases within the feature and concentrates the adsorbate, lowering the resistance to charge transfer there when compared to the generally flatter field regions of the substrate surface, thereby creating an "acceleration" of the plating rate within the recess region. (See, for example, J. Osterwald and J. Schulz-Harder, *Galvanotechnik,* 66, 360 (1975); J. Osterwald, Oberfläche-Surface, 17, 89 (1976); J. Reid and S. Mayer, in *Advanced Metallization Conference* (1999); M. E. Gross, T. Gessner, N. Kobayashi, and Y. Yauda, Editors, p. 53, MRS, Warrendale, Pa. (2000); A. C. West, S. Mayer, and J. Reid, *Electrochem. Solid-State Letters,* 4, C50 (2001); T. P. Moffat, D. Wheeler, and D. Josell, "Superfilling and the Curvature Enhanced Accelerator Coverage Mechanism", *The Electrochemical Society Interface* (Winter 2004). Therefore, baths with good "bottom-up" filling characteristics typically fill smaller (higher aspect ratio) features more rapidly than larger (lower aspect ratio) features. In some cases (e.g., plating baths with superior bottom-up filling characteristics and little or no leveling additives), plating continues at an accelerated rate after completing the small-feature filling stage. When many high-aspect ratio features are located in close proximity, the high degree of adsorbed accelerator originally associated with the high surface area of that region remains after the features have filled. Hence, growth continues at an accelerated rate beyond the point of filled features, and into the period where metal between the features has merged. When this happens, a macroscopic raised area (series of thicker metallized bumps or a raised plateau) forms over the entire region of underlying high aspect ratio features. This bump formation is also termed "feature overplating" or "momentum plating".

The use of advanced "bottom-up" electrofilling techniques with wafers having low and high aspect-ratio features has created a problem of deposited metal surfaces with a wide range of topography, that is, topography containing a large range of height and width variations in both recessed and raised areas. Commonly, features vary in width by two to three orders of magnitude on a single layer. As a specific example, a 0.5 μm-deep (thick dielectric) level can have feature widths of from 0.1 μm to 100 μm. Therefore, while electroplating is the preferred method of metallization, various aspects of improved plating regimens create challenging topography for subsequent planarization A principal objective of damascene circuit interconnect fabrication is to create metal isolated by and embedded in a dielectric medium. Modern copper electroplating for damascene processes proceeds by a "bottom up" fill mechanism that preferentially fills high-aspect-ratio features such as deep trenches and vias on a wafer surface. The preferential filling of recessed features requires careful control of process conditions. U.S. Pat. No. 6,946,065, titled "Process for Electroplating Metal into Microscopic Recessed Features", issued Sep. 20, 2005 to Mayer et. al., which is hereby incorporated by reference for all purposes, teaches techniques for reducing or avoiding the formation of seams and/or voids when electroplating the interior regions of microscopic recessed features. For the most part, prior art processes do not preferentially fill and planarize low-aspect-ratio features and, therefore, they require significant excess metal deposition ("overburden.") Overburden is the additional copper deposited on the substrate to ensure that all low-aspect-ratio features are completely filled (essentially in an isotropic fashion) to the plane of a base layer, that is, to the plane of the isolating dielectric surface (the "field"). Since the preferential "bottom-up" filling generally does not occur in low-aspect-ratio features, the surface of the overburden above low-aspect-ratio features typically follows the contours of the underlying low-aspect-ratio features. In most cases, the overburden on field regions is slightly thicker than the thickness of the damascene dielectric layer, typically on the order of 1.2 times the depth of the deepest feature. So, for example, a damascene structure that has 0.5 micrometers (μm) deep features typically requires an overburden of at least approximately 0.7 μm to 0.8 μm.

The goal of damascene fabrication operations is to isolate finally the individual lines within the feature cavities of the dielectric layer. Since the filling of low-aspect-ratio features is largely isotropic, plating leads to very little if any reduction in the overall topography of the surface. The step change in plated topography is essentially identical to the initial patterned cavity (recess) depth in the dielectric media. Note that if metal overburden were isotropically removed after filling of low-aspect-ratio feature cavities, then these low-aspect-ratio features would loose metal below the plane of the dielectric (i.e., below the field plane) before the metal over high-aspect-ratio lines and the field-area metal were removed. Various approaches and techniques of plating, planarization and polishing have been developed in the prior art with the goal that metal still completely fills these low-aspect-ratio features after overburden has been removed and the individual metal lines have been isolated. These approaches and techniques generally require overburden.

Overburden is undesirable for a number of reasons. It requires deposition of considerable amounts of excess copper that is essentially wasted. It requires an extra step of removing the overburden material. Thus, overburden represents additional materials costs (excess copper deposited and removed), as well as decreased throughput and productivity. In current processes, overburden is removed by a planarization technique such as chemical mechanical polishing (CMP), electrochemical mechanical polishing (eCMP), or electropolishing. CMP and eCMP are particularly expensive processes that generally use corrosive chemical and slurry formulations on large (wafer scale or larger) pads to polish the surface of the integrated circuit substrate. Such pad-rubbing processes are often difficult to control and the polishing end-point can be difficult to detect. The high equipment cost, waste handling cost, and low throughput contribute to the overall expense of CMP and eCMP. Also, with the introduction of porous low-k dielectrics in semiconductor devices, modification of traditional CMP and even eCMP processes is required, as current methods can crack and/or delaminate low-k materials, which typically have a very low compression strength and extreme fragility. Furthermore, none of these techniques achieve perfect planarization.

Chemical mechanical planarization (CMP) is the most common currently used process used to remove excess material from a surface. It typically includes the use of a polishing pad and a solution containing an abrasive along with passivating agents and/or chemical agents that either retard or assist the planing of the material. CMP may be used for planing portions of wafers comprising dielectrics, such as silicon dioxide, or metals, such as copper, aluminum or tungsten. In copper CMP processes, excess copper is planarized (polished) off the top of the wafer surface to expose the thin pattern lines of copper metal inlaid within the barrier layer or dielectric substrate material. Polishing of the substrate is conducted until the underlying substrate is exposed, a condition commonly referred to as breakthrough. For copper CMP, breakthrough is defined as removal of metal from the top of the substrate until the underlying barrier layer above the dielectric film is first exposed. Breakthrough can be detected by optical reflectance from the substrate, by changes in polishing wheel temperature, by changes in polishing wheel torque, or by changes in chemical composition of used polishing solution. Once the excess copper is removed by the polishing step, the wafer must be cleaned with additional chemicals and soft pads to remove the abrasive particles that adhere to the wafer.

To create advanced semiconductor devices that contain multiple levels of metal lines in a dielectric requires the use of new dielectric materials. These new dielectric materials are commonly referred to as low-k dielectrics. Compared to traditional silicon dioxide dielectric, the newer low-k dielectrics are softer and less tough. The large downward pressure exerted onto a wafer during typical CMP polishing may damage fragile low-k dielectrics.

Lower pad pressures and stiffer (less compliant) pads are generally useful in achieving better local planarization efficiency and low-k compatibility, but must be balanced with the competing needs of performing the process at an economically viable rate over a large length scale (the width of the wafer). While multilayer laminated pads containing materials of variable compliance (stiffer layer near the interface, more compliant layers further away from the interface) help address some mechanical tolerance requirements, it is well know that CMP and eCMP techniques suffer from substantially non-ideal planarization performance and global non-uniformities. Neither of these techniques achieve perfect planarization in which the thickness of the metal is the same over all features at all locations of the wafer just prior to all metal being "cleared" from the surface field regions between the embedded features. Non-uniformities therefore exist on two levels: The die level (local) and global level. As a result of CMP technology's inability to achieve perfect die-level planarization, and because of global wafer-scale height variations, excess processing (beyond the point where metal over the field around the feature has been completely removed) occurs on certain areas than would otherwise be desirable. Hence, substantial overpolishing over some feature types (typically larger features) and parts of the wafer occurs.

A difficult problem of CMP includes defect generation and scratching of fine-lined metal in dielectric features by foreign particles as well as the agglomerations of abrasive particles. Scratching results in damage to interconnects and reduces device manufacturing yield. A conglomerate of particles and gels can be removed from the slurries using point-of-use filtration prior to substrate polishing; however, plugging of the filters requires interruption of the process for filtrate removal, which is expensive and results in lower production. Conglomerate slurry particles also plug the surface of the polishing pad, and polishing pads must be periodically reconditioned in a non-value-adding step called dressing.

Measures must typically be taken to avoid "dishing" of filled metal features, erosion of field dielectric and metal lines, and undesired propagation of underlying topography during CMP. (See, for example, "Establishing the discipline of physics-based CMP modeling", S. R. Runnels, and T. Lauren, *Solid State Technology*, (March 2002). Dishing occurs on the interconnect metal primarily in larger features and in contact pad regions during the later stages of copper CMP. Because electroplating creates variations in thickness over the dielectric, and because underlying topography from lower levels is transferred to higher levels of the dielectric, within-die variations in the amount of metal thickness over the dielectric persist up to the point of the first clearing of interconnect metal over the damascene structure (i.e., barrier exposure). Because neither the metal deposition (e.g., electroplating) nor metal removal (e.g., CMP) processes are perfectly uniform across the wafer surface, global non-uniformities also exist. Dishing of a feature generally occurs when the metal has cleared locally around the periphery of the feature cavity but the polishing process is continued over that feature. This "overpolishing" is needed because other areas of the surface have not reached the clearing endpoint. A rubbing pad is supported (contacted) at the feature periphery by the barrier film and dielectric, and the barrier material is largely unaffected (i.e., removed at a much slower rate than metal) as the CMP of the surface continues. The problem then arises that the interconnect metal (e.g., copper) in the feature is slowly removed, preferentially in the feature, hence "dished". It is generally desirable to remove all the interconnect metal (copper) above the barrier/dielectric level from the top of the barrier/dielectric at this point in the process before proceeding with removing the (typically conductive) barrier film. As a result, "overpolishing" is often conducted and dishing occurs.

After interconnect (copper) removal above the field has been completed, the barrier layer is exposed. If metal interconnect removal is properly performed, the barrier remains largely unaffected. During the subsequent CMP of barrier/dielectric material, the risk of erosion arises. Erosion arises from locally varying polishing properties at different areas of the substrate surface. It is believed that variations in mechanical "strength" of the substrate at different points on the circuit cause varying polishing properties. Various feature densities and the different mechanical properties of the metal and dielectric are principal causes of variations in mechanical strength. Removal and polishing of barrier and dielectric material through CMP can be viewed as a much more mechanically driven process than metal CMP. After the barrier has been removed and the dielectric is exposed, the goal of a polishing process is to avoid dishing of embedded metal features and to avoid erosion of high-density feature areas. To eliminate or minimize dishing, some amount of dielectric is typically removed, but this also reduces the thickness of the copper interconnects and increases their electrical resistance. The overall deviations from planarity caused by dishing, erosion, and underlying topography can also lead to difficulties in obtaining good focus across the die during subsequent lithographic steps. More importantly, topography introduced by these effects is replicated at the next metal level, creating "underlying topography". These areas are particularly troublesome for CMP technology because of the competing requirements of having planarization and compliance. Often CMP has difficulty clearing metal from recessed areas of underlying topography, leaving "puddles" of metal. To remove these puddles, the CMP process is generally continued for a longer period of time than otherwise desirable (because this can create excessive dishing).

Alternatives to CMP include electrolytic etching techniques such as electropolishing or electroless etching. Compared to CMP, these are relatively low cost techniques, do not exhibit a number of CMP related defects (e.g., scratching), and do not require complex post-CMP slurry-particle-removal with brushes, megasonic energy or cleaning chemicals. They also provide much higher processing rates. Electropolishing is a method of polishing metal surfaces by applying an electric current through an electrolytic bath, and removing metal via electrolytic dissolution. In many ways the process may be viewed as the reverse of electroplating. Various electropolishing techniques are known in the art.

While etching (electroless etching), electropolishing, electrochemical etching, and membrane mediated electropolishing processes are simpler, less costly operations than CMP (and eCMP), they generally have a more limited ability to planarize a "contoured" surface over longer planarization lengths (either wider features or over longer distances). In contrast, CMP selectively removes metal from exposed surfaces, but not from recesses. Also, due largely to its use of a pad, CMP can planarize over a much wider range of distances and sizes than alternatives to CMP.

Although many approaches in the prior art address the need for simpler and improved electroplanarization in semiconductor device fabrication, they generally address alternative planarization techniques performed after deposition of an undesirably thick overburden with substantial variations in topography.

Osterwald et al., in "Wirkung von Badzusätzen bei der kathodischen Metallabscheidung", *Galvanotechnik*, 66, Nr. 5, pp. 360-365 (1975), Leuze Verlag, Saulgau, Germany, and "Leveling and Roughening by Inhibitors and Catalysts" Oberfläche-Surface, 17, 89, (1976), teach an additive in solution that absorbs onto a cathode surface. The absorbed additive acts as a catalyst of metal deposition conducted with an electroplating solution that does not contain the additive, thereby increasing a metal deposition rate. When the catalyzing additive is absorbed onto a surface having a recess, the surface concentration of catalyzing additive in the recess increases compared to its concentration in non-recessed areas as metal deposition proceeds. As a result, the rate of metal deposition in the recess becomes greater than the metal deposition rate at non-recessed areas. This leads to relative planarization of the deposited metal compared to topography resulting from metal plating on a substrate without adsorbed catalyzing additive. Later, others demonstrated the validity and usefulness of these concepts in interpreting, modeling and controlling preferential filling of small damascene features (see, for example, J. Reid and S. Mayer, in *Advance Metallization Conference Proceedings*, 1999, p. 53; A. C. West, S. Mayer, and J. Reid, Electrochem. *Solid-State Lett.*, 4, C50, (2001); T. P. Moffat, D. Wheeler, W. H. Huber, and D. Josell, Electrochem Solid State Lett, 4, C26, (2001); and T. P. Moffat, D. Wheeler, and D. Josell, *Electrochemical Society Interface*, p. 46, (Winter 2004). U.S. patent application Ser. No. 10/739,822, filed Dec. 17, 2003, by Mayer et al., having the title "Method for Planar Electroplating", teaches a method of selectively attaching a plating accelerator to recessed regions of the dielectric layer before electroplating to achieve selectively accelerated plating (SAP) of metal in the recessed regions.

Electropolishing is a method of polishing metal surfaces by applying an electric current through an electrolytic bath, and removing metal via electrolytic dissolution. Electropolishing may be viewed as the reverse of electroplating. For example, U.S. Pat. No. 5,096,550, issued Mar. 17, 1992, to Mayer et al., which is hereby incorporated by reference, teaches an electropolishing apparatus having a vessel filled with electrolytic solution, a cathode mounted in the vessel, and an anode containing the semiconductor substrate positioned in the vessel. U.S. Pat. No. 5,256,565, issued Oct. 26, 1993, to Bernhardt et al., teaches a method of forming a planarized metal interconnect by connecting a substrate containing a metal-filled trench or via to the anode of a DC voltage source, placing the substrate in an electrolyte, and flowing DC current through the substrate. United States Patent Application Publication No. 2004/0134793, published Jul. 15, 2004, by Uzoh et al., teaches a method and an apparatus for electroetching metal from a substrate surface by applying a voltage between an electrode and a substrate and continuously applying an etching solution to the substrate surface as a plurality of rollers are rotated.

Nevertheless, a problem arises during the electropolishing of surfaces in which a large number of low aspect-ratio (larger width than depth) features exist. Wide interconnect lines (trenches cut in a dielectric layer for a damascene process) and contact/bond pads often have low aspect ratios. Low-aspect-ratio features generally require the plating of an overburden layer slightly thicker than the thickness of the damascene layer so that the feature is completely filled after planarization. The metal fill profile above these features exhibits large recesses having profiles that resemble the original low aspect-ratio feature. The metal processes used to deposit the metal, which are substantially conformal over such low aspect-ratio features, are typically not continued to a point that would geometrically "close" such recesses, because to do so would require depositing a very thick metal layer. Depositing a thick metal layer would be uneconomical due to necessary removal of the large excess of metal at a later stage. Conventional electropolishing techniques can planarize a surface in which the recessed feature to be planarized is no more than perhaps three times as wide as it is deep. For features wider than these, the rate of removal is essentially uniform everywhere. When the metal layer is electropolished to the dielectric surface, recesses over low-aspect-ratio features are propagated and expanded to produce recesses that span the width of these features, leaving effectively little or no metal in the metal pad regions. This is an unacceptable result.

Similar problems may arise from chemical (nonelectrolytic) wet etching of metal from a substrate surface. Wet etching generally proceeds isotropically; that is, there is no selection between etching of metal from peaks and valleys of the substrate surface and etching occurs over the surface at substantially the same rate everywhere. For example, U.S. Pat. No. 5,486,234, issued Jan. 23, 1996, to Controlini et al., which is hereby incorporated by reference, teaches a method of spin-spray etching particularly suited for removing both field metal and metal embedded in a substrate at substantially the same rate by applying a suitable metal etchant onto a spinning wafer. The process etches the metal evenly on the entire surface of the wafer and is useful after the wafer has been electroplated and planarized, for example, by CMP or electropolishing. Because it is an isotropic, a conformal, operation, it requires an initially planar surface to be useful. If not initially planar, differences in metal height between metal over high-aspect-ratio features and metal over low-aspect-ratio features remain and are further propagated. Furthermore, if chemical wet etching were conducted long enough to remove substantially the metal over the field areas and above "overplated" high-aspect-ratio features of a nonplanar substrate, then excessive over-etching of metal and generation of recesses in low-aspect-ratio features would result.

Another class of methods useful in overburden reduction and planarization is referred to as "brush plating" or "planar plating". These methods generally employ a brush or pad that acts on the surface to achieve smoother deposits during the plating process. As described above and known in the art, so-called bottom-up fill (also referred to as "superfilling") methods are now commonly used to fill high-aspect-ratio (i.e., deeper than wide) recess features, though a geometric acceleration concentration mechanism similar to that proposed by Ostwald et. al. However, due to their physical and geometrical limitations, these processes are not capable of filling low-aspect-ratio features (e.g., contact pads). Since both of these feature types can exist on every damascene integrated circuit interconnect level, research into potentially low cost "planar plating" methods has been pursued. Various planar plating methods that attempt to modify the otherwise conformal plating behavior over a recessed low-aspect-ratio region by modifying the plating method (bath additives, transport properties, field effects, etc.) have been reported.

U.S. Pat. No. 3,183,176, issued May 11, 1965, and U.S. Pat. No. 3,313,715, issued Apr. 11, 1967, to Schwartz, teach techniques for brush planar electroplating useful in obtaining smooth electrodeposits, in diminishing surface roughness and in preferentially filling recessed small crevices. A hard polymeric rubbing element with definitely-sized holes is rubbed and moved over a surface while the surface is wetted in a plating bath, in some cases, containing organic plating additives. U.S. Pat. No. 3,751,343, issued Aug. 7, 1973, to Macula et al., describes a useful brush plating apparatus and a process in which electrolyte is held in and moves through a surface-rubbing element having an orbital rubbing like motion simultaneously with electrolytic plating. U.S. Pat. No. 3,619,383, issued Nov. 9, 1971, and U.S. Pat. No. 3,749,652, issued Jul. 31, 1973, to Eisner, teach an apparatus and a method of brush plating that use simultaneous plating and abrasion of the surface to improve metal deposition and to reduce roughness and accumulation of undesired metal.

U.S. Pat. No. 6,867,136, issued Mar. 15, 2005, to Basol et al., teaches a method of brush or "mask-pulsed" plating in which one or more additives that enhance plating are contained in an electrolytic plating solution. Generally similar to the brush plating process of Schwartz above (but note that the patents tend to use their own coined terms for the process, including "mask pulse" plating, "electrochemical mechanical deposition" or ECMD for this technique), the method involves sweeping the top surface of the substrate (field regions) by a brush or pad that contains holes (hence a "mask"). It is known that the use of a rubbing element, such as a pad, in continuous moving contact with a surface such as a wafer creates problems (e.g., defects, feature damage, plating protrusions, metal particle deposition on the pad, and contamination of deposited metal by pad material), and the influence of adsorption dynamics (diffusion, surface reaction rates, local consumption rates, etc.) can make process control difficult. Furthermore, plating selectivity between recessed and exposed regions is generally less than optimal because a finite rate of additive re-adsorption tends to reduce the plating selectivity. The mechanism of masked plating, and specifically the role of a mask-plating pad in creating differential plating activity, remains unclear and leads to doubt regarding optimization, a method's robustness, and its overall utility. Understanding a plating mechanism impacts the ability to design better processes and tool implementation strategies. In addition, while the desired properties of pads have not been specified clearly, the effects of continual contact of a pad with the substrate surface and of the associated continual wear require significant pad conditioning to maintain performance and selectivity. This substantially limits the overall pad life and process flexibility. Replacement of the mask plating pad is not only potentially costly from a material standpoint, but also from a tool utilization and uptime standpoint.

There exists a need for improved technology for depositing and planarizing conductive layers embedded in dielectric substrates having various feature sizes, particularly having both very narrow (submicron) and very wide (on the order of 100 μm) feature widths. Similarly, there exists a need in the semiconductor industry to planarize thin metal films and fine metal interconnect lines inlaid on a patterned substrate that includes dielectric and barrier layer materials. The metal films and interconnect lines and patterns should be substantially free from scratches, dishing and erosion. Techniques for depositing, planarizing and polishing fine copper (or other metal) interconnect lines and metal films on a patterned substrate should yield smooth, undamaged surfaces and have a high throughput rate. Thus, electroplating processes that deposit copper with reduced overburden, that reduce variations in topography, and that improve planarity are highly desirable.

SUMMARY OF THE INVENTION

The invention helps to solve some of the problems mentioned above by providing systems, apparatuses and methods for plating and planarization of integrated circuit substrates. Some embodiments in accordance with the invention utilize selective accelerator removal (SAR) and selectively accelerated plating (SAP) of a substrate surface to produce an intermediate structure characterized by metal overburden having an "embossed" structure, on which metal protrusions above metal-filled features are higher than metal covering field regions. The metal protrusions preferably have substantially the same height. Then, the metal overburden is removed first from the field areas of the substrate and then from above the features until metal in the metal-filled features is substantially planar with a dielectric base layer. Plating and planarization in accordance with the invention avoids dishing, erosion, and scratching or other damage to metal and dielectric surfaces, while maintaining good throughput rates and minimizing costs.

Embodiments in accordance with the invention help to solve the problem of highly variable and difficult-to-control topography that commonly results from damascene copper electroplating processes. Embodiments in accordance with the invention provide "bottom-up" filling of feature cavities of all aspect ratios with minimal overburden. They enable tailoring of topography and reduction of topographic feature sizes. Some embodiments enable control of topography with little or no physical contact of hardware to a substrate surface; for example, without use of a pad or similar type of rubbing element. Methods in accordance with the invention are particularly useful in combination with various non-contacting metal removal techniques, such as isotropic wet etch, electropolishing and membrane-mediated electropolishing (MMEP). Some embodiments of methods in accordance with the invention are also useful for reducing or eliminating dishing and erosion associated with chemical mechanical polishing (CMP) operations.

Some embodiments in accordance with the invention relate to improved methods of preferentially filling features that are recessed from the general plane of the workpiece. In one aspect, some embodiments in accordance with the invention relate to a new process for improving the preferential metal-filling of high-aspect-ratio recesses (or feature cavities) (i.e., features deeper than wide). In another aspect, some embodiments relate to the reduction of excess thickness commonly observed during copper electrodeposition over a high-aspect-ratio feature (a "mound" or "bump" or excessive metal, often resulting from filling high-aspect-ratio features, sometimes called "momentum" or "overplating"). In another aspect, some embodiments in accordance with the invention relate to preferential metal-filling a recessed area (cavity) of a surface with damascene features having a low aspect ratio (i.e., features wider than deep). In another aspect, some embodiments in accordance with the invention reduce the overall amount of excess plating (overburden) on a substrate surface that typically accompanies the filling of low-aspect-ratio features.

In another aspect, embodiments in accordance with the invention relate to removal of metal from a substrate surface. In some embodiments, metal deposition and removal steps occur primarily though electrochemical or chemical action (rather than, for example, physical abrasion or sputtering), and in some embodiments, without physical contact of hardware with the surface of the substrate on which material is being deposited or from which material is being removed. The reduction and control of topography during the electroplating of copper damascene integrated circuits using the novel methods and apparatuses disclosed herein improve the filling and the control of filling of damascene features, and reduce the amount of excess metal necessary to fill recessed features. In some embodiments, it useful to continue the feature-filling processes beyond the simple filling stage (filling the recesses) to create raised or "embossed" regions over underlying features, thereby facilitating the use of preferred removal process sequences, such as a non-contacting wet etch (preferably a surface-reaction-controlled feature-size-independent isotropic wet etch) or membrane-mediated electropolishing (MMEP). Intermediate structures having excess metal above metal-filled features are referred to as being "proud", "embossed" or with protrusions. The protection of underlying metal-filled features with excess metal above the features helps reduce undercutting, dishing, and erosion, helps enhance substrate planarization steps (e.g., barrier/dielectric CMP) after plating, and helps reduce the impacts of underlying topography in subsequent device level manufacture.

Some embodiments in accordance with the invention utilize membrane-mediated elements to achieve electrochemical oxidization and planarization without having to make physical ohmic contacts to the substrate surface. Membrane-mediated elements also help to avoid well-known terminal effect phenomena (ohmic-resistance current distribution problems in thin metal layers).

Methods in accordance with the invention allow use of a simple, low-cost isotropic wet-etching technique after metal plating that selectively removes remains of copper and typically is stopped at a barrier/etch-stop layer. A feature of some embodiments of methods in accordance with the invention is the capability of planarizing the entire surface of the substrate face, including extreme peripheral portions of the substrate face contiguous to the side edges of the substrate.

A feature of some embodiments of methods and apparatuses in accordance with the invention is localized liquid treatment of a substrate compared to more common global treatment. Localized liquid treating is particularly useful for localized wet etching of a substrate, which is better able than global techniques to address non-uniformities on a macroscopic scale, for example, differences in metal thicknesses between different areas across a substrate wafer.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DESCRIPTION OF THE INVENTION

Figure 1:
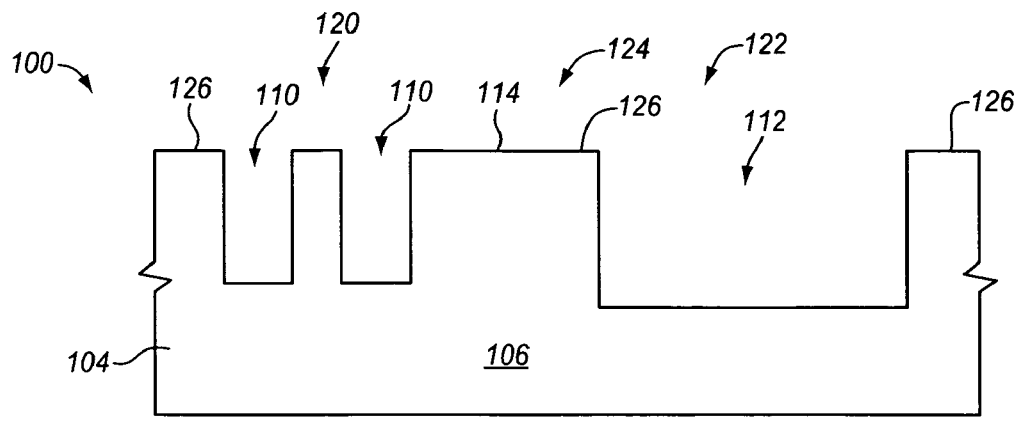
FIG. 1 depicts schematically a cross-sectional view of a substrate wafer portion having a dielectric base layer, which has narrow (e.g., high-aspect-ratio) feature cavities and a wide (e.g., low-aspect-ratio) feature cavity.

The invention is described herein with reference to FIGS. 1-28 and 31-76. It should be understood that the structures and systems depicted schematically in the figures serve explanatory purposes and are not precise depictions of actual structures, apparatuses, and systems in accordance with the invention. Furthermore, the embodiments described herein are exemplary and are not intended to limit the scope of the invention, which is defined in the claims below. For the sake of clarity, parts and elements of various embodiments having similar structure and function are identified using the same reference numerals in the figures below.

The word "substrate" herein generally means an entire workpiece as well as any object on which some material is deposited. In this disclosure, the terms "substrate", "substrate surface" and related terms also refer to the surface of a workpiece as it exists at a particular phase of fabrication and on which a particular fabrication process is being conducted.

In this specification, terms of orientation, such as "face-up", "above", "below", "up", "down", "top", "bottom", and "vertical" used to describe embodiments relate to the relative directions in the figures (e.g., FIG. 1), in which a substrate wafer defines a substantially horizontal plane. It is understood, however, that the spatial orientation of substrates and apparatuses in embodiments in accordance with the invention are not confined to those depicted in the drawings.

The terms "accelerator", "accelerator species" and related terms are used interchangeably in this specification to designate chemical species that activate the surface of a workpiece and enable (often in association with the simultaneous use of other chemical) a greater rate of metal deposition than in areas with less or no accelerator. The terms "accelerator precursor" and "accelerator precursor species" and related terms designate a chemical species that transforms during a method in accordance with the invention into another species that activates the surface of a workpiece. The terms "accelerator", "accelerator precursor", "accelerating species" and related terms are often used in this specification interchangeably. Their meanings are clear from the context in which they are used. The term "species" is used broadly to include an atom, a molecule, a molecular fragment or group, and their combinations and complexes. The terms "accelerator", "accelerator film" and related terms are also used broadly to designate both accelerator species and also a formulation that includes accelerator species, but which can also include other materials, such as liquid or dried solvent, precursor compounds of accelerator species, and formulation materials. While the term "accelerator solution" is used broadly here to mean any liquid suitable for use as an accelerator, an accelerator solution in accordance with the invention typically comprises a known amount of accelerator molecules dissolved in a liquid solvent. It is understood that, alternatively, the accelerator could be attached to the workpiece via a vapor phase interaction, negating the need for forming a liquid accelerator solution. In such a case, the accelerator is applied to the surface from an accelerator gas or gas mixture. The meaning of the various terms as used is clear from its context. While not being bound to a particular theory or mechanism, it is believed that accelerator molecules referred to in the specification provide accelerator species that are strongly adsorbed (chemisorbed) on a workpiece surface, which accelerator species activate the surface. Exemplary accelerators in accordance with the invention are described in co-owned and co-pending U.S. patent application Ser. Nos. 10/739,822, filed Dec. 17, 2003, by Mayer et al., and 10/824,069, filed Apr. 13, 2004, by Drewery et al., which are incorporated by reference.

The accelerating effect of certain accelerator species in accordance with the invention is also long lived. The accelerating effect persists even when surfaces on which the accelerator was initially deposited have been embedded deep inside a growing plated film. The accelerator appears to "float" on the metal surface and not be substantially incorporated into the film while the film is growing (at least not to an extent of significantly diminishing the acceleration effect). Without being bound to a particular theory, it is assumed for purposes of explanation that the accelerator remains on the surface throughout the deposition process unless removed (e.g., removed by a rubbing process).

On the one hand, the terms "acceleration region", "activated surface" and related terms and, on the other hand, the terms "non-accelerated region", "suppressed region" and similar terms are relative terms. The terms acceleration region and related terms refer to a region or area comprising a higher concentration of attached accelerator species relative to a non-accelerated (or suppressed region), and the higher concentration of accelerator species in an acceleration region is able to cause a faster rate of metal deposition than in a non-accelerated region.

The term "aspect ratio" used in the art generally relates to the relative dimensions of an embedded feature or feature cavity. Aspect ratio is defined generally as the ratio of the depth of a feature divided by the width of the feature, or in other terms, as a ratio of the height of the feature divided by the width of the feature opening. In the case of a cylindrical feature, the aspect ratio is the height (or depth) of the feature divided by its diameter. In the case of a rectangular trench, the aspect ratio is the depth of the trench divided by its width. In the art, an aspect ratio of one or greater is generally considered to be a high aspect ratio, and an aspect ratio less than one is generally considered to be a low aspect ratio. In this specification, unless a particular numerical value is mentioned, the terms "high aspect ratio" and "low aspect ratio" are also generally used in a relative sense; that is, a high-aspect-ratio feature has a higher aspect ratio than a low-aspect-ratio feature. The term "adjusted aspect ratio" refers to the aspect ratio of the empty, un-filled space remaining in a feature cavity that has been partially filled with metal. The terms "wide" and "narrow" and related terms when used with respect to feature cavities, feature regions and related terms are used in a relative sense; that is, a wide feature cavity has a wider feature opening (width) than a narrow feature cavity. In some embodiments in accordance with the invention, the term "wide feature cavity" refers generally to a feature cavity having a low aspect ratio ("LAR"); for example, an aspect ratio of 0.33. In such embodiments, the term "narrow aspect ratio" refers generally to a feature cavity having a high aspect ratio ("HAR"); for example, an aspect ratio greater than 1.0.

The term "liquid" is used broadly herein to include not only liquids, but also combinations of liquids and solids, such as slurries and suspensions. The term "rubbing medium" herein is used broadly to include a liquid, a suspension or any other medium used with a rubbing pad during mechanical polishing (rubbing) of a substrate. In some embodiments, the same medium (e.g., liquid, slurry, suspension) is used as both "electropolishing liquid" and rubbing medium. The terms "nonabrasive", "nonabrasive pad", "nonabrasive medium" and similar terms are relative terms used to describe objects and processes that do not scratch or otherwise damage metal and dielectric material commonly used in integrated circuits. The term "abrasive-free planarization" (AFP) refers to a technique that resembles CMP but has little if any abrasive content in the polishing slurry.

The term "anodizing" herein means establishing on a conductive material an electrical bias that is positive relative to some reference material, such as electropolishing liquid or a negatively-biased cathode. Similarly, the term "cathodizing" means establishing on a conductive material an electrical bias that is negative relative to some reference material, such as electroplating liquid or a positively-biased conductive material (e.g., an anode). The terms "cathodic plating", "electrochemical deposition" and related terms are used synonymously in this specification. The terms "anodic dissolution", "electrochemical dissolution" and related terms are used synonymously in this specification. The terms "unbiased", "electrically unbiased" and related terms imply that there is substantially no electrical or ionic current. The term "nonconductive" means electronically nonconductive or ionically nonconductive or both.

The word "area" is used in this specification generally to refer to an area on a substrate surface. The term "nominal area" refers to the area of surface that would be measured if the surface were smooth, without embedded features, raised areas, and other area-increasing topography. The word "region" used in this specification refers generally to a three-dimensional region of a substrate. For example, the term "narrow feature region" refers to parts of the substrate wafer including a narrow (e.g., HAR) feature and material and surfaces above and below the narrow feature.

The term "simultaneous" and related terms means that there is at least some overlap of the time periods in which one or more processes are occurring. It does not mean that whenever a first set of processes is occurring (e.g., processes related to electrochemical plating) that a second set of processes (e.g., mechanical rubbing) must occur during the whole time that the first set of processes is occurring. The term "concomitantly" is used more broadly to describe two or more operations or processes that occur either simultaneously or in quick succession from each other, usually cyclically, but not necessarily simultaneously with each other. A feature of some preferred embodiments in accordance with the invention is that metal plating and metal removal operations occur neither simultaneously nor concomitantly. Another feature of some preferred embodiments in accordance with the invention is that application of accelerator to a substrate surface and metal plating of the substrate surface generally occur neither simultaneously nor concomitantly. Still another feature of some preferred embodiments in accordance with the invention is that metal plating of a substrate wafer and accelerator removal from the substrate wafer do not occur simultaneously at the same location on a substrate surface. On the other hand, in some embodiments, metal plating at a particular point of a substrate wafer and accelerator removal from that particular point of the substrate wafer occur concomitantly, that is, cyclically as a wafer rotates.

The term "isotropic etching", "isotropic removal" and related terms are used in this specification in their usual sense to designate an etching process or other type of material removal operation in which the rate of the etching reaction or other material removal technique is the same in any direction. The term "kinetically-controlled isotropic removal", "surface-kinetics-controlled isotropic etching" and related terms relate to metal removal techniques in which the material removal rate from a substrate surface is apparently controlled by the reaction kinetics of etching reactions rather than by diffusion processes to or from the surface. Kinetics-controlled etching is characteristically different from diffusion-controlled etching in that kinetics-controlled etching is generally independent of feature size, feature separation, feature density, position within a feature and other geometric factors. In some embodiments, kinetics-controlled isotropic etching is more desirable than diffusion-controlled isotropic etching.

The term "topography" and related terms used in the specification refer principally to the topographic relief of a substrate, that is, to characteristics of surface relief such as surface contours, protrusions, planar field areas, feature cavities and recesses. This is in contrast to other uses of the word "topography" in the semiconductor arts that are related to the circuit patterns and their material compositions in integrated circuits.

The term "global treatment", "global etching", "global removal" and related terms are used in this specification to refer to a substrate treatment process conducted over the whole or a substantial portion of a substrate surface at a given time. The term "localized treating", "localized etching", "local removal" and related terms refer to a treatment or process that is conducted in a relatively small portion of a substrate surface at any given time. It is understood that a series of sequential operations involving localized treatment typically result in treatment of a substantial portion of or the whole of a substrate surface.

The terms "move", "movement" and related terms are used in their normal sense to refer to several kinds of movement. In one sense, the terms refer to small reciprocating movements of a rubbing pad when the general location of the pad relative to a substrate wafer does not change. The terms also refer to gross movements of various elements of an apparatus, such as the movements of a rubbing pad and a wafer holder. For example, at times during a plating process, a rubbing pad translates vertically (perpendicularly) toward a substrate face to make physical contact with the substrate. Similarly, at times during a plating process in some embodiments, a rubbing pad moves (is translated) horizontally (parallel) to a substrate face, thereby moving the location of a rubbing portion. The meaning of the terms "move", "movement" and related terms is clear from the particular context in which they are used. For clarity, terms such as "reciprocate" and "translate" are sometimes used to specify the kind of movement being described.

In some embodiments in which the substrate is rotated, the locations of a first plating portion of a substrate and one or more non-electrochemical rubbing portions are continuously changing as the substrate rotates.

The term contact-less technique refers generally to a technique for removing material from a substrate that does not require physically contacting the substrate surface with a solid object, such as a rubbing pad. An exemplary contact-less technique is a selective membrane-mediated accelerator removal technique, which is described below.

Method of Making Embossed Intermediate Structure Using SAR and SAP

Some embodiments of methods in accordance with the invention for forming embedded metal features in electronic devices through selective plating acceleration and topography control are described herein with reference to FIGS. 1-22. It is understood that some methods in accordance with the invention and resulting structures do not necessarily include all of the processes and structures represented and discussed with reference to FIGS. 1-22. For example, in FIGS. 1-21, a substrate base layer comprises dielectric material in which embedded metal features are formed. Nevertheless, methods in accordance with the invention are also suitable for forming embedded metal structures in base layers that are not dielectric. It is also understood that some methods in accordance with the invention and resulting structures also include processes and structures not represented or discussed with reference to FIGS. 1-22.

FIG. 1 depicts schematically a cross-sectional view 100 of a substrate wafer portion 104 having a dielectric base layer 106, which has narrow (e.g., high-aspect-ratio) feature cavities 110, a wide (e.g., a low-aspect ratio) feature cavity 112, and a field (commonly referred to as a "dielectric field") 114. Narrow feature cavities 110 define a narrow-feature region 120 of substrate 104. Similarly, wide feature cavity 112 defines a wide-feature region 122, and dielectric field 114 directly adjacent to wide feature cavity 112 defines a field region 124 adjacent to wide-feature region 122. In portion 104 represented in FIGS. 1-21, field 114 is also adjacent to one of narrow feature cavities 110, and field region 124 is adjacent to narrow-feature region 120, although it is not necessary for field region 124 to be adjacent to narrow-feature region 120. The top surface 126 of base layer 106 defines generally a base-layer field height, or particularly a dielectric-layer field height when base layer 106 is dielectric as in portion 104. The terms "field" and "field region" generally refer to a region of a substrate corresponding to a footprint area of the substrate whether or not dielectric or base layer material is actually exposed. For example, a dielectric field covered by a barrier layer or by a barrier layer with adjacent copper layer, still defines a field. Similarly, a "feature region" refers to a three-dimensional region of a substrate corresponding to a footprint area of a feature or a group (e.g., cluster) of features, whether the feature is exposed or covered, and whether or not a feature cavity is completely filled, partially filled or not filled. Methods and techniques for patterning and etching cavities in an electronic workpiece are well-known in the art. Due to the limited ability to illustrate a LAR feature accurately to scale in FIG. 1 and in the figures that follow, only a relatively narrow LAR feature is shown. In practice, the widths of LAR features vary from as small as two times the depth (as shown) to as large as 300 times the depth for current-generation devices.

Figure 2:
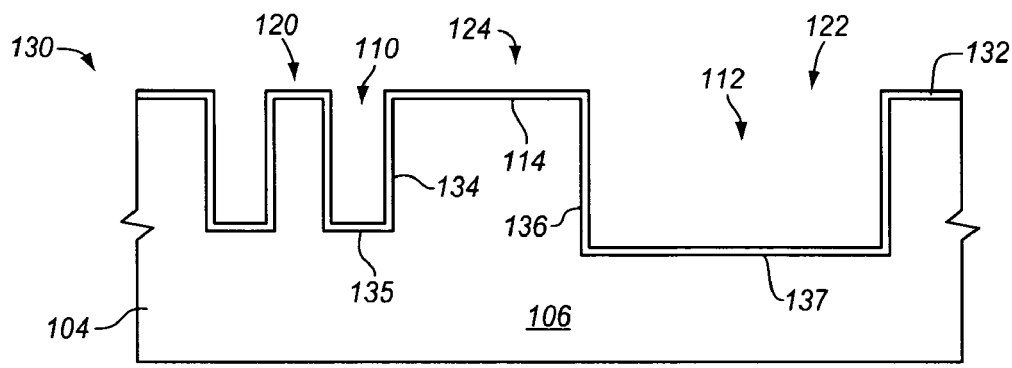
FIG. 2 depicts schematically a cross-sectional view of the substrate wafer portion of FIG. 1 after a barrier layer has been deposited on the substrate surface.

FIG. 2 depicts schematically cross-sectional view 130 of substrate wafer portion 104 after a barrier layer 132 has been deposited on the substrate surface. Typically, barrier layer 132 is deposited conformally on substrate 104 and covers dielectric material 106 in field region 124, narrow-feature region 120 and wide-feature region 122. As a result, barrier layer 132 covers the inside walls 134 and bottom 135 of narrow feature cavities 110 and the inside walls 136 and bottom 137 of wide feature cavity 112. Barrier layer 132 typically comprises a conductive metal or metal nitride, such as tantalum, titanium, or tungsten, and/or nitrides of these metals. In some embodiments, non-conductive materials (e.g., SiN) are used instead of or in addition to conductive material, or the barrier is omitted altogether. In some cases, the barrier layer is a composite layer of more than one film. Barrier layer 132 typically functions both as a diffusion barrier to protect against migration of copper (or other conductive metal used as the core of the electrical interconnect structure) or other deleterious metal into dielectric base layer 106 and other parts of an electronic device, and as an adhesion layer to improve interfacial adhesion between the layers.

Barrier layer 132 commonly is deposited using a PVD or a CVD method known in the art. As feature sizes become smaller, however, in some integrated circuit devices, alternative methods have been developed (often exhibiting improved conformal deposition behavior) for forming barrier layer 132, including ALD methods and electroless deposition methods.

Figure 3:
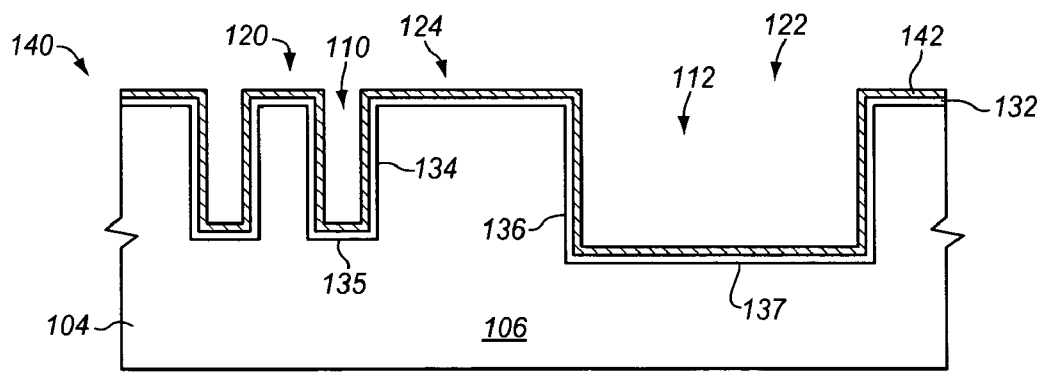
FIG. 3 depicts schematically a cross-sectional view of the substrate wafer portion of FIG. 2 after a metal seed layer has been deposited on the substrate surface.

FIG. 3 depicts schematically cross-sectional view 140 of substrate wafer portion 104 after a metal seed layer 142 has been deposited on the substrate surface. Typically, metal seed layer 142 is deposited ideally conformally on substrate 104 and covers barrier layer 132 in field region 124, narrow-feature region 120 and wide-feature region 122. As result, metal seed layer 142 covers the inside walls 134 and bottom 135 of narrow feature cavities 110 and the inside walls 136 and bottom 137 of wide feature cavity 112. In some embodiments, metal seed layer 142 comprises copper. In some embodiments, metal seed layer 142 comprises non-cuprous metal, such as ruthenium, osmium, rhenium, rhodium, platinum, platinum, nickel, cobalt, nickel alloy and cobalt alloy. In some embodiments, a single metal layer functions as both a diffusion barrier and as a metal seed layer. In such embodiments, barrier layer 132 and metal seed layer 142 of FIG. 3 are replaced by a single barrier/seed layer (not shown). Some improved techniques for depositing a seed layer include proximity focusing scanning microplating (PFSM), which is described further below.

Figure 4:
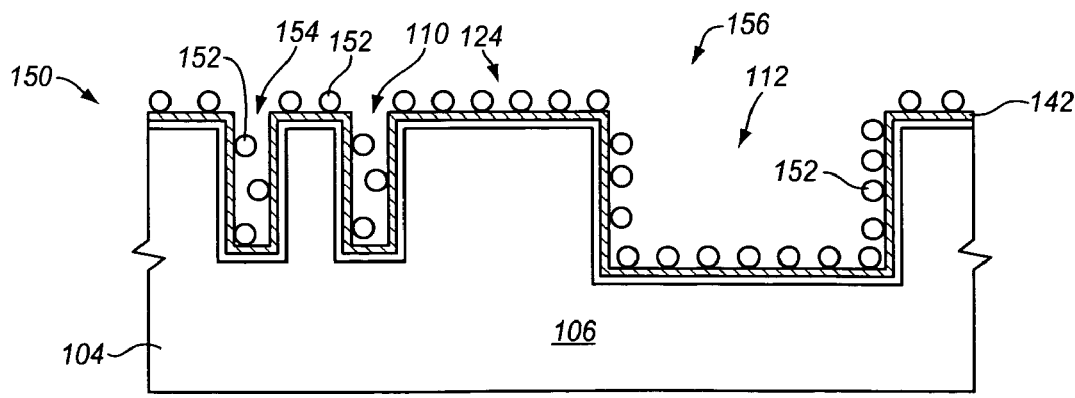
FIG. 4 depicts schematically a cross-sectional view of the substrate wafer portion of FIG. 3 after an initial deposition accelerator, represented by spheres, has been applied in accordance with the invention to the metal seed layer at the substrate surface.

Generally, rapid bottom-up filling of narrow feature cavities 110 is desired. Techniques for rapid bottom-up filling of high-aspect-ratio cavities are known in the art. In some embodiments in accordance with the invention, initial metal-deposition accelerator is applied to the substrate surface before plating in order to enhance bottom-up filling of narrow feature cavities 110. FIG. 4 depicts schematically cross-sectional view 150 of substrate wafer portion 104 after an initial deposition accelerator 152, represented by spheres 152, has been applied to metal seed layer 142 at the substrate surface of substrate 104. Initial accelerator 152 serves to increase the plating rate of metal in narrow feature cavities 110 compared to a plating rate of metal in wide feature cavity 112 and filed region 124 during a subsequent narrow-feature metal deposition (discussed below). While not being bound to any particular theory of action, the process of plating that begins conformally is accelerated within the high aspect ratio features by the geometric concentration of the surface-bound accelerator species leading to an associated reduced polarization there. Suitable chemically-active accelerator species include mercaptopropane sulphonate (MPS) and mercaptoethane sulphonate (MES), either as an acid or salt. Alternatively, in some embodiments, a suitable electrochemically-active accelerator precursor is used. For example, dimercaptopropane sulphonate is electrochemically reduced to chemically adsorbed 3-mercaptopropane sulphonate at the surface when it is present in a plating bath. It is desirable to avoid an excessive rate of filling in narrow feature cavities 110 and in narrow-feature region 120, especially after partial completion of narrow-feature metal deposition processes in which the surface concentration of surface-attached accelerator increases due to in decreasing surface area in narrow-feature region 120. Therefore, in some embodiments, the surface concentration of initial accelerator 152 after initially being applied to the substrate surface is a "compensated concentration". A "compensated concentration" serves to compensate for the well-known geometric increase in surface concentration of accelerator in narrow feature cavities relative to the smaller increase in surface concentration in wide feature cavities as metal plating proceeds and as the surface concentration of accelerator increases proportionally to the decrease in surface area in a cavity. In some embodiments, it is desired that the original concentration of initial accelerator in narrow feature cavities 110 is actually lower than the concentration in field region 124 and wide-feature region 122. A technique for achieving a lower initial concentration of initial accelerator in narrow feature cavities relative to wide feature cavities is to apply a solution containing initial accelerator species to the substrate surface, which accelerator species comprises large-sized molecules relative to the width of opening 154 of narrow feature cavities 110, but which molecules are relatively small compared to the size of the opening 156 of wide feature cavity 112, as depicted schematically in FIG. 4. The solution is applied to the substrate for a limited time. Because of the relatively narrow opening of narrow feature cavities, fewer accelerator molecules per surface area migrate into narrow feature cavities than into wide feature cavities and onto field surfaces during a limited time.

Figure 5:
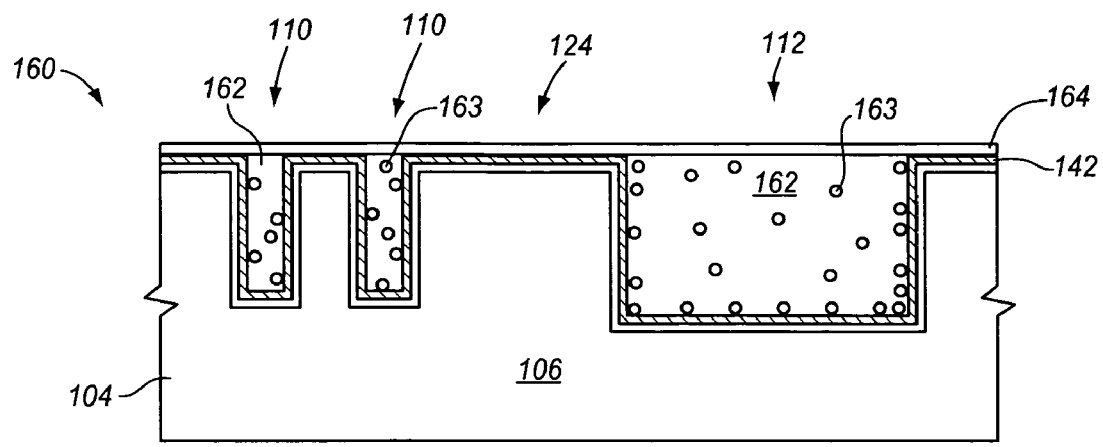
FIG. 5 depicts schematically a cross-sectional view of a substrate portion of FIG. 3 in which a liquid containing a limited concentration of initial accelerator species represented by spheres is present in the feature cavities covered by a plastic film.

An alternative technique for achieving an initial compensated concentration of initial accelerator in narrow feature cavities relative to a surface concentration in wide-feature cavities is to apply a liquid containing a limited concentration of initial accelerator species to the substrate surface of substrate 104 so that the liquid fills feature cavities 110, 112. FIG. 5 depicts schematically a cross-sectional view 160 of a substrate portion 104 in which a liquid 162 containing a limited concentration of initial accelerator species represented by spheres 163 is present in feature cavities 110, 112, covered by a covering material such as a plastic film 164. Since the volume-to-surface ratio of a narrow feature cavity is less than the volume-to-surface ratio of a wide feature cavity, the equilibrium surface concentration of initial accelerator in a narrow feature cavity is less than the concentration in a wide feature cavity.

Some improved techniques for selective accelerator removal include selective electrochemical accelerator removal (SEAR), which is described further below.

Figure 6:
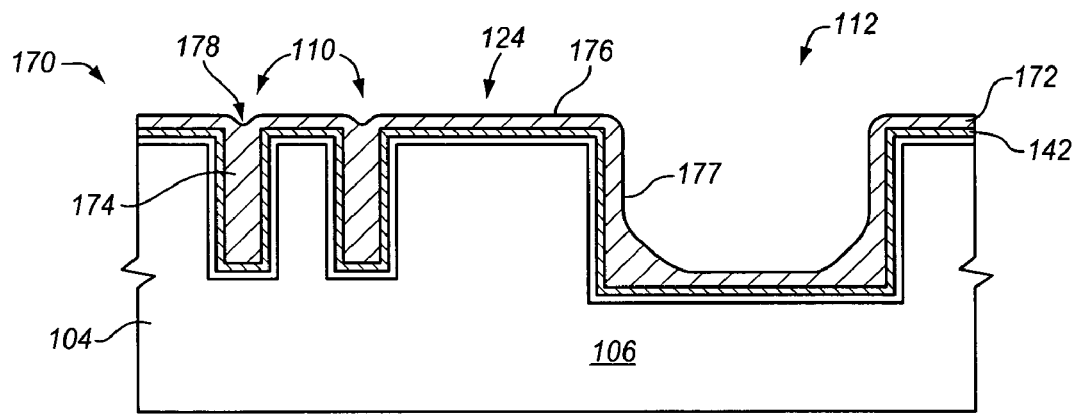
FIG. 6 depicts schematically a cross-sectional view of the substrate wafer portion of FIG. 4 or 5 after metal plating during a narrow-feature metal deposition in accordance with the invention.
Figure 7:
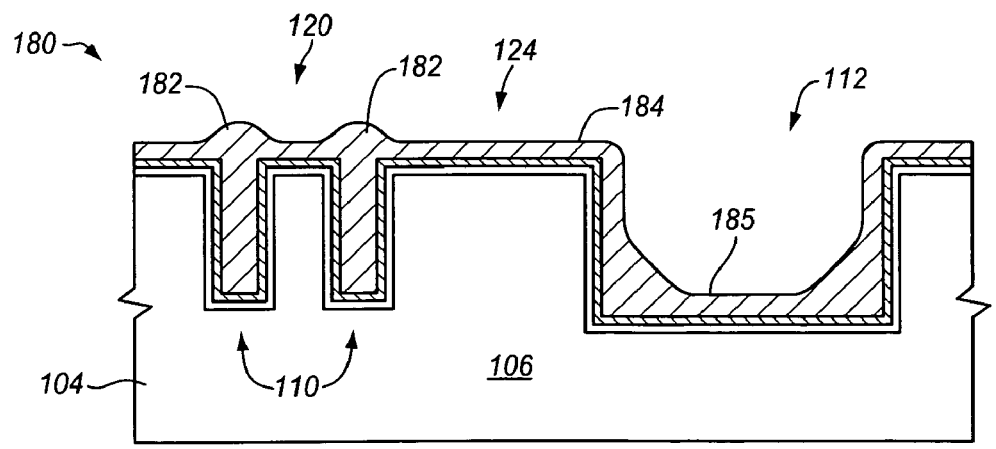
FIG. 7 depicts schematically a cross-sectional view of the substrate wafer portion of FIG. 6 after metal plating during a narrow-feature metal deposition in accordance with the invention has continued until narrow feature cavities have been completely filled and deposited metal has formed metal protrusions in the narrow-feature region above narrow feature cavities.
Figure 8:
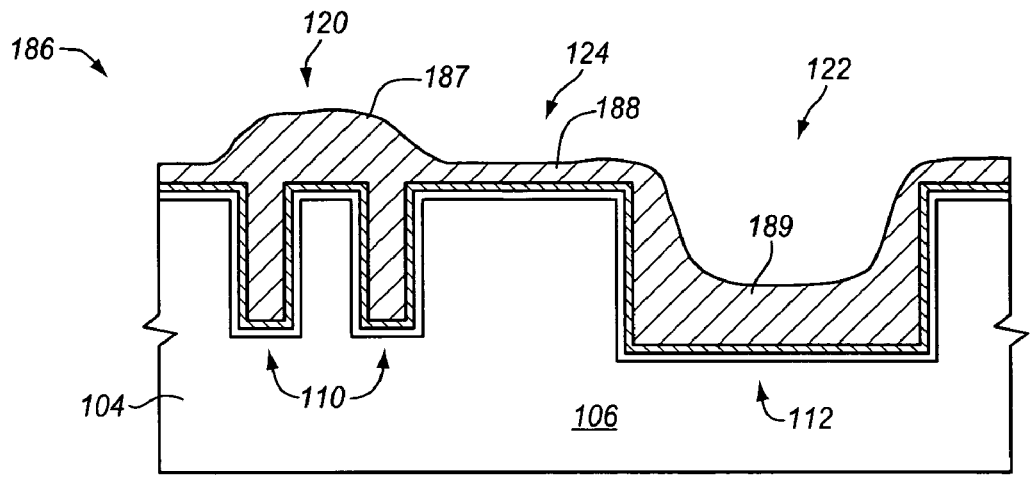
FIG. 8 depicts schematically a cross-sectional view of the substrate wafer portion of FIG. 7 after metal plating during a narrow-feature metal deposition in accordance with the invention has continued further until deposited metal has formed a metal protrusion in the narrow-feature region above completely-filled narrow feature cavities.

FIG. 6 depicts schematically cross-sectional view 170 of substrate wafer portion 104 after metal plating during a narrow-feature metal deposition in accordance with the invention. In some embodiments, surface-attached accelerator is present at one or more regions of the substrate surface during plating operations to fill narrow-feature cavities 110 (see FIGS. 4 and 5). For purposes of clarity and ease of explanation, no accelerator is depicted in FIGS. 6, 7 and 8. Metal layer 172 has been plated on metal seed layer 142. A narrow-feature metal deposition in accordance with the invention is designed to fill substantially narrow feature cavities 110 with deposited metal. Typically, selective filling of small, narrow feature cavities is achieved by using rapid bottom-up-filling plating solutions, which are known in the art, or by selective acceleration of narrow-feature cavities, as discussed above with reference to FIGS. 4 and 5, or by a combination of techniques. As depicted in FIG. 6, deposited metal portions 174 of metal layer 172 substantially fill narrow-feature cavities 110. Field metal portion 176 of metal layer 172 covers field region 124 and wide-feature metal portion 177 covers the inside walls of wide feature cavity 112. Typically, the thickness (depth) of deposited metal portion 174 in narrow-feature cavities is greater than the thickness of deposited metal in field regions and in wide feature cavities. Preferably, a narrow-feature metal deposition in accordance with the invention is continued until any remaining empty space (i.e., unfilled space) in feature cavities initially having an aspect ratio greater than one has an "adjusted aspect ratio" less than one. As depicted in FIG. 6, empty spaces 178 in narrow feature cavities 110 after partial filling have an adjusted aspect ratio less than one. In some embodiments, substantially no accelerator becomes attached to substrate 104 during narrow-feature metal deposition.

FIG. 7 depicts schematically cross-sectional view 180 of substrate wafer portion 104 after metal plating during a narrow-feature metal deposition in accordance with the invention has continued until narrow feature cavities 110 have been completely filled and deposited metal has formed metal narrow-feature protrusions 182 in narrow-feature region 120 above narrow feature cavities 110. In contrast, deposited metal portion 184 in field region 124 has a relatively thin thickness, and deposited metal portion 185 only partially fills wide feature cavity 112.

FIG. 8 depicts schematically cross-sectional view 186 of substrate wafer portion 104 after metal plating during a narrow-feature metal deposition in accordance with the invention has continued further until deposited metal has formed metal narrow-feature protrusion 187 in narrow-feature region 120 above completely-filled narrow feature cavities 110. In contrast, deposited metal portion 188 in field region 124 has a relatively thin thickness, and deposited metal portion 189 only partially fills wide feature cavity 112 in wide-feature region 122. For purposes of clarity and ease of explanation, the relative height of metal protrusion 187 above the height of field metal portion 188 is depicted as being somewhat greater (approximately two to three times greater) than is typically generated during actual fabrication in accordance with the invention.

The height of the protrusion formed over a narrow feature (e.g., a HAR feature) is dependant on a number of factors, including geometric parameters, such as the initial feature width, feature aspect ratio, and feature density. Generally, the height of the protrusion is greater for features with higher aspect ratios and higher feature densities. Hence, varying protrusion heights are typically observed when comparing array regions having feature sizes of varying aspect ratio (e.g., aspect ratios in a range of from 1 to 3). The height of a protrusion is also dependent on the amount of accelerator initially within and on the feature walls (accelerator-pretreated surface), and/or on the accelerator concentration in a plating bath. Furthermore, the current density used in the narrow-feature filling step, and the plating bath constituents and composition (e.g., acid concentration; metal concentration; suppressor concentration, molecular weight and composition; leveler concentration and type/formulation; and chloride concentration) also influence the protrusion height, and are balanced with the goal of void-free filling. In embodiments in which chemical and geometric parameters are fixed to obtain good feature filling, other process parameters are selected to influence the protrusion height; such as, the applied current/potential, the current versus time profile, rotation rate (which influences leveler diffusion to the surface, thereby hindering protrusion growth), and the duration of the plating operation (overall plating charge).

As depicted FIGS. 6, 7 and 8, a narrow-feature metal deposition in accordance with the invention tends to result in substantial filling of high-aspect-ratio feature cavities (FIG. 6) or in complete filling of high-aspect-ratio feature cavities and formation of a metal protrusion above high-aspect-ratio features (FIGS. 7, 8). In contrast, a low-aspect-ratio feature cavity remains substantially un-filled during a narrow-feature metal deposition. If the narrow-feature filling were continued, the thickness of the metal at the base of the LAR feature would eventually exceed the original depth of the cavity, reaching and/or exceeding the plane of dielectric field 114, but the thickness of metal in the LAR feature relative to the new field height would not change significantly (i.e., a recess in the deposited metal would result). While not shown, in some cases, such an operation is desired and the process of filling high aspect ratio features is continued to this greater metal thickness without departing from the fundamentals of the invention. Generally, a wide feature cavity in this specification has an adjusted aspect ratio less than one upon completion of a narrow-feature metal deposition in accordance with the invention.

Figure 9:
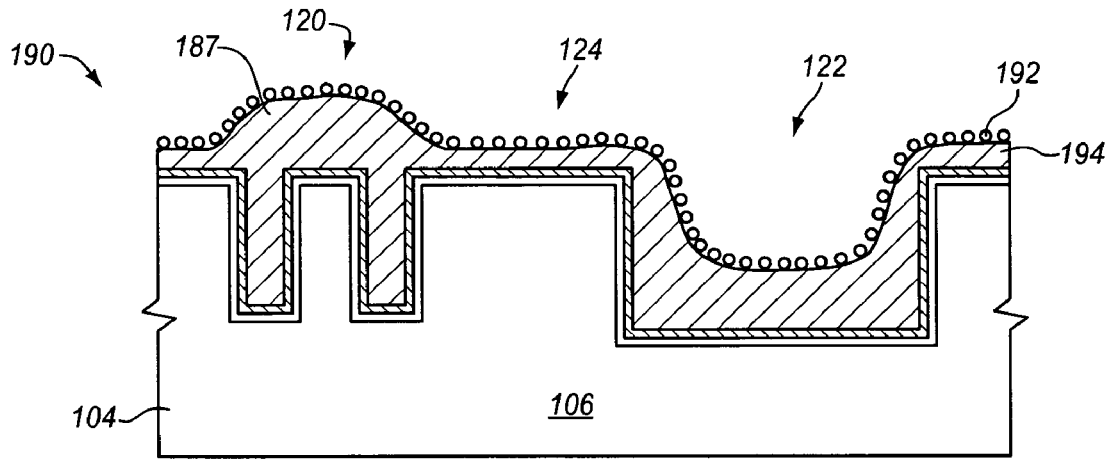
FIG. 9 depicts schematically a cross-sectional view of the substrate wafer portion of FIG. 8 after metal-deposition accelerator (represented by spheres) has attached substantially uniformly to the substrate surface, the accelerator being attached to the deposited metal in the narrow-feature, wide-feature and field regions.

FIG. 9 depicts schematically cross-sectional view 190 of substrate wafer portion 104 after accelerator 192 (represented by spheres 192) has attached substantially uniformly to the substrate surface, the accelerator being attached to the deposited metal in narrow-feature region 120, wide-feature region 122 and field region 124. In some embodiments, processes of causing accelerator 192 to become attached to deposited metal 194 at the surface of substrate 736 include contacting the substrate surface with a liquid solution containing accelerator such as 3-mercapto-1-propane sulfonic acid, MPSA, or 2-mercaptoethane sulfonic acid, MESA. In other embodiments, accelerator species 192 become attached to substrate surface through electrochemical activation or vapor phase deposition, as described in U.S. patent application Ser. No. 10/739,822, filed Dec. 17, 2003, by Mayer et al., having the title "Method for Planar Electroplating", which is incorporated by reference. In some embodiments, exposing substrate 104, including wide-feature region 122, to a deposition accelerator is performed without simultaneously depositing metal.

Figure 10:
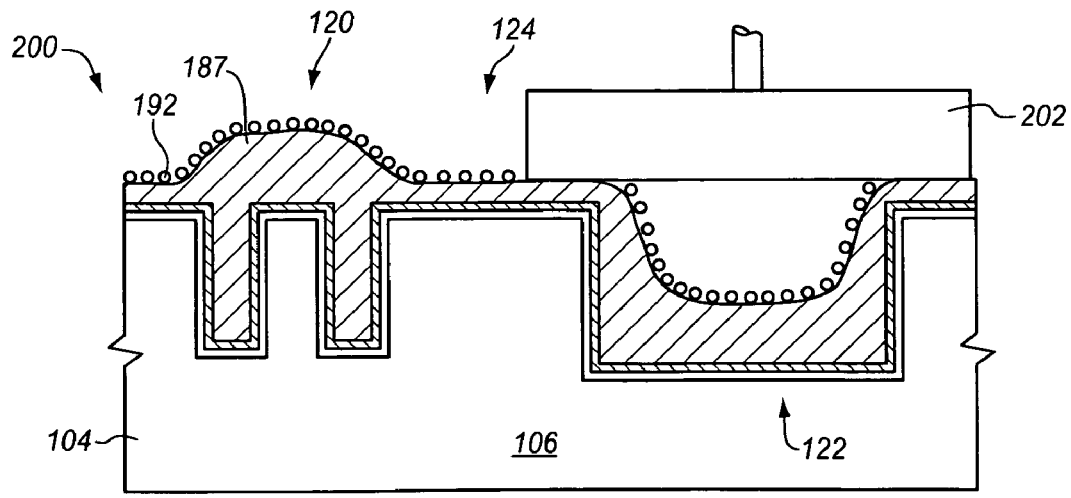
FIG. 10 depicts schematically a cross-sectional view of the substrate wafer portion of FIG. 9 during processes of selectively removing metal-deposition accelerator from exposed surfaces of the substrate, including substantially removing accelerator from the narrow-feature region and field regions, but not removing the deposition accelerator substantially from the wide-feature region.

FIG. 10 depicts schematically cross-sectional view 200 of substrate wafer portion 104 during processes of selectively removing accelerator 192 from exposed surfaces of substrate 736, including substantially removing accelerator 192 from narrow-feature region 120 and field region 124, but not removing accelerator substantially from wide-feature region 122. Typically, accelerator 192 is selectively removed using a rubbing pad 202 having appropriately engineered compliance. In some embodiments, causing accelerator to become attached selectively to wide-feature region 122 relative to field region 124 is performed without simultaneously depositing metal in wide-feature region 122.

Figure 11:
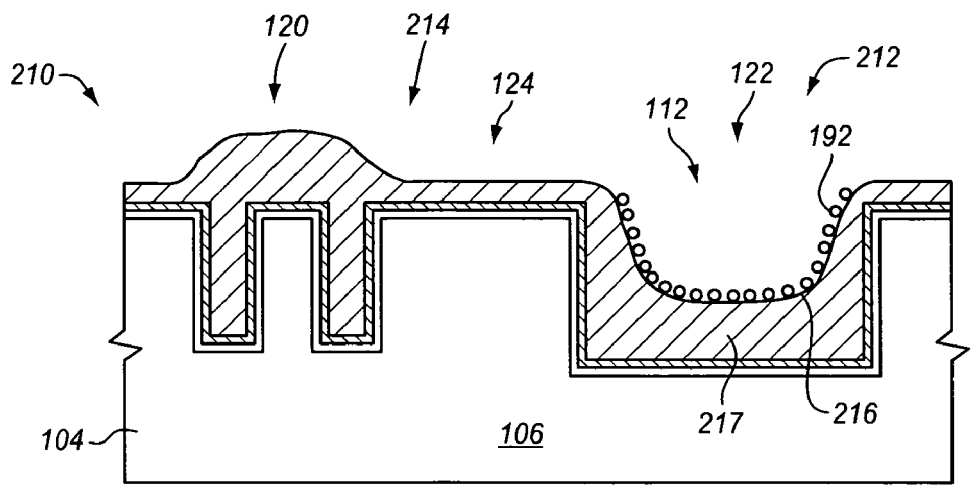
FIG. 11 depicts schematically a cross-sectional view of the substrate wafer portion of FIG. 10 after accelerator has been selectively removed from the narrow-feature region and field region.

FIG. 11 depicts schematically cross-sectional view 210 of substrate wafer portion 104 after accelerator has been selectively removed from narrow-feature region 120 and field region 124. As a result, metal-deposition accelerator 192 is selectively attached in an acceleration region 212, which includes wide-feature region 122, and relatively little or no accelerator is present in non-acceleration region 214, which comprises narrow-feature region 120 and field region 124. Accelerator attached to surface 216 of deposited metal portion 217 in wide feature cavity 112 serves to increase a rate of metal deposition in acceleration region 212 relative to a rate of metal deposition in non-acceleration region 214.

Figure 12:
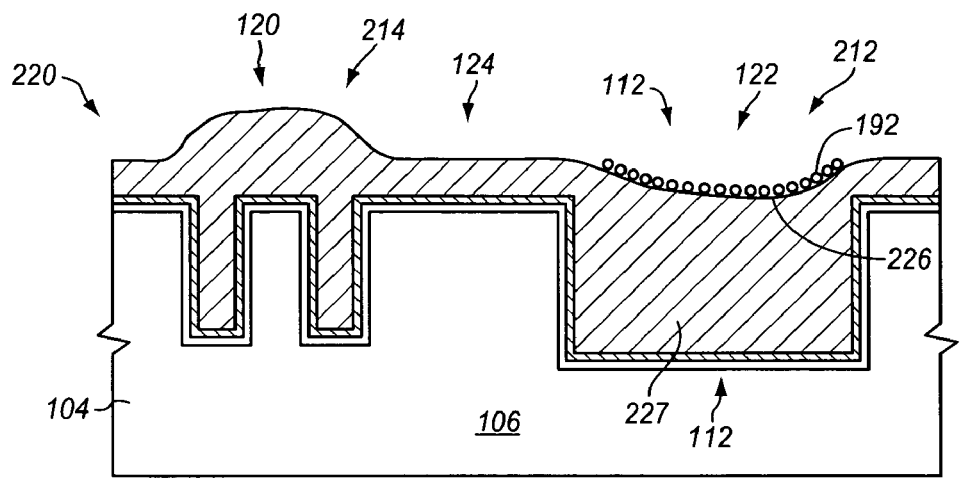
FIG. 12 depicts schematically a cross-sectional view of the substrate wafer portion of FIG. 11 after metal plating during a wide-feature metal deposition in accordance with the invention has substantially filled the wide feature cavity in the wide-feature region.

FIG. 12 depicts schematically cross-sectional view 220 of substrate wafer portion 104 after metal plating during a wide-feature metal deposition in accordance with the invention has substantially filled wide feature cavity 112 in wide-feature region 122. Accelerator attached to surface 226 of deposited metal portion 227 in acceleration region 212 increased the rate of metal deposition in acceleration region 212 relative to the rate of metal deposition in non-acceleration region 214. As a result, more metal deposited in wide-feature region 112 than in narrow-feature region 120 and field region 124. Thus, even though some metal deposition occurred in narrow-feature region 120 and field region 124 causing an increase in the thickness of deposited metal in narrow-feature region 120 and field region 124, the current density and the increase in the thickness of deposited metal in wide-feature region 122 was greater. Although the surface area of metal in wide-feature region 122 decreased to some degree, and concentration of accelerator occurred at the corners of the feature, causing a slight increase in the surface concentration of accelerator 192 in the corners of wide-feature region 112, the increase does not effect the feature filling as a whole and the increase in feature-filling rate is much less pronounced than when HAR (narrow) features fill. In some embodiments, substantially no accelerator becomes attached to substrate 104 during wide-feature metal deposition.

Figure 13:
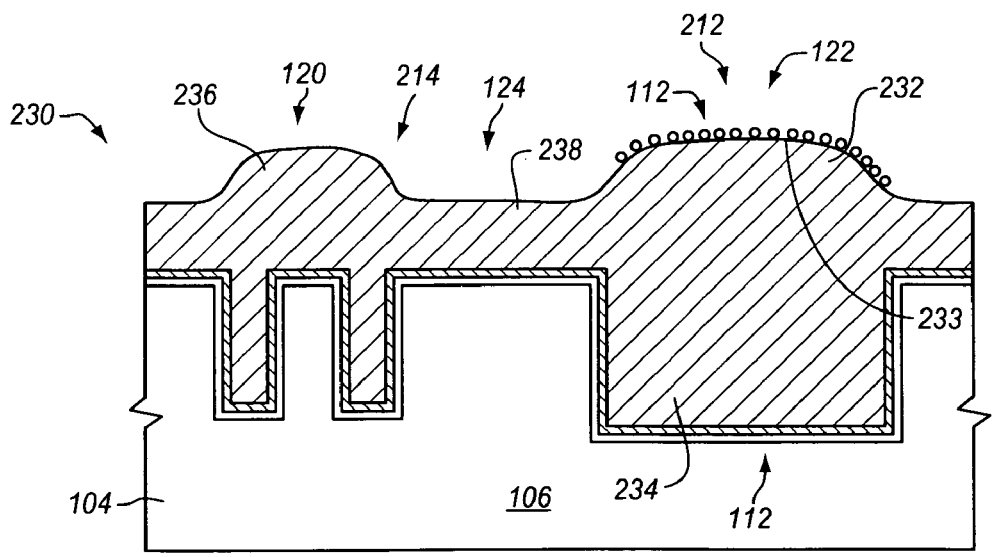
FIG. 13 depicts schematically a cross-sectional view of the substrate wafer portion of FIG. 12 after metal plating during a wide-feature metal deposition in accordance with the invention has continued further until deposited metal has formed a metal protrusion in the wide-feature region above the completely-filled wide feature cavity.

FIG. 13 depicts schematically cross-sectional view 230 of substrate wafer portion 104 after metal plating during a wide-feature metal deposition in accordance with the invention has continued further until deposited metal has formed metal wide-feature protrusion 232 in wide-feature region 122 above completely-filled wide feature cavity 112. Some compositions of plating solutions useful for performing a wide-feature metal deposition have been described in U.S. patent application Ser. No. 10/739,822, filed Dec. 17, 2003, by Mayer et al., which is incorporated by reference. Accelerator attached to surface 233 of deposited metal portion 234 in acceleration region 212 increases the rate of metal deposition in acceleration region 212 relative to the rate of metal deposition in non-acceleration region 214. As a result, more metal deposits in wide-feature region 112 than in narrow-feature region 120 and field region 124. The higher the plating contrast, the less metal deposits in field region 124 and over narrow-feature cavities 110 compared to wide-feature region 122. Thus, even though FIG. 12 depicts some metal deposition in narrow-feature region 120 and field region 124 causing an increase in the thickness of deposited metal in narrow-feature region 120 and field region 124, the increase in the thickness of deposited metal in wide-feature region 122 was much greater. Also, the surface area of metal in wide-feature region 122 increased as metal protrusion 232 formed (particular at the edges of protrusion 232), thereby slightly decreasing the surface concentration of accelerator 192 in wide-feature region 112 (primarily at the protruded features edge). In embodiments in accordance with the invention, the wide-feature filling in wide-feature metal deposition processes generally is continued at least to a point at which the Wide (e.g., LAR) feature is planar with the height of field metal portion 238 in field region 124. Typically, wide-feature metal deposition processes are continued until the protrusion height of metal in both narrow-feature region 120 and wide-feature region 122 is at least slightly greater than the height of field metal portion 238 in field region 124. The resulting intermediate structure depicted in FIG. 13 is designated in this specification as "embossed" because typically the topography characteristically comprises topographic features in raised relief (protrusions 232, 236) above filled feature cavities, and because typically the topography of deposited metal characteristically is lowest in field regions, and because the topography of deposited metal typically comprises substantially no recessed features (except for relatively thinly deposited metal in field regions). In some embodiments, LAR filling in wide-feature metal deposition processes is continued until metal protrusion 232 in wide-feature region 112 and metal protrusion 236 in narrow-feature region 110 have approximately the same protrusion height.

Figure 14:
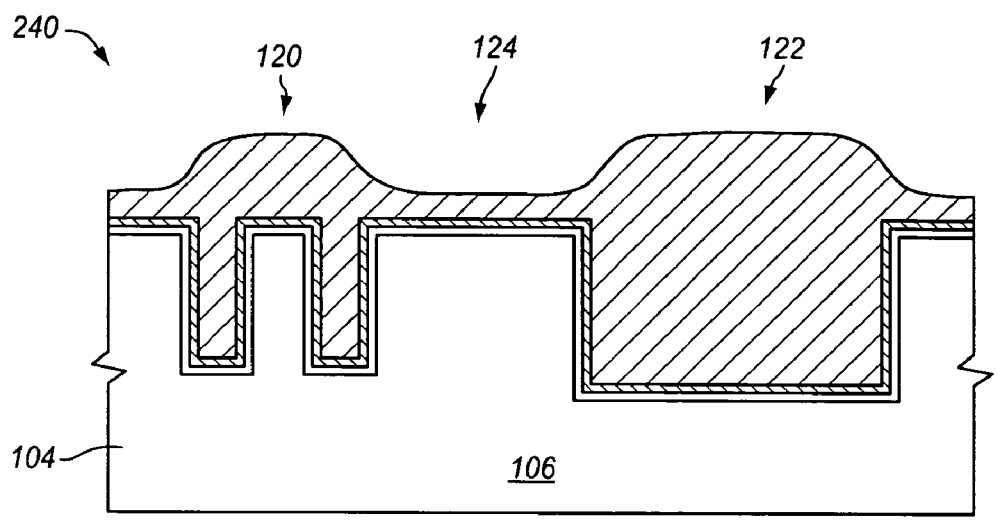
FIG. 14 depicts schematically a cross-sectional view of the substrate wafer portion of FIG. 13 after some deposited metal has been removed isotropically from the substrate, resulting in a substantially uniform decrease in metal height in the narrow-feature region, wide-feature region and field regions.

FIG. 14 depicts schematically cross-sectional view 240 of substrate wafer portion 104 after some deposited overburden metal has been removed from substrate 104, usually at a substantially uniform rate (at least initially) in regions 120, 122, and 124 of substrate 104, and preferably isotropically, resulting in a substantially uniform decrease in metal thickness or height in narrow-feature region 120, wide-feature region 122 and field region 124. Typically, substantially uniform removal of metal from the various regions of the substrate surface is achieved using a chemical wet etching technique. Preferred metal removal processes do not cause a substantial increase in the surface roughness or attack metal grain structure. For example, U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions useful for surface-reaction-kinetics-controlled isotropic wet etching of copper from a substrate surface in accordance with the invention. Modification of the etch formulation (ratio of complexing agent concentration to oxidizing agent concentration and pH), enables modulation of the etching behavior, as well as a high rate of isotropic removal without grain specific attack or substantial increases in roughness.

Figure 15:
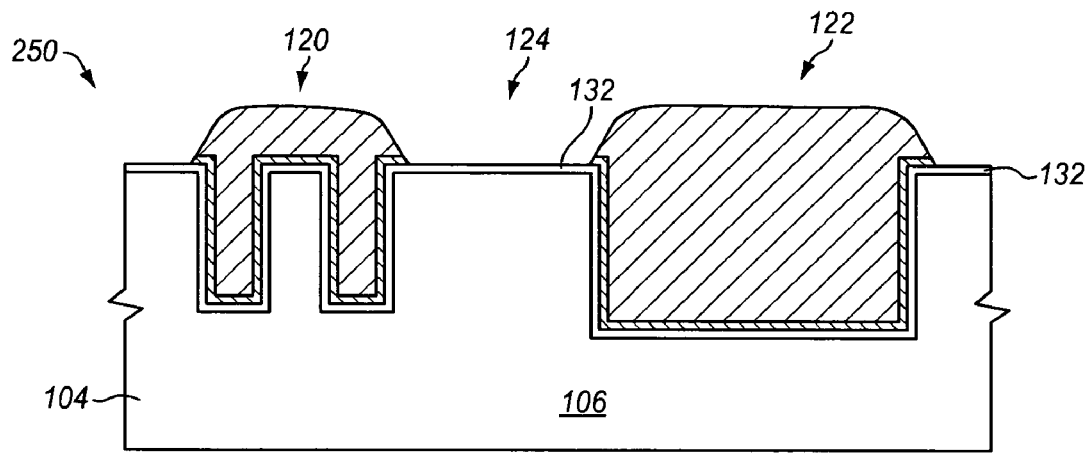
FIG. 15 depicts schematically a cross-sectional view of the substrate wafer portion of FIG. 14 after continued isotropic removal of deposited metal from the substrate, resulting in substantially complete removal of deposited metal from the field region.

FIG. 15 depicts schematically cross-sectional view 250 of substrate wafer portion 104 after continued removal of deposited overburden metal from substrate 104, resulting in substantially complete removal of deposited metal from field region 114. Typically, though not required, processes for removing deposited metal in accordance with the invention from a substrate wafer are selective to deposited metal relative to barrier material. FIG. 15 depicts substantially complete metal removal in the field with substantially no etching of the barrier. In some instances, it is desirable to maintain the barrier layer intact at this stage of the process; for example, to protect the dielectric from ion contamination and resulting necessary cleaning. In a preferred technique for removing metal removal and leaving the barrier intact, the etch is designed to be selective for interconnect metal versus barrier metal (larger relative etching rates). U.S. patent application Ser. No. 10/690,084, filed Oct. 20, 2003, by Koos et al., teaches an etching solution formulation suitable for achieving this objective. Alternatively, etching is stopped or otherwise terminated (e.g., by modulation in pH, dilution, chemical quenching, change in temperature) at the point when the barrier 132 is first exposed in field region 124 to avoid barrier removal. In some embodiments in which a single layer functions as both a barrier and a metal seed layer (not shown), processes for removing deposited metal do not substantially remove or affect the barrier/seed layer. In other embodiments in which a single layer functions as both a barrier and a metal seed layer (not shown), processes for removing deposited metal substantially remove the barrier/seed layer and stop at underlying dielectric base layer 106.

Figure 16:
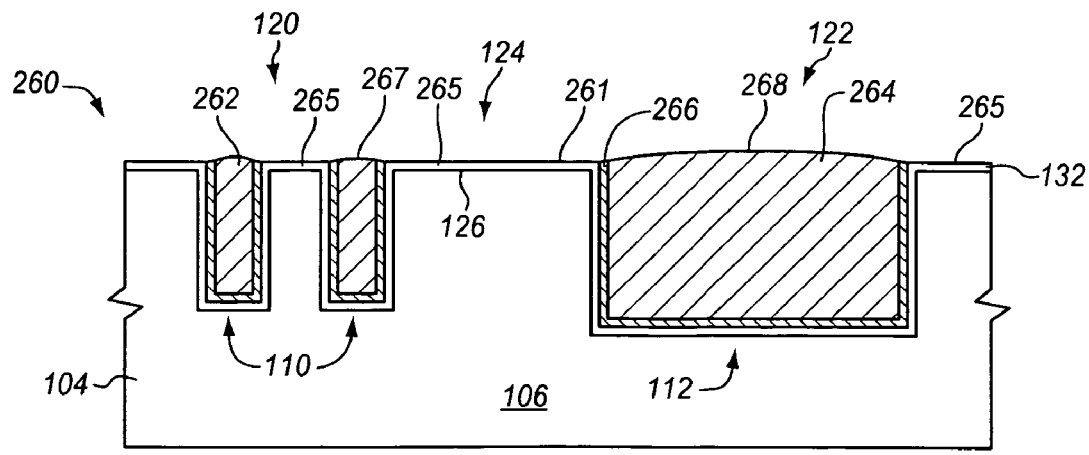
FIG. 16 depicts schematically a cross-sectional view of the substrate wafer portion of FIG. 15 after continued isotropic removal of deposited metal from the substrate, resulting in removal of deposited metal from the narrow-feature region and the wide-feature region down approximately to the barrier-layer height defined by the top surface of the barrier layer.

FIG. 16 depicts schematically cross-sectional view 260 of substrate wafer portion 104 after continued removal of deposited overburden metal from substrate 104, resulting in removal of deposited metal from narrow-feature region 120 and wide-feature region 124 down approximately to the barrier-layer height defined by top surface 261 of barrier layer 132, or alternatively to the dielectric-layer field height defined by top surface 126 of base layer 106.

In some embodiments, one or more local areas of the substrate surface appear in cross-section as depicted in FIG. 15, while other local areas appear as depicted in FIG. 16. Generally, however, only one type of topography is preferred, and techniques of controlled localized wet etching to achieve this result are described below with reference to FIGS. 44-57. In some embodiments, isotropic metal removal is continued beyond the point of first clearing all the metal from fields locally (FIG. 15) because other local areas of the surface have not obtained the degree of metal removal shown in FIG. 15, or because further reduction of protrusion height is desired.

In some preferred embodiments, a small bulge of metal remains above one or more of filled narrow feature cavities 110 and filled wide feature cavity 112. In some embodiments, it is not necessary to remove deposited metal completely from field region 124 or to make filled metal features 262, 264 absolutely planar at this stage of fabrication because typically later steps serve to remove field metal and barrier 132 and to planarize the substrate surface. Examples of some suitable techniques include chemical mechanical polishing, electropolishing, electrochemical mechanical polishing (eCMP), and membrane-mediated electrochemical polishing (MMEP). Nevertheless, it is usually desirable to create a surface structure at this stage of fabrication that has a substantially uniform, relatively small amount of metal over the field and a substantially equal thickness of embossing over the entire substrate (wafer) for given type, size, density and aspect ratio of feature cavities. While FIGS. 13-16 show narrow-feature region 120 and wide-feature region 122 with substantially the same protrusion (embossment) height, in some embodiments, it is desirable to deposit metal in the wide-feature region with either a larger or smaller protrusion (embossment) height than in the narrow-feature region, depending on subsequent processing techniques and other factors (such as any tendency for dishing and erosion). Adjustments of the general narrow-feature protrusion height relative to the field (as well the local heights of protrusions above particular types of various HAR features) are typically achieved by modifying process conditions of the narrow-feature-filling metal deposition step, such as the plating bath composition, plating current and plating time. For example, generally higher bath leveler concentration tends to reduce narrow-feature (e.g., HAR) protrusion heights, higher accelerator concentration (at low concentrations) increases or (at higher concentrations) decreases protrusion heights, and lower currents tend to increase protrusion heights. Similarly, modifying the conditions that influence plating-rate contrast ratio during the wide-feature metal deposition plating step and altering the total wide-feature deposition plating charge and time modifies the protrusion (embossment) heights above wide-feature cavities (e.g., LAR features) relative to the field.

Figure 17:
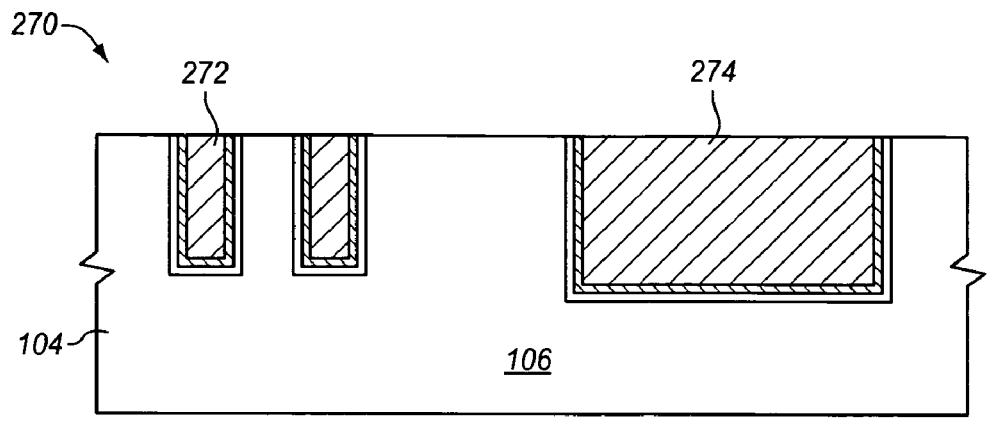
FIG. 17 depicts schematically a cross-sectional view of the substrate wafer portion of FIG. 16 after removal of the barrier layer from the substrate surface and planarization of the substrate surface to form small metal structures and a large metal structure embedded in the dielectric base layer in accordance with the invention.

In some embodiments in accordance with the invention, a substrate 104 as depicted in FIG. 16 is planarized to form small metal structures 272 and large metal structure 274 embedded in dielectric base layer 106, as depicted in FIG. 17. Planarization of the substrate surface at this stage of fabrication typically involves removing barrier material, metal seed material, and deposited metal. As indicated in FIGS. 16 and 17, planarization includes removal of exposed barrier material 265 of barrier layer 132 from field region 124 and from other exposed surface areas of substrate 104. Planarization also typically includes removal of a small amount of metal seed material 266 (FIG. 16) located at the substrate surface, as well as a small amount of deposited metal located at the surfaces 267, 268 (FIG. 16) of filled metal features 262, 264, respectively. While not explicitly shown, in some embodiments, some dielectric material is also removed in the planarization process and the thickness of the lines reduced. However, one clear advantage that the present invention has over conventional processes is a reduction in feature dishing and a reduction in erosion and loss of dielectric and line metal to achieve a planarized surface. The resulting deeper lines of a given width reduce line resistance and increase communication speed. Similarly, since less dielectric material is removed, the capacitance between the lines is smaller. This is particularly true for bi-layered dielectric structures (a high-K "capping" dielectric material over a low-K base). The better control and reduced variation in the amount of high dielectric material removed in barrier removal and planarization steps allows use of a thinner high-K dielectric capping layer and thereby results in a lower net K value in the environment of the metal line. Therefore, a smaller net line time constant and more rapid transmission of information are achieved.

FIG. 17 depicts schematically cross-sectional view 270 of substrate wafer portion 104 after planarization of the embossed metal and removal of barrier layer 132 (FIG. 16) from the substrate surface and planarization of the substrate surface to form small metal structures 272 and large metal structure 274 embedded in dielectric base layer 106, in accordance with the invention.

Alternatively, in some embodiments in accordance with the invention, selective removal of metal from narrow-feature region 120 and wide-feature region 122 is continued to form a small recess (empty space) in feature cavities 110, 112 before barrier material is removed from field region 124 and other upper surfaces of dielectric base layer 106. Formation of such recesses is useful for forming improved metal capping layer structures to cap embedded metal features. Co-owned and co-pending U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions for forming recesses in features and for forming improved capping layers of embedded metal features. For example, an intact barrier layer is advantageous when utilizing processes such as described in U.S. patent application Ser. No. 11/251,353, filed Oct. 15, 2005, by Reid et al., entitled "Capping Before Barrier Removal IC Fabrication Method", which is hereby incorporated by reference in its entirety for all purposes.

Figure 18:
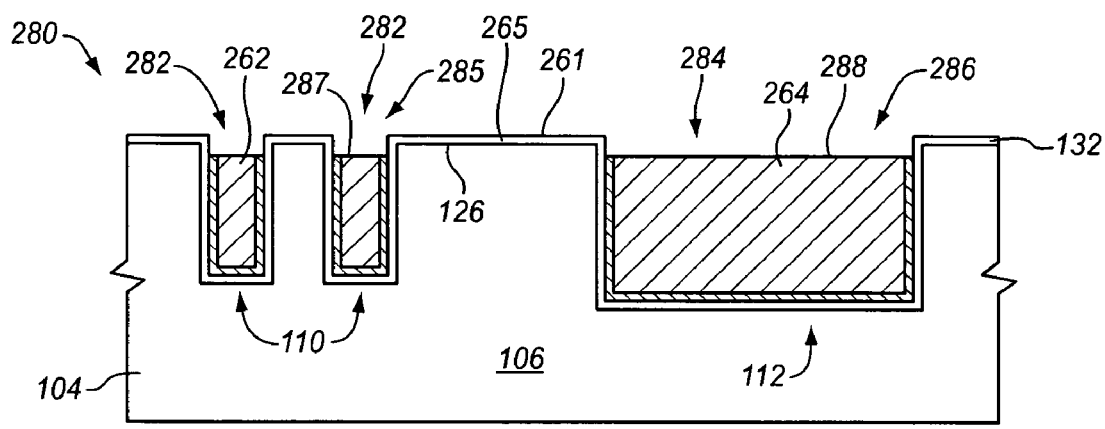
FIG. 18 depicts schematically a cross-sectional view of the substrate wafer portion of FIG. 16 after removal of a relatively small amount of deposited metal and metal seed material from the top of the filled metal features, resulting in formation of recesses at the tops of the narrow and wide features.

FIG. 18 depicts schematically cross-sectional view 280 of substrate wafer portion 104 after removal of a relatively small amount of deposited metal and metal seed material from the top of filled metal features 262, 264, resulting in formation of recesses 282, 284 at the tops 285, 286 of narrow and wide features 110, 112, respectively. Typically, metal removal to form recesses 282, 284 is conducted so that the top surfaces 287, 288 of deposited metal 262, 264, respectively, are lower than the top layer 261 of barrier layer 132, or alternatively, lower than the dielectric-layer field height defined by top surface 126 of base layer 106, as depicted in FIG. 18. Typically, recesses 282, 284 are formed by performing or continuing a selective isotropic wet etching mentioned above. An exemplary recess depth comprises about 130 Å below the dielectric field height 126. The amount of recess is typically in a range of about from 100 Å to 700 Å deep. An exemplary recess comprises a depth about 130 Å below the dielectric field height 126.

In other embodiments, the interconnect metal in field 124 is first removed and made coplanar with the barrier by a planarization technique that is selective for copper (or other metal) but does not remove the barrier (not shown, but similar to the result depicted in FIG. 16). Examples of suitable processes for this step include abrasive-free chemical mechanical polishing or membrane-mediated electropolishing. Then, the co-planar surface is etched to create recessed features as shown in FIG. 18.

Figure 19:
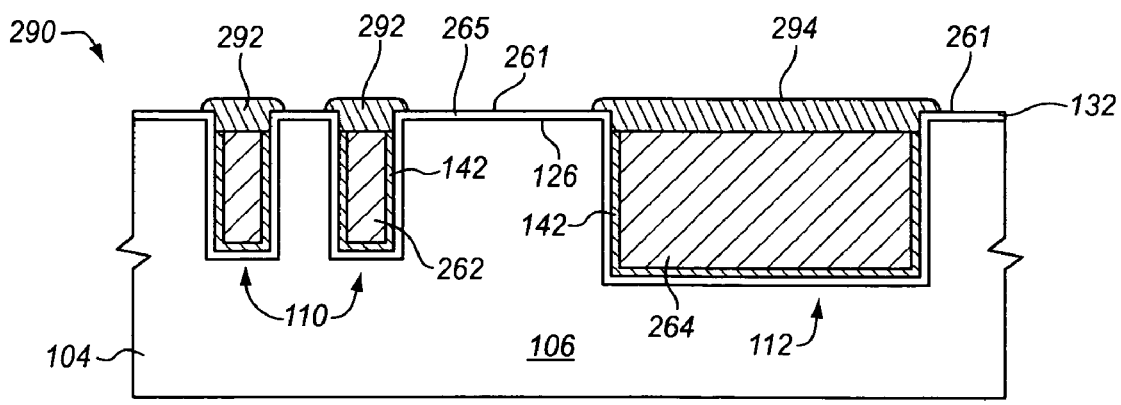
FIG. 19 depicts schematically a cross-sectional view of the substrate wafer portion of FIG. 18 after metal capping material has been formed in accordance with the invention to fill the recesses above metal features.

FIG. 19 depicts schematically cross-sectional view 290 of substrate wafer portion 104 after metal capping material 292, 294 has been formed in accordance with the invention to fill recesses 282, 284 (FIG. 18) above metal features 262, 264, which include portions of metal seed layer 142 lining the inside surfaces of feature cavities 110, 112, respectively. Typically, metal capping material 292, 294 is deposited by electroless deposition and deposited uniformly within the wall of the feature, filling up the cavity created by the wet etch recess step, as depicted in FIG. 19. If the deposition process is allowed to continue upwards and beyond the plane of the confinements of the feature cavity wall, capping material begins to grow more laterally, resulting in some degree of encroachment on surface 261 and resulting in a slight bulge above the top surface 261 of barrier layer 132. While not shown, in some embodiments, the process is stopped before this occurs, and the capping metal remains confined within the feature walls. Alternatively, exposed barrier layer material 265 is removed either before formation of recesses or before or after deposition of metal capping material. The presence of barrier layer portions 265 of barrier layer 132 on the top surfaces 126 of dielectric base layer 106, however, provides an advantage of enhancing nucleation and deposition of metal capping material using electroless techniques while generally maintaining good selectivity for the process. For example, the nucleation and deposition of cobalt capping layer material is improved by the presence of conductive barrier layer material on the top surfaces 126 of dielectric base layer 106, as described in U.S. patent application Ser. No. 11/251,353, by Reid et al., which has been incorporated by reference.

Figure 20:
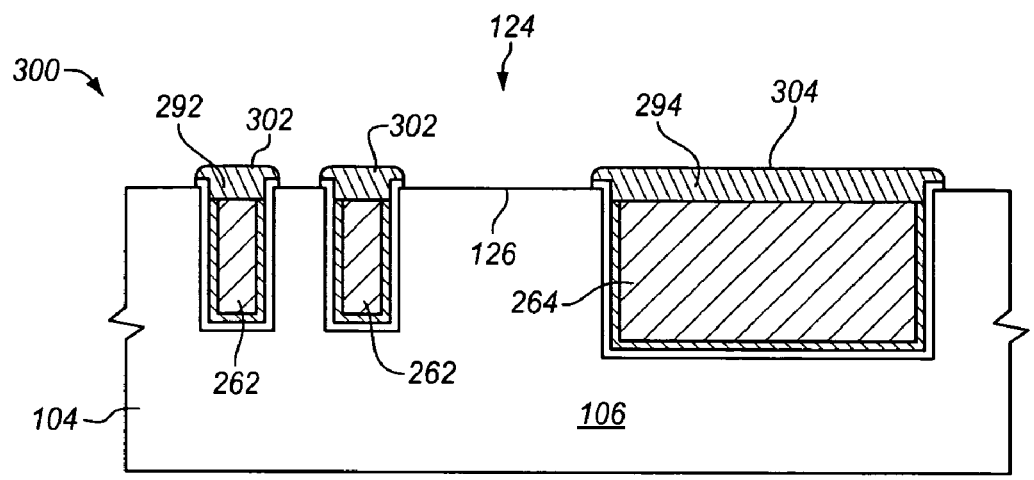
FIG. 20 depicts schematically a cross-sectional view of the substrate wafer portion of FIG. 19 after substantial removal of barrier layer material from the field region and from other exposed surface areas of the substrate.

FIG. 20 depicts schematically cross-sectional view 300 of substrate wafer portion 104 after substantial removal of barrier layer material of barrier layer 132 (FIG. 20) from field region 124 and from other exposed surface areas of substrate 104. It is generally important to remove barrier layer material from field region 124 and other exposed surface areas because the barrier layer material typically is electrically conductive, and its presence in a finished electronic device could cause electrical shorting between conductive lines embedded in the dielectric. In some embodiments, however, in which the barrier layer is not electrically conductive, such a barrier removal step is not required. Various dry or wet techniques are suitable for removing barrier layer material. Preferred etches are selective to removal of barrier material while leaving the capping and interconnect metal unaffected. For example, as described below, a hot concentrated alkaline solution (25% KOH or tetramethlyammonium hydroxide at 70-90° C.) removes tantalum or tantalum nitride but leaves cobalt and nickel (capping material) and copper (interconnect metal) unaffected. Alternatively, a reactive ion etch, such as with $SF_6$ or $BF_4$, is useful to remove a barrier layer. Preferably, the top surfaces 302, 304 of capping layer material 292, 294 are slightly recessed, nearly coplanar with or protrude slightly above the dielectric-layer field height defined by top surface 126 of base layer 106 after removal of the barrier layer material.

Figure 21:
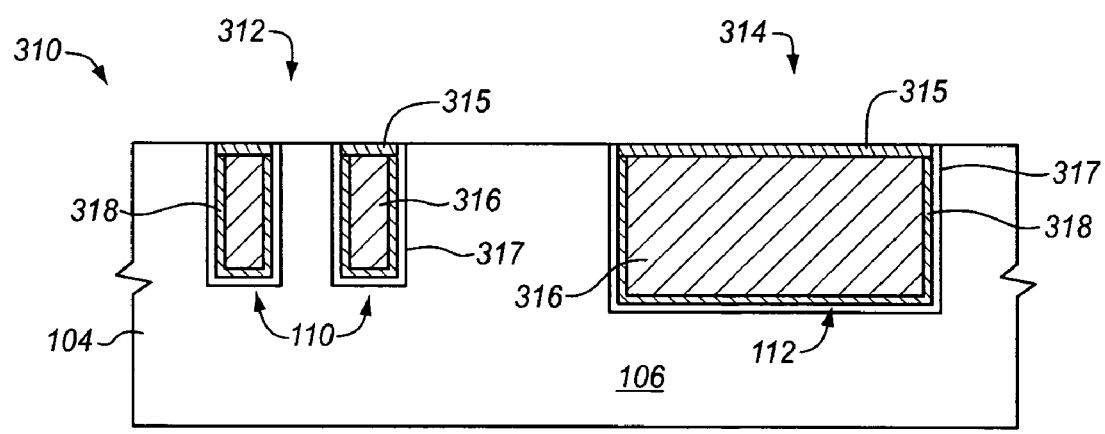
FIG. 21 depicts schematically a cross-sectional view of the substrate wafer portion of FIG. 20 after planarization of the substrate surface to form small metal structures and a large metal structure embedded in the dielectric base layer in accordance with the invention.

FIG. 21 depicts schematically cross-sectional view 310 of substrate wafer portion 104 after planarization of the substrate surface to form small metal structures 312 and large metal structure 314 embedded in dielectric base layer 106, in accordance with the invention. Planarization of the substrate surface at this stage of fabrication typically involves removing relatively small amounts of metal capping layer metal, small amounts of dielectric base-layer material and the barrier layer or remnants of barrier layer material. Planarization typically includes removal of a small amount of metal capping later material from the top surfaces 302, 304 (FIG. 20) of capping layer material 292, 294, respectively, thereby forming capping layers 315. The resulting structure includes embedded small metal features 312 and embedded large metal feature 314, which are embedded in dielectric base layer 106. In some embodiments, embedded metal features 312, 314 in accordance with the invention comprise deposited metal 316, a thin layer of barrier material 317 on the inside walls of feature cavities 110, 112, metal seed layer material 318, and capping layer material 315.

Figure 22:
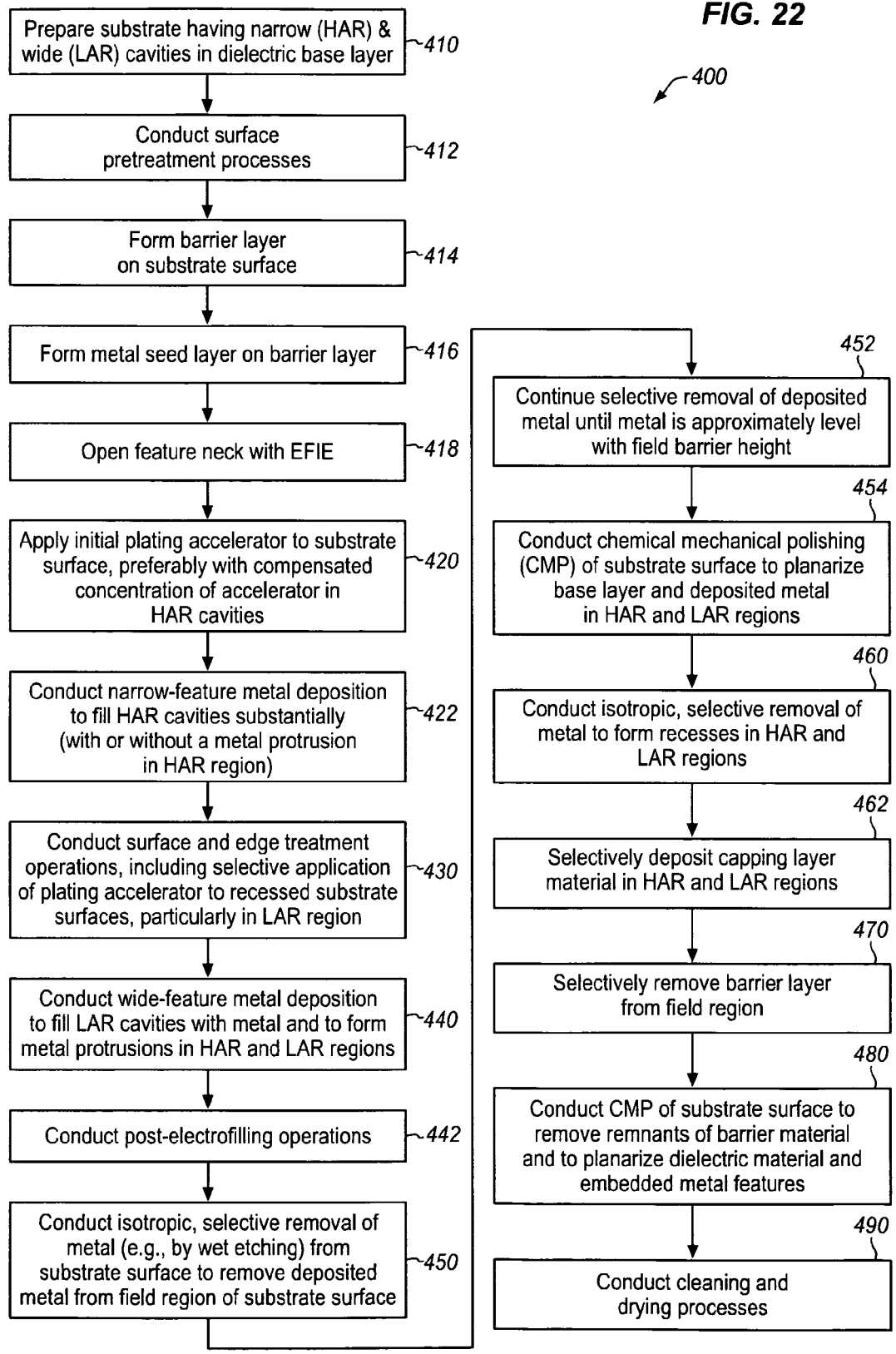
FIG. 22 contains a generalized process flow sheet of a method in accordance with the invention for conducting topography reduction and control by selective accelerator removal (SAR) and selectively accelerated plating (SAP) to fabricate embedded metal structures in an electronic device.

FIG. 22 contains a generalized process flow sheet of a method 400 in accordance with the invention for conducting topography reduction and control by selective accelerator removal (SAR) and selectively accelerated plating (SAP) to fabricate embedded metal structures in a dielectric layer of an electronic device. Method 400 is described herein initially with reference to the diagrams of FIGS. 1-21. Although method 400 is described mainly with reference to electroplating of metal to fill feature cavities, it is understood that a method in accordance with the invention is applicable to other techniques of metal deposition. Also, although method 400 is described herein with reference to steps 410 through 490, it is understood that some methods in accordance with the invention do not include all of the steps of generalized method 400. Furthermore, it is understood that some methods in accordance with the invention include steps that are different from or additional to steps 410 through 490.

With reference to FIG. 1, steps 410 comprise providing a substrate 104 having a narrow (e.g., high-aspect-ratio, "HAR") feature cavity 110 and a wide (e.g., low-aspect-ratio, "LAR") feature cavity 112 in a dielectric base layer 106. As explained above, in this specification, the terms narrow feature and wide feature may refer to features having an aspect ratio greater than one (HAR) and less than one (LAR), respectively. The terms are also used in a relative sense in this specification; that is, when used together in the same context, the term narrow feature may refer to a feature that has an aspect ratio that is larger than the aspect ratio of another feature, referred to as a wide feature. When used in such relative sense, the aspect ratio of the narrow feature may be greater than one and the aspect ratio of the wide feature may be less than one, or both the narrow feature and the wide feature may have an aspect ratio greater than one, or both may have an aspect ratio less than one.

Steps 412 comprise surface pretreatment processes. In some embodiments, surface pretreatment of dielectric base layer 106 using one or more conventional techniques is conducted after patterning and etching of a substrate wafer (e.g., to make feature cavities 110, 112) and before deposition of barrier and seed materials onto substrate 104. For example, typically dielectric base layer 106 having feature cavities 110, 112 is cleaned, rinsed and dried after etching of cavities 110, 112 to remove remnants of etching chemicals and photoresist before formation of a barrier layer or a barrier/seed layer. Another example includes operations to prepare a substrate for electroless or atomic layer deposition of a metal-containing barrier layer or a metal-containing barrier/seed layer. An exemplary preparation of a dielectric surface known in the art includes sensitization with a hot tin chloride, $SnCl_2$, solution (1-10 wt % for about 1 min to 1 hr), followed by surface activation with a palladium chloride, $PdCl_2$, solution (0.05 to 1 g/L, 10 seconds to 1 minute). In some embodiments, pretreatment steps 112 are conducted after formation of a barrier layer on dielectric base layer 106. In some embodiments, pretreatment steps 112 are conducted after formation of a metal seed layer on a barrier layer and before electrofilling steps. An example includes operations to prepare a barrier layer for electroless deposition of a metal-containing seed layer, such as sensitization of a barrier layer with a hot tin chloride, $SnCl_2$, solution followed by surface activation with a palladium chloride, $PdCl_2$, solution. Another example includes annealing of a metal seed layer, of a metal-containing barrier layer, or of a metal barrier/seed layer in a reducing atmosphere (e.g., forming gas at T=200° to 400° C.) to reduce metal oxides before electrochemical or electroless metal deposition. Still another example includes wet reduction of a metal-containing surface. Examples of wet reduction techniques include contacting a substrate surface with a reducing liquid containing a reducing or oxide-removing compound, such as a borane complex (such as dimethylamine borane, DMAB, or morpholine borane), glyoxylic acid, formaldehyde, or hydrogen iodide. Hydrogen iodide is especially useful for reducing a non-cuprous metal oxide, such as a ruthenium oxide in a ruthenium-containing seed layer or barrier/seed layer. Another example of pretreatment processes include pre-wetting of a substrate surface prior to electrochemical or electroless metal plating operations to reduce defects arising from bubble formation and incomplete wetting. Another example of pretreatment processes include application of a chemical accelerator to a substrate surface to enhance bottom-up filling of small, high-aspect-ratio features. Examples of a suitable chemical accelerator include a solution of MPSA or MESA at a concentration in a range of about from 0.01 to 1 g/L. U.S. patent application Ser. No. 10/739,822, filed Dec. 17, 2003, by Mayer et al., having the title "Method for Planar Electroplating", which is incorporated by reference, teaches a method of selectively attaching a plating accelerator to recessed regions of a dielectric layer before electroplating to achieve selectively accelerated plating (SAP) of metal in the recessed regions.

Steps 414 include formation of a barrier layer 132 (FIG. 2). Barrier layer 132 typically comprises a conductive metal or nitride, such as titanium, tungsten or tantalum and their nitrides. Barrier layer 132 commonly is deposited using a PVD or a CVD method known in the art. As feature sizes become smaller, however, in some integrated circuit devices, alternative methods have been developed for forming barrier layer 132, including ALD methods and electroless deposition methods.

Steps 416 include formation of a metal seed layer 142 on substrate 104 to cover barrier layer 132. As depicted in FIG. 3, metal seed layer 142 typically is formed using conformal deposition techniques known in the art, such as CVD or electroless deposition. For example, U.S. Pat. No. 7,041,596, issued May 9, 2006, to Dalton et al., titled "Surface Treatment Using Iodine Plasma To Improve Metal Deposition", which is hereby incorporated by reference, teaches methods of forming a ruthenium thin-film on a substrate using an iodine plasma pretreatment followed by CVD or ALD.

In some embodiments, steps 416 include utilization of a proximity focusing scanning microplater (PFSM) to form metal seed layer 142. A PFSM, also referred to as a proximity focusing scanning electrolytic plating apparatus, is suitable for several useful IC fabrication applications, including metal seed layer deposition.

A PFSM apparatus and methods for using a PFSM apparatus are described in more detail below with reference to FIGS. 58 and 59. A PFSM enables electrolytic plating onto very thin barrier or seed materials (sheet resistance in excess of 200 ohm cm) with high uniformity and is operable to mitigate problems associated with the rapid corrosion possible on a seed layer as well as with variations in processes that occur while trying to wet and to process a large wafer simultaneously. Steps 420 include applying initial plating accelerator 152 to metal seed layer 142 on substrate 104, as depicted in FIG. 4. Initial accelerator 152 serves to increase the plating rate of metal in narrow feature cavities 110 compared to a plating rate of metal in field region 124 and in wide feature cavity 112 during a subsequent narrow-feature metal deposition (discussed below). Suitable accelerator species include MPSA and MESA. U.S. patent application Ser. No. 10/739,822, filed Dec. 17, 2003, by Mayer et al., having the title "Method for Planar Electroplating", which is incorporated by reference, teaches the attaching of a plating accelerator to recessed regions of a dielectric layer before electroplating to achieve selectively accelerated plating (SAP) of metal in the recessed regions. Typically, an accelerator solution is applied globally to a substrate surface through a global application nozzle known in the art, such as a J-hook spray nozzle. Because concentrations of accelerator solution applied to a substrate are relatively dilute (e.g., 1 g/L MPSA in water), a concentrated solution of accelerator typically is diluted with water in a mixing manifold or mixing nozzle on-site just before being sprayed onto a substrate surface. Typically, up to about 200 ml of accelerator solution is used to wet the surface of one substrate wafer for 10 to 15 seconds. In an exemplary application of accelerator to a substrate surface, a solution of 1 g/L MPSA in water is sprayed onto a 200 mm substrate being rotated at 300 rpm at a flow rate of 100 cc/min for 10 seconds, which is followed by rinsing with DI water (300 rpm, 20 seconds) and finally by spin drying (1500 rpm, 25 seconds).

In preferred embodiments, the surface concentration of initial accelerator 152 after being first applied to the substrate surface is a "compensated concentration". A "compensated concentration" serves to compensate for the well-known geometric increase in surface concentration of accelerator in narrow-feature cavities relative to the smaller increase in surface concentration in wide-feature cavities as metal plating proceeds and as the surface concentration of accelerator increases proportionally to the decrease in surface area in a cavity. By using a compensated concentration of an initial accelerator species, the plating of metal in narrow feature cavities is more easily controlled during the narrow-feature metal deposition steps than if the surface concentration of initial accelerator species were uniform.

A technique for achieving a lower initial concentration of initial accelerator in narrow-feature cavities relative to wide-feature cavities and exposed filed areas is to apply a solution containing initial accelerator species to the substrate surface, which accelerator species comprises large-sized molecules relative to the width of opening 154 of narrow-feature cavities 110, but which molecules are relatively small compared to the size of the opening 156 of wide-feature cavity 112, as depicted schematically in FIG. 4. By exposing the substrate surface to initial accelerator molecules for a limited duration, diffusion of initial accelerator molecules into narrow-feature cavities 110 is limited relative to diffusion into wide-feature cavity 112, resulting in a lower initial surface concentration of initial accelerator molecules in narrow feature cavities 110 compared to their surface concentration in the field region 124 and in wide feature cavity 112. For example, using a MPSA concentration of 1 to 10 mg/L for from 1 to 30 seconds can lead to concentrations of adsorbed MPSA that vary with feature aspect ratio. In some cases, a reducing agent is added to the solution of MPSA to mitigate seed layer corrosion. An alternative technique for achieving an initial compensated concentration of initial accelerator in narrow feature cavities relative to a surface concentration in wide-feature cavities and field areas is to apply a liquid containing a limited concentration of initial accelerator species to the substrate surface of substrate 104 so that the liquid fills feature cavities 110, 112. Then, excess liquid is removed from field region 124 and other exposed surfaces of the substrate surface, and optionally the substrate is covered with a thin plastic film. The limited amount of initial accelerator species present in the feature cavities is allowed to reach substantial equilibrium between liquid concentration and surface concentration. Since the amount of liquid and accelerator species per surface area in narrow-feature cavities is less than the amount of liquid and accelerator species per surface area in wide-feature cavities, the equilibrium surface concentration of initial accelerator species in narrow-feature cavities is less than the equilibrium surface concentration in wide-feature cavities. FIG. 5 depicts schematically a cross-sectional view 160 of a substrate portion 104 in which a liquid 162 containing a limited concentration of initial accelerator species represented by spheres 163 is present in feature cavities 110, 112. Excess liquid has been removed from field region 124 and other exposed surfaces of the substrate surface, and a removable thin plastic film 164 covers feature cavities 110, 112. As depicted in FIG. 5, the liquid concentration of initial accelerator in liquid 162 has approached substantial equilibrium with the surface concentration of initial accelerator species at the inside walls and bottom of feature cavities 110, 112. Since the volume-to-surface ratio of a narrow feature cavity is less than the volume-two-surface ratio of a wide feature cavity, the equilibrium surface concentration of initial accelerator in a narrow feature cavity is less than the concentration in a wide feature cavity.

Another alternative in steps 420 for achieving an initial compensated concentration of initial accelerator in narrow feature cavities relative to a surface concentration in field regions and in wide-feature cavities is to attach accelerating species or accelerator precursor species globally to the substrate surface and then utilize a selective electrochemical accelerator removal (SEAR) technique to selectively remove the attached species from field regions and wide-feature cavities, leaving a higher concentration of accelerator in narrow feature cavities. In a SEAR process, the selective removal of the accelerating species is accomplished via an electrochemical operation (e.g., an electrochemical oxidation or reduction) or a process that is facilitated by the formation of chemicals created by an electrochemical process. Electrochemical operations in SEAR techniques appear to be relatively simple to enable and have added benefits of selectivity and control compared with other, non-electrochemical techniques. Global application of accelerator followed by SEAR techniques are described in more detail below with reference to FIGS. 60-62.

Another alternative technique in steps 420 to achieve an initial compensated concentration of initial accelerator in narrow feature cavities relative to a surface concentration in field regions and in wide-feature cavities is to attach accelerating species or accelerator precursor species globally to the substrate surface, and then to utilize diffusion-controlled chemical etching. An etching solution of an exemplary diffusion-controlled chemical etching process contains a necessary etch component at very low concentration (e.g., a very low concentration of oxidizer or metal-complexing agent) so that the process of etching is diffusion-controlled and limited in the intricacies of a HAR feature. It has been observed that accelerator is removed from a surface by various metal etching processes. By removing the metal to which the accelerator is attached in a selective and spatially varying manner, the concentration of accelerator on the surface is selectively controlled. Accelerator that is initially attached to the surface substantially uniformly is removed as metal is removed, specifically, at a substantially higher rate at the field and in relatively open LAR features than within an HAR feature. A relatively low concentration limits the supply of metal etching oxidizer, metal etching complexant, or accelerator complexant so that its diffusion within an HAR feature is rate limiting. In the example of accelerator MPSA on the surface of copper, MPSA is first attached substantially uniformly onto a surface. Then, a copper etching solution containing a combination of one or more of an oxidizer (e.g., hydrogen peroxide, ammonium persulfate, permanganate), a metal complexing agent (when the pH of the etching solution so requires; e.g., ammonia, citrate, glycine, ethylene diamine tetraacetate EDTA) and an accelerator-binding (-complexing) agent (e.g., dissolved copper metal ion) is contacted with the surface. While not bound to any particular theory, the accelerator binding agent appears to limit the kinetics (rate) of the adsorption of accelerator to the surface. Thus, when its supply to the surface is limited within the confines of an HAR feature, the accelerator binding agent causes greater accelerator re-adsorption within the HAR feature than on more exposed surfaces and less net accelerator removal from within the feature. The net result of the selective etch removal step is to leave a gradually increasing concentration of accelerator from the top towards the bottom of a HAR feature, facilitating geometric concentration and highly selective bottom-up filling during subsequent feature-filling operations.

In some embodiments, steps 420 include non-electrochemical methods of selective removal of accelerator. Some embodiments include physically contacting the substrate surface; for example, with a rubbing pad. Other embodiments, like the selective chemical etching method described above, do not include contacting the surface. Another example of a non-contacting method is the use of heat (a very rapid pulse of heat) emanating from a heated "head" that passes quickly over the surface and can alter or decompose an accelerator, or cause the desorption of accelerator, in regions of a raised surface.

Steps 422 include conducting a narrow-feature metal deposition in accordance with the invention to fill substantially narrow feature cavities 110, as depicted in FIG. 6. Typically, steps 422 do not substantially fill wide feature cavity 112, as depicted in FIG. 6. Nevertheless, in some embodiments, steps 422 are continued to fill a wide-cavity feature above the plane of the dielectric field. The consequences of doing so are that more metal needs to be removed subsequently, and the protrusion (embossment) height over the narrow (e.g. HAR)

features tend to be larger. Techniques for preferential filling of high-aspect-ratio (HAR) features are known in the art and several novel ones are described herein. Steps 422 in accordance with the present invention serve to fill substantially narrow (HAR) features 110 with metal, while generally purposely minimizing the deposition of metal in field region 124 and in wide (LAR) feature 112. In some embodiments, steps 422 are continued to form metal protrusions 182, 187, as depicted in FIGS. 7 and 8, respectively. Metal deposited in steps 422 typically comprises copper. Steps 422 for depositing copper or other metal typically include electroplating solutions and deposition techniques similar to those used in the art. Co-owned U.S. Pat. Nos. 6,402,923, 6,793,796, 6,890,416, and 6,946,065 issued to Mayer et al., which are hereby incorporated by reference, teach various aspects of electroplating copper onto integrated circuit substrates. In some embodiments, substantially no accelerator becomes attached to the substrate during narrow-feature metal deposition.

In some embodiments, steps 422 include PFSM (proximity focusing scanning microplating), described below with reference to FIGS. 58 and 59.

Steps 430 include conducting surface and edge treatment (SET) operations. SET operations serve to prepare a substrate wafer in advance of wide-feature metal deposition processes. Steps 430 include applying plating accelerator selectively to recessed areas of substrate surface 104, particularly to wide-feature region 122, which includes substantially unfilled wide-feature cavity 122. Typically, steps 430 include applying accelerator globally to substrate surface 104, as depicted in FIG. 9, and then selectively removing accelerator from raised portions, such as narrow-feature protrusion 187 in narrow-feature region 120, and from field region 124. Examples of suitable techniques useful for exposing the substrate to accelerator include contacting the substrate surface with a phase containing an accelerator species. Suitable phases include liquid, a solution, and a vapor.

Examples of suitable accelerator species include mercapto-group-containing molecules, such as 2-mercaptoethane sulfonic acid (MESA), 3-mercapto-1-propane sulfonic acid (MPSA), 3-mercaptopropionic acid, mercaptopyruvate, 3-mercapto-2-butanol, 2,3 dimercaptopropane sulphonic acid, 1-thioglycerol, salts of these compounds and derivatives of these compounds. 3-mercapto-1-propane sulfonic acid is represented by the chemical formula:

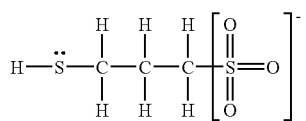

2,3 dimercaptopropane sulphonic acid is represented by the chemical formula below:

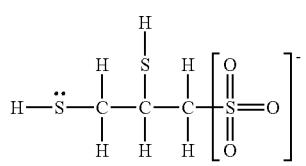

These accelerator species are typically used in aqueous solutions having a concentration in a range of about 1 ppm to 1000 ppm, generally at a pH-value less than about 5. These and similar accelerators have been found to adsorb strongly to a workpiece surface (e.g., copper metal seed layer) upon simple contact by spraying or immersion, but not to interfere substantially with the kinetics of an overall electrochemical charge transfer process, particularly in baths containing suppressors and halides. It is likely that a large number of other accelerator molecules, undisclosed here or yet undiscovered, exist. Preferred accelerators in accordance with this invention adsorb (or otherwise attach) onto a workpiece surface or region; are able to be removed selectively from exposed regions (e.g., using a technique such as rubbing with a pad); are able to increase substantially the metal deposition rate compared to a rate observed without accelerator; and are not significantly incorporated into the deposited metal or otherwise altered during the deposition process (i.e., remain substantially accelerating and "float on the surface" throughout the process).

U.S. patent application Ser. No. 10/739,822, filed Dec. 17, 2003, by Mayer et al., having the title "Method for Planar Electroplating", U.S. patent application Ser. No. 10/824,069, filed Apr. 13, 2004, by Drewery et al., having the title "Selectively Accelerated Plating of Metal Features", and U.S. patent application Ser. No. 10/947,085, filed Sep. 21, 2004, by Mayer et al., having the title "Selectively Accelerated Plating of Metal Features", which are incorporated by reference, teach techniques for electrochemically activating an accelerator precursor to form an accelerator species that attaches to a substrate surface. For example, it has been found that in baths containing dimercaptopropane sulfonic acid (DMPSA) or dimercaptoethane sulfonic acid (DMESA), surface depolarization ("activation") of the accelerator occurs after a sufficiently high current density and/or potential is applied to the workpiece surface. Dimercaptopropane sulfonic acid (DMPSA) is represented by the formula:

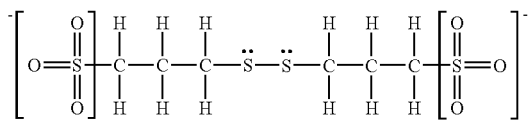

In the literature, dimercaptopropane sulphonic acid (DMPSA) is also sometimes called bis(sodiumsulfopropyl) disulfide (SPS) and 4,5 dithiaoctane-1,8-disulphonic acid. A sufficiently high current/potential applied for a sufficient time substantially reduces polarization, probably through the action of the electrochemical conversion of these compounds to strongly chemically-adsorbing accelerator molecules. This effect remains even after returning to lower current/potentials. While not being bound by any particular theory, this threshold current/potential appears to result in one or more reactions that build up a strongly adsorbed accelerating product. More specifically, it appears that DMPSA (a dimmer of MPSA) is electrochemically reduced to MPSA (and DMESA to MESA), which is the effective accelerating molecule present at the surface. An exemplary accelerator-precursor solution contains DMPSA or DMESA or a salt or derivative of one of these compounds at a concentration in a range of about from 1 to 100 ppm. Negative polarization of the substrate wafer at a voltage greater than about −100 mV vs. copper (reference electrode in the same solution as the plating bath but free of suppressing additives) for a duration greater than about 1 second provides good global attachment of accelerator to a metal-seeded substrate surface.

In some embodiments, selectively removing accelerator from raised areas of region 120 and field areas 124 of substrate 104 is conducted using a rubbing pad, as depicted in FIG. 10. U.S. patent application Ser. No. 10/739,822, filed Dec. 17, 2003, by Mayer et al., having the title "Method for Planar Electroplating", which is incorporated by reference, teaches systems and methods for selectively removing accelerator from a substrate surface using a rubbing pad. In some embodiments, selectively removing accelerator from raised areas of narrow-feature region 120 and exposed field areas 124 of substrate 104 is conducted without substantially touching or abrading the substrate surface. For example, in some embodiments, selectively removing accelerator from raised areas of region 120 and field areas 124 of substrate 104 is conducted using a selective electrochemical accelerator removal (SEAR) technique, which is described in U.S. patent application Ser. No. 11/544,957 filed Oct. 5, 2006, by Mayer et al., which is incorporated by reference, and is also described in more detail below with reference to FIGS. 60-62.

FIG. 11 depicts schematically substrate wafer portion 104 after accelerator has been selectively removed from raised narrow-feature region 120 and from field region 124, so that accelerator 192 is selectively attached in acceleration region 212, which includes wide-feature region 122. In some embodiments, exposing the wide-feature region of the substrate to a deposition accelerator is conducted without simultaneously depositing metal. Also, causing accelerator to become attached selectively to the substrate in the wide-feature region relative to said field region (typically by selectively removing accelerator from the field region) is performed without simultaneously depositing metal in the wide-feature region. Thus, substantially no metal deposition occurs during selective application of accelerator in steps 430.

Steps 430 typically also include other SET operations in addition to selective application of accelerator, as described above. In some embodiments, SET steps 430 include operations conditioning the substrate surface before selective application of accelerator. Some embodiments include cleaning residues from the substrate surface resulting from previous fabrication processes, in particular from the narrow-feature metal deposition steps 422, before selective application of accelerator. Typically, this cleaning is accomplished by rinsing the substrate surface with deionized water (hot water preferred) or by contacting the surface with a conventional cleaning solution and then rinsing with deionized water. In some embodiments, this liquid cleaning or etching is accompanied by physical rubbing of the surface. Some embodiments include deactivation of initial accelerator that is present in narrow-feature regions to avoid excessive over plating in narrow-feature regions during wide-feature metal deposition processes to follow. Some embodiments deactivate initial accelerator by contacting the substrate surface with conventional leveler species, which essentially poison or deactivate accelerator species on the surface. Some embodiments include etching processes prior to selective application of accelerator. Typically, such etching processes comprise isotropic wet etching of exposed metal surfaces to remove a small amount of metal (e.g., about 10 Å to 100 Å). This etching essentially cleans the exposed metal surfaces and removes initial surface-adsorbed accelerator and levelers from the metal surfaces, particularly from metal in narrow-feature region 120. U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions useful for isotropic wet etching of copper from a substrate surface in accordance with the invention, and which are described in more detail below.

Figure 23:
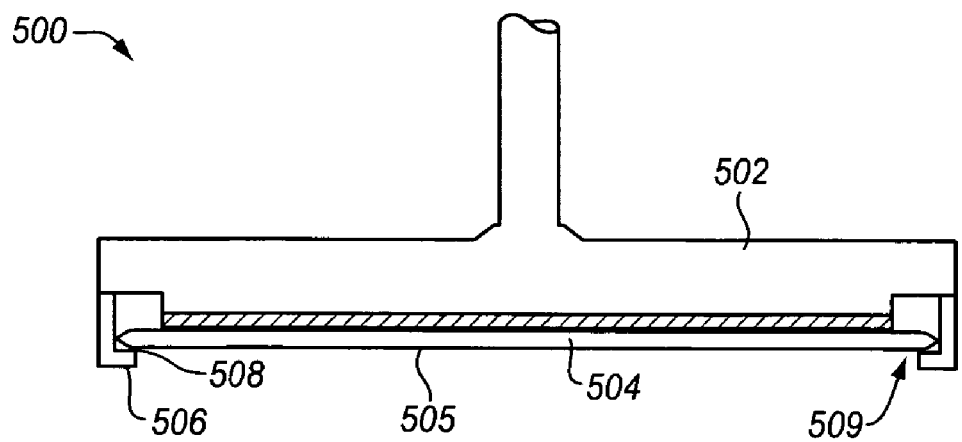
FIG. 23 depicts schematically a cross-sectional view of a clamshell-type wafer holder holding a substrate wafer, wherein the wafer holder comprises a holder lip in physical contact with and covering the outer wafer edge.
Figure 24:
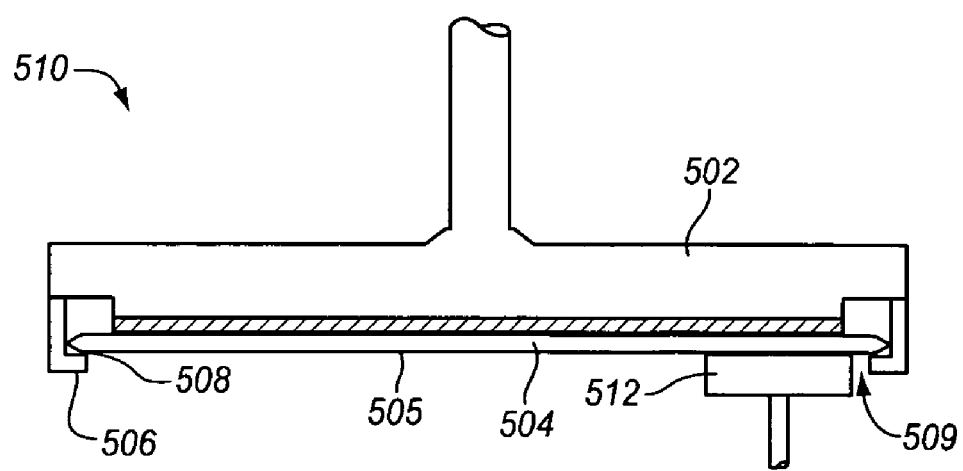
FIG. 24 depicts cross-sectional view in which a rubbing pad for removing accelerator from the substrate face is positioned adjacent to the lip, wherein the rubbing pad typically is not effective in the exposed area adjacent to the lip.
Figure 25:
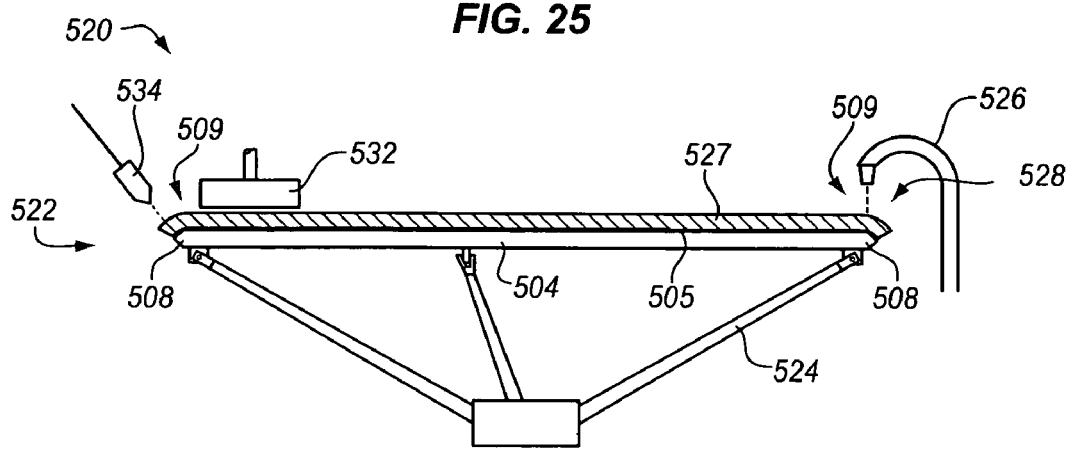
FIG. 25 depicts schematically a cross-sectional view of a system for conducting edge accelerator removal (EAR) operations in accordance with the invention.

In some embodiments, SET operations conducted in steps 430 include edge accelerator removal (EAR) processes after selective application of accelerator to the substrate surface. EAR processes include removal of accelerator from an exposed peripheral area of a substrate surface that is directly adjacent to a wafer holder that encloses all or part of the outer edge of a substrate surface. Removal or deactivation of accelerator in areas of a substrate that will be enclosed by or are directly adjacent to a wafer holder during plating operations is desirable before plating operations begin to avoid excessive and/or uncontrolled plating of metal in such areas. By removing accelerator from these areas, which are not easily accessible to accelerator removal once the wafer is enclosed in the wafer holder, excessive accelerated plating near the interface of the wafer and holder is avoided. In some embodiments, techniques for conducting a wide-feature metal deposition on a substrate surface to which accelerator has been selectively applied include removal or deactivation of accelerator during wide-feature metal deposition processes to slow down or stop metal deposition onto some surfaces, for example raised surfaces. Such processes to slow down accelerated metal deposition include, for example, rubbing the substrate surface with a pad to remove accelerator. Typically, however, such processes to slow down or to stop metal deposition are not effective at areas of a substrate beneath or directly adjacent to wafer-holder hardware in contact with the outer edge of a wafer. For example, it is practically difficult using rubbing techniques to remove accelerator from an area of a substrate within about 1 mm of hardware in contact with a substrate surface. Therefore, if accelerator in such areas were not removed or deactivated prior to placement of the substrate into a wafer holding device before plating operations, plating in such areas could be excessive or uncontrolled. For example, FIG. 23 depicts schematically a cross-sectional view of a clamshell-type wafer holder 502 holding a substrate wafer 504, which has a substrate front side 505. As depicted in FIG. 23, wafer holder 502 comprises a holder lip 506 in physical contact with and covering outer wafer edge 508. Wafer 504 has a narrow exposed adjacent area 509 adjacent to lip 506. FIG. 24 depicts cross-sectional view 510 in which a rubbing pad 512 for removing accelerator from substrate face 505 is positioned adjacent to lip 506. Typically, rubbing pad 512 is not effective in exposed adjacent area 509. FIG. 25 depicts schematically a cross-sectional view 520 of a system 522 for conducting EAR operations. System 522 includes wafer chuck 524 and J-nozzle 526. Wafer chuck 524 is holding a substrate wafer 504 having face-up substrate face 505. As depicted in FIG. 25, accelerator 527 is attached to substrate face 505, either globally or selectively attached. J-nozzle 526 is operable to dispense a controlled stream or spray of liquid at an outer peripheral area 528 of substrate wafer 504 for the purpose of removing or deactivating accelerator 527 in outer peripheral area 528. Outer peripheral area 528 includes outer edge 508 and adjacent area 509. In some embodiments, J-nozzle 526 is used for spraying a liquid etchant onto outer peripheral area 528. This etching essentially removes a thin metal film with attached accelerator from the metal seed surface or plated metal surface in outer peripheral area 528. Systems and methods for edge bevel removal (EBR) of copper from silicon wafers are described in U.S. Pat. No. 6,586,342, issued Jul. 1, 2003. to Mayer et al., and in U.S. Pat. No. 6,309,981, issued Oct. 30, 2001, to Mayer et al., which are hereby incorporated by reference. The systems and methods of EBR are generally adaptable to EAR in accordance with the invention. U.S. patent application Ser.

No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions useful for isotropic etching of copper from a substrate surface in accordance with the invention. In some embodiments, J-nozzle 526 is used for spraying a liquid solution containing leveler additive onto outer peripheral area 528. This leveler essentially poisons or deactivates accelerator on the metal seed surface or on plated metal in outer peripheral area 528. In some embodiments, J-nozzle 526 is used for spraying hot deionized water onto outer peripheral area 528. The hot deionized water essentially desorbs accelerator from the metal seed surface or from plated metal in outer peripheral area 528. An exemplary J-nozzle has a nozzle hole having a diameter of about $10/1000$ inch. A slow, steady stream of hot deionized water dispensed at a rate of about 2 ml to 10 ml in about 10 seconds onto outer peripheral area 528 of a wafer rotating at a speed of about 10 rpm to 20 rpm is sufficient to desorb accelerator from a circular band in outer peripheral area 528 having a width of about 3 mm. Some embodiments of a system 522 in accordance with the invention optionally include a rubbing pad 532 to enhance removal of accelerator from outer peripheral area 528. Some embodiments of a system 522 in accordance with the invention optionally include a rinsing nozzle 534 for rinsing outer peripheral area 528 with deionized water or other fluid.

Figure 26:
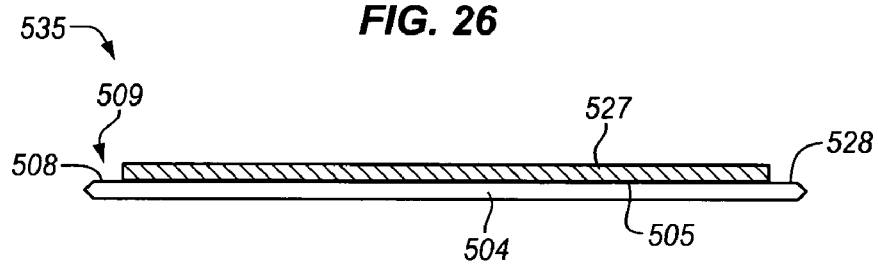
FIG. 26 depicts schematically a substrate wafer after EAR treatment in accordance with the invention.

FIG. 26 depicts schematically a substrate wafer 504 after EAR treatment, as described above with reference to FIG. 25. As depicted in FIG. 26, accelerator 527 has been removed from outer peripheral area 528, which includes outer edge 508 and adjacent area 509 of substrate wafer 504.

Steps 440 include conducting a wide-feature metal deposition in accordance with the invention to fill wide-feature cavities with metal and to form metal protrusions in wide-feature regions. FIG. 12 depicts substrate wafer portion 104 in an intermediate stage of fabrication after metal plating during a wide-feature metal deposition in accordance with the invention has substantially filled wide feature cavity 112 in wide-feature region 122. Accelerator attached to surface 226 of deposited metal portion 227 in acceleration region 212 increased the rate of metal deposition in acceleration region 212 relative to the rate of metal deposition in non-acceleration region 214. As a result, more metal deposited in wide-feature region 112 than in narrow-feature region 120 and field region 124. Thus, even though some metal deposition occurred in narrow-feature region 120 and field region 124 causing an increase in the thickness of deposited metal in narrow-feature region 120 and field region 124, the increase in the thickness of deposited metal in wide-feature region 122 was much greater. In some embodiments, substantially no accelerator becomes attached to the substrate during wide-feature metal deposition of steps 440.

FIG. 13 depicts substrate wafer portion 104 after continued metal plating during a wide-feature metal deposition in accordance with the invention has formed metal protrusion 232 in wide-feature region 122 above completely-filled wide feature cavity 112. Accelerator attached to surface 233 of deposited metal portion 234 in acceleration region 212 increased the rate of metal deposition in acceleration region 212 relative to the rate of metal deposition in non-acceleration region 214. As a result, more metal deposited in wide-feature region 112 than in narrow-feature region 120 and field region 124. Thus, even though some metal deposition occurred in narrow-feature region 120 and field region 124 causing an increase in the thickness of deposited metal in narrow-feature region 120 and field region 124, the increase in the thickness of deposited metal in wide-feature region 122 was greater. In some embodiments in accordance with the invention, wide-feature metal deposition steps 440 are continued at least until the protrusion height of metal in both narrow-feature region 120 and wide-feature region 122 is greater than the height of field metal portion 238 in field region 124. In some embodiments, wide-feature metal deposition steps 440 are continued until metal wide-feature protrusion 232 in wide-feature region 122 and metal narrow-feature protrusion 236 in narrow-feature region 120 have approximately the same protrusion height. In some embodiments, steps 422 are conducted so that bumps and protrusions over differently-sized narrow (e.g., high-aspect-ratio) features are substantially equal in height, and thereafter steps 440 are conducted so that substantially all metal protrusions located on a resulting embossed substrate have substantially the same height. One interesting difference often observed in the filling of low-aspect-ratio ("LAR") features versus high-aspect-ratio ("HAR") features is that LAR features tend to fill at substantially the same rate, independent of the feature size (aspect ratio). It is believed this is because the mechanism of filling is not primarily driven by a surface-area-driven increase in accelerator concentration, but rather by the relatively same amount (concentration) of accelerator that remains on the bottoms and walls of all LAR features after selective removal of accelerator from exposed (field) surfaces. While not bound to any particular theory, the processes of creating selectively higher accelerator concentration within a wide (e.g., LAR) feature does not lead to significant variations in the concentration of accelerator among feature sizes. For LAR features, accelerator concentration does not substantially change during the plating process, hence the observed feature-size-independent plating behavior. In some embodiments, a metal deposition solution used in steps 440 is identical to or similar to a deposition solution used in steps 422. In some embodiments, however, a metal deposition solution used in steps 440 is different from one or more deposition solutions used in steps 422.

Figure 27:
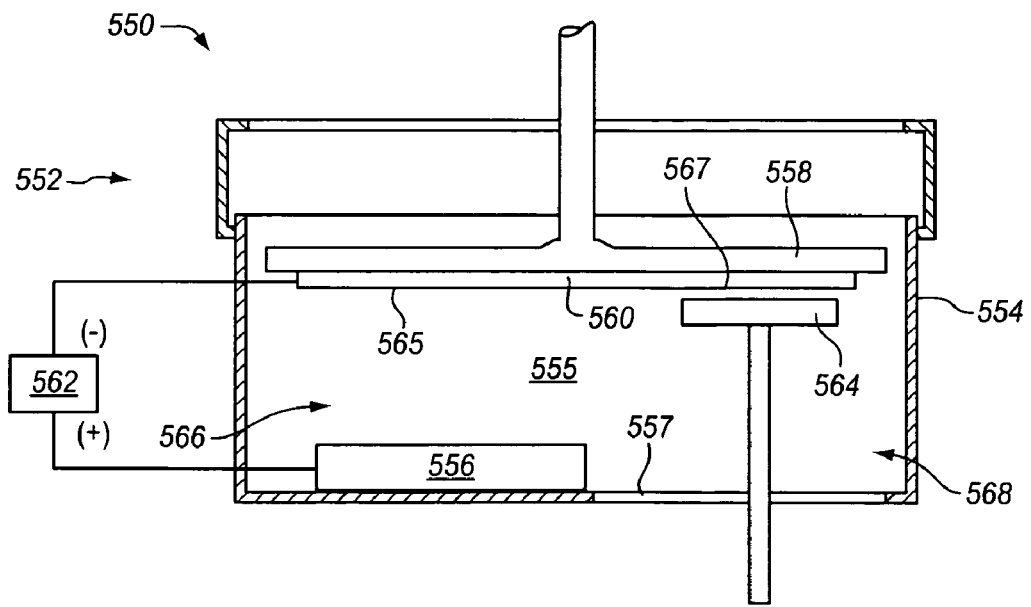
FIG. 27 depicts schematically a cross-sectional view of a generalized apparatus in accordance with the invention for electroplating a first portion of a substrate and for selectively removing accelerator from a second portion of a substrate.

Systems and methods for electroplating metal in damascene processes to fill embedded feature cavities are known in the art. An example of a fabrication tool having a plating cell suitable for electroplating in accordance with the invention is a model SABRE®, which is commercially available from Novellus Systems, Inc. Co-owned U.S. Pat. No. 6,755,954, issued Jun. 29, 2004, to Mayer et al., and U.S. Pat. No. 6,402,923, issued Jun. 11, 2002, to Mayer et al., which are hereby incorporated by reference, teach systems and methods for shaping electric fields in an electroplating bath to control current density on a cathodic substrate wafer during electroplating. Co-owned and co-pending U.S. patent application Ser. No. 10/739,822, filed Dec. 17, 2003, by Mayer et al., having the title "Method for Planar Electroplating", which is incorporated by reference, teaches apparatuses and methods for selectively plating metal onto a portion of a substrate surface and selectively removing accelerator from another portion of the substrate surface using a rubbing pad. Embodiments for conducting attaching of accelerator to a substrate, selective removal of accelerator, and selective accelerated electroplating in the same processing cell are described herein with reference to FIGS. 65-71. FIG. 27 depicts schematically a cross-sectional view 550 of a generalized apparatus 552 in accordance with the invention for electroplating a first portion of a substrate and for selectively removing accelerator from a second portion of the substrate. System 552 includes a bath container 554 to hold a plating bath 555, which contains electroplating solution. System 552 further comprises an anode 556 that substantially covers about one-half of the bottom 557 of bath container 554. System 552 further includes wafer holder 558 that is operable to hold a substrate wafer 560 in a substantially face-down position in plating bath 555 and to rotate substrate wafer 560. A power supply 562 is electrically connected to substrate wafer 560 and to anode 556. System 552 further comprises rubbing pad 564. Power supply 562 and anode 556 are operable to generate electric current in plating bath 555 to electroplate metal at wafer portion 565 in a plating zone 566 of plating bath 555 (corresponding approximately to the footprint of anode 556), while causing substantially less or no electroplating at portion 567 of substrate wafer 560 in pad zone 568 (corresponding approximately to the footprint of container bottom 557 not covered by anode 556). Rubbing pad 564 is operable to remove accelerator from raised surfaces of substrate wafer 560 at least a portion of substrate portion 567.

Figure 28:
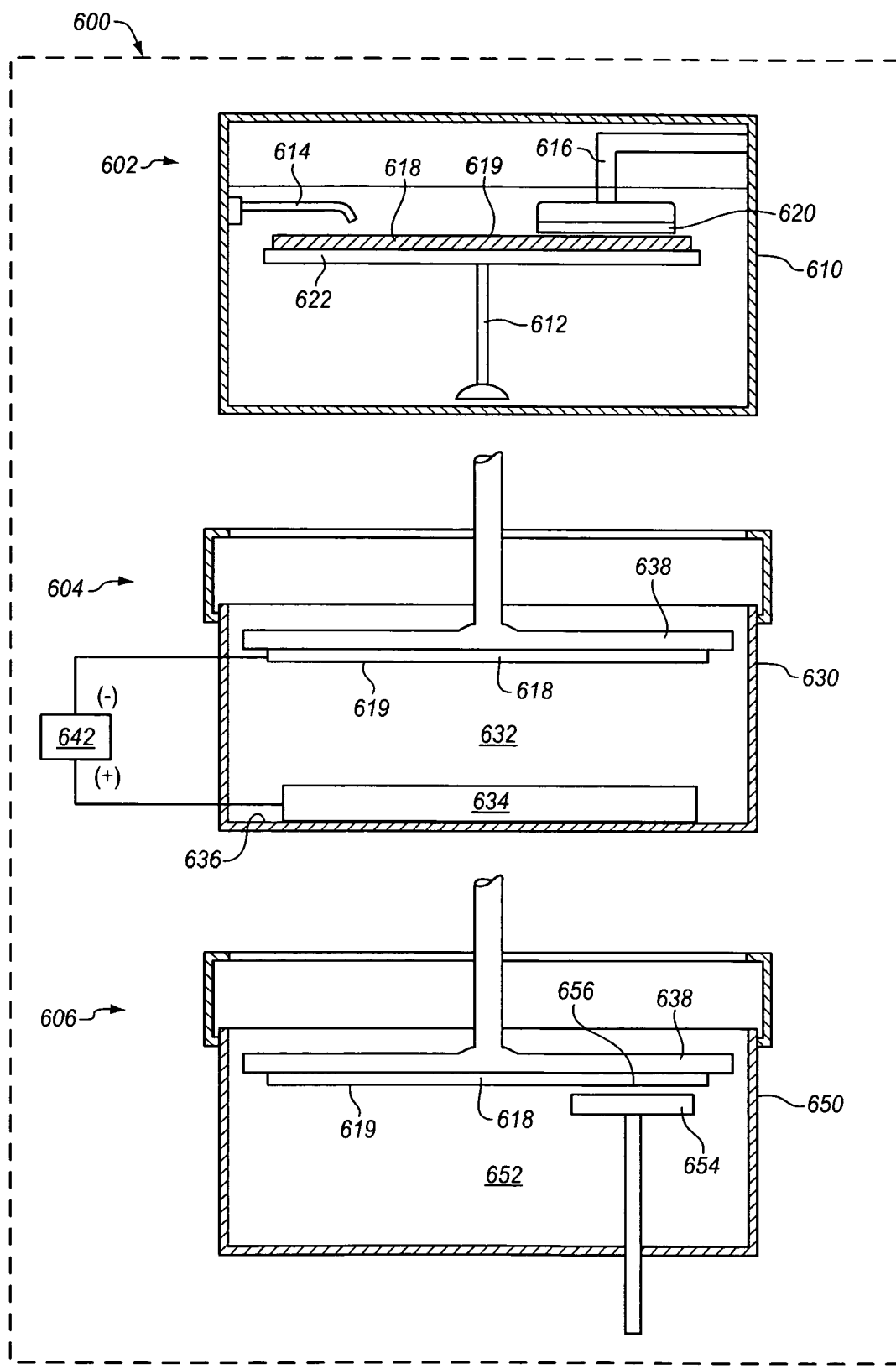
FIG. 28 depicts schematically a subsystem comprising a plurality of cell modules for conducting selective accelerator removal (SAR) and selectively accelerated plating (SAP) in accordance with the invention.

In some embodiments, application and selective removal of accelerator are conducted separately from plating operations. For example, FIG. 28 depicts schematically a system comprising a plurality of cell modules for conducting selective accelerator removal (SAR) and selectively accelerated plating (SAP) in accordance with the invention.

Some embodiments include steps 442 of post-deposition (post-electrofilling) operations. Examples of post-deposition operations include: edge bevel removal to remove deposited metal from an edge bevel region of a substrate. Systems and methods for edge bevel removal (EBR) of copper from silicon wafers are described in U.S. Pat. No. 6,586,342, issued Jul. 1, 2003. to Mayer et al., and in U.S. Pat. No. 6,309,981, issued Oct. 30, 2001, to Mayer et al., which are incorporated by reference. In some embodiments, post-electrofill operations comprise a conventional spin-rinse-dry (SRD) known in the art to rinse and to dry a substrate.

Steps 450 include removing deposited overburden metal from the substrate surface. Preferably, metal removal steps 450 are selective of copper (or other deposited metal) over barrier material. Preferably, metal removal steps 450 are isotropic. FIG. 14 depicts substrate wafer portion 104 after some deposited metal has been removed isotropically from substrate 104 resulting in a substantially uniform decrease in metal height in narrow-feature region 120, wide-feature region 122 and field region 124.

Typically, metal removal processes are continued in steps 450 until barrier layer 132 in field region 124 clears, that is, until substantially all metal has been removed from field regions of the substrate and barrier material 132 stops the removal. FIG. 15 depicts substrate wafer portion 104 after continued isotropic removal of deposited overburden metal from substrate 104 in steps 450, resulting in substantially complete removal of deposited metal from field region 124. As depicted in FIG. 15, metal removal was stopped at (or the removal was selective against) barrier 132 in field region 124. It is clear that in some embodiments, the bulk of metal but not all metal is removed from field regions 124 in steps 450. In some embodiments in which a single layer functions as both a barrier and a metal seed layer (not shown), processes for removing deposited metal do not substantially remove or affect the barrier/seed layer. In other embodiments in which a single layer functions as both a barrier and a metal seed layer (not shown), processes for removing deposited metal substantially remove the barrier/seed layer and stop at underlying dielectric base layer 106.

Steps 452 comprise selective removal of copper (or other deposited metal) from the substrate until most of the metal above HAR features and above LAR features has been removed down to about the height of the barrier layer, or alternatively down to the dielectric base layer, as depicted in FIG. 16. Typically, steps 450, 452 comprise isotropic wet etching chemistry and techniques, as discussed in more detail below. As a practical matter, a surface-reaction-kinetics-controlled isotropic technique is advantageous especially in steps 452 after the barrier clears in field region 124 (FIG. 15) and side edges of metal in feature regions 120, 122 are exposed to etching chemicals. Surface-reaction controlled etching avoids acceleration of etching rates at the edges of features, from isolated features, and from some features at the edges of an array of features. In contrast, when etching reactions are diffusion controlled, an increase in metal removal rates occurs at these locations. As a result, conventional diffusion-controlled techniques engineered to be uniform (on a macroscopic scale) become practically non-isotropic (at a microscopic scale) upon exposure of edge discontinuities to etching liquid. In some embodiments in accordance with the invention, processes of conducting a chemical wet etch do not include electrochemical processes. Further, processes of conducting a chemical wet etch preferably do not include physically contacting the substrate with a pad. As a result, the likelihood of undesired erosion of dielectric material in the base layer is diminished, and the likelihood of undesired dishing of large, low-aspect-ratio features is also diminished.

U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions useful for surface-reaction-kinetics-controlled isotropic wet etching of copper from a substrate surface in accordance with the invention. An exemplary chemical wet etching technique includes contacting a substrate with an etching solution comprising an oxidizing agent to oxidize a portion of deposited metal, thereby forming a metal oxide; and simultaneously or subsequently contacting the substrate with an etching solution comprising a metal-oxide-etching (e.g., metal-oxide reacting and dissolving) agent that selectively removes metal oxide and not the deposited metal. In some embodiments, an etching solution further comprises a pH-buffering agent, which may be the same as or different from a complexing agent. In some embodiments, an etching solution further comprises a corrosion inhibitor. In some embodiments, the action of the oxidizing agent and the complexing agents are combined and occur simultaneously by being incorporated into a single solution. Generally, a copper oxidation process takes place uniformly over the features of a partially fabricated integrated circuit (IC). Thus, the etching is independent of feature size, feature separation and density, position within a feature, and other geometric factors. This is because the oxidation rate is controlled primarily by surface reaction kinetics, as opposed to diffusion of compounds to and/or from the copper surface. An exemplary oxidizing agent of an etching solution includes one or more of a peroxide, a persulfide, ozone and a permanganate. Typically, the peroxide is hydrogen peroxide, $H_2O_2$.

Once copper oxide is formed by the oxidizing solution, it can be removed by using any suitable copper oxide etchant. An exemplary metal-oxide-etching agent of an etching solution includes one or more agents selected from a group comprising glycine, phosphoric acid, sulfuric acid, acetic acid, ethylenediamine tetraaceitc acid (EDTA), citric acid and salts thereof, and maleic acid and salts thereof. In some embodiments, a copper oxide etchant selectively removes copper oxide without substantially attacking the copper crystallites or grain boundaries. Suitable copper oxide etchants include dilute acids, amines such as glycine, and various copper complexing agents. Exemplary acids include dissociated inorganic acids such as phosphoric acid, sulfuric acid and organic acids such as acetic acid. Appropriate pH for an acid oxide-removal solution is typically in the range of about pH 0 to pH 2. Suitable complexing agents include ethylenediamine tetraacetic acid (EDTA), citric acid and salts thereof, glycine, maleic acid and salts thereof, and certain ammonium compounds known to those of skill in the art. When a complexing agent is used, the pH value is typically in a range of about from 5 to 12.

In some embodiments, separate oxidizing and oxide removal solutions are employed. In some embodiments, however, an etching solution in accordance with the invention includes both an oxidizing agent and a metal-oxide-etching (i.e., metal-oxide removal) agent. An exemplary etching solution contains peroxide at a concentration in a range of about from 0.5% to 20% peroxide by weight and glycine at a concentration in a range of about from 0.05% to 15% by weight, and has a solution pH in a range of about from 5 to 12, more preferably pH 7 to pH 11. Such an etching solution is typically about 100 times more selective to copper than to conductive Ta or TaN barrier material, so that etching is effectively stopped at the conductive barrier. An exemplary etching solution comprises about 3% by weight $H_2O_2$ and about 1% by weight glycine, and a pH in a range of about from 6 to 10, most preferably pH 9. Preferably, the single solution includes a buffering agent that maintains the pH at a specific value. Buffering agents such as acetate, ammonia, glycine, carbonate, or phosphate are selected, as known in the art, depending on the desired pH value. In some embodiments, the pH is adjusted by the addition of an appropriate agent such as acids, an alkali metal or tetra-alkyl ammonium hydroxide. By controlling the ratio of copper oxidizing agent and copper-oxide etchant in such solutions, one controls the amount of oxidation and the depth of the intermediate copper oxide film that is formed on the surface of the substrate. The aim of isotropic etching techniques, especially in steps 452, is to effect substantially equal rates of metal removal from all exposed metal surfaces independent of feature location, size, density or other geometric parameters.

Techniques are known in the art for global etching of a substrate surface by contacting all or a substantial portion of a substrate surface with a selective or nonselective etching liquid for a time duration to achieve etching of material. Some embodiments in accordance with the invention utilize techniques of localized wet etching that include contacting an etch area (treatment portion) of the substrate with an etching solution; and not contacting a non-treatment portion of the substrate with an etching solution. Systems and methods of localized wet etching (or other liquid treatment) of a substrate surface are described in more detail below with reference to FIGS. 44-57. In some alternative embodiments, metal removal steps 450 are initiated using global etching techniques to remove the bulk of overburden metal from a substrate surface that is completely covered with overburden metal, as depicted in FIGS. 14 and 15. Such global etching does not necessarily require the use of a surface reaction controlled etching agent; nevertheless, preferably it is performed using a process that is either uniform or radially tunable. Then, when clearing of metal from field regions begins or is close to beginning, metal removal in steps 450, 452 is continued using localized, selective, isotropic wet etching techniques, which provide more flexibility and better control of metal removal than global techniques. Systems and methods for conducting localized etching are discussed in more detail below with reference to FIGS. 44-57 and 60-62.

FIG. 16 depicts substrate wafer portion 104 after continued isotropic removal of deposited metal from substrate 104 in steps 452, resulting in removal of deposited metal from narrow-feature region 120 and wide-feature region 124 down approximately to the barrier-layer height defined by top surface 261 of barrier layer 132 or alternatively to the dielectric-layer field height defined by top surface 126 of base layer 106. In some embodiments, a small bulge of metal remains above one or more of filled narrow feature cavities 110 and/or filled wide feature cavity 112. Typically, it is not necessary to remove completely deposited metal from field region 124 or to make filled metal features 262, 264 absolutely planar at this stage of fabrication because typically later processes serve to remove barrier 132 and to planarize the substrate surface. For example, in embodiments in which about 200 Å of metal is left in the field and between 200 Å and 3000 Å of metal is left over the features, the substrate is planarized successfully during a subsequent CMP barrier/dielectric planarization step.

Some embodiments of a method in accordance with the invention include substrate planarization steps 454 after isotropic removal of metal in steps 450, 452. Steps 454 typically comprise removing a barrier layer and planarizing the substrate, including planarizing the dielectric base layer and the deposited metal in narrow (HAR) and wide-feature (LAR) regions. In some embodiments, steps 454 comprise chemical mechanical polishing (CMP) of the substrate surface to remove the barrier and to planarize the substrate. FIG. 17 depicts substrate 104 after planarization in steps 454 of the substrate of FIG. 16 to form small metal structures 272 and large metal structure 274 embedded in dielectric base layer 106. Planarization of the substrate surface at this stage of fabrication typically involves removing barrier material, metal seed material, and deposited metal. As indicated in FIGS. 16 and 17, planarization typically includes removal of exposed barrier material 265 of barrier layer 132 from field region 124 and from other exposed surface areas of substrate 104. In some embodiments, planarization also includes removal of a small amount of metal seed material 266 (FIG. 16) or electroplated metal located at the substrate surface and left there after the isotropic etching operation, as well as a small amount of deposited material located above the plane of the general surfaces at bulge locations 267, 268 (FIG. 16) of filled metal features 262, 264, respectively. Thus, FIG. 17 depicts substrate wafer portion 104 after removal of barrier layer 132 (FIG. 16) from the substrate surface and planarization of the substrate surface to form small metal structures 272 and large metal structure 274 embedded in dielectric base layer 106, in accordance with the invention. Alternatively, and more typically, steps 454 are conducted to remove metal from field region 124 and to planarize substantially the substrate surface, while leaving barrier layer 132 substantially in place. Then, steps 460 are conducted to form recesses in the narrow-feature and wide-feature regions. Steps 460 typically include isotropic, selective removal of metal from narrow-feature region 120 and wide-feature region 122 to form a small recess (empty space) in feature cavities 110, 112, preferably, but not necessarily, before barrier material 265 is removed from field region 124 and other upper surfaces of dielectric base layer 106 (FIG. 18). Formation of such recesses is useful for forming improved metal capping layer structures to cap embedded metal features. Co-owned and co-pending U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", and U.S. patent application Ser. No. 11/251,353, filed Oct. 13, 2005, by Reid et al., titled "Capping Before Barrier-Removal IC Fabrication Method", which are incorporated by reference, teach methods and compositions for forming recesses in features and for forming improved capping layers on embedded metal features. As described above in the description of steps 450, 452, an exemplary etching solution contains peroxide at a concentration in a range of about from 0.5% to 20% peroxide by weight and glycine at a concentration in a range of about from 0.05% to 15% by weight, and has a solution pH in a range of about from 5 to 12. The aim of these isotropic etch steps is to effect substantially equal amounts of metal removal from the embedded lines, independent of feature location, size, density or other geometric parameters. The amount of copper etched back below the level of the field regions depends upon various considerations, such as the desired capping-layer thickness at the end of the process, and the amount of dielectric to be removed in a subsequent dielectric planarization operation, if such operation is employed. Note that when the substrate at the beginning of the process is highly planar, these processes need not remove any dielectric material, or at least only a relatively small amount of such material, to effect planarity. In an exemplary embodiment in the 65-nanometer technology node, etch-back steps 460 create a recess in the copper (deposited metal) lines of approximately 130 Å. An advantage of an etching solution in accordance with the invention that is surface-reaction controlled (instead of diffusion controlled) is that the rate of metal removal remains uniform and more easily controlled (compared to diffusion-controlled etching) during etching of metal from metal features to form recesses. FIG. 18 depicts substrate wafer portion 104 after removal of a relatively small amount of deposited metal and metal seed material from the top of filled metal features 262, 264, resulting in formation of recesses 282, 284 at the tops 285, 286 of narrow (HAR) and wide (LAR) features 110, 112, respectively. Typically, metal removal to form recesses 282, 284 is conducted so that the top surfaces 287, 288 of deposited metal 262, 264, respectively, are lower than the top surface 261 of barrier layer 132, or alternatively, lower than the dielectric-layer field height defined by top surface 126 of base layer 106, as depicted in FIG. 18. Typically, recesses 282, 284 are formed by continuing a selective isotropic wet etching mentioned above or by performing an additional isotropic wet etching step after copper planarization, with the barrier material left in place.

Steps 462 include formation of capping layers in narrow-feature and wide-feature regions. Preferably, capping layer material is selectively deposited in narrow-feature and wide-feature regions and is confined within the feature walls to minimize "mushroom" effects and encroachment between adjacent features and thereby to minimize the amount of excess capping layer material that must be removed from surface areas between embedded metal features. FIG. 19 depicts substrate wafer portion 104 after metal capping material 292, 294 has been formed in accordance with the invention to fill recesses 282, 284 (FIG. 18) above metal portions 262, 264, which include portions of metal seed layer 142 lining the inside surfaces of feature cavities 110, 112, respectively.

In some embodiments in accordance with the invention, steps 462 include electroless plating of capping layer metal onto a foreign metal (e.g., cobalt on copper). Some embodiments comprise a two-phase technique including a nucleation phase and a growth phase. In the nucleation phase, a desired depositing metal (e.g., cobalt) is caused to deposit on a foreign metal substrate surface (e.g., copper). Afterwards, in the growth phase, the desired metal (e.g., cobalt) grows on a film of similar metal (e.g., cobalt). Typically, optimum or idealized process conditions for the nucleation phase are different from those of the growth phase. For example, for electroless plating of cobalt on copper, the optimal set of conditions for the nucleation reaction to occur is very different from that of the growth reaction. Nucleation of cobalt onto a copper substrate involves the generation of excess reduced cobalt-metal atoms at the copper surface at a sufficient concentration to form a nucleation layer of cobalt. To create this concentration of surface cobalt atoms, a reducing agent of sufficient strength (i.e., an agent having suitable free-energy driving-force and kinetics) to reduce sufficient metal ions at a sufficiently rapid rate is required. One example of such a reducing agent is N,N-dimethylamine borane (DMAB) or a source of hypophosphite ion such as ammonium hypophosphite (AHP). Because the process of cobalt-ion reduction is likely step-wise, the creation of partially-reduced surface-absorbed metal ions presents a problem. The partially-reduced ions can diffuse away into the electrolyte and not aid in the nucleation process. Also, if there is any dissolved oxidizer (oxygen) in the electroless plating electrolyte, the reduction processes rate is reduced by the fact that some of the reducing agent must be used to reduce the oxidizer. To minimize the occurrence of these possibilities, initiation of the electroless plating operation during a nucleation phase is typically performed under stagnant conditions. If the wafer were spinning quickly, rapid vigorous fluid flow would inhibit the accumulation of partially-reduced cobalt ions and/or would enhance the transport of oxygen to the surface. As a result, nucleation would be slow or not occur. On the other hand, once nucleation has occurred, the kinetics of the reducing-agent oxidation and cobalt reduction are quite different. It is believed that cobalt grows on cobalt more rapidly than during nucleation (the second step-charge transfer from cobalt's plus-one oxidation state to fully reduced metal is more rapid on the cobalt surface), and the reduction of oxygen is kinetically more inhibited. Thus, some fluid convection, such as caused by a high rotational speed, is useful to enhance mass transfer and deposition rates. Furthermore, the kinetics of a reducing oxidation agent (e.g., dimethylamine borane) are substantially slower on the cobalt surface than on copper. Therefore, during the cobalt growth phase, a different set of chemical (composition and concentration of reducing agents) and physical (e.g., temperature, rotation rate) conditions are desirable. Typically, a third phase, activation, precedes nucleation. Co-owned and copending U.S. patent application Ser. No. 10/609,518, filed Jun. 30, 2003, by Mayer et al., which is hereby incorporated by reference, teaches a generalized method for conducting electroless deposition of Cobalt using three distinct process phases in a thin-liquid-layer reactor. The teachings of U.S. application Ser. No. 10/609,518 are adaptable to methods and apparatuses in accordance with the present invention. Co-owned and copending U.S. patent application Ser. No. 11/200,338, filed Aug. 9, 2005, by Feng et al., titled "Small-Volume Electroless Plating Cell", which is hereby incorporated by reference, teaches a small-volume plating cell suitable for electroless plating of capping layer material in accordance with the invention. Co-owned and copending U.S. patent application Ser. No. 11/201,709, filed Aug. 11, 2005, by Webb et al., titled "Electroless Plating-Liquid System", which is hereby incorporated by reference, teaches a system for heating, flowing, and otherwise managing plating solution in an electroless plating cell apparatus.

In some embodiments, the capping layer comprises a refractory metal such as cobalt or nickel, although other conductive materials are utilized in some embodiments. In some embodiments, the capping layer also contains other materials that are impurities or purposely added components, such as cobalt, nickel, tungsten, boron, phosphorus, titanium, tantalum, zinc, cadmium, molybdenum and/or lead. These additional materials typically form an alloy with the majority capping metal. Or, they serve as dopants in the metal, or segregate to the grain boundaries to stabilize the material. Or, they form a non-equilibrium mixture with the metal. Preferably, the additional materials fill or "stuff" the metal grain boundaries with amorphous material and thereby block natural diffusion paths along these paths. This improves the barrier properties of the metal capping layer. The metal (with or without such additional material) typically comprises various morphologies, such as amorphous or polycrystalline morphologies. Generally, metal layers with greater amorphous character serve as more effective diffusion barriers.

In preferred embodiments, the capping layer is deposited such that it is thick enough to act as a diffusion barrier and allow for electrical shunting of current when metal voids are present in a particular conductive line-region, but not so thick as to create too much resistance between conductive metal layers or to cause an excessive amount of geography in the device (thereby limiting the size of the conductive metal). To some extent, a suitable thickness of the capping layer is dependent upon the morphology of the underlying metal layer. That is, if the underlying etched metal has considerable grain structure, a thicker capping layer is preferred compared to a case in which the underlying metal grain size is small or amorphous. A capping layer typically has a thickness in a range of about from 30 Å to 500 Å (3 nm to 50 nm), more preferably in a range of about from 100 Å and 200 Å (10 nm to 20 nm). In some embodiments, steps 462 include a post-deposition treatment. In some embodiments, a post-deposition treatment comprises annealing the substrate. In some embodiments, annealing of the substrate enhances intermixing of dopants in the nucleation layer and in the bulk layer. For example, in the case of some embodiments where a cobalt capping layer is deposited, boron from the cobalt nucleation layer and phosphorus from the bulk cobalt layer mix to form a $CoB_xP_y$ barrier capping layer. The degree of the boron/phosphorus mixing and the distribution of the boron and phosphorus in the final $CoB_xP_y$ capping layer depends on anneal process conditions (e.g., temperature and anneal time). In addition, the microstructure of the resulting mixed $CoB_xP_y$ capping layer is controlled by an anneal process in some embodiments. Preferred substrate temperatures of anneal processes are between about 150° C. and 400° C. The anneal time comprises a time in a range of about from 30 seconds (high temperature) to one hour (low temperature, typically in a batch mode), with longer times being required for lower temperatures. Annealing is typically performed under vacuum or in a reducing atmosphere.

In some embodiments, steps 462 include a nitridation of the metal capping layer, typically after a post-clean/anneal process. Nitridation of the metal capping layer serves to enhance further the barrier properties of the metal capping layer. In cases where a cobalt capping layer is used, nitridation produces a cobalt nitride layer that has good barrier properties. In some embodiments, a cobalt nitride layer includes $BN_X$ and/or $PN_X$ and/or $WN_X$, depending on the reducing agents/dopants used in the previous electroless deposition steps, and preferably has an amorphous microstructure. U.S. Pat. No. 6,962,873, issued Nov. 8, 2005, to Park, which is hereby incorporated by reference, teaches a method for fabricating a cobalt nitride barrier layer.

Typically, as depicted in FIG. 19, metal capping material 292, 294 is formed to bulge slightly above the top surface 261 of barrier layer 132. Alternatively, barrier layer 132 is removed either before formation of recesses or before deposition of metal capping material. The presence of barrier layer 132 on top surface 126 of dielectric base layer 106, however, provides an advantage of enhancing nucleation and deposition of metal capping material using electroless techniques. For example, the nucleation and deposition of cobalt capping layer material is improved by the presence of conductive barrier layer material on the top surfaces of dielectric base layer 106. It is believed that despite the presence of native oxides, such as $Ta_2O_5$, TaO or TiN, which typically form on a barrier layer when exposed to water or air, the barrier layer still remains conductive because of the metallic layer below the surface oxide film. The oxide film on the barrier is highly resistive to electroless deposition of capping metal, but the characteristic of underlying electrical conductivity is useful for electrolytic techniques of depositing capping layer material in steps 462. An exemplary technique for electrolytic deposition of capping layer material in steps 462 includes proximity focusing scanning microplating (PFSM), described below with reference to FIGS. 58 and 59.

Steps 470 include removing barrier layer material from the field regions of the substrate. In some embodiments, steps 470 are also useful for removing encroaching metal capping layer material from field regions between metal-filled features. FIG. 20 depicts substrate wafer portion 104 after substantial removal of field barrier layer portion 265 of barrier layer 132 (FIG. 19) from field region 124 and from other exposed surface areas of substrate 104. It is important to remove barrier layer material from field region 124 and other exposed surface areas because if the barrier material is substantially electrically conductive, its presence in a finished electronic device could cause electrical shorting between lines embedded in the dielectric. In embodiments in which the barrier layer is not conductive, it is not necessary to remove it. Preferably, top surfaces 302, 304 of capping layer material 292, 294 are parallel with or protrude slightly above the dielectric-layer field height defined by top surface 126 of base layer 106 after removal of the barrier layer material. Various dry or wet techniques are suitable for removing barrier layer material. An exemplary barrier-specific wet etching technique comprises contacting the substrate surface with a hot alkaline solution. For example, an alkaline solution (e.g. 10-40% KOH, NaOH, tetramethylammonium hydroxide, tetrabutylammonium hydroxide), sometimes combined with an oxidizer such as hydrogen peroxide, at a temperature of about 70° to 90° C. effectively removes Ta, Ti, TiN and TaN barrier material, while not significantly affecting copper, cobalt or dielectric oxide materials.

An example of a dry etching technique suitable for steps 470 comprises reactive ion etching (RIE). An exemplary suitable RIE technique known in the art uses sulfur hexafluoride, $SF_6$, or boron tetrafluoride, $BF_4$, under conventional operating conditions. Another suitable dry technique is conventional dry vacuum ion bombardment to sputter barrier material off the substrate surface.

Steps 480 include polishing and planarization of the substrate surface. FIG. 21 depicts substrate wafer portion 104 after planarization of the substrate surface to form small metal structures 312 and large metal structure 314 embedded in dielectric base layer 106, in accordance with the invention. Planarization of the substrate surface at this stage of fabrication typically involves removing relatively small amounts of metal capping layer metal, small amounts of dielectric base-layer material and remnants of barrier layer material. Planarization typically includes removal of a small amount of metal capping layer material from the top surfaces 302, 304 (FIG. 20) of capping layer material 292, 294, respectively, thereby forming capping layers 315. The resulting structure includes embedded small metal features 312 and embedded large metal feature 314, which are embedded in dielectric base layer 106. In some embodiments, embedded metal features 312, 314 in accordance with the invention comprise deposited metal 316, a thin layer of barrier material 317 on the inside walls of feature cavities 110, 112, metal seed layer material 318, and capping layers 315.

Steps 480 typically comprise chemical mechanical polishing (CMP) of the substrate surface using techniques known in the art. In contrast to methods and techniques of the prior art for forming a planar structure having embedded metal features, however, methods in accordance with the present invention minimize the utilization of CMP techniques to remove material during fabrication. In some embodiments, the capping layer material that is deposited into recesses (e.g., recesses 282, 284 (steps 460 of FIG. 22), and which is then polished, resulting in decreased net thickness (step 480 of FIG. 22) provides benefits additional to the improved planarity of the surface. The deposition of capping layer material typically begins via formation of a large number of small isolated nuclei. These nuclei must coalesce to form a complete, hermetic film. By initially depositing a capping material film thicker than its final thickness and then polishing it back, a hermetic barrier film without macro- and microscopic gaps and with otherwise desirable characteristics, and which has a desirably thin final thickness, is formed This is a significant advantage of methods in accordance with the invention compared to the conventional practice of depositing a capping layer over an exposed feature that is neither recessed nor thereafter polished.

Steps 490 include post-planarization processes, such as cleaning and drying the substrate surface. For example, after using a CMP technique to planarize the substrate surface in steps 480, cleaning of the substrate is necessary to remove CMP slurry (abrasion) particles and remnants of polished materials from the substrate surface. Typically, cleaning is conducted by directing one or more chemical treatment streams at the substrate surface while scrubbing the surface with one or more brushes using standard techniques. Additionally or alternatively, cleaning includes washing with an alcohol, such as isopropyl alcohol, and application of megasonic energy to the substrate or to cleaning fluids. After exposure to a water-containing environment, an advanced vapor dry (AVD) process (Maragoni or Rotagoni surface-tension controlled drying) is useful for drying a low-K and/or hydrophobic substrate.

In some embodiments, narrow-feature filling in steps 422, global application of an accelerator species in steps 430 by electrochemical activation, and subsequent wide-feature metal deposition in steps 440 are conducted in the same accelerator/plating bath or by using substantially the same accelerator/plating solution. Although application of accelerator and electroplating are conducted using a common liquid solution and/or are conducted in the same processing cell in some embodiments, some embodiments in accordance with the invention are characterized in that application of accelerator and deposition of metal do not occur simultaneously or contemporaneously at the same location of a substrate surface. Similarly, in some embodiments, selective removal of accelerator and deposition of metal do not occur simultaneously or contemporaneously at the same location of a substrate surface. In other words, there is no fundamental requirement for the various steps of accelerator application, accelerator removal and metal deposition to occur at the same time or in rapid sequence, although this is sometimes done for economic reasons.

An alternative embodiment of a method in accordance with the invention is similar to generalized method 400 of FIG. 22 except that accelerator for wide-feature metal deposition is applied during a narrow-feature deposition step, instead of being applied after narrow-feature deposition. An exemplary process flow of such an alternative method includes the following steps: (a) providing a substrate (such as substrate 104) having a base layer and a substrate surface, the base layer having a narrow feature cavity, a wide feature cavity and a field region adjacent to the wide-feature region; (b) exposing the substrate to a narrow-feature deposition solution that also contains an accelerator precursor; (c) cathodizing the substrate to conduct a narrow-feature metal deposition using the narrow-feature deposition solution, thereby depositing metal on said substrate in at least the narrow feature cavity, wherein the cathodizing also transforms the accelerator precursor to an accelerator attached to the substrate; (d) ceasing exposure of substrate to the narrow-feature deposition solution; (e) selectively removing the attached accelerator from the field region so that the wide-feature region has a higher surface concentration of accelerator than the field region; (f) exposing the substrate to a wide-feature deposition solution; (g) then conducting a wide-feature metal deposition.

Multi-Cell Apparatus For SAR and SAP

In some embodiments, selective removal of accelerator is conducted in one cell (or module), and plating is conducted in a second cell (or module), as described with reference to FIG. 28. FIG. 28 depicts schematically a subsystem 600 comprising a plurality of cell modules for conducting selective accelerator removal (SAR) and selectively accelerated plating (SAP) in accordance with the invention. Subsystem 600 includes accelerator application module 602, selective accelerated plating module 604, and optional selective accelerator removal module 606. Accelerator application module 602 is operable to apply chemical accelerator globally to a substrate surface and then selectively remove accelerator. Accelerator application module 602 includes a containment cell 610. Located in containment cell 610 are a substrate holder 612, an applicator nozzle 614, and a pad assembly 616. Substrate holder 612 is operable to hold and support a substrate wafer 618. Applicator nozzle 614 is operable to dispense a spray or stream of liquid accelerator solution onto surface 619 of substrate wafer 618. Pad assembly 616 is operable to hold a rubbing pad 620 and to apply rubbing pad 620 to substrate surfaces 619 during rubbing operations. Preferably, support platen 622 of substrate holder 612 comprises a compliant backing material that supports substrate wafer 618 during rubbing operations, but is also flexible enough to accommodate rubbing pad pressures necessary for selectively removing accelerator from raised surfaces of substrate surface 619. Typically, liquid accelerator solution comprising an accelerator species, such as MPSA or MESA, is applied globally to substrate surface 619 through applicator nozzle 614. Subsequently, pad assembly 616 is utilized to selectively remove accelerator from raised surfaces of substrate surface 619 by rubbing surface 619 with rubbing pad 620. Generally, pad assembly 616 is operable to translate rubbing pad 620 horizontally and vertically relative to substrate surface 619 and a rubbing lubricant (not shown) is applied to the surface. Preferably, in subsystem 600, no metal deposition occurs in accelerator application module 602 (or in optional accelerator removal module 606, when present) during accelerator application and selective accelerator removal.

Selective accelerated plating (SAP) module 604 includes a bath container 630 to hold a plating bath 632, which contains electroplating solution. Module 604 further comprises an anode 634 that substantially covers bottom 636 of bath container 630. Module 604 further includes wafer holder 638 that is operable to hold substrate wafer 618 (after selective formation of accelerated regions in a module 602) in a substantially face-down position in plating bath 632 and to rotate substrate wafer 618. A power supply 642 is electrically connected to substrate wafer 618 and to anode 634. Power supply 642 and anode 634 are operable to generate electric current in plating bath 632 to electroplate metal selectively onto substrate surface 619 of substrate wafer 618. In some embodiments, the plating process is performed using an electroless technique. Generally, during plating in plating module 604, no accelerator is present in the plating bath and no accelerator becomes attached or is selectively removed.

Optional selective accelerator removal module 606 includes a bath container 650 to hold a rubbing bath 652, often also referred to as a rubbing lubricant. In some embodiments, rubbing bath 652 is substantially identical to plating bath 632, but this is not a requirement. Since accelerator removal module 606 does not also function to plate the wafer, there is greater latitude in the choice of rubbing lubricant and the requirements of accelerator selective removal are decoupled from plating requirements, especially from requirements of effectively plating and filling a wide (e.g., LAR) feature. Module 606 further comprises rubbing pad 654. In embodiments in which module 606 is utilized, substrate 618 is transferred from plating bath 632 of module 604 in wafer holder 638 into rubbing bath 652 of module 606 for selective removal of accelerator from raised surfaces of substrate surface 619 between electroplating operations. Rubbing pad 654 is operable to remove accelerator selectively from raised surfaces of substrate surface 619 at substrate portion 656.

Figure 29:
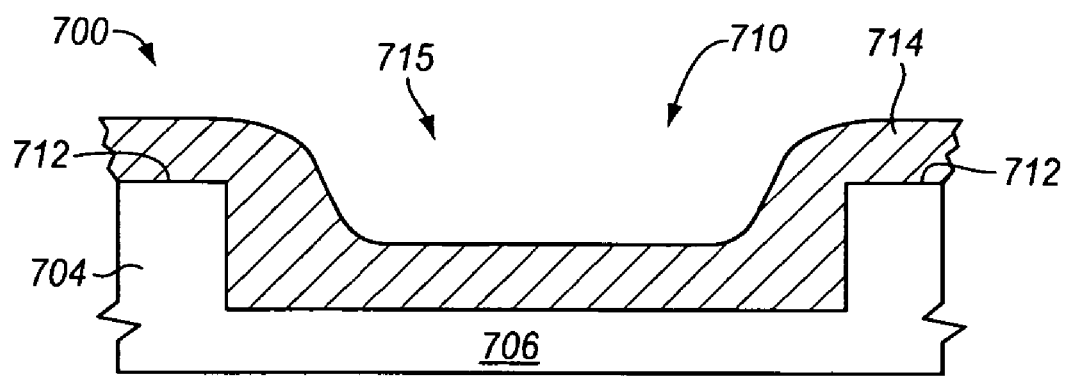
FIG. 29 depicts schematically a cross-sectional view of a substrate portion in an intermediate stage of fabrication with a conventional method of the prior art for filling a wide feature, for example, a low-aspect-ratio (LAR) feature.
Figure 30:
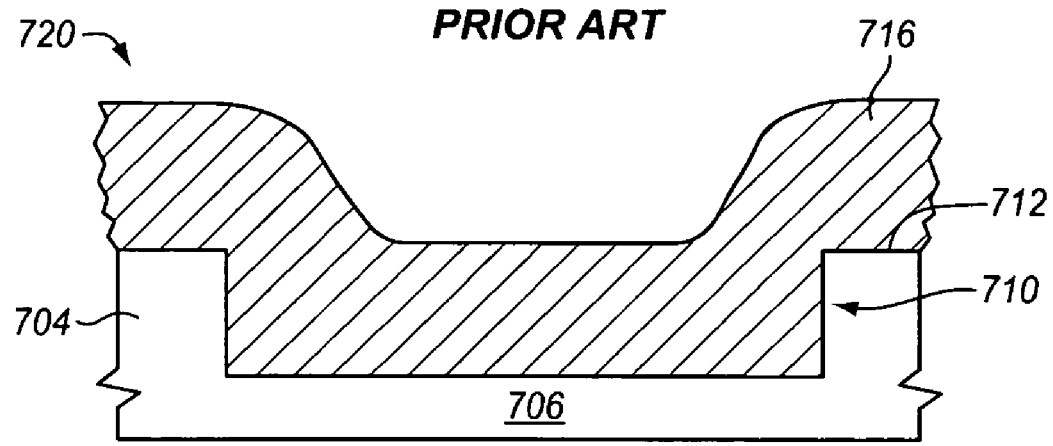
FIG. 30 depicts a cross-sectional view of the substrate portion of FIG. 29 after continued metal deposition by a conventional method of the prior art to fill completely a wide LAR feature cavity.

FIG. 29 depicts schematically a cross-sectional view 700 of a substrate portion 704 in an intermediate stage of fabrication with a conventional method of the prior art for filling a wide feature, for example, a low-aspect-ratio (LAR) feature having a width of 1 μm or more. Wide interconnect lines (e.g., trenches cut in a dielectric layer for a damascene process) and contact/bond pads often have low aspect ratios. When conventional methods of the prior art are used, low-aspect-ratio features generally require the plating of an overburden layer slightly thicker than the thickness of the damascene layer so that the feature is completely filled after planarization. The metal fill profile above these features exhibits large recesses having profiles that resemble the original low aspect-ratio feature. The metal processes used to deposit the metal, which are substantially conformal over such low aspect-ratio features, are typically not continued to a point that would geometrically "close" such recesses, because to do so would require depositing a very thick metal layer. Depositing a thick metal layer would be uneconomical due to necessary removal of the large excess of metal at a later stage. Conventional electropolishing techniques are able to planarize a surface in which the recessed feature to be planarized is no more than perhaps three times as wide as it is deep. For features wider than these, the rate of removal is essentially uniform everywhere. When the metal layer is electropolished to the dielectric surface, recesses over low-aspect-ratio features are propagated and expanded to produce recesses that span the width of these features, leaving effectively little or no metal in the metal pad regions. This is an unacceptable result. Substrate portion 704 includes a base layer 706, for example, a dielectric layer. Substrate portion 704 further includes wide feature cavity 710 in base layer 706 and field area 712 adjacent to wide feature cavity 710. As depicted in FIG. 29, substantially conformal metal layer 714 deposited on substrate portion 704 using conventional techniques of the prior art contains a large recess 715 resembling the original LAR feature cavity 710. FIG. 30 depicts cross-sectional view 720 of substrate portion 704 after continued metal deposition by a conventional method of the prior art to completely fill wide LAR feature cavity 710. The thickness of substantially conformally-deposited metal layer 716 over field area 712 would be unacceptably large because the deposition time would be unacceptably long, the large amount of metal in field areas 712 would be wasted, and satisfactory planarization would be impractical.

Figure 31:
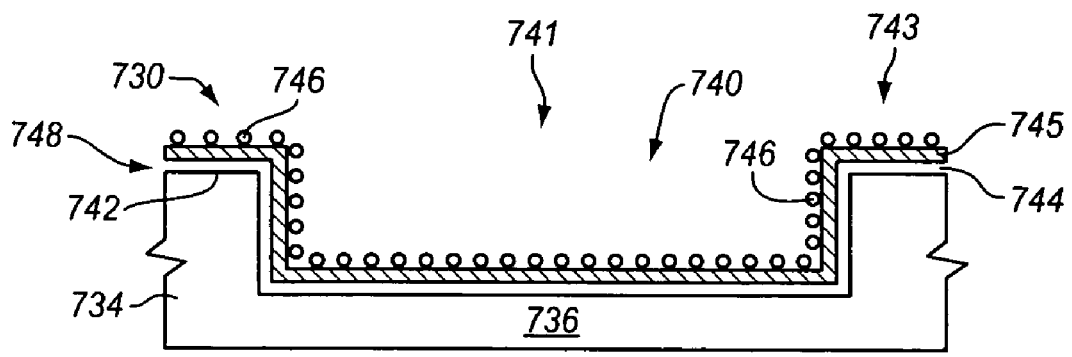
FIG. 31 depicts schematically a cross-sectional view of a substrate portion in an intermediate stage of fabrication with a method in accordance with the present invention for making a metal structure filling a wide feature cavity, for example, a low-aspect-ratio (LAR) feature having a width of 1 μm or wider.

Method Using SAR and SAP to Make Embossed Intermediate Structure over Lo-Aspect-Ratio Feature FIG. 31 depicts schematically a cross-sectional view 730 of a substrate portion 734 in an intermediate stage of fabrication with a method in accordance with the present invention for making a metal structure filling a wide feature cavity, for example, a low-aspect-ratio (LAR) feature having a width of 1 μm or wider. Substrate portion 734 includes a base layer 736, for example, a dielectric layer. Base layer 736 of substrate portion 734 includes wide feature cavity 740, which defines a wide-feature region 741. Base layer 736 further includes field 742 directly adjacent to wide feature cavity 740. Field 742 defines a field region 743. Substrate portion 734 further includes a barrier layer 744 covering the top surface of base layer 736, and a metal seed layer 745 located on barrier layer 744. As depicted in FIG. 31, an accelerator 746 (represented by spheres) in accordance with the invention has been applied globally to substrate 734, covering the substrate surface both in feature cavity 740 and on field 742. Base layer 736 has a base layer height 748 defined by field 742. In some embodiments, exposing wide-feature region 741 to a deposition accelerator is performed without simultaneously depositing metal.

Figure 32:
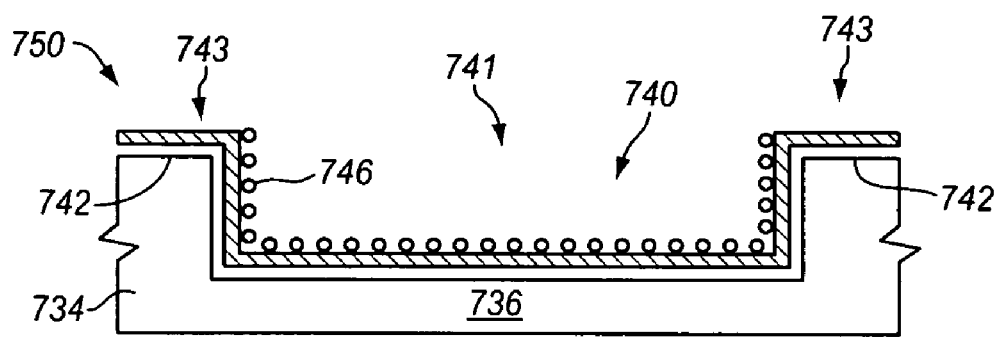
FIG. 32 depicts schematically a cross-sectional view of the substrate portion of FIG. 31 after accelerator has been selectively removed in accordance with the invention from the field region, resulting in accelerator being selectively attached to the substrate in the wide feature cavity of the wide-feature region.

FIG. 32 depicts schematically cross-sectional view 750 of substrate portion 734 after accelerator 746 has been selectively removed in accordance with the invention from field region 743, resulting in accelerator 746 being selectively attached to substrate 734 in wide feature cavity 740 of wide-feature region 741. In some embodiments, causing accelerator 746 to become attached selectively to wide-feature region 741 relative to said field region (usually by selectively removing accelerator from field region 743) is performed without simultaneously depositing metal in wide-feature region 741.

Figure 33:
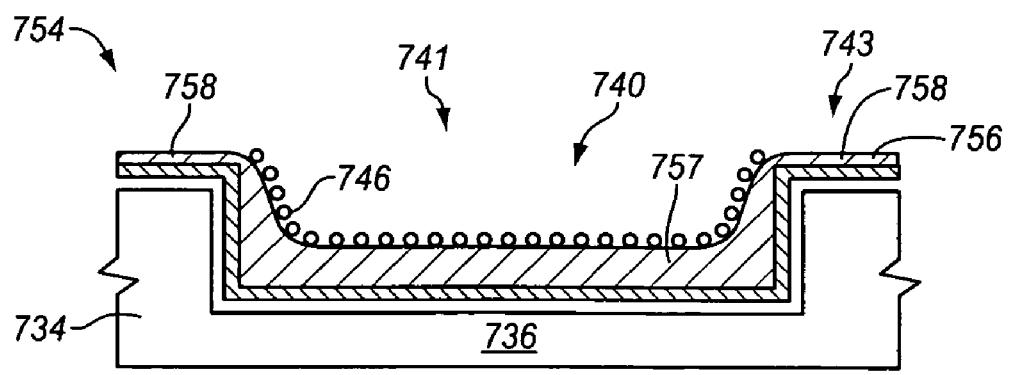
FIG. 33 depicts schematically a cross-sectional view of the substrate portion of FIG. 32 after selectively accelerated plating in accordance with the invention.

FIG. 33 depicts schematically cross-sectional view 754 of substrate portion 734 after selectively accelerated plating in accordance with the invention. Deposited metal layer 756 includes deposited metal portion 757 in wide-feature region 741 and deposited field metal portion 758 in field region 743. The greater concentration of accelerator 746 in wide-feature region 741 increased the rate of metal deposition in wide-feature region 741 relative to the rate of metal deposition in field region 743. As a result, deposited metal portion 757 in wide-feature region 741 is thicker than deposited field metal portion 758 in field region 743. In some embodiments, substantially no accelerator becomes attached to substrate 734 during wide-feature metal deposition.

Figure 34:
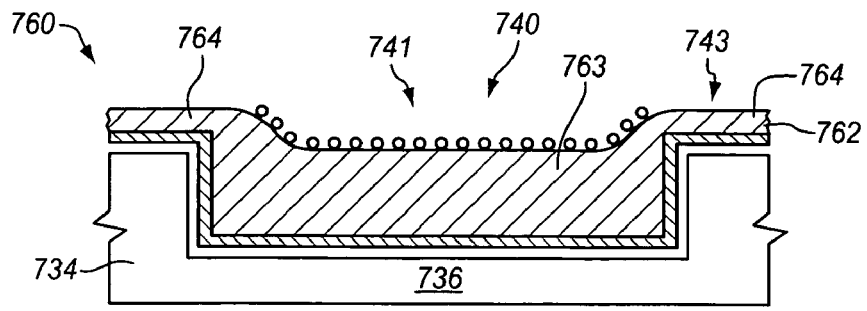
FIG. 34 depicts schematically a cross-sectional view of the substrate portion of FIG. 33 after continued selectively accelerated plating in accordance with the invention.

FIG. 34 depicts schematically cross-sectional view 760 of substrate portion 734 after continued selectively accelerated plating in accordance with the invention. Deposited metal layer 762 includes deposited metal portion 763 in wide-feature region 741 and deposited field metal portion 764 in field region 743. The greater concentration of accelerator 746 in wide-feature region 741 increased the rate of metal deposition in wide-feature region 741 relative to the rate of metal deposition in field region 743. As a result, deposited metal portion 763 in wide-feature region 741 is thicker than deposited field metal portion 764 in field region 743. Wide feature cavity 740 has been substantially filled with deposited metal portion 763, but the thickness of field metal portion 764 is much less than the width of wide feature cavity 740.

Figure 35:
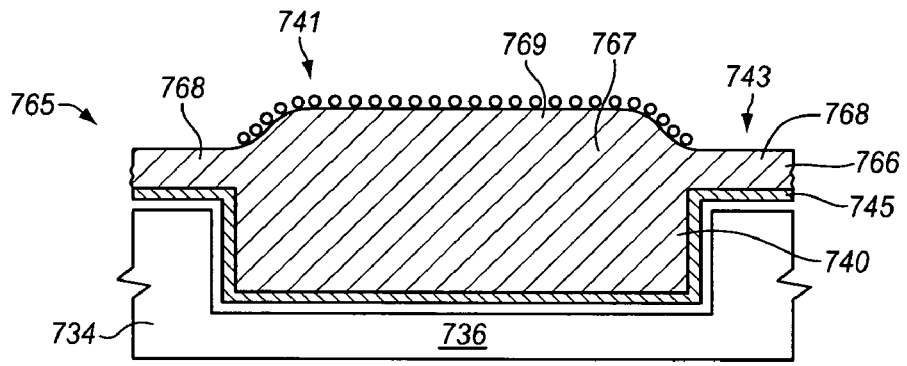
FIG. 35 depicts schematically a cross-sectional view of the substrate portion of FIG. 34 after continued selectively accelerated plating in accordance with the invention.

FIG. 35 depicts schematically cross-sectional view 765 of substrate portion 734 after continued selectively accelerated plating in accordance with the invention. Deposited metal layer 766 includes deposited metal portion 767 in wide-feature region 741 and deposited field metal portion 768 in field region 743. The greater concentration of accelerator 746 in wide-feature region 741 increased the rate of metal deposition in wide-feature region 741 relative to the rate of metal deposition in field region 743. As a result, deposited metal portion 767 in wide-feature region 741 is thicker than deposited field metal portion 768 in field region 743. Wide feature cavity 740 has been filled with deposited metal portion 767. Metal portion 767 includes wide-feature protrusion 769 located in wide-feature region 741. As depicted in FIG. 35, protrusion 769 has a wide-feature protrusion height above base layer 736 that is greater than a thickness of deposited field metal 768 in field region 743, thereby forming an embossed structure. Generally, deposited field metal 768 in field region 743 has a thickness less than one-half of the width of feature cavity 740 after feature cavity 740 has been filled with metal and a metal protrusion 769 has been formed. Typically, deposited field metal 768 field region 743 has a thickness less than one-fifth (1/5) of the width of feature cavity 740 after feature cavity 740 has been filled with metal and a metal protrusion 769 has been formed.

Figure 36:
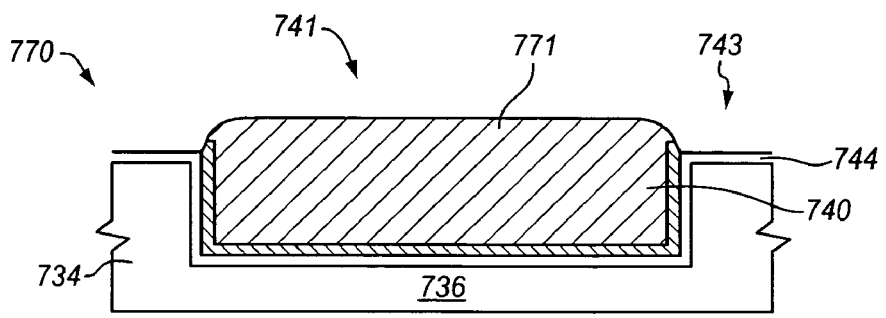
FIG. 36 depicts schematically a cross-sectional view of the substrate portion of FIG. 35 in a further intermediate stage of fabrication after removal of deposited metal completely from the field region in accordance with the invention.

FIG. 36 depicts schematically cross-sectional view 770 of substrate portion 734 in a further intermediate stage of fabrication after removal of deposited metal completely from field region 743. Preferably, deposited metal is removed isotropically from substrate 734 so that the rate of metal removal is substantially uniform in field region 743 and wide-feature region 741 until substantially all of the metal (including metal seed layer 745) has been removed from field region 743. Generally, an isotropic chemical wet etching technique in accordance with the invention effectively stops at barrier 744. As depicted in FIG. 36, a protrusion 771 remains in wide-feature region 741.

Figure 37:
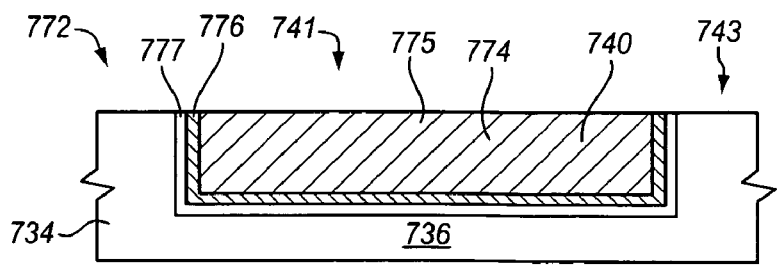
FIG. 37 depicts schematically a cross-sectional view of the substrate portion of FIG. 36 in a further intermediate stage of fabrication in accordance with the invention after planarization of the substrate, resulting in formation of a metal structure in the base layer.

FIG. 37 depicts schematically cross-sectional view 772 of substrate portion 734 in a further stage of fabrication after planarization of the substrate, resulting in formation of metal structure 774 in base layer 736. Barrier material has been removed from field region 743. Metal structure 774 includes deposited metal 775, seed metal portion 776, and barrier layer portion 777 (when the barrier material is conductive). In alternative embodiments, a capping layer as described above in the discussion of method 400 (FIG. 22) and with reference to FIGS. 18-21 is formed on metal structure 774.

Figure 38:
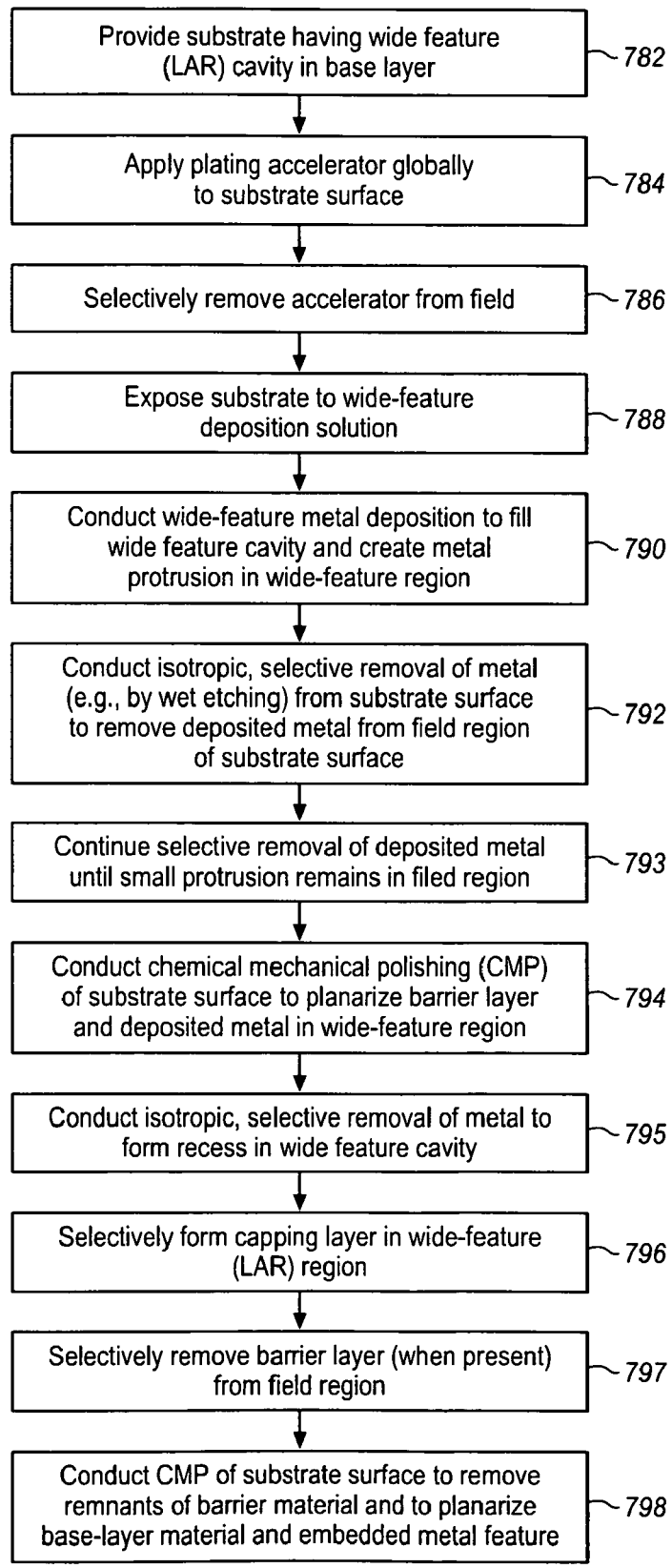
FIG. 38 contains a generalized process flow sheet of a method in accordance with the invention for conducting topography reduction and control by selective accelerator removal (SAR) and selectively accelerated plating (SAP) to fabricate an embedded metal structures in a base layer (e.g., dielectric layer)

FIG. 38 contains a generalized process flow sheet of a method 780 in accordance with the invention for conducting topography reduction and control by selective accelerator removal (SAR) and selectively accelerated plating (SAP) to fabricate embedded metal structures in a dielectric layer of an electronic device. Steps 784-798 of method 780 correspond substantially to steps 430 through 480 of method 400 in FIG. 22. Also, although method 780 presented herein comprises steps 782 through 798, it is understood that some methods in accordance with the invention do not include all of the steps of generalized method 780. Furthermore, it is understood that some methods in accordance with the invention include steps that are different from or additional to steps 782 through 798.

Figure 39:
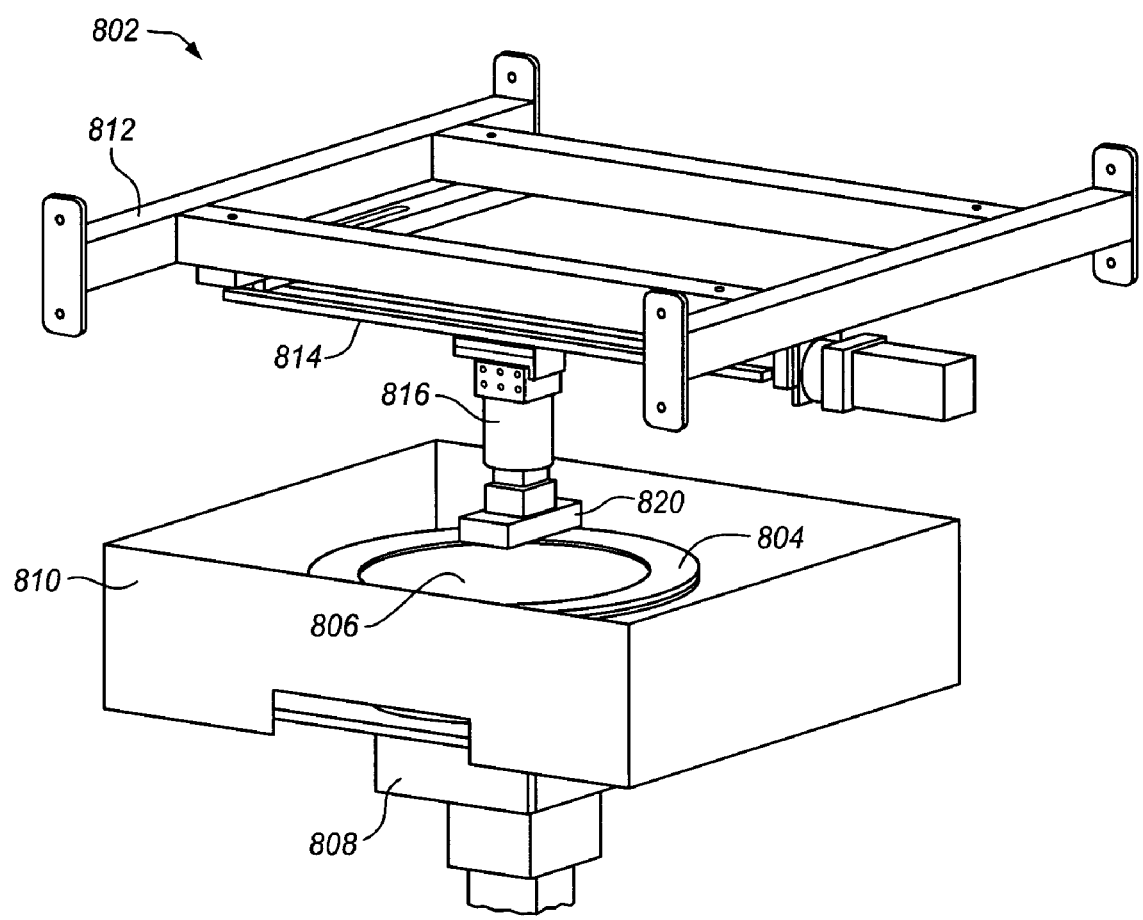
FIG. 39 depicts schematically an apparatus that is operable to remove accelerator selectively from raised surfaces of a substrate.

FIG. 39 depicts schematically an apparatus 800 that is operable to remove selectively accelerator from raised surfaces of a substrate. Under typical operating conditions, metal deposition by plating or other technique is not performed at the same or a different portion of the wafer simultaneously with accelerator application or removal. Also, metal deposition is not performed concurrently, that is, in rapid or repetitive sequential succession, with accelerator application or removal. Apparatus 800 comprises a vacuum chuck 804 for holding a substrate wafer. As depicted in FIG. 39, vacuum chuck 804 is in a face-up configuration, though this orientation is not necessary. Chuck 804 includes a slightly recessed pocket 806 that is operable to align a substrate wafer to the center of the apparatus. Alternatively, a wafer is carefully aligned with the center, or aligned with retractable locating pins located at the chuck periphery. In some embodiments, chuck 804 is movable both in rotational and orbital movements via a set of motors and gears in motor assembly 808. Wafer chuck 804 is contained in a containment vessel 810, which is operable to collect fluids used in various tool operations for reuse or waste disposal. Apparatus 800 further comprises a gantry 812 located above chuck 804 (attached to the tool frame, not shown). Attached to gantry 812 is a linear actuator 814 and a vertical actuator 816. Below vertical actuator 816 is attached a pad assembly 820, including a platen pad support and pad. In some embodiments, the platen onto which the pad is attached (e.g., by a double sided adhesive) contains lubricant feed lines and a manifold (not shown) for distributing lubricant through holes in the pad and between the pad and the wafer. During accelerator removal operations, a wafer is secured to chuck 804 by means of vacuum, and chuck 804 is moved (orbitally and/or rotationally) under the wafer to create abrasion between the pad and raised and/or exposed surfaces of the wafer. In some embodiments, the pad is moved from the left-hand outer radius through the center to the opposite end of the wafer to process the entire wafer. In some embodiments, the patent is disposed in a particular location to process only a section of the wafer. In some embodiments, the pad is designed in a variety of shapes and sizes to suit particular needs. In addition to a simple block shape (as shown), some embodiments include a long bar (e.g., slightly smaller, the same size, or larger than the wafer's diameter) that is swept from one side of the wafer to the other while the wafer moves (orbitally and/or rotatationally) under the pad. In some embodiments, the pad has a substantially circular, semicircular, or oblong shape, smaller than or larger than the entire wafer area. In some embodiments, apparatus 800 also includes features (not shown) such as spray nozzles. Spray nozzles are useful for: dispensing etchant, an acid solution, or a metal-oxide reducing agent (useful in removing surface oxide and creating a monolayer or sub monolayer of accelerator-absorbing material); applying accelerator; and wafer rinsing.

FIGS. 10 and 11 depict schematically substantially complete removal of accelerator from field region 124 and narrow-feature (HAR) region 120 before and during accelerated wide-feature (LAR) metal deposition (filling). Similarly, FIG. 32 shows complete removal of accelerator 746 from field region 743 before accelerated wide-feature (LAR) metal deposition (filling). It is understood, however, that to practice the invention, it is necessary only to establish a relative difference in plating rates between regions. Since it is necessary only to attach selectively more accelerator in an acceleration region than in a non-acceleration region, only a partial removal or reduction in the amount of accelerator in a non-acceleration region compared to that in the accelerated region is required to practice the invention. Generally, the greater the extent of accelerator removal from the exposed (e.g., field) regions, the greater the relative plating rate achieved in the wide-feature region. The relative plating rate is termed the "plating contrast", and is measured by the ratio of the deposition rates of two surfaces. The term "plating contrast" is used herein to describe and often to quantify relative rates of plating (deposition rate ratio) between two regions on a surface. In some embodiments, selective attachment of accelerator and resulting differences in plating rates are achieved by rubbing exposed surfaces to remove accelerator. Similarly, the term plating contrast is used to describe the relative metal deposition rates between regions where accelerator has been removed (or partially removed) versus a region where it has been applied, remains, or partially remains. When the plating contrast between the field (non-acceleration) region and a recess (accelerated) region is large, relatively little metal is deposited in the field and a large amount of metal is deposited in the recess. The plating contrast "C" can be expressed as:

$$C = \frac{R_{acc}}{R_{non}}$$

where C is the contrast "ratio", $R_{acc}$ is the rate of deposition in the region where more accelerator is present, and $R_{non}$ is the deposition rate where less accelerator is present (non-acceleration). C typically has a value greater than unity. $R_{acc}$ and $R_{non}$ and, therefore, the plating contrast C depend on a number of parameters, including: (1) the particular accelerator compound; (2) the initial surface concentration at the two locations; (3) the plating bath composition; (4) the plating voltage/current; (5) the accelerator application temperature; (6) accelerator bath temperature; (7) the original accelerator concentration; (8) duration of accelerator application; (9) the manner of accelerator removal (e.g., pad material, microstructure, irrigation grooves, pressure, time, lubricant chemistry) and associated degree of accelerator removal from the field; (10) the extent of de-attachment or "corrosion" of accelerator from the unrubbed recessed region occurring during the rubbing operation; and (11) the plating bath temperature.

Plating contrast metal deposition rate are both generally strong functions of potential/current. Knowing the plating contrast as a function of potential/current and controlling potential/current enable control and tuning of the deposition time and the thickness of metal in the field region needed to fill a cavity or to create a desired amount of embossment (protrusion) over a feature cavity and above the general field level. Interestingly and somewhat surprisingly, plating metal under conditions of relatively low current/potential often fills a structure more rapidly than with a high plating current/potential.

Obtaining a large plating contrast is generally a desirable, but not the only processing goal. For example, under certain conditions, a plating contrast ratio in excess of 75 to 1 is achievable. Nevertheless, the metal deposition rate under these conditions often is quite low, and therefore, is undesirable unless a very small cavity is being filled. Therefore, in some embodiments, other parameters besides contrast are considered and balanced, including: the plating rate of the accelerated and non-accelerated surfaces; the associated net processing time; the deposited metal film's morphology, texture, hardness; the formation of plating nodules or other defects.

A rubbing operation is typically performed in conjunction with a lubricant, which can have a marked effect on the rate and extent (total limiting amount) of accelerator removal. The lubricant is typically a liquid or liquid containing dissolved solutes; for example, water containing dissolved salts, acids or bases to make an electrolyte solution. In some embodiments, the lubricant includes abrasive particles and is a slurry. It has been found that the composition of the lubricant solution is sometimes critical to an accelerator removal process. Furthermore, different lubricants work differently depending on a number of process parameters, such as: the nature of the underlying substrate surface (e.g., type of metal, roughness, grain structure); choice of accelerator; pad material and microstructure; desired plating rate; and composition of plating bath. Therefore, screening and optimization of accelerator lubricants and other parameters is important.

Patterned wafers are often used process optimization. For example, after performing operations such as steps 410 through 422 of FIG. 22, a particular lubricant composition and pad under a particular set of operating conditions (e.g., time, pressure, temperature) are utilized for selective removal of accelerator (steps 430). Then, the patterned substrate is electroplated in a wide-feature plating bath under a controlled set of operating conditions (step 440 of FIG. 22) and the filling characteristics of the features are analyzed (e.g., by profilometery or cross-sectional focused ion beam cut scanning electron microscopy).

While screening of process conditions using a patterned wafer is generally a straightforward process, the cost of procuring and producing patterned wafers, and the time and expense of analyzing the results are often prohibitive. Therefore, a novel process has been developed, which is performed through a series of metal depositions on flat ("blanket") wafer surfaces. The novel process generates critical data over a large range of accelerator-removal conditions relatively quickly and inexpensively. It allows investigation of a large set of possible lubricant compositions and other operating conditions. Essentially, a flat-surface-test comprises a pair of metal depositions under identical conditions with the exception that one surface (or portion of a surface) is rubbed and another is not rubbed. An apparatus such as apparatus 800 depicted in FIG. 39 is operable to process full wafers and samples and to collect data for testing and selecting accelerator-removal lubricants, pads, and other parameters. An exemplary flat-surface substrate for performing accelerator-removal testing includes a non-patterned silicon wafer with a seeded metal layer deposited thereon. Firstly, the flat surface is (optionally) pre-plated, etched/cleaned, and acid-rinsed (to remove any residual oxide). Then, the substrate is globally and uniformly exposed to accelerator (e.g., by spraying or dipping the surface in a solution containing the accelerator). After rinsing the surface to remove entrained accelerator solution, the surface is exposed to the lubricant for fixed a period of time, during which time, typically a portion of substrate surface is rubbed with the lubricant and another portion is simply exposed to the lubricant without rubbing. These two samples (which are different portions of the same surface, or alternatively, two separate substrates) simulate the conditions of the rubbed exposed field and the unrubbed recessed regions of the surface, respectively. The pad rubbing is performed under a controlled set of conditions (such as time, reciprocation rate, speed), which are optionally varied to optimize the removal results. Then, the two samples are plated in a particular wide-feature (LAR) metal plating-bath. Data is collected during the plating process; such as, current or charge passed at a series of fixed voltages, or current response to swept voltage. In some embodiments, plating bath is also varied as part of the process optimization. Such measurements allow analysis of the effects of choice of lubricant, pad design, plating bath, plating current/voltage, and other parameters. Desired objectives of comparing and selecting process parameters include: minimizing metal-deposition time; minimizing defects; selecting a particular grain structure; and modifying the embossed structure shape.

Example 1

Accelerator removal tests were performed on a central section of a number of 300 mm thermal-oxide coated silicon wafers using an apparatus 800 as depicted in FIG. 39. Each silicon wafer had a 150 Å tantalum barrier/adhesion layer and a 1000 Å copper PVD seed. Each wafer was "pre-electroplated" in a SABRE® plating tool available from Novellus Systems, Inc. The pre-electroplating was performed at a charge density of 0.32 C/cm$^2$. (at approximately 1200 Å) in a copper plating bath containing additives and electrolytes for filling 35 nm narrow-cavity features having an aspect ratio exceeding 4:1. The pre-plating step is useful for simulating and elucidating the abrasion interactions between a pad and the metal micro-topography and roughness that generally are present on a surface after a narrow-feature (HAR) metal deposition/filling operation. Prior to global accelerator application, the wafer was etched (etch rate about 1000 Å/min) to remove residual plating bath adsorbates/levelers, and the wafer surface was cleaned by spraying a solution of 5 g/L glycine, 120 g/L 30% hydrogen peroxide, adjusted to a pH of 8.8 using a solution of 25% tetramethylammonium hydroxide over the surface for three seconds. After a brief rinse, the wafer was sprayed with a 5 wt % solution of sulfuric acid in water (to remove any residual surface oxide), and rinsed again, this time for 20 seconds. It is generally important to remove both the metal oxide (e.g., by the acid) and any residual copper ions off the substrate surface because otherwise the subsequently-applied accelerator could react with and precipitate with either of them and form an undesirable precipitate film.

Then, the substrate surface was sprayed with accelerator to cause global (to the entire surface) attachment of accelerator. The accelerator solution contained 1 g/L 3-mercaptopropane sulphonic acid in 1% acid and was sprayed for 5 seconds. Then, the wafer was rinsed again to make it ready for selective accelerator removal.

A 2×2 inch IC1000 pad manufactured by Rodel was used to abrade the wafer center for two minutes with an applied pressure of 0.7 psi using a 1-inch diameter 100 rpm orbital motion. The wafer was placed in recessed pocket 1106 of vacuum chuck 804 of an apparatus 800. In these tests, lubricant did not flow through the pad; rather, lubricant was disposed on the wafer and retained in the chuck pocket 806, that served as a small reservoir and aided in retaining the lubricant on the wafer surface during the rubbing process. The pad was vertically lowered onto the wafer surface and downward pressure was applied to the wafer through the pad using a pneumatic cylinder (not explicitly shown in FIG. 39). The wafer was orbited relative to the fixed pad. A layer of lubricant (approximately 70 cc total) was applied substantially uniformly to the entire wafer surface (including under the pad) just prior to commencement of the rubbing operation. The basic lubricant in the accelerator-removal tests consisted essentially of a solution of water and 8 ml/L of Enthone Viaform-NEXT® Suppressor. Various additives were added to the basic lubricant solution to test the effect of various lubricant compositions on accelerator removal.

Immediately following the rubbing operation, orbital motion was terminated, the pad raised and moved to the side (horizontally), and the wafer was rotated (spun) at 300 rpm to remove the lubricant and then rinsed with deionized water.

To assess the electrochemical activity and residual acceleration of the two areas of the wafer (center/rubbed and peripheral/unrubbed), the wafer was cleaved into coupons, which were covered with a piece of tape that masked the surface from plating electrolyte except in an area of the tape at which a hole had been punched. The circular punched hole had an area of approximately 1 cm$^2$. The coupons were immersed in a beaker containing a test plating bath containing sulfuric acid, copper sulfate, and a plating suppressor (BASF PLURONIC® surfactant polyethylene oxide block co-polymer L-62), but no accelerator (electrochemically or chemical active) or leveler additives. In some embodiments in accordance with the invention, accelerator and/or leverer additives are added in small quantities to a metal-deposition plating bath to impact grain structure, impurities, and roughness, but such additives are not central to establishing plating contrast and were not used in this example. The present exemplary plating bath contained 50 g/L copper ion (from copper sulfate pentahydrate), 80 g/L sulfuric acid and 8 ml/L Enthone Viaform-NEXT® suppressor. Within the plating bath, a copper-metal-sheet counter-electrode faced opposite a test coupon. The opening of a Luggin capillary for the Hg/HgSO$_4$ reference electrodes was placed between the coupon and counter-electrode near the coupon surface (minimizing interference of and requirement for any ohmic potential drop corrections). In these tests, the current response was recorded as the potential was swept at 20 mV/sec from −0.4V (near the open circuit potential) to −1V.

Figure 40:
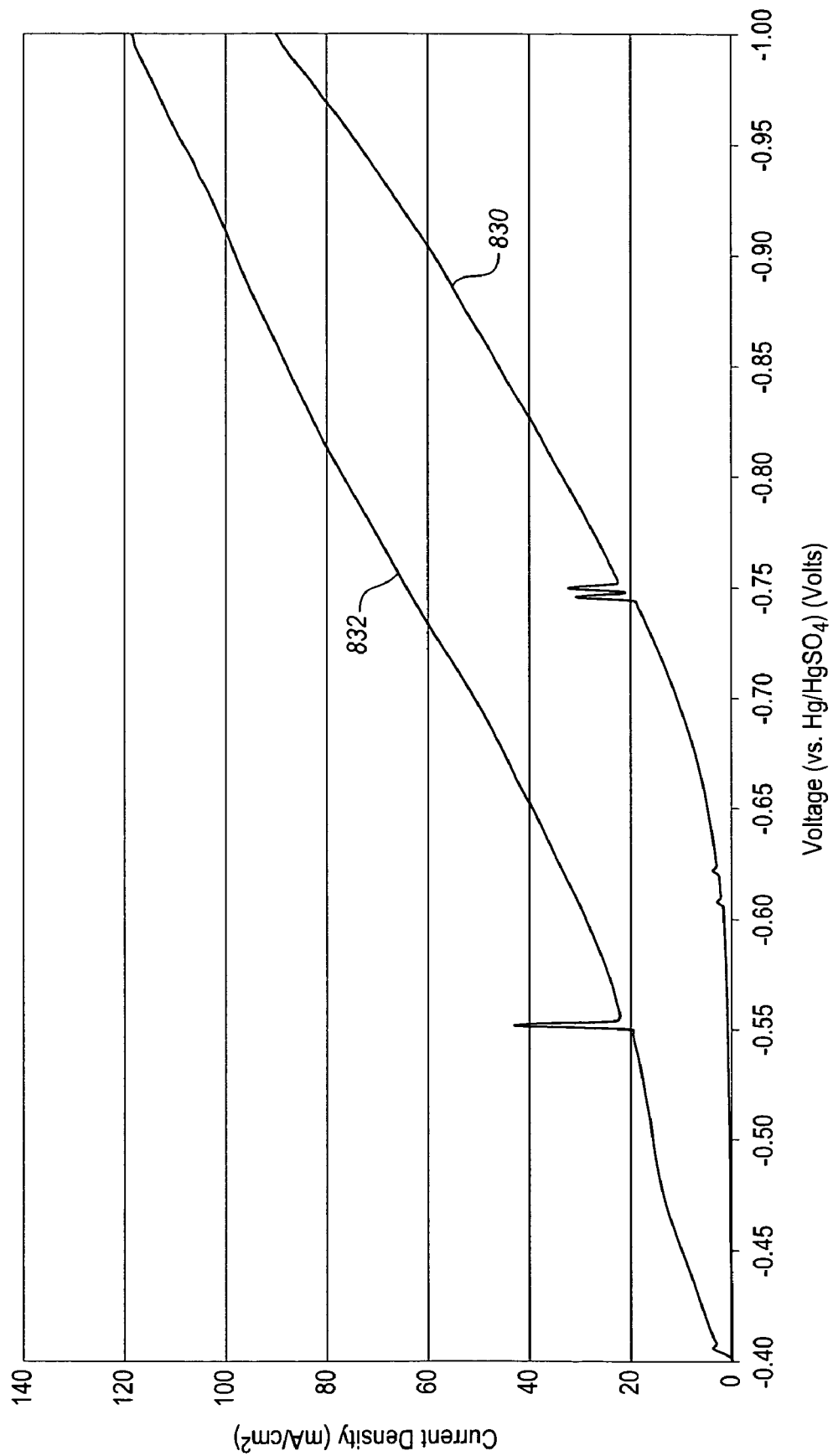
FIG. 40 contains a graph in which current density in units of milliamps per centimeter squared ($mA/cm^2$) is plotted as a function of voltage, and on which data have been plotted showing the current density/voltage response of a wafer coupon that was exposed to accelerator in accordance with the invention and a coupon that was neither exposed to accelerator nor rubbed.

FIG. 40 contains a graph in which current density in units of milliamps per centimeter squared (mA/cm$^2$) is plotted as a function of voltage. Curve 830 shows the current density/voltage response of a wafer coupon that was not exposed to accelerator or lubricant, nor was it rubbed. Because the plating bath contained suppressor, the current was quite low up to a potential of around 700 mV versus. Hg/HgSO$_4$. In contrast, curve 832 shows the current density/voltage response of a wafer coupon that received the acceleration treatment but was neither exposed to lubricant nor rubbed. These two curves essentially bracket the maximum expected amount of acceleration and non-acceleration expected for a particular combination of accelerator application, accelerator removal and plating conditions. The currents typically vary by two or three orders of magnitude during the scan. Thus, the spikes along the current curves are artificial, being an artifact of the potentiostat control circuitry changing current range scales from one decade to the next. With respect to both sets of conditions (fully accelerated and totally non-accelerated), it is expected that if the voltage sweep were allowed to continue much beyond −1V, the supply of copper to the surface would become rate limiting and a plateau in the current would occur.

Figure 41:
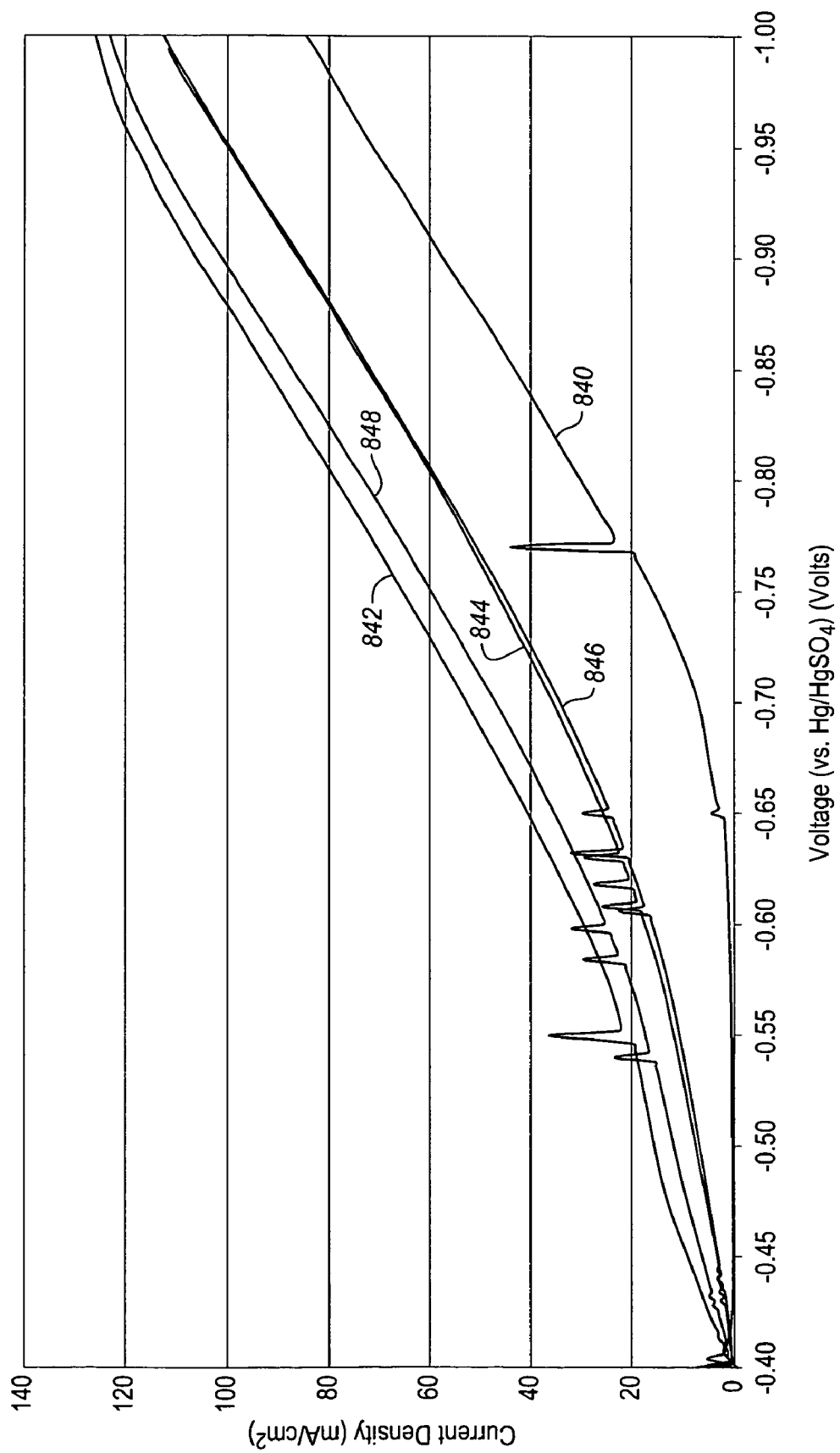
FIG. 41 contains a graph in which current density in units of $mA/cm^2$ is plotted as a function of voltage, in which data curves indicate the effect on accelerator removal (current density) by rubbing in accordance with the invention.

FIG. 41 also contains a graph in which current density in units of mA/cm$^2$ is plotted as a function of voltage. The resulting curves show the effect on acceleration as a result of rubbing with lubricant using a tool similar to apparatus 800 of FIG. 39. Curve 840 shows the current density/voltage response of a wafer coupon that was not exposed to accelerator or lubricant, nor was it rubbed. Curve 842 shows the current density/voltage response of a wafer coupon that received the acceleration treatment but was neither rubbed nor exposed to lubricant. On other samples, rubbing was performed as described above with a lubricant of water and 8 ml/L Enthone Viaform-NEXT® Suppressor without addition of 50 ppm chloride ion for curve 844 and with the addition of 50 ppm chloride ion for curve 846. Curve 848 shows the response in a coupon created from the same wafer corresponding to curve 846, exposed to the same lubricant, but not rubbed (i.e., from the outer periphery of the wafer). There was apparently some loss of accelerator, perhaps associated with the presence of the chloride ion and an associated corrosion reaction. Keeping track of accelerator loss from a lubricant in the absence of rubbing (e.g., though a chemical etching action) is important because one or more phenomena other than abrasion sometimes effectively remove accelerator from within a feature and reduce the effective plating contrast.

Figure 42:
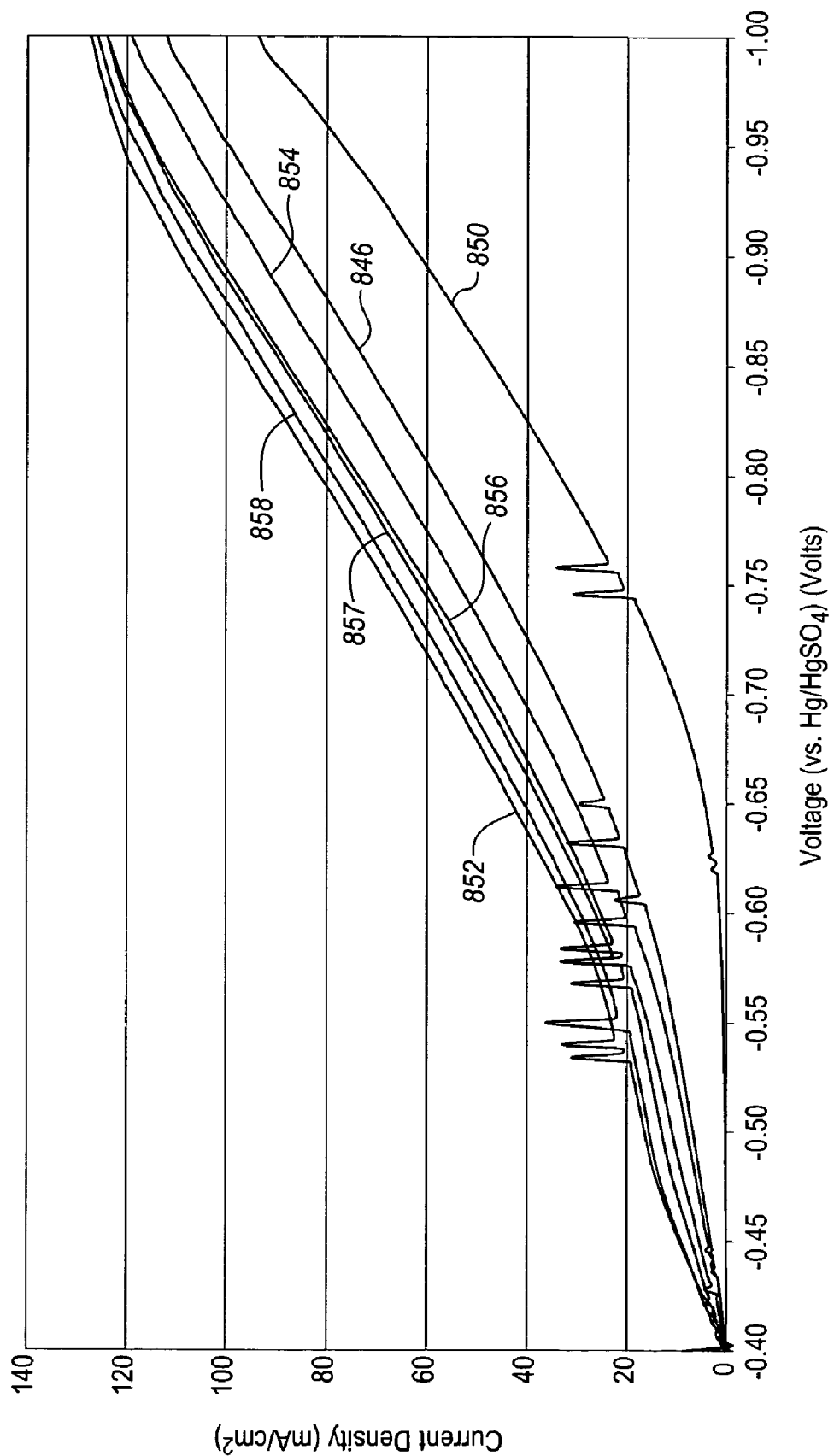
FIG. 42 also contains a graph in which current density in units of $mA/cm^2$ is plotted as a function of voltage, and the data curves show the effect on acceleration resulting from rubbing with a lubricant containing various amounts of sulfuric acid.

FIG. 42 also contains a graph in which current density in units of mA/cm$^2$ is plotted as a function of voltage. The resulting curves show the effect on acceleration resulting from rubbing with a lubricant containing various amounts of sulfuric acid. Curve 850 shows the current density/voltage response of a wafer coupon that was not exposed to accelerator or lubricant, and it was not rubbed. Curve 852 shows the current density/voltage response of a wafer coupon that received the acceleration treatment but was not rubbed or exposed to lubricant (full acceleration). After accelerator was applied to other samples, rubbing was performed as described above with a lubricant of water and 8 ml/L Enthone Viaform-NEXT® suppressor to which 50 ppm chloride ion and various amounts of sulfuric acid were added. Curve 846 shows the current density/voltage response of a wafer coupon rubbed with a lubricant containing no acid (as in FIG. 41). Curves 854, 856, and 857 show the current density/voltage response of a wafer coupon rubbed with a lubricant containing 5 g/L, 10 g/L and 80 g/L sulfuric acid, respectively. Curve 858 shows the current density/voltage response of a wafer coupon exposed to a lubricant containing 80 g/L sulfuric acid, but not rubbed. These curves show a steady reduction in the ability to remove accelerator with increasing acid concentration. At 80 g/L, there is almost no removal of accelerator evident (compared to the accelerated and unrubbed sample corresponding to curve 852).

Figure 43:
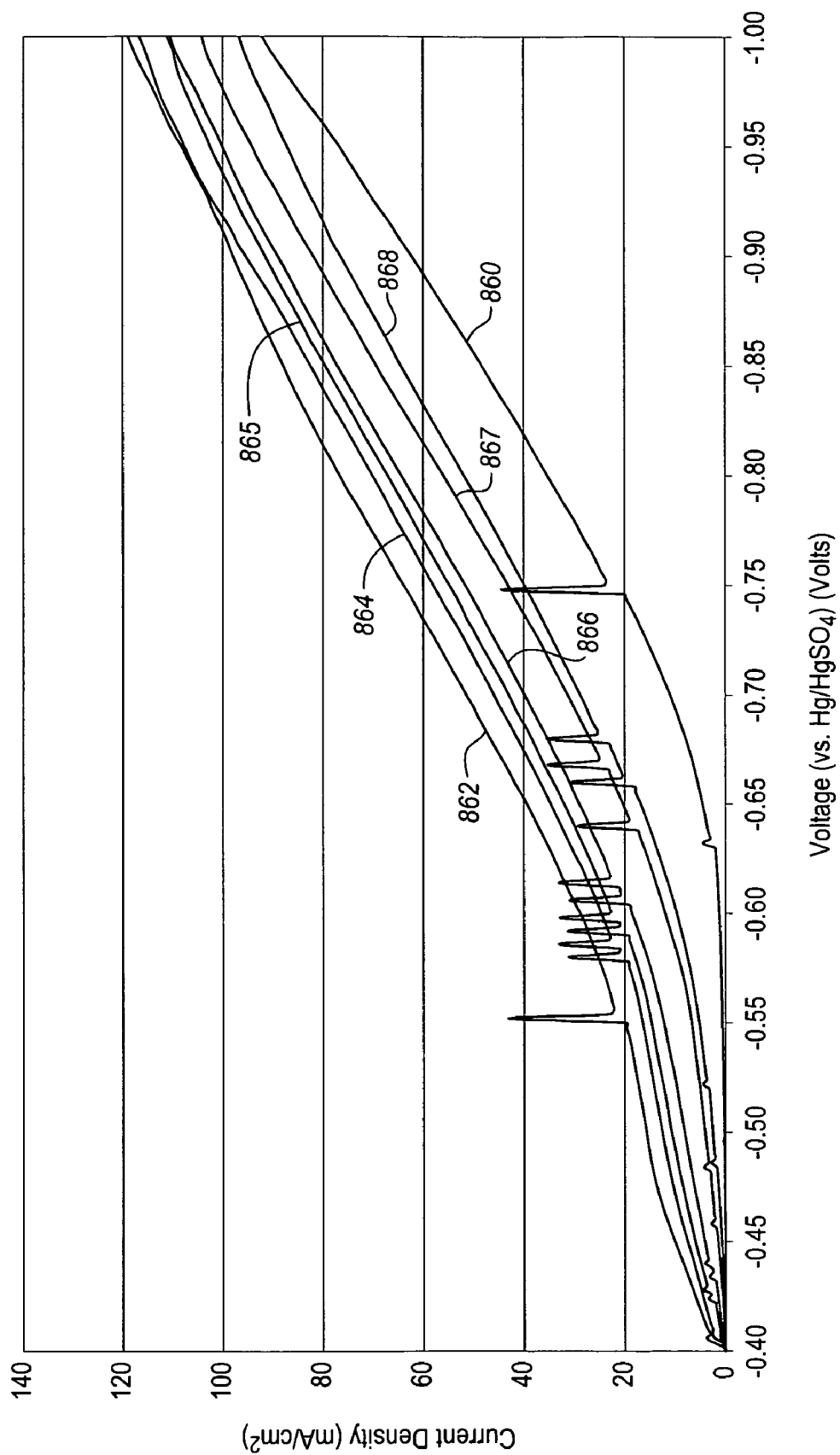
FIG. 43 contains a graph in which current density in units of $mA/cm^2$ is plotted as a function of voltage, and the plotted data show the effects on acceleration of adding copper ion to the rubbing lubricant.

FIG. 43 also contains a graph in which current density in units of mA/cm$^2$ is plotted as a function of voltage. The data plotted in FIG. 43 show the effects of adding copper ion to the rubbing lubricant. Curve 850 shows the current density/voltage response of a wafer coupon that was exposed neither to accelerator nor to lubricant, and it was not rubbed. Curve 852 shows the current density/voltage response of a wafer coupon that received the acceleration treatment but was never rubbed (full acceleration). The lubricant solution contained 8 ml/L Enthone Viaform-NEXT® suppressor in water, to which was added 50 ppm chloride ion, 80 g/L sulfuric acid, and various amounts of copper ion. Curve 864 corresponds to data collected from current density measurements on a coupon accelerated and then rubbed using lubricant containing 8 ml/L Enthone Viaform-NEXT® suppressor, 50 ppm chloride ion, 80 g/L sulfuric acid, but no copper. Curve 865 corresponds to the coupon rubbed with the same lubricant but also containing 6.3 g/L copper ion. The data of curves 866, 867 and 868 correspond to similar lubricants containing 12.5 g/L, 25 g/L and 50 g/L copper ion, respectively. The data plotted in the graph of FIG. 43 show a consistent increase in the amount of accelerator removal from the wafer as copper concentration increased.

These results and other observations indicate that a high concentration of acid generally inhibits accelerator removal, and that a high level of copper ion effectively enhances the removal of accelerator. Also, observations have shown that copper-plating-bath suppressor-like compounds often hinder the accelerator-removal process. Therefore, while components like acid and suppressors are often used and necessary for successful plating operations, they are not necessarily helpful for selective accelerator removal and for obtaining maximum plating contrast. The ability to perform selective accelerator removal operations without simultaneous metal plating, as laid forth in this specification, is, therefore, useful for achieving maximal plating contrast and other desired results without the complication of combining metal plating and selective accelerator removal.

In embodiments described above, lubricants are liquid solutions. Some lubricants in accordance with the invention comprise a slurry or insoluble abrasive particles. In some embodiments, removal of accelerator is achieved using a suspension of slurry in the lubricant. In some embodiments, a slurry has the advantage of improving the compliance of the removal over small variations in topography often seen in the processing of multilevel integrated circuits. Nevertheless, the use of a slurry typically creates the additional need of removing the often tenuous slurry particles from the substrate surface after an abrasion process. Techniques for removing slurry include using one or more of chemicals, brushes, and forced energy (e.g., megasonic energy) to remove adhering slurry particles. A chemical species useful in "releasing" particles might remove the accelerator from within features and etch the substrate surface. Furthermore, if abrasive particles were added to a lubricant, and if a wide low-aspect-ratio feature were plated in an initial narrow-feature plating operation to a thickness below the layer of the general base-layer (dielectric) fieldheight, then particles located within the wide feature could be particularly difficult to remove. They could become embedded into the subsequently deposited metal, causing defects. To address this potential problem, some embodiments use a slurry that is different from the type of slurries typically used in CMP processes. Thus, in embodiments using an abrasive slurry, the lubricant/abrasive slurry acts primarily as a mechanical abrasive and not as a chemical-mechanical slurry combination. A lubricant-slurry in accordance with the invention typically has one of more of the following general attributes: (1) the lubricant is free of any metal complexing agents, which would tend to dissolve the underlying metal and make it substantially more soluble at the pH of the lubricant (e.g., no citrate, EDTA, glycine, ammonia, etc.); (2) the lubricant contains a relatively high concentration of dissolved metal ion, preferably in a non-complexing form (e.g., at least ¼ the saturation value and up to the saturation value of metal ion at the operative pH; e.g., in the form of a sulfate, phosphate); (3) the abrasive particles are substantially insoluble in the lubricant at the operative pH; (4) the abrasive particles do not contain materials that are more noble than the metal from which the accelerator is to be removed; and (5) the abrasive particles are easily removed from the surface by applying rinsing solution that dissolves or complexes the material of the abrasive particles, without corroding or removing the accelerator from the metal to which the accelerator is attached within the features. In some situations, the abrasive is imbedded into the pad itself as a "fixed" abrasive.

An exemplary lubricant with abrasive particles suitable for removing accelerator from copper comprises a concentrated aqueous solution of copper sulfate with a pH range less than 1, preferably between pH 2 and 7. The preferred abrasive particles for use with copper comprise cupric oxide. A slurry containing copper sulfate and cupric oxide is effective in removing accelerator from the surface. Any acidity of the solution (when the pH is above that of the stability pH) is neutralized by the reaction of the oxide with protons to form water and cupric ion. Once saturation is achieved, the process stops. An exemplary process flow includes firstly rinsing the surface with DI water to remove most of the slurry (including essentially all of the copper sulfate and all but the surface-adherent CuO particles). Then, the substrate surface is sprayed with a solution that does not remove the accelerator, but dissolves the CuO particles. For example, a solution containing a dilute acid, such as sulfuric acid, reacts with the surface particles, dissolving them to form water and cupric sulfate. When the subsequent plating bath is acidic, it simply dissolves the CuO particles in the bath. Alternatively, a more neutral solution that contains a copper complexing agent (citrate, glycine, etc.) is used, resulting in a corresponding reaction. The key benefit of this process flow is that the abrasive particle, which aids in the removal of accelerator from field regions but which might end up within a feature, is removed with a simple rinsing solution, without complicated equipment or costly chemicals. Additionally, loss of accelerator activity within the features is avoided.

Localized Liquid Treatment (Etching)

Figure 44:
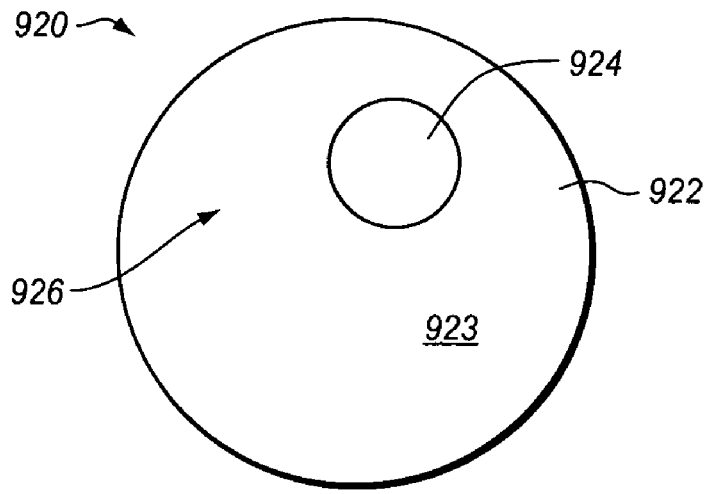
FIG. 44 depicts a top-down view of a substrate wafer on which etching liquid has wetted a localized etching area of the substrate surface, but has not wetted a non-etch portion of the substrate.
Figure 45:
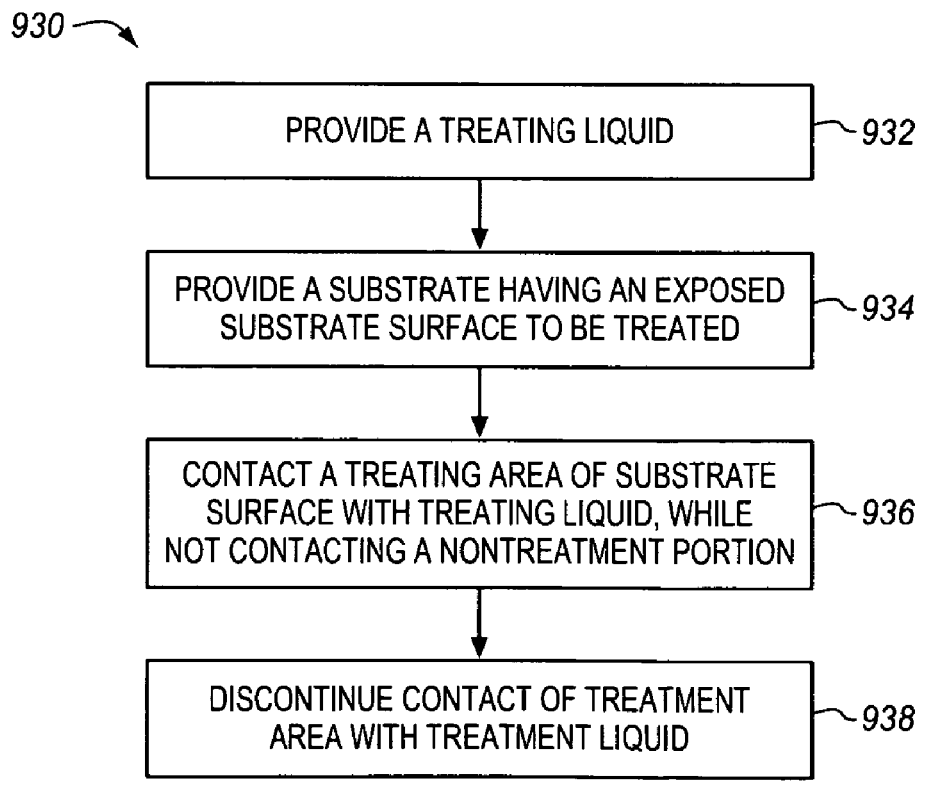
FIG. 45 shows a process flow sheet of a generalized method in accordance with the invention for localized treating of the surface of a substrate with a liquid.

FIG. 44 depicts a top-down view 920 of a substrate wafer 922 having a substrate surface 923 on which etching liquid has wetted a localized etching area 924 of substrate surface 923, but has not wetted a non-etch portion of the substrate. FIG. 45 shows a process flow sheet of a generalized method 930 in accordance with the invention for localized treating of the surface of a substrate with a liquid. Steps 932 include providing a treating liquid, such as a liquid etching solution. In this specification, localized liquid treating is described mainly with reference to selective, isotropic etching of a substrate surface. It is understood, however, that methods in accordance with the invention are generally applicable to other types of treating liquids and treating operations. Steps 934 include providing a substrate having an exposed substrate surface to be treated. Steps 936 include contacting a treating area of the substrate surface with treating liquid, while either not contacting all or part of a nontreatment portion, or exposing all or part of the nontreatment portion to a diluent, or exposing all or part of the nontreatment portion to a reaction-quenching liquid stream. Steps 938 include discontinuing contacting the treatment area with treatment liquid. Typically, steps 936-938 are repeated at different treating areas of the substrate until the entire substrate surface has been treated.

Figure 46:
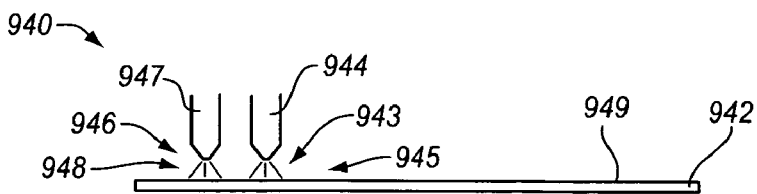
FIG. 46 depicts schematically a cross-sectional view of a substrate wafer section in which a treating liquid is directed from a treating nozzle to wet a treating area, and a diluent or quenching liquid is directed from a quench nozzle at a quench area of the substrate surface.

In some embodiments, treating liquid contacts a treating area, and a diluting liquid or a quenching liquid is used to rinse, dilute or quench an area of a substrate that has been previously treated. FIG. 46 depicts schematically a cross-sectional view 940 of a substrate wafer section 942 in which a treating liquid 943 is directed from a treating nozzle 944 to wet treating area 945, and a diluent/quenching liquid 946 is directed from a quench nozzle 947 at a quench area 948 of substrate surface 949.

Figure 47:
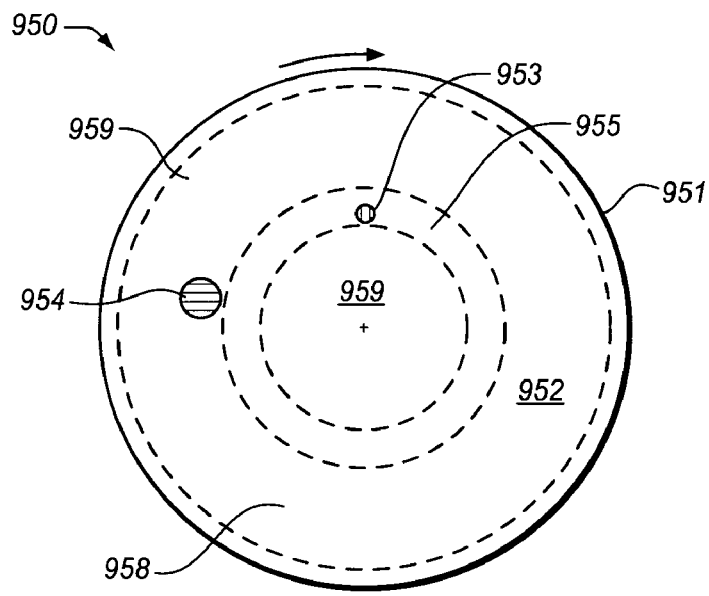
FIG. 47 depicts schematically a top-down view of a substrate wafer in which treating liquid, such as liquid etching solution, is applied at any instant to a treating-liquid impact area, and diluent or quenching liquid is applied at any instant to a quenching-liquid impact area, and as the wafer is rotated, treating liquid contacts a circular treating area, and quenching liquid contacts a substantially circular quench area.

FIG. 47 depicts schematically an instantaneous top-down view 950 of a substrate wafer 951 having substrate surface 952. Treating liquid, such as liquid etching solution, is applied at any instant to treating-liquid impact area 953. Impact area 953 is depicted in FIG. 47 without accounting for modifications in its shape due to shear forces arising from rotation of substrate wafer 951. Diluent or quenching liquid is applied at any instant to a quenching-liquid impact area 954. Impact area 954 is depicted in FIG. 47 without accounting for modifications in its shape due to sheart forces arising from rotation of substrate wafer 951. After its application at a treating-liquid impact area, which in some embodiments is continuously moving on a rotating wafer surface as depicted in FIG. 47, treating liquid (e.g., etchant) spreads outwards on the wafer surface due to centrifugal forces. Similarly, after its application at a quenching-liquid impact area that is continuously moving on a rotating wafer surface, quenching liquid or diluent spreads outwards on the wafer surface due to centrifugal forces. As a result, as wafer 951 rotates, treating liquid contacts an approximately circular treating area 955 (indicated by inner and middle dashed circles in FIG. 47), and diluent or quenching liquid contacts a substantially circular quench area 958 (indicated by middle and outer dashed circles). Quench area 958 includes substantially the portion of substrate surface 952 located radially outwards from treating area 955 and extending substantially to the edge of the wafer. Typically, a treating-liquid impact area 953 and a quenching-liquid impact area 954 each comprise a portion of substrate surface 952 that is substantially less than the total exposed surface area of substrate surface 952. When treating-liquid impact area 953 is located away from the periphery of a wafer, treating area 955 and a quench area 958 comprise a significant portion of substrate surface 952. In preferred embodiments in accordance with the invention, during etching of a substrate surface, such as during steps 450, 452 of method 400, a treating-liquid impact area is located initially at the center of a substrate wafer to conduct localized etching, and then the treating-liquid impact area is continually moved radially outwards toward the wafer edge until the entire substrate surface has been treated. At any point in time, a non-treatment portion 959 of substrate surface 952 includes exposed areas of the substrate surface that are not in contact with treating liquid or in which treating liquid has been sufficiently diluted or in which treating action has been quenched by a quenchant. In other words, non-treatment portion 959 generally includes all of substrate surface 952 except treating area 955. It is understood that in some embodiments, treatment of a wafer begins at the peripheral edge and proceeds towards the center.

Figure 48:
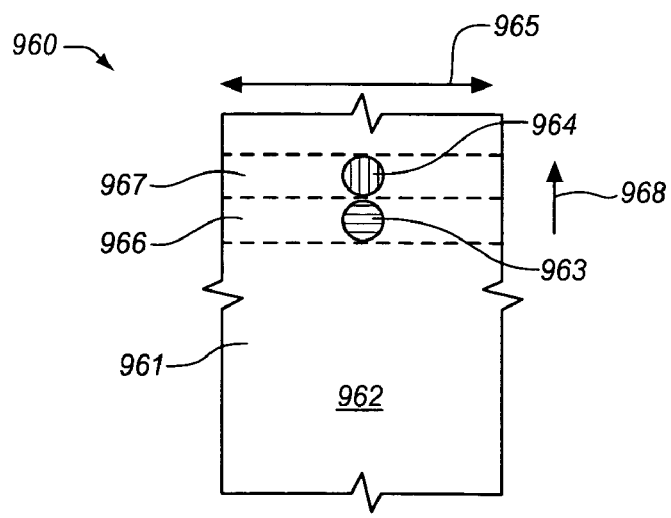
FIG. 48 depicts schematically a top-down view of a substrate surface on which treatment liquid is being applied to a treating-liquid impact area and diluent or quenching liquid is being applied to a quenching-liquid impact area.

FIG. 48 depicts schematically a top-down view 960 of a substrate 961 having substrate surface 962 on which treatment liquid is being applied to a treating-liquid impact area 963, and on which diluent or quenching liquid is being applied to a diluent/quenchant impact area 964. As substrate 961 is moved in a horizontal direction (indicated by arrows 965, treating liquid wets treating area 966 and diluent/quenchant liquid wets quench area 967. As substrate 961 is thereafter moved in a vertical direction in the sense of arrow 968, the positions of the treating area and quench area shift correspondingly.

Figure 49:
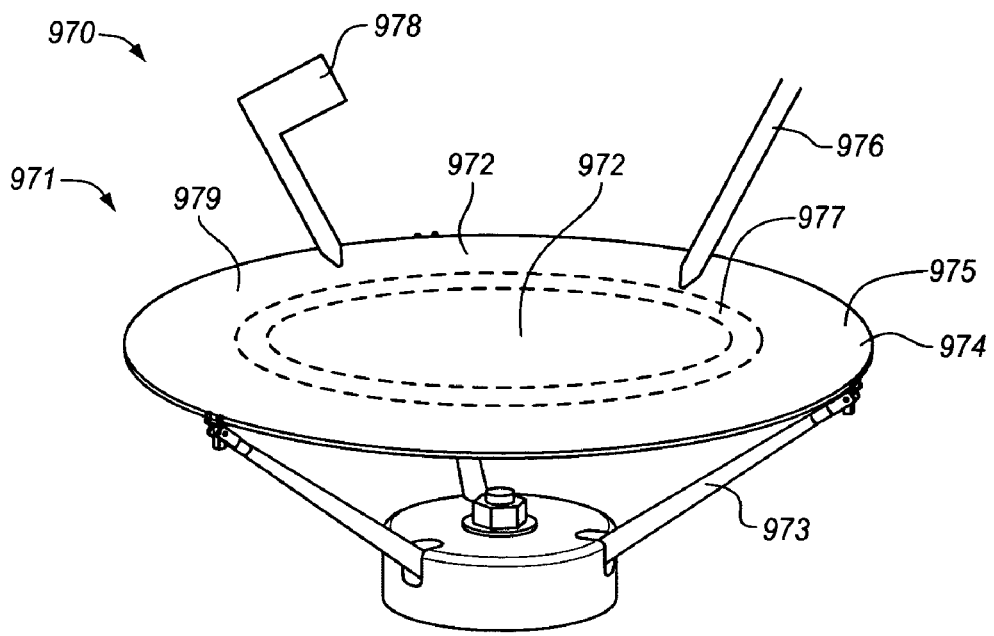
FIG. 49 depicts a perspective view of a system operable for localized liquid treatment (e.g., localized liquid etching) of a substrate surface in accordance with the invention.

FIG. 49 depicts perspective view 970 of a system 971 operable for localized liquid treatment (e.g., localized liquid etching) of a substrate surface in accordance with the invention by contacting a localized treatment area and not contacting non-treatment portion 972. System 971 comprises a wafer chuck 973 that is operable to hold a substrate wafer 974 having a substrate face 975. As depicted in FIG. 49, a stylus-like treating liquid applicator 976 is applying treating liquid to substrate surface 975 and thereby contacting a treating area 977 as wafer 974 rotates during an intermediate stage of liquid treatment (e.g., etching). A quench nozzle 978 is dispensing diluent or quenching liquid that contacts a quench area 979.

Figure 50:
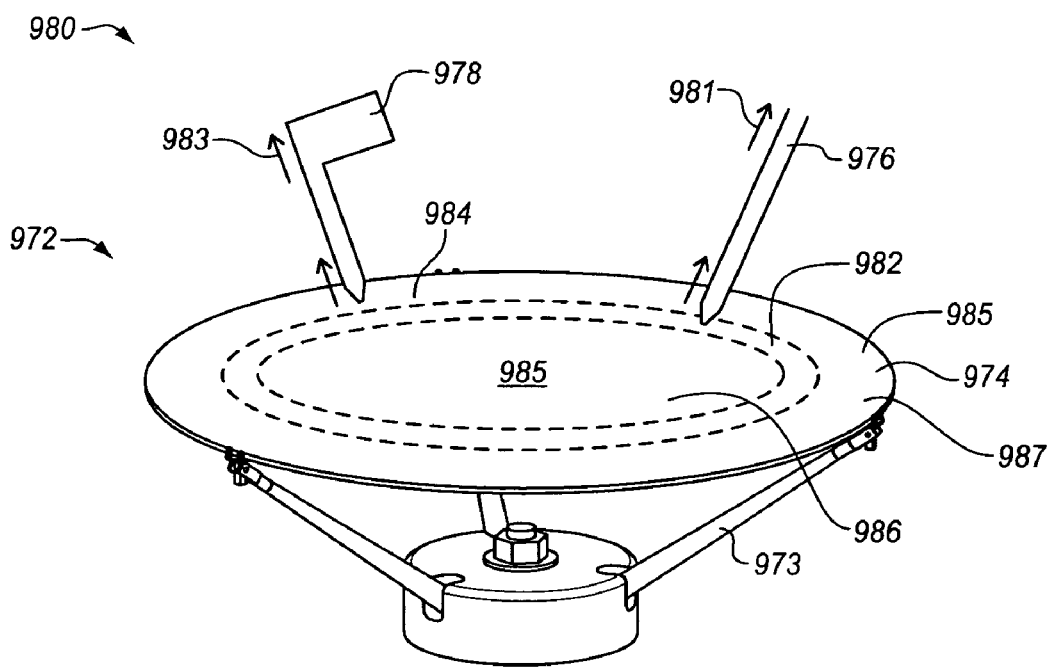
FIG. 50 depicts a perspective view of the system and substrate of FIG. 49 in a subsequent stage of liquid treatment in which the applicator has been moved radially outwards to form a new treating area, and the quench nozzle has moved radially outwards to form a new quench area.

FIG. 50 depicts perspective view 980 of system 971 and substrate 974 in a subsequent stage of liquid treatment in which stylus-like applicator 976 has been moved radially outwards as indicated by arrows 981 to form a new treating area 982 located radially outwards from previous treating area 977 (FIG. 49), and quench nozzle 978 has moved radially outwards indicated by arrows 983 to form new quench area 984 located radially outwards from treating area 982. Non-treatment portion 985 includes those portions 986 and 987 of substrate 974 not being treated at a particular point in time.

Figure 51:
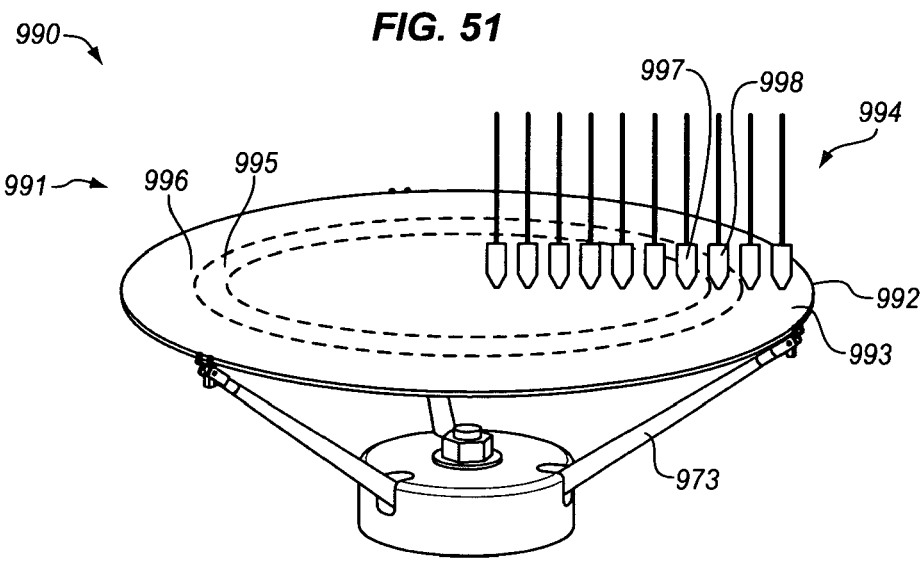
FIG. 51 depicts schematically a perspective view of a system in accordance with the invention for conducting localized liquid treatment (e.g. liquid etching), comprising a plurality of nozzles operable to direct a stream or spray of a treating liquid or a quenching liquid.

FIG. 51 depicts schematically a perspective view 990 of a system 991 in accordance with the invention for conducting localized liquid treatment (e.g. liquid etching). System 991 comprises wafer chuck 973 for holding and rotating a substrate wafer 992 having a substrate face 993. System 991 comprises a plurality of nozzles 994 that are operable to direct a stream or spray of a treating liquid or a diluent/quenching liquid or alternately different liquids. Nozzles 994 are located in system 991 so that wafer chuck 993 is operable to locate substrate wafer 992 in such a manner that one or more nozzles 994 direct treating liquid at one or more treating-liquid impact areas to form a treating area 995. Typically, nozzles 994 are operable to form a quench area 996 radially outwards from treating area 995. Typically, after radially inward areas have been treated, an applicator nozzle 997 located radially inwards is closed to treating liquid, and a radially outwards treating nozzle 998 is opened to treating liquid so that the treating area moves radially outwards on substrate surface 993. In some embodiments, a plurality of nozzles are used to dispense treating liquid simultaneously onto substrate face 993. In some embodiments, the flowrates and or concentrations of treating liquid from a plurality of nozzles are different; for example, in some embodiments, flowrates and/or concentrations or etching liquid are tailored to accommodate different metal thicknesses at different radial locations on a substrate wafer.

Figure 52:
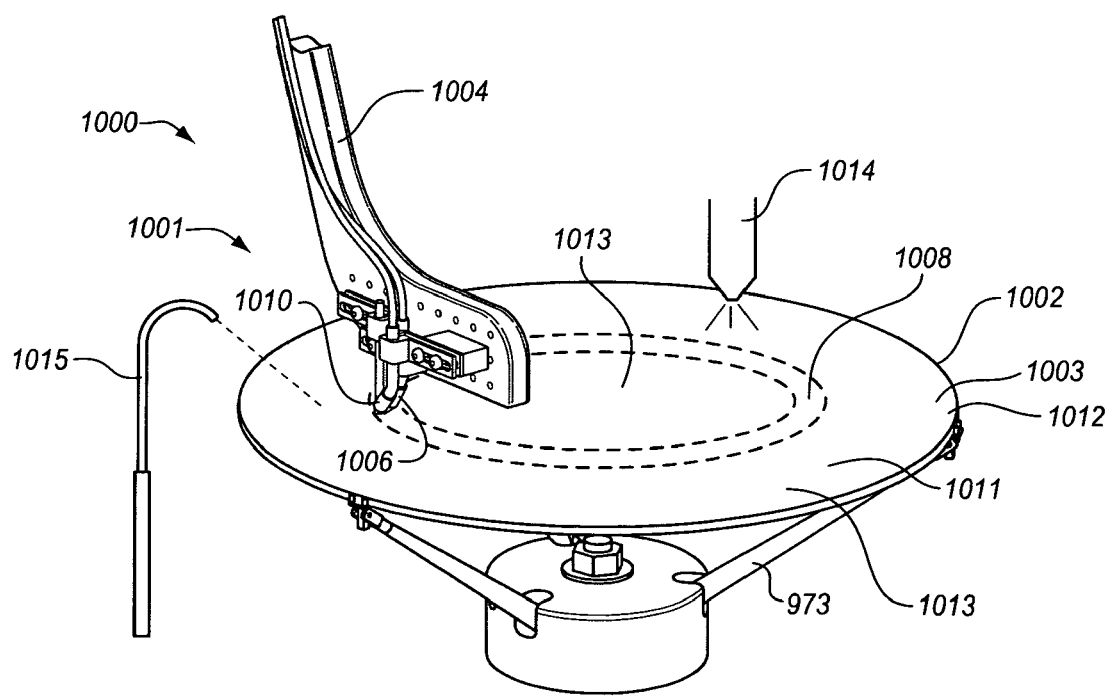
FIG. 52 depicts schematically a perspective view of a system in accordance with the invention for conducting localized liquid treatment (e.g. liquid etching); comprising a liquid dispenser boom having an applicator nozzle for directing a stream or spray of treating liquid (e.g., liquid etching solution) to a treating impact area on a substrate surface.
Figure 53:
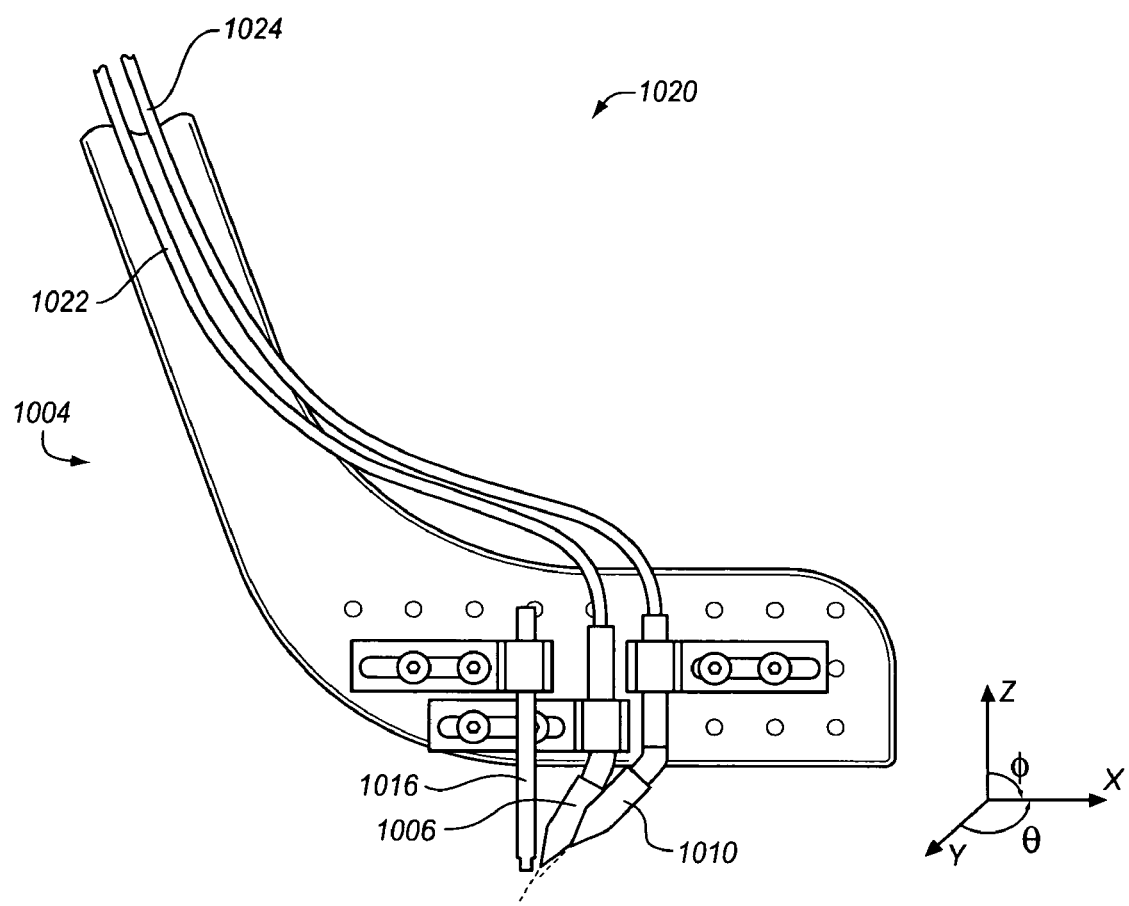
FIG. 53 depicts schematically a cross-sectional view of a dispenser boom in accordance with the invention for conducting localized liquid treatment.

FIG. 52 depicts schematically a perspective view 1000 of a system 1001 in accordance with the invention for conducting localized liquid treatment (e.g. liquid etching). System 1001 comprises wafer chuck 973 for holding and rotating a substrate wafer 1002 having a substrate face 1003. System 1001 further comprises a liquid dispenser boom 1004. Dispenser boom 1004 comprises applicator nozzle 1006 for directing a stream or spray of treating liquid (e.g., liquid etching solution) to a treating impact area on substrate surface 1003 to contact a treating area (e.g., an etching area). In some embodiments, at any point in time, treating liquid is in contact with only a relatively small, localized portion of the total area of substrate surface 1003. A substantial portion of substrate surface 1003 is not in contact with treating liquid. As depicted in FIG. 52, applicator nozzle 1006 is located to form an approximately circular etching area 1008 on rotating substrate 1002. Dispenser boom 1004 further comprises quench nozzle 1010, which is operable to direct a diluent or quenching liquid at a quenchant impact area of substrate surface 1003. As depicted in FIG. 52, quench nozzle 1010 is located to form circular quench area 1011 on rotating substrate 1002. Quench nozzle 1010 is located so that circular quench area 1011 is located radially outwards from treating (etching) area 1008 and generally extends to the peripheral edge 1012 of wafer 1002. A non-treatment portion 1013 includes substrate surface areas not in contact with treating liquid. For example, in the embodiment depicted in FIG. 52, non-treatment portion 1013 includes circular quench area 1011 and the circular area located radially inwards from treating (etching) area 1008. Typically, dispenser boom 1004 is physically supported by and attached to an inside wall of a liquid treating cell (not shown). In preferred embodiments, dispenser boom 1004 is operable to move applicator nozzle 1006 and quench nozzle 1010 radially outwards from the center of a substrate wafer (as depicted in FIG. 52), or from edge 1012 of a wafer radially inwards towards the center. System 1001 further comprises one or more global applicator nozzles 1014 that are operable to direct treating liquid (or alternately, diluent or quenching liquid) onto a relatively large portion of substrate surface 1003 or onto the entire surface 1003 to wet substrate surface 1003 globally. System 1001 further comprises optical sensor 1015 for monitoring and controlling liquid treating operations. For example, in some embodiments of a system 1001 for liquid etching of metal from substrate surface 1003, optical sensor 1015 comprises a reflectivity sensor. Alternatively or additionally, system 1001 comprises an eddy current detector for measuring local eddy currents in a treating area and thereby measuring metal thickness. Preferably, as depicted in FIG. 53, dispenser boom 1004 further comprises an endpoint sensor 1016. In some embodiments, endpoint sensor 1016 comprises a spectrophotometer for measuring the spectra of various materials, such as copper, titanium and tantalum.

FIG. 53 depicts schematically a cross-sectional view 1020 of a dispenser boom 1004. Dispenser boom comprises treating-liquid inlet tubing 1022 that fluidically connects a source (not shown) of treating liquid (e.g., liquid etching solution) to applicator nozzle 1006. Dispenser boom further comprises diluent/quenchant inlet tubing 1024 that fluidically connects a source (not shown) of diluent or quenching liquid (e.g., deionized water or liquid quenching solution) to quench nozzle 1010. Dispenser boom 1004 further comprises an endpoint sensor 1016 for measuring a property of the substrate surface to determine a composition of the surface, such as the relative amount of a particular metal on the surface. In preferred embodiments, dispenser boom 1004 is movable in the x, y, z, θ, and φ directions indicated in FIG. 53.

An exemplary applicator nozzle 944, 994, 1006 and an exemplary stylus-like applicator 976 are operable to apply etching solution (or other treating liquid) to a rotating substrate wafer to create an etching area (treating area) corresponding to a wetted circular band having a radial width in a range of about from 2 mm to 25 mm, typically in a range of about from 3 mm to 8 mm.

Figure 54:
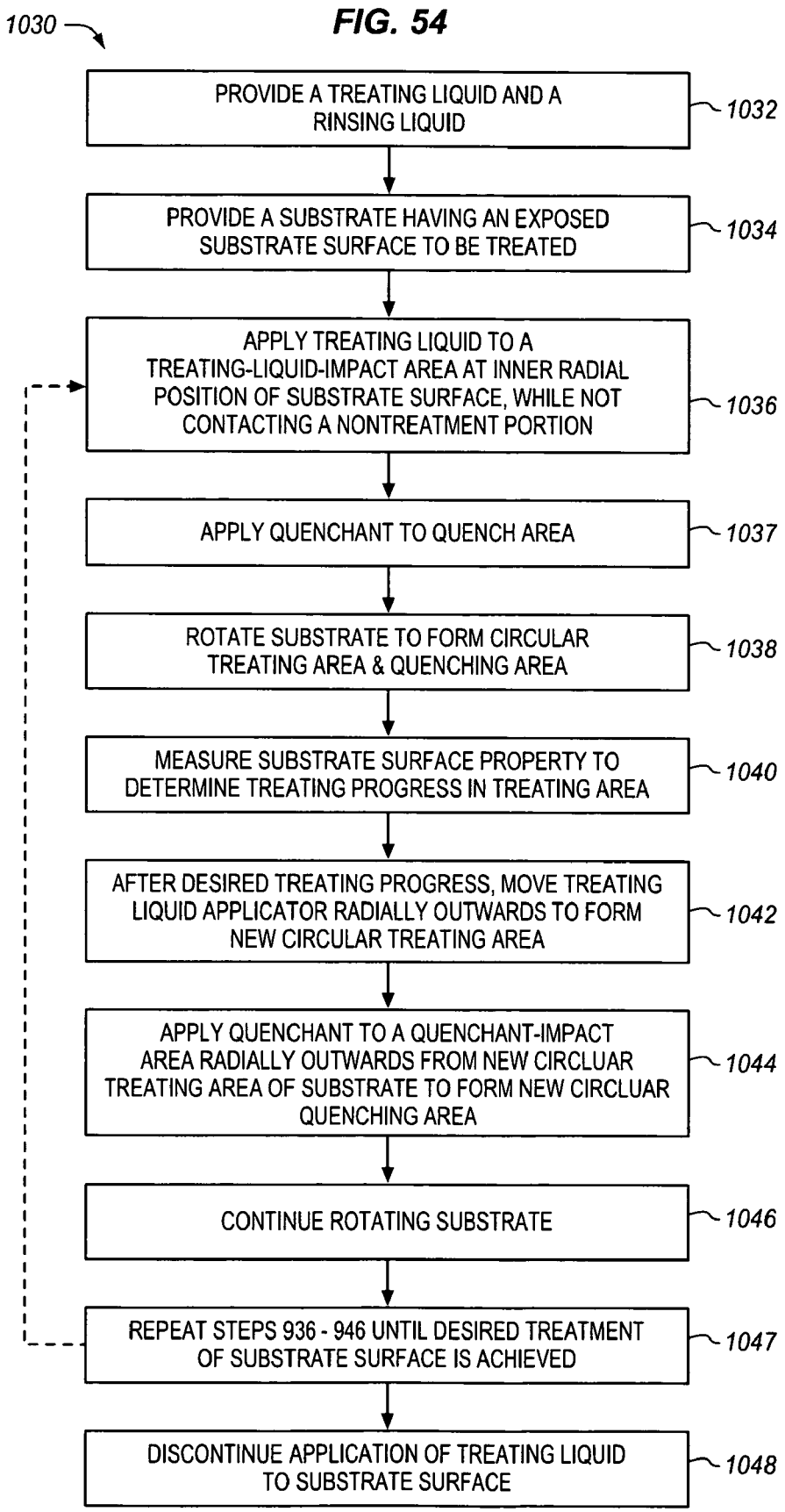
FIG. 54 shows a process flow sheet of a generalized method in accordance with the invention for localized treating of the surface of a substrate with a liquid.

FIG. 54 shows a process flow sheet of a generalized method 1030 in accordance with the invention for localized treating of the surface of a substrate with a liquid. Method 1030 is described herein with reference to FIGS. 47, 49, 50, 52 and 53. Steps 1032 include providing a treating liquid and, preferably, a diluent or quenching liquid. An exemplary treating liquid is a metal etching solution comprising a peroxide and a glycine, as described above. The term diluent or quenching liquid is used broadly to include a fluid (usually a liquid, but in some embodiments a gel, a dispersion or a gas) used to rinse away, dilute or quench (i.e., deactivate) a treating liquid. An exemplary diluent is deionized water to dilute and to rinse away an etching liquid, and thereby to quench substantially a chemical etching reaction.

Steps 1034 include providing a substrate 951, 974, 1002 having an exposed substrate surface 952, 975, 1003 to be treated. Steps 1036 include applying treating liquid to a treating-liquid impact area 953 at an inner radial position of the substrate surface, while not contacting a nontreatment portion 959, 972, 1013 of the substrate surface. Steps 1037 include applying quenching liquid to a quenching-liquid impact area 953 at an inner radial position of the substrate surface, while not contacting a treatment area. Steps 1038 include rotating substrate 951, 974, 1002 to form an approximately circular treating area 955, 977, 1008. Steps 1040 include measuring a substrate surface property to determine treating progress in treating area 955, 977, 1008 and for endpoint detection. For example, in embodiments for etching metal from a substrate surface, an optical sensor 1015 is useful for measuring reflectivity or surface color to determine a thickness of metal in a localized etching area. Similarly, spectraphotometer 1016 measures the presence of particular materials at substrate surface 1003. Steps 1042 include moving a treating-liquid applicator 976, 1006 radially outwards to form a new circular treating area 982 and a different non-treatment portion 985 on the rotating substrate. Steps 1044 generally include applying a diluent or quenching liquid to a new quenchant-impact area 954 that is generally radially outwards from the new circular treating area of the substrate to form a circular quench area 984 included in non-treatment portion 985. In some embodiments, steps 1044 include applying a diluent or quenching liquid to the most recent treating area to quench (effectively stop) the treatment there as the treating area is moved to the new treating area. Steps 1044 provide increased control over etching processes by enabling rapid quenching of etching reactions. Steps 1046 include continuing to rotate the substrate. Steps 1047 include repeating steps 1036-1046 until desired treatment of the entire substrate surface is achieved. Steps 1048 generally include discontinuing the application of treating liquid to the substrate surface, cleaning and rinsing the substrate surface, and preparing the substrate surface for further fabrication operations.

Systems and methods in accordance with the invention for localized liquid etching (or other liquid treatment) enable greater flexibility and control of etching operations compared to global etching techniques. Radial variations in average thickness of metal are usually much greater across the entire radius of the wafer than across a narrow etching area 955, 977, 982, 1008 in accordance with the invention. Localized feedback control provided by measuring metal thickness in accordance with the invention enables tailoring of etching dwell times and etching rates to a particular etching area. In some embodiments, etching rates are controlled by varying the concentrations of reactants. For example, in an etching solution comprising hydrogen peroxide and glycine in accordance with the invention, the copper etching rate typically decreases as the relative hydrogen peroxide concentration increases. In some embodiments, the copper etching rate of the exemplary solution is varied by shifting the pH value. A high pH value enhances oxidation through peroxide. A low pH value enhances oxide etching associated with glycine. It is believed that the peroxide forms a surface-protecting oxide film, which is then removed through the glycine. In some embodiments, quenching of etching reactions conducted using an etching solution comprising an oxidizing agent and an oxide-etching agent is effected by shifting the pH value. Application of a highly alkaline solution to a rinse area of a substrate to increases the pH above pH 12, effectively shuts down the oxide etching. Application of a highly acidic solution to a rinse area of a substrate to decrease the pH below pH 3, effectively shuts down the oxidation. Application of a solution containing a copper-complexing agent at a concentration of about 50 weight percent (wt %), or greater, effectively stops metal oxidation. Also, average metal protrusion heights typically vary radially across a wafer, and localized etching techniques provide better controlled etching of metal above features than global techniques.

Example 2

Localized metal etching in accordance with the invention was performed to remove copper from a series of 200 mm semiconductor wafers using an etching solution in accordance with the invention together with a diluent (deionized water) or one of various quenching solutions. Liquid etchant was dispensed onto a wafer that was rotating at 500 rpm at a location about 50 mm from the wafer center. The liquid etchant was dispensed for 30 seconds at a flow rate of 40 milliliters per minute (ml/min) through an applicator nozzle having a diameter of 0.02 inches (0.51 mm). The etchant liquid comprised an etching solution containing 5 g/L of 30 weight percent (wt %) $H_2O_2$ and 4 g/L glycine. Concurrently, diluent or quenching liquid was dispensed for 30 seconds at a flow rate of 150 ml/min through a quench nozzle having a diameter of 0.03 inches (0.76 mm). The quench nozzle was located next to the etchant applicator nozzle, 0.43 inches (about 11 mm) radially outwards from the applicator nozzle. In one stationary etching procedure, deionized water was dispensed through the quench nozzle. In another etching procedure, a copper sulfate quenching solution having a concentration of 13.3 g/L $CuSO_4$ was dispensed. In another etching procedure, the quenching solution contained 8 ml/L TMAH at pH 12.20. In another etching procedure, the quenching solution contained 1 ml/L HCl. In still another etching procedure, the quenchant contained 200 ml/L Enthone "Viaform" leveler. Etching procedures were conducted at room temperature. After application of the etching solution and concurrent application of the diluent or quenchant, the amount of copper removal was measured across each wafer. The results were plotted on the graph of FIG. 55.

Figure 55:
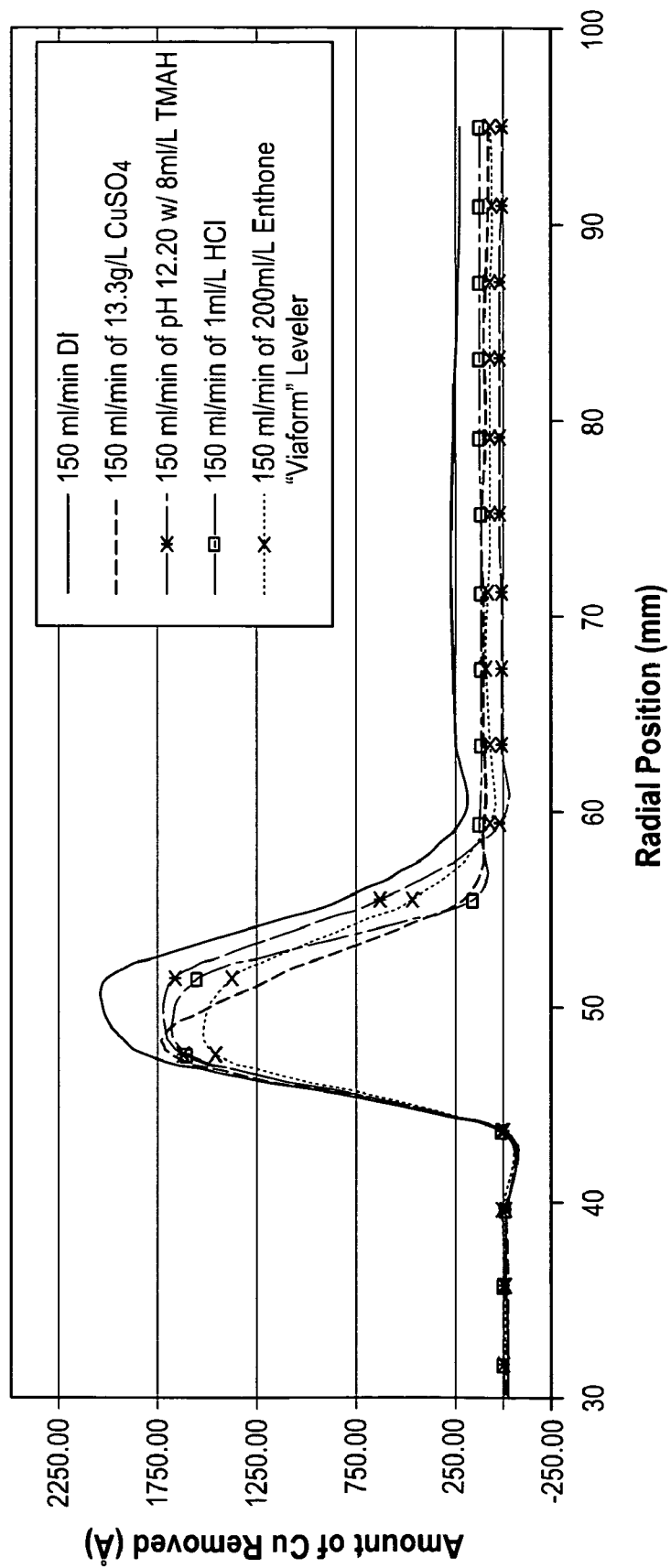
FIG. 55 contains a graph of stationary etch profiles for a hydrogen peroxide—glycine etching liquid and various compositions of quenching liquid in which the amount of copper (in Å units) removed is plotted as a function of radial position on a 200 mm substrate wafer.

FIG. 55 contains a graph of stationary etch profiles for a hydrogen peroxide—glycine etching liquid and various compositions of quenching liquid in which the amount of copper (in Å units) removed is plotted as a function of radial position on a 200 mm substrate wafer. The data show that copper removal after 30 seconds was greatest at the location of the stationary etchant applicator nozzle, which was located about 50 mm radially outwards from the center of the wafer. The maximum amount of copper removal in each procedure was less than or equal to about 2000 Å (or 200 nm). Because there was no wetting of the rotating wafer radially inwards from the location of the applicator nozzle, no copper was removed radially inwards from the applicator nozzle. The amount of copper removed radially outwards from the nozzle did not exceed about 250 Å at positions on the wafer more than about 55 or 60 mm radially outwards from wafer center. In other words, most of the etching was localized in a band having a width of about 10 mm to 15 mm centered about the location of the etchant applicator nozzle. The quenching solution containing 8 ml/L TMAH was the most effective in minimizing the amount of copper removal at radial positions greater than 60 mm from a wafer center.

Example 3

A localized etching procedure in accordance with the invention was conducted to remove copper from 200 mm semiconductor wafers under conditions similar to those described above in Example 2 to demonstrate the effect of diluent flowrate on localized copper removal.

As in Example 2, liquid etchant was dispensed onto a wafer that was rotating at 500 rpm at a location about 50 mm from the wafer center. The liquid etchant was dispensed for 30 seconds at a flow rate of 40 ml/min through an applicator nozzle having a diameter of 0.02 inches (0.51 mm). The etchant liquid comprised an etching solution containing 5 g/L of 30 weight percent (% wt.) $H_2O_2$ and 4 g/L glycine. Concurrently, deionized water was dispensed for 30 seconds at a flow rate of 2700 ml/min through a quench nozzle having a diameter of 0.156 inches (4.0 mm). The quench nozzle was located next to the etchant applicator nozzle, 0.43 inches (about 11 mm) radially outwards from the applicator nozzle.

After application of the etching solution and concurrent application of the deionized water, the amount of copper removal was measured across the wafer. The results were plotted on the graph of FIG. 56 together with data associated with deionized water from Example 2.

Figure 56:
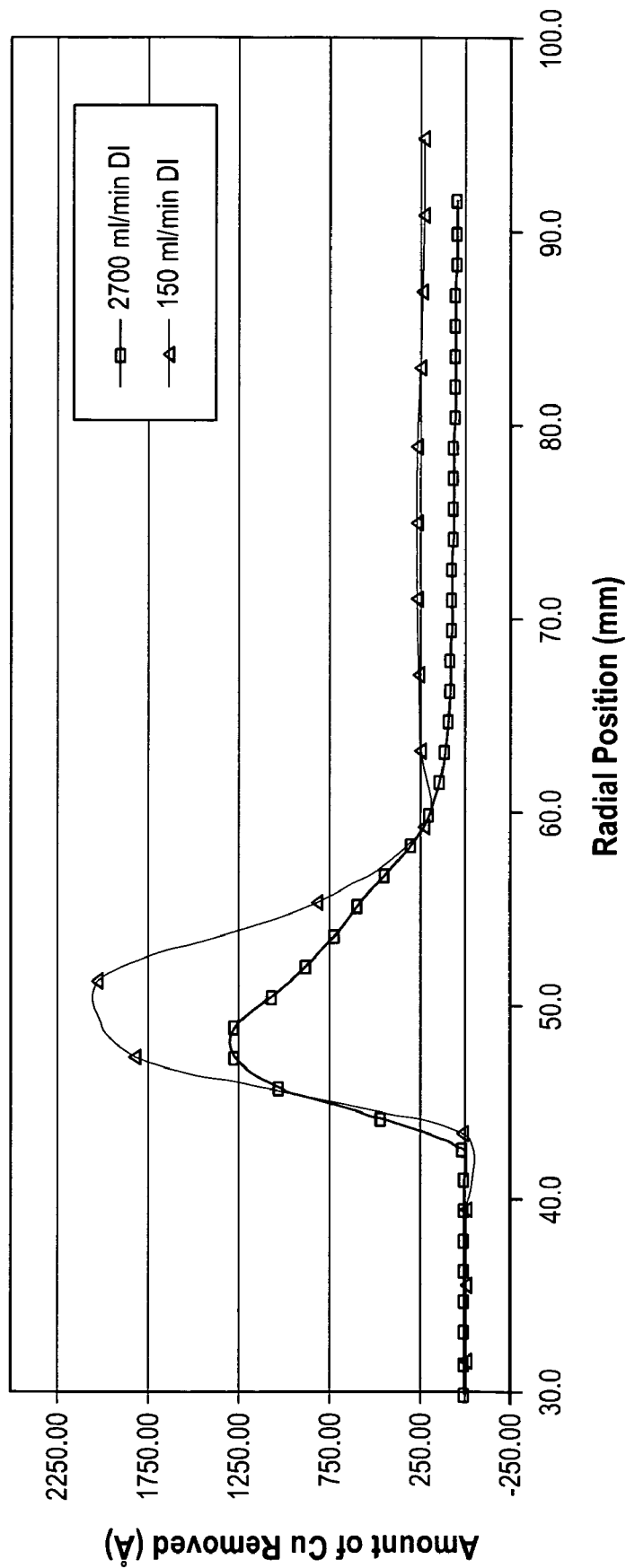
FIG. 56 contains a graph of stationary etch profiles for hydrogen peroxide—glycine etching liquid and DI (deionized water) diluent in which the amount of copper (in Å units) removed is plotted as a function of radial position on a 200 mm substrate wafer for two different flow rates of deionized water.

FIG. 56 contains a graph of stationary etch profiles for hydrogen peroxide—glycine etching liquid and DI (deionized water) diluent in which the amount of copper (in Å units) removed is plotted as a function of radial position on a 200 mm substrate wafer for the two different flow rates of deionized water. The data show that a relatively large increase in the flow rate of deionized water (diluent) significantly decreases the amount of metal removal at positions on the substrate wafer radially outwards from 60 mm, but the high flow rate of deionized water also significantly decreases the rate of metal removal in the localized band under the etchant applicator nozzle.

Example 4

A localized etching procedure was conducted on each of several semiconductor wafers to study the effect of scanning velocity on the amount of copper removed from particular radial locations on a substrate wafer.

Liquid etchant was dispensed onto a wafer rotating at 400 rpm from an applicator nozzle starting at the center of a wafer and moving radially outwards to the edge of the wafer at a constant scanning velocity of 1 mm/sec. The liquid etchant was dispensed at a flow rate of 40 ml/min through an applicator nozzle having a diameter of 0.02 inches (0.51 mm). As in Example 2, the etchant liquid comprised an etching solution containing 5 g/L of 30 weight percent (% wt.) $H_2O_2$ and 4 g/L glycine. Concurrently, quenching liquid was dispensed at a flow rate of 150 ml/min through a quench nozzle having a diameter of 0.03 inches (0.76 mm). The quench nozzle was located next to the etchant applicator nozzle, 0.43 inches (about 11 mm) radially outwards from the applicator nozzle. The quenching solution contained 8 ml/L TMAH at pH 12.20. Under similar conditions, etchant and quenching liquid were dispensed on another wafer, except the applicator and quench nozzles were scanned across the wafer from center to edge using a modified scanning velocity profile. At the center of the wafer, the nozzles moved radially outwards at a speed of 3 mm/sec. Then, between radial positions of about 5 and 15 mm from the center, the scanning velocity was ramped down to about 2 mm/sec. Then, between radial positions of about 20 and 35 mm from the center, the scanning velocity was ramped down to about 1.5 mm/sec. Finally, between radial positions of about 45 and 55 mm from the center, the scanning velocity was ramped down to about 1 mm/sec.

Figure 57:
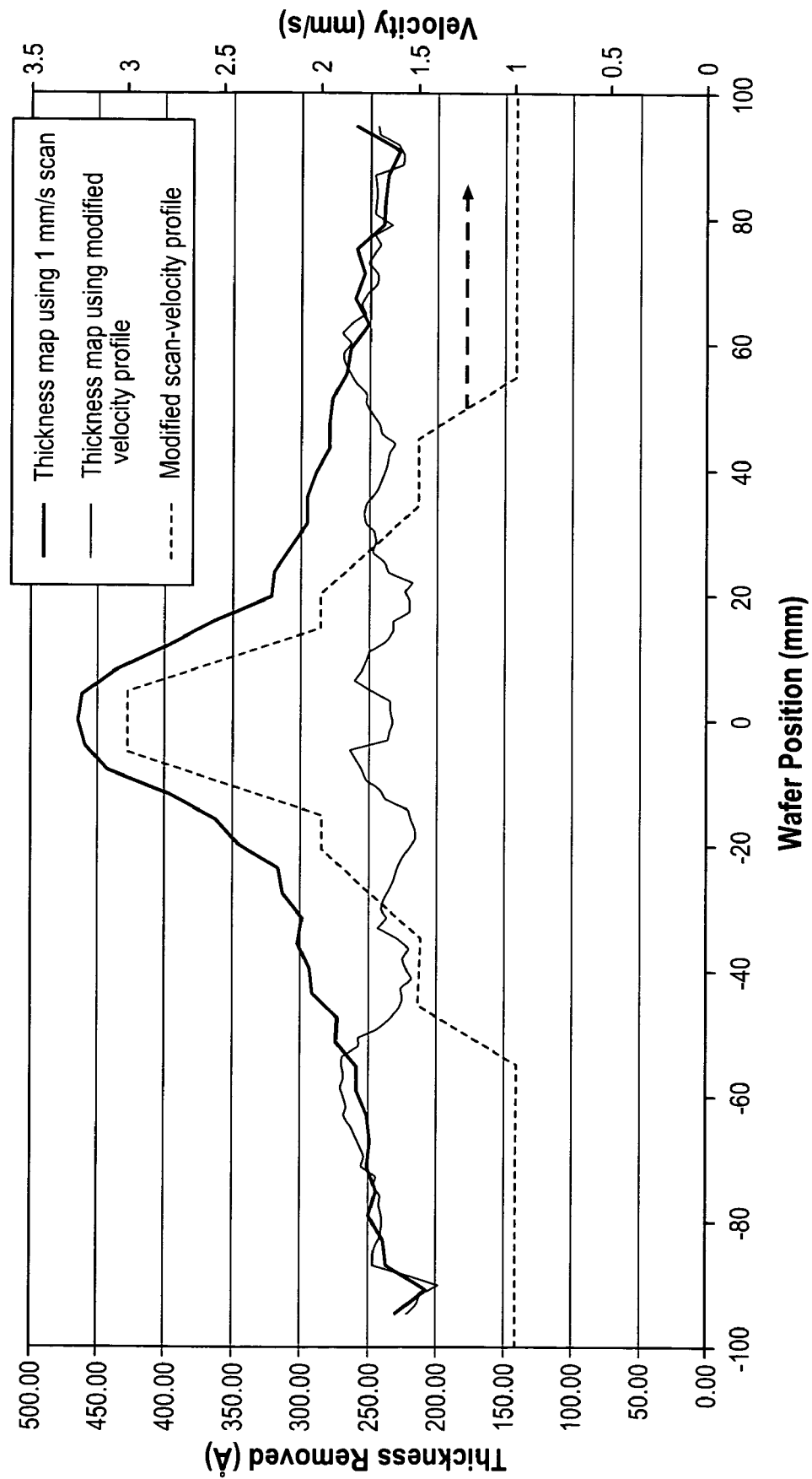
FIG. 57 contains a graph of scanning etch profiles for hydrogen peroxide—glycine etching liquid and TMAH quenching liquid in which the amount of copper (in Å units) removed is plotted as a function of radial position on a 200 mm substrate wafer after etching using a constant velocity (1 mm/sec) scan and a modified scan-velocity profile.

The amount of copper removal was measured across each wafer. The results were plotted on the graph of FIG. 57. FIG. 57 contains a graph of scanning etch profiles for hydrogen peroxide—glycine etching liquid and TMAH quenching liquid in which the amount of copper (in Å units) removed is plotted as a function of radial position on a 200 mm substrate wafer after etching using the constant velocity (1 mm/sec) scan and the modified velocity profile. Also, the scanning velocity of the applicator and quenching nozzles associated with the modified velocity profile was plotted as a function of radial wafer position. The copper-removal data associated with constant radial scanning velocity of 1 mm/sec indicate that the amount of copper removed from the center region of the wafer (e.g., from the center out to a radial position of 20 mm) was significantly greater than the amount of copper removed from the outer regions of the wafer. In contrast, the data associated with the modified velocity profile show that the amount of copper removed from the substrate surface varied only about 50 Å at all radial locations across the wafer. Generally, the data indicate that tailoring of the scanning velocity profile is useful for tailoring and adjusting the profile of localized etching of metal (or other material) from a rotating substrate wafer.

Proximity Focusing Scanning Microplater (PFSM)

Figure 58:
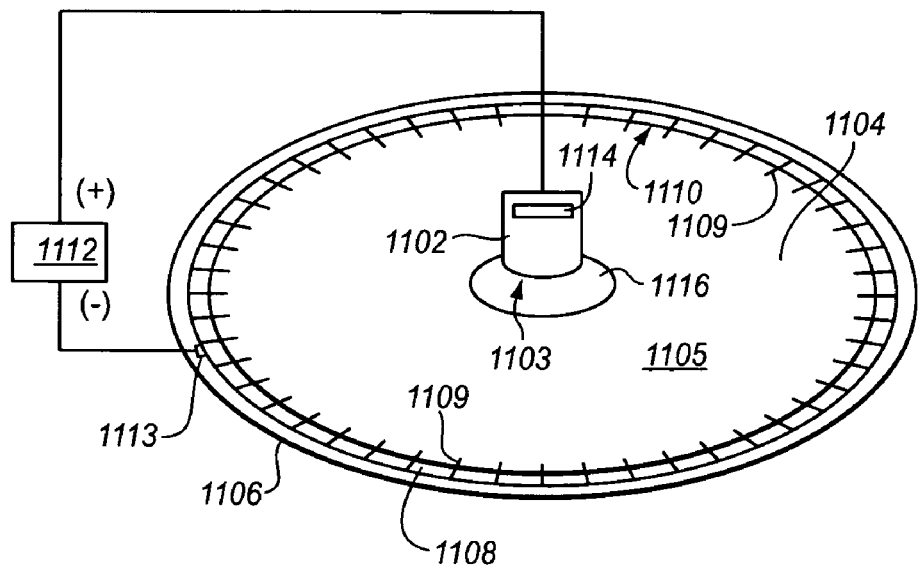
FIG. 58 depicts schematically a proximity focusing scanning microplating head having a bottom opening positioned a small distance above a substrate surface.
Figure 59:
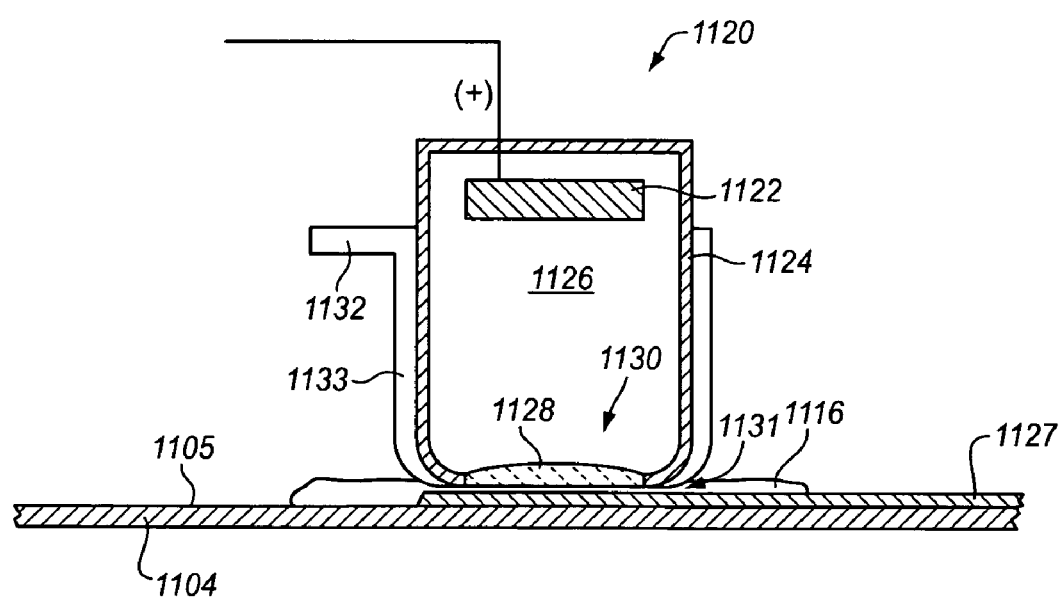
FIG. 59 depicts an embodiment of a scanning microplating head assembly in which a counter electrode is housed in a microplating head chamber and exposed to electrolyte contained within the plating head chamber, and a membrane is located at a virtual anode aperture at the bottom of the head.

A proximity focusing scanning microplater (PFSM) is described herein with reference to FIGS. 58 and 59. A PFSM enables electrolytic plating on thin barrier or seed materials (sheet resistance in excess of 200 ohm cm) with high uniformity. Fields of application of PFSM technology include but are not limited to deposition of electrolytic copper seed layers and electrofilling of damascence structures directly onto thin resistive barriers. PFSM typically avoids influences of the so-called terminal effect. PFSM techniques are also useful for direct electrolytic plating of cappng and copper electromigration (EM) containment layers (e.g., Co, Ni) over damascene lines by using an intact electrically-conductive barrier layer (used to carry electrical current from the wafer periphery to the location of deposition). Due to the small size of the PFSM plating head, enhanced and effective use of pulse plating while plating onto relatively highly resistive barrier materials is enabled. This is because the capacitance of the system/circuit, being proportional to plating area, is substantially smaller than when plating an entire wafer surface at once. Scanning with the proximity focusing head typically enables more uniform deposition than achieved by full-wafer plating techniques. It mitigates the challenges of rapid uniform wetting of an entire wafer surface and provides better control of exposure to bath additives. PFSM helps to overcome previous industry challenges of plating nucleation on barriers and of non-uniform plating initiation associated with terminal resistance.

FIG. 58 depicts schematically a proximity focusing scanning microplating head 1102 having a bottom opening 1103 positioned a small distance above (or below, depending on the wafer orientation with respect to earths gravity) a substrate wafer 1104 having substrate surface 1105. Generally, "small distance" implies a distance small with respect to the characteristic global distance of the wafer, its diameter. More specifically, opening 1103 of head 1102 generally is positioned a distance of about from 0.1 mm to 5 mm from the substrate surface, preferably less than 2 mm from the substrate surface. Surface tension of the electrolyte at these dimensions helps to mitigate fluid flowing away from the area of treatment (under head 1102). In some embodiments of PFSM in accordance with the invention, the lower edge of a membrane (depicted in FIG. 59) at head opening 1103 that defines the head's bottom area physically touches a portion of wafer substrate surface 1105.

Systems and methods operable to treat a portion of a substrate wafer using a thin liquid layer of treating liquid in a thin gap between a treating head and the surface of a wafer are disclosed in co-owned and co-pending U.S. patent application Ser. No. 11/213,190, filed Aug. 26, 2005, by Mayer et al., titled "Pad-Assisted Electropolishing", in co-owned and co-pending U.S. patent application Ser. No. 10/609,518, filed Jun. 30, 2003, by Mayer et al., titled "Liquid Treatment Using Thin Liquid Layer", and in U.S. patent application Ser. No. 10/739,822, filed Dec. 17, 2003, by Mayer et al., having the title "Method for Planar Electroplating", which are all incorporated herein by reference.

As depicted in FIG. 58, wafer 1104 is supported in wafer holder 1106. Wafer holder 1106 comprises a circular electrical contact ring 1108 near the periphery of wafer holder 1106 and a plurality of electrical edge contact fingers 1109 at the periphery for making electrical contact between electrical contact ring 1108 and edge 1110 of substrate surface 1105. As depicted in FIG. 58, a negative terminal of a power supply 1112 is connected to electrical contact ring 1108 via an electrical buss 1113. A positive terminal of power supply 1112 is connected to anode 1114 located within proximity focusing head assembly 1102. Typically, contact ring 1108 and contact fingers 1109 are enclosed or sealed to avoid inadvertent exposure to the plating electrolyte and inadvertent plating thereupon. Similar to the structures described in U.S. Pat. No. 6,755,946, issued Jun. 29, 2004, to Patton et al., which is hereby incorporated by reference, in some embodiments in accordance with the invention, additional electrical contact fingers located at the periphery of wafer holder 1106 are operable to measure electrical resistance or potential through metal on substrate face 1105 as a means of monitoring the progress and uniformity of metal film growth during the plating operation. In some embodiments in accordance with the present invention, current is supplied to one or more electrical contacts proximate to the electrochemical portion of a substrate face, while substantially no current is supplied to the other electrical contacts. By varying the current supplied to individual electrical contacts in such embodiments, the current distribution across a conductive metal-containing substrate face is modified. As a result, some portions of substrate face 1105 are less biased electrically with respect to electrolytic liquid than a portion at which microplating is being conducted. As a practical matter, large ohmic resistance to current flow through a relatively thin metal film on substrate face 1105 substantially prevents electroplating of metal at regions of substrate face 1105 away from head 1102, even when current is supplied through more than one or all electrical contacts.

In a preferred embodiment, PFSM head assembly 1120 (FIG. 59) is brought face down (i.e., bottom 1103 down) (with respect to the earths gravitational field) and wafer surface 1105 is face up. In some embodiments, the wafer surface 1105 is initially completely dry of electrolytic plating solution. Typically, electrolytic plating solution 1116 is introduced in a thin gap created between microplater head 1102 and wafer 1104. Then, wafer 1104 is rotated and head 1102 is scanned (e.g., linearly, orbitally or otherwise) with respect to the wafer center. Other means and types of relative motion are envisioned. At sufficiently small gaps and wafer rotation rates, due to dominant surface tension forces, the plating solution does not substantially move or wet previously dry areas of the wafer, so these areas remain dry and unable to complete the ionic or electrolytic side of the electrical circuit. Starting the operation (plating and/or wetting) at the wafer center and progressing radially outwards usually is a preferred manner of operation. Nevertheless, operation starting at the edge and moving to the center is sometimes useful for particularly resistive or corrosion sensitive barrier/seed films, because the deposited metal in the outer radii then reduces the voltage drop more than would otherwise be observed without depositing metal there first.

Conventionally, wafer 1104 is immersed in an electrolytic plating solution usually either face up or face down. In a face down configuration, the commercially-available SABRE® wafer holder comprising a plating cup, cone and clamshell is suitable. PFSM techniques using microplating head 1102 and other elements are useful for improving initial plating uniformity compared with full-wafer simultaneous-plating of a wafer immersed in an anode chamber. In some embodiments, microplating head 1102 is simply added in a space above the plating bath and anode chamber of a conventional-type plating cell or within the bath and above a standard anode chamber, but then the standard anode (used for global and fully simultaneous wafer-face plating) is not energized until after completion of the microplating operation. After completion of microplating operations, the microplating head is simply moved out of the space between the wafer and the standard anode (e.g., to the side), and additional operations proceed as in current non-PFSM modes of operation. It is understood that the term "standard anode" herein includes many of the advanced features already introduced for improving plating uniformity, such as multiple concentric anodes, dynamic iris, and asymmetric anodes.

FIG. 59 depicts an embodiment of a scanning microplating head assembly 1120. A counter electrode 1122 is located (enclosed or "housed") in microplating head chamber 1124 and exposed to electrolyte 1126 contained within plating head chamber 1124. In some embodiments, electrolyte 1126 in plating head chamber 1124 comprises the same solution (or similar composition) as electrolytic deposition solution 1116 used to plate metal 1127 onto wafer surface 1105 of wafer 1104. A membrane 1128 is located at virtual anode aperture 1130 to contain electrolyte fluid 1126 and separate fluid and particles in microplating head chamber 1124 from fluid and particles in thin film gap 1131, from which the plating actually occurs. Examples of suitable membrane material include cationic conductive media (e.g., Dupont NAFION®) and microporous plastics, glass, and ceramics. Alternatively, membrane 1128 comprises porous felt-like material, similar to that used in well known brush plating operations. The felt-like separator is lightly rubbed over surface 1105 and electrolyte wicks out of the material onto the wafer as contact is made. Use of a felt-like separator can improve control of electrolyte exposure on the wafer by preventing it from flowing or weeping away from the PFSM head. The primary function of membrane 1128 is to control and to minimize electrolyte flow and, in some cases, to impede the mixing of electrolytes and the transport of any particles generated by the counter electrode.

FIG. 59 also depicts a plating solution inlet tube 1132 and manifold 1133, optionally coaxial with the counter electrode (anode) chamber 1124, but it is understood that introduction of the electrolyte can be accomplished by other means (such as a simple tube attached to or in proximity to head 1124).

Counter electrode 1122 comprises either an active electrode (i.e., substantially comprising the metal being electrodeposited) or an inert or dimensionally stable electrode (e.g., platinum, platinum coated metal, Ti) as known in the art. A reference electrode or an electrode lead tube (often referred to in the art as a Luggin capillary) (not shown) is optionally attached or housed in proximity to and in contact with the plating solutions, within head chamber 1124, within plating solution manifold 1133, or outside plating head 1124 and manifold 1133 but in electrical connection with plating electrolyte 1116 that is in contact with wafer surface 1105.

Opening 1130 of microplating head assembly 1120 proximate to the substantially horizontal plane of membrane 1128, as shown in FIG. 59, is the location of a "virtual" counter electrode. The position and plane of a virtual counter electrode is mathematically and functionally similar to a case in which the counter electrode is physically at that same location, acting as a source of applied current. By physically locating electrode 1122 within microplating head chamber 1124 and placing membrane 1128 between counter electrode 1122 and working electrode 1105 (i.e., cathodic substrate surface 1105), the same end result is achieved as having the counter electrode 1122 very close to substrate surface 1105, while having the benefit of locating it mechanically and otherwise suitably to simplify design and operation.

When a water based electrolyte 1116 is used, surface tension forces predominate when gap 1131 between head opening 1130 and wafer surface 1105 is less than 2 mm and the rotation rate or relative movement between the wafer and the head is kept below about 50 rpm (200 mm wafer). As a result, in some embodiments, liquid is introduced to a dry wafer from the area around or through the head without liquid spreading radially outward. When operating this way, the outer regions of the wafer, initially dry, are slowly and controllably wetted only after the head passes over that region, and thereafter plated.

FIG. 59 shows electrolyte 1116 wetting the surface only at a certain area on wafer surface 1105, which is generally preferred. It is understood, however, that in some embodiments, wafer surface 1105 is substantially or completely wetted by or immersed in an electrolyte.

While not shown in FIG. 59, in some embodiments, a brush electrical contact attached or in close proximity to cathode 1104, 1105 is useful in supplying electrical current to substrate 1104. Suitable brush materials include metal "wool" or carbon contacts. In preferred embodiments, contact is made outside of a substrate region that is wetted, but closer to the surface portion being electroplated (i.e., not at wafer edge 1110).

In some embodiments, plating head 1120 contains a wick or membrane that is operable to soak up electrolyte and to keep the electrolyte fixed in gap region 1131 between microhead chamber 1124 and wafer surface 1105. Scanning the surface with the wick in contact with the wafer allows for slow controlled wetting of the previously dry wafer and for keeping the region wetted localized to those areas under or previously under the wick. This is similar to well known selective plating or brush plating, only the operation is performed on a wafer and in a manner to solve such problems as terminal effect and nucleation problems.

In some embodiments, equipment for other operations is incorporated into the scanning microplating apparatus. In some embodiments, a wafer is chemically treated by a nozzle, wick or other appropriate device "upstream" or prior to the microplating operation. Examples of pretreatments include chemical activation of the surface (e.g., using a concentrated HI solution or strong alkaline solution to remove residual oxide from the barrier or dielectric layer). Another example is simple wetting of the wafer with water, or with electrolyte just before passing under the microhead. Alternatively, water can be used to dilute and thereby reduce the conductivity of electrolyte that might seep away from the area of the PFSM head. Such a pretreatment operation typically is followed by a rinsing step between the pretreatment and the scanning microplating operation. In some embodiments, a plurality of operations are accomplished in the same operational module using appropriate hardware (e.g., multiple heads, spray nozzles, etc).

In some embodiments, integration of fabrication processes before, after or in between PFSM operations is conducted in accordance with the invention. Examples include apparatuses that perform in-situ measuring or pseudo-in-situ measuring (where the process is stopped, a measurement is made, and the process is continued), which are particularly useful in controlling the end results. Use of a peripheral "ring" of contact fingers 1109 (FIG. 58), some of which are electrically isolated (either in time or permanently) from fingers supplying current to the plating operation, enables dynamic cross-wafer measurements from which an appropriate mathematical algorithm determines the film thickness profile as plating progresses. In some embodiments, such measuring is conducted with a reference electrode or Luggin capillary in close proximity to the surface. Other measuring techniques include optical measurement (reflectometry/colorimetry) and eddy current measurements, among others.

The PFSM method and apparatus described above address a number of difficult problems inherent to present and future requirements of the integrated circuit industry. For example, PFSM in accordance with the invention mitigates thick plating at the wafer contact edge that is invariably observed with thin seed and barrier plating. A benefit of PFSM technology is an enhanced ability to use pulse plating to obtain desirable electrodeposition film attributes, such as small grain size, and to use short and high amplitude current density pulses that result in faradaic charge transfer (rather than capacitive double layer charging) to initiate nucleation. Another benefit of PFSM technology is the ability to use reverse pulsing while avoiding common problems such as plating on a lip seal, particle generation, and non-uniform current density "waves" over the wafer. PFSM generally provides better control of plating and pulse-plating processes at all locations of a substrate. Due to the relatively small amount of proximity-focused surface area under the plating head and the corresponding small size of the area being plated, the "circuit's" total capacitance, its distributed capacitance, and the terminal resistance are proportionally low. Thus, the small plating area increases the system's response time (i.e., decreases the RC time constant). Furthermore, once a metal film has been plated in a given small area, the head is moved away from over (or under) the area. Even though this area is typically still wetted with electrolyte (though it can be rinsed with DI water to reduce the electrolyte conductivity there), the resistance to flow through the thin film of electrolyte is often much greater than the resistance though the metal film, and so little plating occurs in the plated area after the plating head is removed from it. Parameters affecting this behavior are, for example: the plating head size (e.g., diameter of the head is cylindrical in shape); the thickness of the liquid layer; the conductivity of the electrolyte; and the proximity of the head (virtual cathode aperture) to the wafer surface.

Related to the above-mentioned advantages is the often-encountered difficulty of initiating difficulty of initiating plating of a thin-seed or barrier in the central regions of a wafer. In particular, plating a metal onto an underlying "foreign" metal typically requires an initial reduction of a native metal oxide and/or substantial energy to initiate heterogeneous nucleation of electrodepositing metal onto the foreign metal (e.g. Cu onto Ru). The underlying metal typically exhibits a substantial (hundreds of mV) overvoltage resistance to nucleation and native-oxide film reduction. This voltage drop typically is greater than the voltage drop in the seed or barrier film between the edge and the center of a wafer. Hence, plating initiates only at the outer periphery, often without progressing inward. Because metal plates at the outer periphery first, the metal-phase voltage drop at the plated peripheral area is greatly diminished, and this inhibits the ability to achieve and to maintain a sufficiently negative voltage to overcome cross-wafer resistances. For example, in the case of a galvanostatic (constant current) operation, as soon as plating commences at the outer regions, both the ohmic and kinetic system resistances to deposition drop dramatically. As a result, the driving voltage required to maintain the system set point current falls substantially. This reduces the voltage in the metal everywhere, but most importantly at points on the wafer where plating has not initiated, and it becomes unfavorable for plating to begin there subsequently. As a result, very high rates of deposition occur in a limited area at the periphery where plating initiated, and often little or no plating occurs at the inner regions. PFSM technology helps to overcome this problem.

PFSM technology is useful for a number of tailored electrochemical depositions, such as atomic layer wet deposition or electrodeposition or electro-graphing. In some applications, PFSM techniques are more suitable than more standard electrolytic methods and electrolyte formulations because, for example, they allow for the formation of more adherent "seeding" layers of, for example copper. Another useful application for PFSM, as mentioned above, is selective electrolytic plating and initiation of electroless plating by electrolytic plating (e.g., of a barrier and metal capping film, such as cobalt, nickel, CoW, NiW, CoNiW) over the lines of in-laid and exposed damascence copper for the purposes of improving electromigration properties and acting as a diffusion barrier. A structure and method were described with reference to FIG. 19 and to steps 462 of method 400 in which a metal capping layer is deposited by electrolytic or electroless processes on a metal-filled feature with a metal barrier layer intact (i.e., prior to barrier layer removal but after field metal is removed). Fabricating a capping layer above embedded metal features using PFSM has several benefits, including: the use of a stable electroplating bath versus comparatively unstable electroless plating baths for selective capping deposition; and the ability to create a film that is very thin (ultra small grains and very thin; e.g. 20-40 Å) via pulse electrolytic plating in the recesses of lines created by a wet-etching process. A useful and efficient combination of process functionality and hardware in a single module combines a sequence of chemical wet etching to remove copper from the barrier/ dielectric layer (e.g., with the wafer face down), followed by PFSM to deposit a capping layer over exposed (and perhaps recessed) metal lines. The end point detection schemes (either one or a combination of them) discussed above are useful for either or both of these operations. For example, cross wafer resistance is useful to track the thinning of the metal layer during the etching operation, and optical reflectance spectroscopy is useful to follow the deposition of cobalt onto copper lines. In the case of electrolytic deposition, PFSM technology in accordance with the invention is particularly suitable because it enables the creation of an extremely thin film with controlled morphology (e.g., through pulse plating) that would be difficult to achieve using a more conventional fully-simultaneous global wafer plating technique. In embodiments in which PFSM technology is applied, parameters such as film hermeticity, continuity, micro-uniformity and precise thickness deposition control, among others, typically are more important than a high rate of deposition.

EFEI, SEAR, SMMART

Techniques of selective electrochemical accelerator removal (SEAR) employ an electric-field-imposing-element (EFIE) that contains a proximity-focusing interface (PFI). The PFI is brought very close to, or in some cases in contact with, the workpiece surface (close proximity here being similar to and of the same order or scale of the topography present on the surface). Generally, the EFIE/PFI hardware is operable to create, impose or induce a spatially selective electrochemical reaction at the workpiece surface. The electrochemical reaction or reactions associated with a EFIE occur preferentially at locations physically closer to the EFIE's proximity focusing interface than at locations further away from the EFIE's proximity focusing interface. The electrochemical reaction associated with the EFIE and occurring at the workpiece surface is induced by the proximity and nearly constant potential of the EFIE's PFI surface transmitted though a very high resistance electrolyte. This electrolyte is interposed between the workpiece and the electric field imposing element's PFI. In this specification, the high resistance electrolyte is referred to as the electric-field-supporting-electrolyte (EFSE). In some embodiments, the spatially selective removal, modification, destruction or other technique of "deactivation" of an accelerator is selectively achieved over a substrate surface by the spatially specific action of the EFIE's proximity focusing interface (PFI) combined with the high resistivity EFSE. Co-owned and co-pending U.S. patent application Ser. No. 11/544,957, filed Oct. 5, 2006, titled "Selective Electrochemical Accelerator Removal", which is incorporated by reference and which claimed the benefit of U.S. Provisional Application Ser. No. 60/724,209, filed Oct. 5, 2005, titled "Selective Electrochemical Accelerator Removal", teaches systems and methods for conducting SEAR techniques in accordance with the invention.

Figure 60:
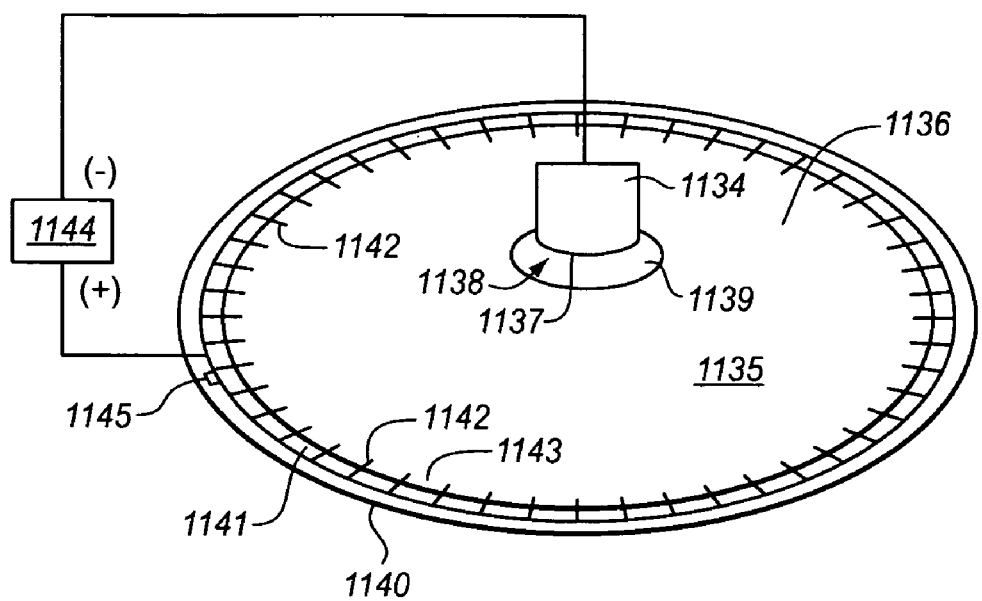
FIG. 60 depicts schematically an electric-field-imposing-element (EFIE) in accordance with the invention being operable to remove accelerator selectively from a substrate surface.

FIG. 60 depicts schematically an EFIE 1134 in accordance with the invention being operable to remove accelerator selectively from a substrate surface 1135 of a substrate wafer 1136. EFIE 1134 comprises a PFI 1137 in accordance with the invention located at bottom 1138 of EFIE 1134. Bottom 1138 of EFIE 1134 is immersed in EFSE 1139, which covers a portion of substrate surface 1135. As depicted in FIG. 60, wafer 1136 is supported in wafer holder 1140. Wafer holder 1140 comprises a circular electrical contact ring 1141 near the periphery of wafer holder 1140 and a plurality of electrical edge contact fingers 1142 for making electrical contact between electrical contact ring 1141 and edge 1143 of substrate surface 1135. As depicted in FIG. 60, a positive terminal of a power supply 1144 is connected to electrical contact ring 1141 via an electrical buss 1145. A negative terminal of power supply 1144 is connected to EFIE 1134. It is understood that in some embodiments, the polarities of electrical connections between power supply 1144 and EFIE 1134 and wafer 1136 are the opposite from those depicted in FIG. 60. Typically, contact ring 1141 and contact fingers 1142 are enclosed or sealed to avoid inadvertent exposure to the plating electrolyte. Similar to the structures described in U.S. Pat. No. 6,755,946, issued Jun. 29, 2004, to Patton et al., which is hereby incorporated by reference, in some embodiments in accordance with the invention, additional electrical contact fingers located at the periphery of wafer holder 1140 are operable to measure electrical resistance or potential through metal on substrate face 1135 as a means of monitoring the progress and uniformity of metal film growth during a subsequent plating operation. In some embodiments in accordance with the present invention, current is supplied to one or more electrical contacts proximate to the electrochemical portion of a substrate face, while substantially no current is supplied to the other electrical contacts. By varying the current supplied to individual electrical contacts, the current distribution across a conductive metal-containing substrate face is controlled. As a result, substrate face 1135 at non-electrochemical portions of the wafer is electrically substantially unbiased with respect to electrolytic liquid. As a practical matter, strong ohmic resistance to current flow through a relatively thin metal film on substrate face 1135 substantially prevents electrochemical activity at regions of substrate face 1135 away from head 1134.

EFIE PFI 1137, when combined with the highly resistive EFSE 1139, is substantially an equipotential surface on the scale at least as large as features of the substrate workpiece features and EFIE/workpiece spacing. When a PFI is located very close to the substrate workpiece surface, electrochemical reactions occur preferentially in substrate areas closest to the EFIE proximity-focusing-interface (PFI) surface, and occur at significantly slower rates or not at all in regions further away from the PFI.

The combination of a power supply operable to impose a voltage between the terminal leads of the workpiece and the EFIE (either directly or indirectly to the EFIE proximity focusing element), of the conductivity of the metal on the workpiece, and of the relatively low system resistance across the EFIE PFI's surface (which is much smaller than that across the EFSE) results in a large electric field within and across the EFSE. Hence, through proper design and control of the EFIE, choice of EFSE electrolyte, and selection of other operating conditions, a large field is generated over a very small distance and in the vicinity of the workpiece surface. The voltage typically varies in strength primarily in the direction of a vector drawn between the workpiece surface and the EFIE's PFI. Current passes in a direction substantially perpendicular to the gradient in voltage. Also, the field strength increases as the separation between the elements decreases, and hence electrochemical reaction rates vary depending on the depth or local separation between the EFIE PFI 1137 and the substrate workpiece 1136.

Because the specific ionic resistance of the electric-field-supporting-electrolyte (EFSE) 1139 is usually quite large (>1 kohm cm), the term "electrolyte" in this specification typically refers to a highly resistive fluid containing a relatively small concentration of ionic species. In some embodiments, the electrolyte is simply a solvent (preferably non-flammable), such as ultrapure water (de-ionized water), supercritical carbondioxide, or ammonia, but organic solvents such as propylene carbonate, ethylene carbonate, dimethylcarbonate, diethlyene carbonate are also useful. Water is found to be particularly useful because of its low cost, environmental friendliness and high abundance, but certain conditions make the use of other solvents also desirable. For example, non-water solvents are preferred when performing SEAR on metals more noble than water (e.g. Au, Pd). The concentration of ionic species (or ionic complexes) in the EFSE is generally less than $1.0 \times 10^{-2}$ moles/liter, more generally less than $1.0 \times 10^{-3}$ moles/liter. The resistance of the EFSE electrolyte is typically greater than 1 kiloohm-cm (k$\Omega$-cm), more preferably greater than 0.1 Megaohm-cm (the resistance of DI water is typically about $10^{-20}$ Megaohm-cm). The average electric field imposed between the workpiece and the EFIE and across the EFSE is usually large; for example, an average field is estimated to be greater than $5 \times 10^5$ Volts/cm. For example, in some embodiments, the average distance between the EFIE and some "raised" portions of the workpiece closest to the EFIE are believed to be less than 500 Å, and the voltage between the workpiece and the EFIE surface is greater than 6 Volts. In this example, then, the electric field strength is $1.2 \times 10^7$ volts/cm. Under such large fields, the solvent of most electrolytes breaks down (decomposes). Therefore, in some embodiments, solvent breakdown occurs concurrently with, and even enhances, the SEAR operations. For example, in embodiments in which water is used and in which the workpiece is anodically polarized, oxygen forms along with the formation of protons, and this typically aids the removal of the accelerator and/or the removal of the metal onto which the accelerator is attached (e.g., by avoiding the formation of a resistive metal oxide and changing the pH to acidic conditions locally).

Under these conditions, a diffuse electrolytic double layer of the two interfaces within the EFSE (i.e., the interface at the substrate workpiece surface and the interface at the EFIE PFI) overlap. Charged species of opposing polarity are expected to migrate at high speeds toward the oppositely-polarized neutralizing electrode (either the EFIE PFI or the substrate workpiece). As a result, the forces acting on the two charge interfaces are quite large. Diffusion is expected to be a minor physical process under these conditions. Therefore, charged species are not expected to diffuse substantially in the lateral direction, nor is there significant impact of species formation on the electric fields within the features. Rather, ions created by the electrochemical reactions are expected to migrate directly from the raised portions of the workpiece to the PFI (or vice versa). Therefore, diffusion of any charged species created by the electrochemical process is small compared to migration. It is believed that the preferential overlap of the interfaces (workpiece/EFSE interface and PFI/EFSE interface) at raised workpiece locations enables the acceleration of desirable electrochemical reactions in many cases.

In some embodiments, electric field imposing element (EFIE) 1134 comprises, for example, a single element or material (in which case the PFI and the EFIE are one and the same). But in other embodiments, the EFIE contains multiple elements that make the proximity-focusing interface (PFI) functional or more useful. Therefore, in some embodiments, the EFIE comprises a number of subelements or components, one of which is the PFI.

In some embodiments, the PFI comprises a solid, a liquid, a gel, or a polymer (including an ionic conducting polymer). In some embodiments, the EFIE PFI comprises an electrical conductor, such as a metal. Alternatively, in some embodiments, the PFI comprises an ionic conductor. In some embodiments, the PFI is porous on a microscopic scale, being resistive to, but still allowing, flow under sufficiently high pressure, where the bulk transport of both liquid solvent and current-carrying ions contained therein still occurs. In some embodiments, the PFI is nanoporous (allowing or rejecting flow of certain sized molecules and/or ions on a molecular scale), such as are typically employed in reverse osmotic operations.

In some embodiments, the proximity focusing interface, PFI, is a solid ionic conducting polymer, such as an anionic or cationic conductive and/or selective membranes (e.g., a Per-fluorosulphonated membrane, such as NAFION® available from DuPont Corporation). In some embodiments, the EFIE PFI comprises a material that is both an electrical and ionic conductor, such as an electrolyte-filled electrically conductive material (e.g., carbon aerogel).

Examples of EFIE designs and materials include: a flat, electrically conductive electrode (e.g., a polished-flat solid electrical current collection anode or cathode constructed of a metal); a metallic surface film or coating on a very flat, smooth, or polished insulator (e.g., a film coating on a smooth, polished piece of silicon or silicon wafer); an electrode formed from a thin metal film or foil; a thin metal film coated on an elastic substrate (e.g., a metal film on a rubber or polymer); a solid piece or film of porous, non-conductive inorganic or inorganic material (e.g., a polymer containing an electrolyte within its pores, such as porous "fritted" silica glass, silica areogel, resorcinol-formaldehyde derived organic aerogel); and a cationic or anionic conductive membrane (e.g., NAFION® by Dupont). Specific examples of a liquid EFIE include: ion-containing, ion-conductive electrolytes substantially immiscible with the underlying EFSE and containing ions immiscible with the underlying EFSE; and liquid metals (e.g., mercury).

In some embodiments, a thin film EFIE (e.g., thin metal film, metal coated film on an elastomer or polymer, a cationic and anionic membranes, or films of aerogel) is constrained along its periphery, and pressurized on one side. The membrane or film deflects toward the substrate surface to create a proximity focusing element, whose face closest to the workpiece is the proximity focusing interface, PFI. The proximity focusing element is "blown-up" like a balloon by having a pressurized fluid on the non-EFSE side of the EFIE. This is useful in achieving compliance of the EFIE over longer lengths and, when combined with relative movement between the workpiece and the EFIE and induced EFSE flow in the gap between them, controls the spacing between the working and counter electrodes. While not being bound by any particular theory, it is believed that a lifting or separating hydrodynamic force is balanced by forces tending to reduce the electrode spacing (such as the weight of the components and the space-charge coulombic attraction between the substrate workpiece and the EFIE PFI surfaces). By controlling the separation of the substrate workpiece and the EFIE, and having the EFSE between them, it is believed that conditions are created that include: a hydrodynamic separating force that increases with diminished spacing; and an attractive coulombic force that increases with diminishing separation. The forces acting on the two bodies are transmitted between the two interfaces and to the mechanical assemblies. The closer the two interfaces are and the greater the relative velocity, the greater the hydrodynamic separating force. In contrast, other forces act to bring the two interfaces together, such as gravity (a body force of the mass of the mechanical components) and the electrostatic or columbic attraction of the charged interfaces. By varying parameters, such as the (compensated) weight/load, relative velocity, voltage, and EFSE conductivity, among others, the required separation between the EIFE PFI and the substrate workpiece is effectively controlled.

Figure 61:
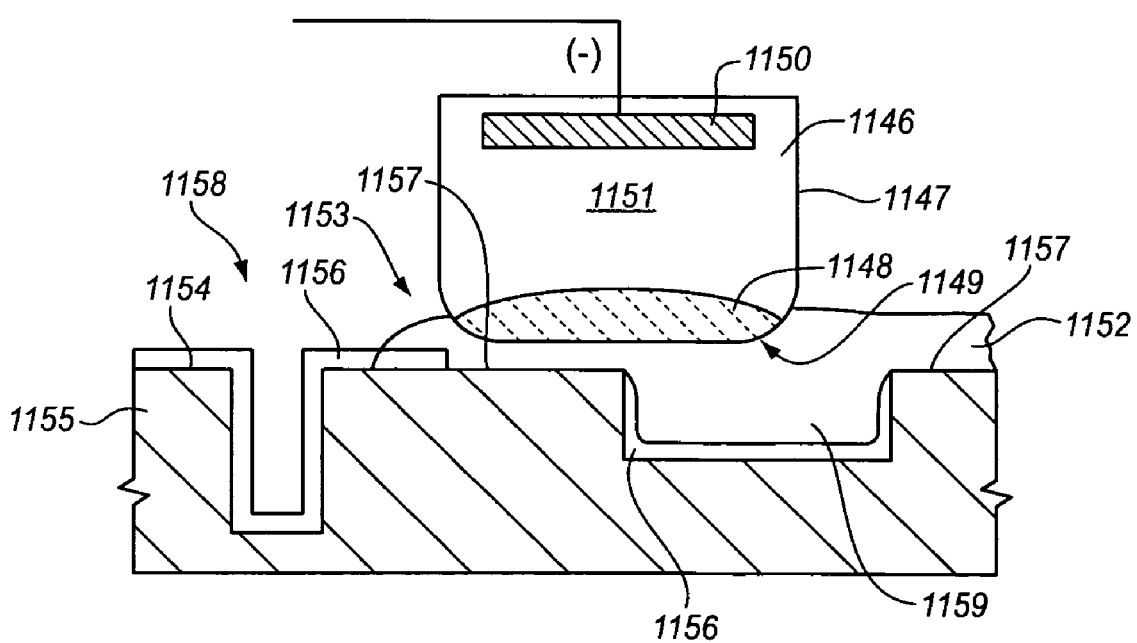
FIG. 61 depicts schematically a EFIE in accordance with the invention for conducting selective membrane mediated accelerator removal technology (SMMART) in accordance with the invention.

FIG. 61 depicts schematically a EFIE 1146 in accordance with the invention for conducting selective membrane-mediated accelerator removal technology (SMMART) in accordance with the invention. EFIE 1146 comprises a chamber 1147, an ionic conducting PFI membrane 1148 defining a bottom 1149 of EFIE chamber 1147, and an electrode 1150 located in chamber 1147. Chamber 1147 further contains highly conductive electrolyte 1151. FIG. 61 further depicts bottom 1149 of EFIE 1146, including PFI membrane 1148, immersed in EFSE 1152, which is located on a wetted portion 1153 of substrate surface 1154 of substrate 1155. FIG. 61 further depicts accelerator 1156 on portions of substrate 1155 at an intermediate stage of selective electrochemical accelerator removal (SEAR) in accordance with the invention. As depicted in FIG. 61, accelerator has been removed from (or deactivated in) raised field regions 1157 of substrate surface 1154 at which close proximity of PFI membrane 1148 to the substrate surface caused removal (or deactivation) of accelerator. On the other hand, accelerator 1156 has not been removed or deactivated in substrate region 1158, in which SEAR has not yet been conducted, and in recessed region 1159, which was not in close proximity to PFI membrane 1148 during SEAR.

In some embodiments, the bottom PFI surface 1149 of EFIE 1146 does not substantially follow the topography of the surfaces on the scale at which accelerator is desired to be selectively removed. Instead, it spans the recessed regions 1159 rather than stepping to follow the workpiece topography, thereby making the separation between PFI 1148 and the workpiece surface within the recess larger than it is between the PFI and raised regions and general field surfaces 1157. To achieve this, equipment design and operating parameters are selected, such as compressibility properties of PFI 1148 and flow characteristics of EFSE 1152. While PFI 1148 is flexible in many embodiments (and in some embodiments, substantially deforms and penetrates into the recessed cavities under conditions in which the substrate workpiece and the PFI are not moving relative to one another), relative motion, the incompressibility of the pressurized fluid, viscous flow forces and pressure of the assembly typically enable the PFI to "fly" over recessed regions of considerable size and low aspect ratio without physically contacting the surfaces of the cavity walls. In some embodiments, the PFI actually touches exposed field surfaces of a substrate, either continuously or intermittently. In some embodiments, the spacing between the EFIE PFI and the substrate workpiece is controlled and maintained as described in U.S. Pat. No. 6,756,307, issued Jun. 29, 2004, to Kelly et al., and International Publication No. WO/2005/042810, by Mazur et. al., which patent documents are hereby incorporated by reference.

In some embodiments, EFIE 1134, 1146 is porous to the macroscopic flow of either the EFSE or electrolyte contained in or behind the porous electrode. An EFIE serves to create a PFI 1137, 1148 and an interface that has a highly equipotential surface facing the substrate workpiece. Resistance from the power supply lead or counter electrode 1150 to the proximity focusing interface, PFI, preferably is much smaller (e.g., 1% or less) than the resistance across the electric-field-supporting-electrolyte (EFSE). This is achieved by using EFIE proximity focusing elements with high electrical conductivity (as in a metal or semiconductor) or having a highly conductive ionic solution or ion transport material behind a counter electrode and the proximity-focusing interface. In the latter case, EFIE counter electrode 1150 is removed or remote to the electrochemical reaction, being located spatially away from the proximity-focusing interface. This creates a "virtual electrode". This embodiment of operation is referred to as Selective Membrane Mediated Accelerator Removal Technology (SMMART). In such embodiments, front surface 1149 of proximity focusing element 1148 (FIG. 61) at its interface is held at a substantially constant voltage because of the relative resistances of the system. The voltage gradient changes abruptly (and becomes nearly constant) beyond the proximity focusing interface in EFSE 1139, 1152.

Whereas the term word "removal" is used in describing SEAR techniques, it is understood that it is not necessarily required for the accelerating adsorbate to be physically removed from the surface to achieve the goals of the invention or to practice this invention. For example, in some embodiments, the adsorbate is simply altered (e.g., decomposed, oxidized, reduced, or otherwise modified). In some embodiments, the adsorbate is driven into or buried underneath a deposit during the electrochemical process (e.g., by metal electrodeposition). But regardless of the manner in which it is accomplished, the chemical functionality of the adsorbate as an accelerating compound is diminished or eliminated by the SEAR process through the presence and action of the EFIE and the SEAR technique.

In some embodiments, initial adsorbing of accelerator to a substrate surface involves contacting the substrate surface with an "activating" solution of the accelerator, e.g., the activating solution mentioned above. Contact typically involves spraying, dipping, spin coating, sublimation or other methods. Alternatively, the additive is adsorbed on the surface by electrochemical reduction of an accelerator precursor compound. An example of such a compound is a dimer of the accelerator itself (e.g., dimercaptopropane sulfonic acid (DMPSA), which is a precursor of accelerating additive 3-mercapto 1-propane sulfonic acid, MPSA). Other means of accelerator deposition involve vapor deposition, atomic layer deposition, or any other suitable means of reacting and forming an activated surface known to those of skill in the art. In the case of CVD deposition of copper metal, iodine is known to be a chemical deposition accelerator. After pretreatment of a surface with iodine, SEAR removal is conducted and followed by CVD copper deposition.

The term "virtual" counter electrode refers to a structure in which a solid member or body contains a surface at a given location that faces the working electrode and exhibits a substantially constant (equipotential) voltage and acts in a physical manner as if a faradaic electrode were in the given location.

As described in U.S. patent application Ser. No. 10/739, 822, filed Dec. 17, 2003, by Mayer et al., there are a number of means to achieve global activation of the metal surface. These include, among others: spraying the surface with a solution containing the accelerator; vapor deposition; sublimination; and chemical vapor deposition.

The conditions for filling LAR and HAR features are often different and typically are performed in separate operations, using different materials, equipment and steps. In some embodiments of methods in accordance with the invention, SEAR techniques are practiced without continually contacting the work-piece surface during plating operations. In fact, use of a physical contracting device at any point in the process is not required in some embodiments. Compared to all known prior art, such applications of SEAR technology are faster, lead to improved contrast between the deposition rate within the initially recessed features and the rate in field areas, permit the use of simpler hardware that is inherently more robust, are less costly to perform (material consumables), and create products with fewer defects.

SEAR is useful to fill both HAR and LAR features. While the general SEAR techniques for filling HAR and LAR features are similar, the specific operating conditions and process flows often are slightly different. In some embodiments of the invention, SEAR plating processes are performed sequentially, filling HAR features first, and then filling LAR features. In other embodiments, only HAR features are filled using SEAR technology, and standard overplating is performed to fill LAR features. Finally, in other embodiments, HAR features are filled by conventional methods, and SEAR techniques are used only to fill LAR features selectively.

An exemplary pretreatment prior to HAR feature filling includes applying a reducing agent to remove surface oxides, depositing a metal seed layer (e.g., by liquid atomic layer deposition), or simply application of a wetting agent. A preferred embodiment of selective HAR feature filling begins either with treating the surface with accelerator by chemical exposure of the surface to an accelerator species (e.g., by spraying with a solution), or by exposing the surface to an electrolytic solution that is then converted electrochemically to form an accelerator on the surface; for example, by spraying a surface with a water solution containing mercaptopropane- or mercaptoethane sulfonic acid (chemical treatment method), or by cathodically polarizing (applying a reducing potential and current to) a workpiece in a bath containing an electrochemically active accelerator precursor. The electrochemically active accelerator precursor is, in many cases, a compound that is transformed into a chemically active accelerator. For example, each of dimercaptopropane sulfonic acid and dimercaptoethane sulfonic acid is a dimer of an accelerating compound. In some embodiments involving electrochemical activation, the electrolyte also contains other materials, such as metal ions (e.g., copper), a suppressor, chloride ion and leveler compounds useful in the deposition of metal and the conversion of the accelerator to a surface-adhering chemically active form. In some embodiments, metal deposition occurs concurrently with accelerator deposition. For example, as electrochemical current is passed, it is believed that a dimer such as dimercaptopropane sulfonic acid is reduced to the monomer mercaptopropane sulfonic acid, and then becomes strongly attached to the surface. The concentration of accelerator solution used for HAR filling is generally quite low; for example, in a range of about from 2 ppm to 50 ppm of mercaptopropane sulfonic acid (MPSA) or dimercaptopropane sulfonic acid (DMPSA). The chemical or electrochemical treatment takes from about 2 to 30 seconds. Currents (when applicable) are from 0.5 to 5 mA/cm$^2$. The concentrations used are generally lower than those typically used to attach accelerator in wide feature cavities (discussed below).

Depending on the concentration of the accelerator or accelerator precursor and other operating conditions (e.g. current, flow, temperature, etc.), it is believed that the rate at which accelerator become attached to a substrate surface generally results in preferential concentration at the field regions and lower concentrations in the restricted recessed cavity areas. This is the opposite of the desired concentration profiles useful in filling the features. In some embodiments, substantially more uniform surface concentrations of accelerator are achieved, but generally the surface concentration at the initiation of electroplating is likely lower on the surfaces inside feature cavities due to their limited accessibility to the accelerator in solution. Only later in the electroplating process, when metal is deposited (initially isotropically) over the substrate surface and geometric concentration of accelerator occurs, do higher surface concentrations of accelerator obtain within the recessed regions. Therefore, if one selectively removes the accelerator from the field/raised-surface after the accelerator has been deposited over the whole surface, the initial relative rates of plating within feature cavities is increased compared to regions from which accelerator was removed.

For example, in some embodiments, a surface is electrochemically plated (e.g., 0.5 to 30 seconds, 0.5 to 5 mA/cm$^2$, 0.25-150 Coulombs charge) in a bath containing 10 to 100 ppm dimercaptopropane sulfonic acid (DMPSA), 10 to 80 g/L copper sulfate, 10 to 200 g/L sulfuric acid and 100 to 1000 ppm L-92 polyetheylene oxide suppressor. These ranges are for illustrative purposes only as other combinations and ranges are possible. Alternatively, the surface is treated with 2-50 ppm mercaptopropane sulfonic acid (MPSA) for from 2 to 30 seconds. After either of these operations (or one followed by the other) the surface is completely rinsed of electrolyte with deionized water. Next, SEAR is performed on the surface. High resistivity water is applied over the surface, the surface is rotated under the EFIE, the unit is anodically polarized (or alternatively cathodically polarized) and electric current is passed between the workpiece and the EFIE. When anodic polarization is used, typically some metal on the substrate is concurrently removed with the accelerator. For an additional benefit, in some embodiments, such metal removal is performed preferentially at the top opening (neck) of a feature in order to avoid or remove undesirable accumulated metal that often limits the ability to fill extremely deep features. This is a "side reaction", which may be desirable when it aids in dislodging, or "undercutting", attached accelerator from the surface. Also, the solvent (e.g. water) decomposes, and some current associated with this additional side reaction is also consumed. The formation of acid (protons) typically helps to decrease the pH at the surface and improve the solubility of the metal. Therefore, while the specific reactions and their interactions are not fully understood, they are believed to be useful in many cases to achieve objectives of the invention. The fraction of current associated with the side reactions (not directly associated with faradaic charge transfer to the accelerator itself can be large, approaching 100%. Nevertheless, the amount of material removed is generally very small. As little as 10 Å to 100 Å appears to be sufficient in many cases to remove almost all the accelerator from the surface. In some cases, essentially no metal removal is required. Removing too much metal at this point in the process where there is often very little metal covering the surface makes control and minimization of the removal important. Charges from 20 to 200 mC/cm$^2$ are found useful. In many cases, as little as 10 mC/cm or less can be used. The voltages applied across the EFSE can range from 3 to 20V, generally 5 to 10 V are best. Current or voltage pulsing (e.g., on/off, reversing direction) is useful and provides good process control in some embodiments.

After removal of accelerator from the field areas using SEAR as described above, generally the wafer is placed into an electrolytic plating solution. In preferred embodiments, the electrolyte contains metal ions, a suppressor, chloride ion, and an acid, but little or no accelerator chemical (either electrochemically active or chemically active). Electroplating is performed until the features are filled. Filling is superior to a process in which the SEAR step is not performed because SEAR enables a larger difference between the concentration of accelerator in the feature and that on the field. The resulting selective electroplating (preceded by SEAR) uses the known phenomenon of geometric concentration of the additive within the feature in order to create a differential between the concentrations within the feature cavities (the same as in the conventional filling method), but removes accelerator from the field surface and impedes plating there.

Attaching accelerator to a substrate before LAR plating typically is conducted using apparatuses and techniques similar to those described above for narrow (HAR) features. Generally, however, it is desirable to contact a substrate surface with a much higher concentration of accelerator than used for HAR filling. Because the features are wider than they are deep, geometric concentration of accelerator does not appreciably occur in this process and does not significantly lead to selective filling. The process proceeds primarily by creating different relative amounts of plating accelerator at the recessed regions and the field regions, which remains largely unchanged throughout the filling process. For example, a higher concentration of DMPSA is used and a larger current density applied (compared to HAR-filling steps) to achieve a high concentration of surface accelerating monomer from the electrochemical conversion (reduction) of the dimer. For example, 50 to 500 ppm DMPSA and current densities of greater than 5 $mA/cm^2$ for 5 to 20 seconds are effective. Alternatively, direct chemical adsorption of MPSA from an aqueous solution at concentrations of 50 to 2000 ppm for 2 to 10 seconds are effective. After application of the accelerator, the surface is usually completely and thoroughly rinsed, and removal of the accelerator from the field regions using SEAR proceeds in a similar manner to that for high-aspect-ratio features. However, a stringent, optimized design of the EFIE PFI should be considered. In some embodiments, a stiffer, less flexible EFIE PFI is desirable to maintain the spacing between the bottom of wide feature cavities and the PFI because the distance between the edges of the feature are larger and dishing of the PFI into the feature cavity is expected to be greater. In some embodiments, different operating conditions (e.g., higher velocity differential between the workpiece and the PFI and higher electrolyte flow rates) are desirable. It is desirable to maintain electrode spacing and hence contrast in accelerator removal rates between recessed regions 1159 and field regions 1157 (FIG. 61) during accelerator removal operations. Control of the amount of accelerator removed from the field is less critical, however, than during selective accelerator removal before HAR filling. Metal deposited on the field during HAR feature filling increases the amount of metal to be removed from the field areas before all field metal is removed from some locations. Also, preferential removal at the mouth/edge of a LAR feature is less likely to improve the process because closure of a wide feature does not occur as it can in narrow, high-aspect-ratio features. Some metal removal or decomposition of metal is expected and usually is advantageous when anodic removal of the accelerator is the technique used.

In cathodic reduction SEAR, a workpiece (e.g., substrate 1136) is cathodically polarized and formation of dissolved molecular hydrogen (dissolved gas) is a typical side reaction. It is believed that metal/accelerator bonds are broken by reducing the linkage and protonating the molecule. For example, in embodiments in which MPSA is used as an accelerator, it is believed that MPSA is tethered to the metal at its sulfur atom, then the MPSA is hydrogenated and the bond to the metal is broken by the reduction process. By increasing the surface potential and the field strength across the overlapping interfaces in the raised regions (compared to field regions) metal removal occurs preferentially (e.g., by simple reduction or hydrogenation of the accelerator) at the raised regions of the surface.

In some embodiments of an apparatus in accordance with the invention, the EFIE proximity focusing interface (PFI) is a metal foil or plastic film coated with a metal film, creating an EFIE membrane. The foil is inflated with fluid (gas or liquid) on the opposite side of the foil from the proximity focusing interface and workpiece. The composition of the metal film should resist corrosion by materials used in the operation. Examples of suitable materials for the metal film include noble metals (Pt, Pd, Ir, Au) and other electrochemically stable materials (Ru, carbon, Hg). A chamber containing the inflating fluid is selectively pressurized to establish membrane rigidity and control. The membrane is pressurized and brought in close proximity to the substrate surface, while the substrate surface is wetted with high resistance electrolyte (EFSE) and the substrate workpiece is moved under the membrane. The relative speed of the workpiece and membrane is typically 5 to 100 cm/sec, more specifically 10 to 50 cm/sec when using water as an EFSE. A power supply connected to the substrate workpiece and EFIE (e.g., by electrical contacts at a wafer edge and the metal film membrane) is energized, imposing a voltage between the two electrodes and allowing current to pass. Care should be taken to avoid physical contact of a metal film with the substrate workpiece. If contact occurred between a substrate and a metal membrane of a PFI, electronic current would pass between the workpiece and the film and thereby reduce or stop the removal of the accelerator. If contact occurred, polarization of the EFSE would decrease and the removal efficiency would diminish. Also, electronic arcing or even welding of the surfaces might occur, so spatial separation should be maintained. In some embodiments, the membrane is moved over the surface as required to achieve selective removal of the accelerator. Sometimes, some metal removal and solvent breakdown products form concurrently with the process of removing the accelerator. If metal deposits onto the PFI from the workpiece, periodic removal of that metal is accomplished by periodically etching the metal off of the interface. In the case of deposited copper on a Pt foil membrane, a number of etchants are suitable, such as a mixture of hydrogen peroxide and sulfuric acid, or nitric acid. Alternatively, in some embodiments, a deposited metal is removed by reversing the current direction and depositing the metal either onto the substrate workpiece, or onto a sacrificial body. This is an important measure for preventing electrical contact between the metal film and the substrate.

In some embodiments, the proximity focusing interface (PFI) element is an ionic conductor. As mentioned above, methods and processes to remove accelerator using an ionic conducting membrane are designated selective membrane mediated accelerator removal technology (SMMART). A SMMART PFI has an advantage over a PFI comprising electronically conductive metal in that intermittent or stray physical contact of the membrane of a SMMART PFI does not cause electrical shorting of the current to the workpiece. The membrane acts as a virtual counter electrode PFI. Though it is believed that a faradaic process does not occur there, the potential is maintained at a nearly constant value and the interface can be brought very close to the surface. Metal deposition and gas evolution are avoided by having the auxiliary counter electrode spatially removed from the interface, and hence is constructed as to not interfere with the operation. Hence, longevity of the operation without maintenance is achieved. Typically, the ionic conductor is chosen so it does not conduct electricity (electrons), and so faradaic reduction processes do not occur at its interface to EFSE (electric-field-supporting electrolyte). A counter electrode resides in a chamber on the opposite side of the ion conductor from the substrate workpiece. A high conductivity electrolytic solution resides on the counter electrode side of the assembly. The conductivity of this electrolyte is typically at least 100, more typically 10,000, times more conductive than the electric field supporting electrolyte (EFSE). Examples of suitable electrolytes are water-based solutions containing substantial concentrations of acids, bases, or metal salts (e.g., >2 wt % solutions). The power supply's electrical leads are connected to the counter electrode and the substrate workpiece. In some embodiments, the PFI comprises a cationic conducting film held at its periphery, and the film is an "inflatable membrane" similar to that discussed for the metal foil membrane above. A particular example of a useful cationic membrane material is NAFION®, manufactured by Dupont. During SMMART operations involving an anodically-polarized workpiece, positively charged species generated at the substrate workpiece (e.g., protons, metal ions from workpiece metal, positively charged ionic forms of the accelerator detached from the substrate surface) migrate to the membrane interface and through the membrane. Charge balance requires that an equivalent faradaic reaction occur at the counter electrode 1150, housed in the EFIE electrolyte chamber 1147 of PFI 1146 (FIG. 61). For example, when the highly conductive solution 1151 contains metal ions and acid, hydrogen gas and/or metal plating tends to occur at the counter electrode. In the case of SMMART operations involving a cathodically-polarized workpiece, the counter electrode is preferably a noble or dimensionally stable electrode (e.g. Pt, Ta, Au), and the high-conductivity electrolyte is preferably substantially devoid of any metal ions (e.g., a high-purity acid solution). The accelerator 1156 is preferably removed from the substrate surface by a reduction process. When the reduced accelerator species is neutral, then it is removed by being dissolved in the flowing electric field supporting electrolyte (EFSE). In embodiments in which the reduced accelerator species created by a cathodic SMMART technique are negatively charged, an anionic conductive membrane is preferred.

As mentioned above, after performing SEAR, metal deposition (e.g., electrodeposition) is performed selectively in the LAR recessed regions of the workpiece surface. In an exemplary embodiment, MPSA solution is sprayed onto a workpiece substrate. The workpiece is then rinsed to remove residual accelerator from the surface, and then SEAR is performed (e.g., by SMMART). Next, the workpiece is electroplated using a plating solution containing metal ions and an appropriate suppressor for MPSA (e.g. polyethylene oxide or polyethylene glycol or co-polymers of these, with ppm concentrations of chloride ion). An acid is also often used. Cathodic plating current is applied to the substrate workpiece and the recessed features are preferentially filled with metal (i.e., bottom-up filling). In some embodiments of the invention, the filling of the features continues to a point where the amount of metal in the features is sufficient for the LAR recessed feature cavities to be completely filled, and raised or protruded metal is produced over recessed feature cavities. This is a unique aspect of embodiments in accordance with the invention that enable protruded metal to be deposited over LAR features, and it is highly advantageous when properly controlled. After plating, the workpiece is rinsed of residual plating solution and dried (e.g. in a spin rinse dryer). In some embodiments the workpiece is then annealed (200°-450° C., 0.5 to 30 minutes). Removal of metal from the surface is then performed. However, because of the reduced topography and embossed structures enabled by SEAR, removal techniques other than costly CMP or eCMP can be performed. For example, an isotropic wet etch, electropolish or MMEP can be performed. The process is typically terminated when the metal in the field clears. If excess filling (embossing) of metal over the features was performed during the SEAR and plating processes, the first point that all metal clears to the dielectric plane occurs at regions devoid of recessed features, for example, in field regions. In conventional process schemes of the prior art, metal clears first at low-aspect-ratio features and around their periphery. Thus, embossing in accordance with the invention protects damascene features and changes the order of clearing typically seen in conventional process flows (e.g., standard electroplating and CMP).

Figure 62:
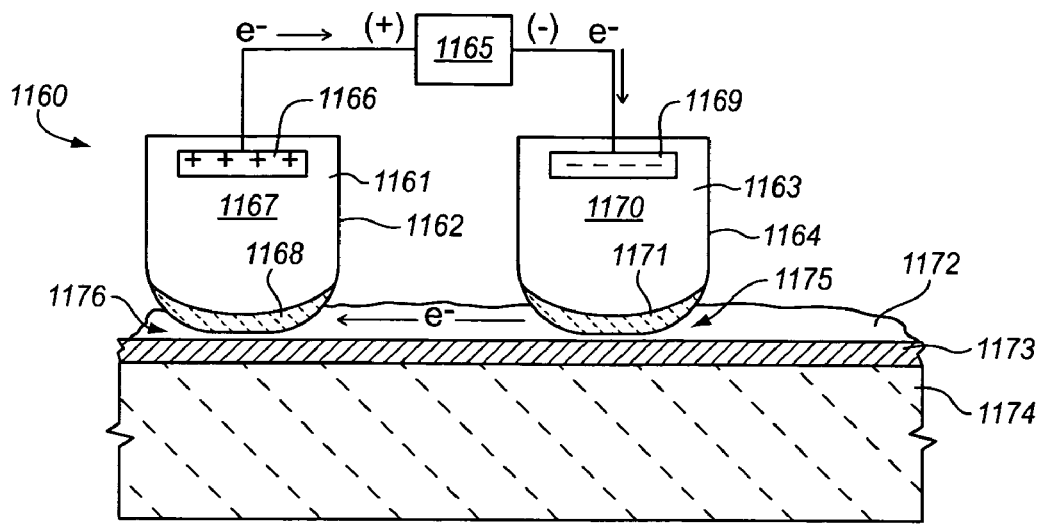
FIG. 62 depicts schematically a bipolar system in accordance with the invention that is operable to supply indirect current to a substrate surface.

While in some embodiments, application of current to the substrate workpiece is made by physically contacting the surface metal with a metallic lead at the periphery (a contact connecting it to the power supply), in other embodiments, an alternative, "indirect" or electrochemical contacting method is utilized. U.S. Pat. No. 6,143,155 entitled "Method for Simultaneous Non-Contact Electrochemical Plating and Planarizing of Semiconductor Wafers Using a Bipolar Electrode Assembly", issued Nov. 7, 2000, to Adams et. al, which is hereby incorporated by reference, teaches a method of simultaneous non-contact plating and planarizing of copper interconnections in a semiconductor wafer by providing relative motion between a bipolar electrode and a metallized surface of a semiconductor wafer without physical contact with the wafer or direct electrical connection. In some embodiments in accordance with the invention, two or more SMMART EFIE's are used simultaneously to supply indirect current to a substrate surface. FIG. 62 depicts schematically a bipolar system 1160 in accordance with the invention. System 1160 comprises an oxidation EFIE head 1161 comprising chamber 1162, a reduction EFIE head 1163 comprising chamber 1164, and a power supply 1165. Oxidation EFIE 1161 includes oxidation electrode 1166, electrolyte 1167 and PFI membrane 1168. Reduction EFIE 1163 includes reduction electrode 1169, electrolyte 1170 and PFI membrane 1171. PFI membranes 1168, 1171 of EFIE heads 1161, 1163, respectively, are immersed in EFSE 1172, which is located on a wetted portion of metal layer 1173 covering base layer 1174 of a substrate wafer. EFIE 1161 is anodically polarized with respect to the metal layer 1173, and EFIE 1163 is cathodically polarized with respect to metal layer 1173. Reductive reactions occur at the surface portion 1175 under the negatively polarized reduction electrode 1169, while oxidative reactions occur at surface portion 1176 under the positively polarized oxidation electrode 1166. Electrons (electrical current) flow through metal layer 1173 from surface portion 1175 to surface portion 1176.

Figure 63:
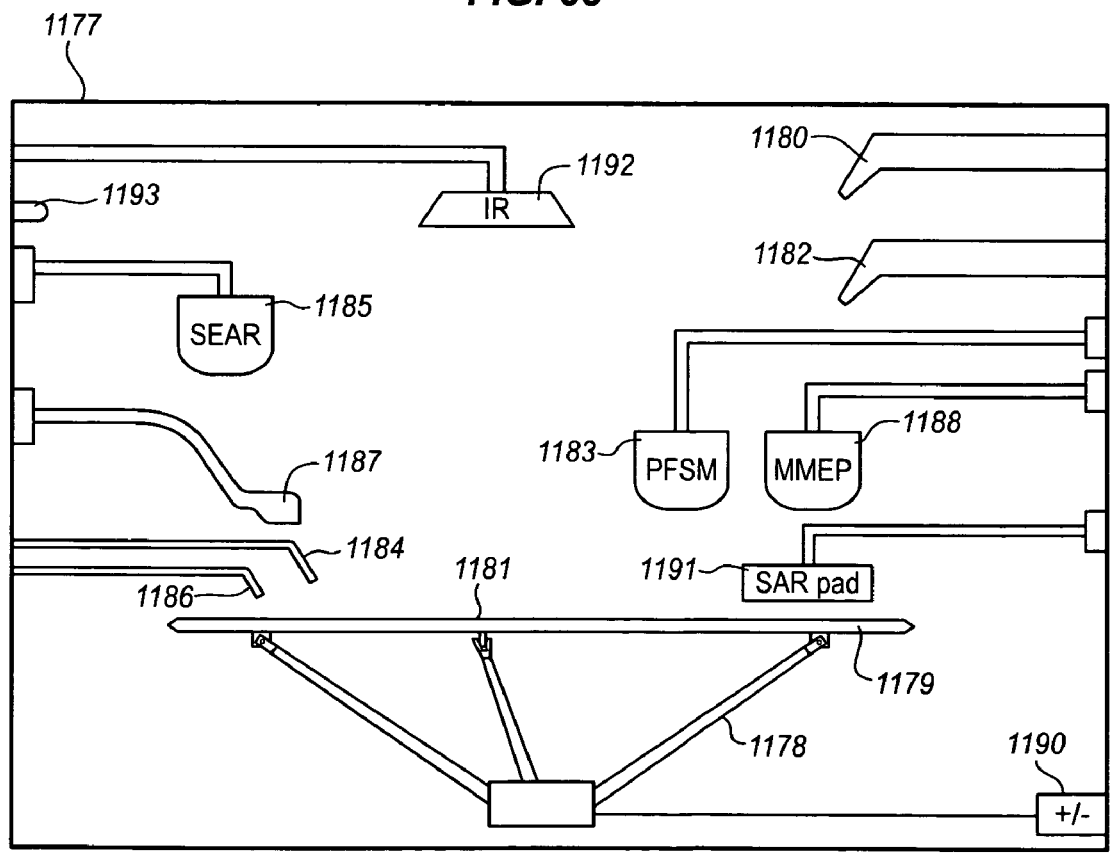
FIG. 63 depicts schematically a fabrication module in accordance with the invention that is operable to conduct in a single tool module the operations necessary for fabricating embedded metal features.

In some embodiments, the operations of surface pretreatments, accelerator application, SEAR (e.g. SMMART), HAR feature filling, SET operations, LAR feature filling and metal removal are combined in a single tool module. FIG. 63 depicts schematically a fabrication module 1177 in accordance with the invention for fabricating embedded metal features in a dielectric substrate. Module 1177 comprises wafer chuck 1178 for supporting, moving and rotating a substrate wafer 1179. Some embodiments include a clamshell-type wafer holder (as described with reference to FIG. 65) instead of wafer chuck 1178. Module 1177 further comprises accelerator inlet nozzle 1180, which is operable to apply accelerator solution globally onto a substrate surface 1181. Module 1177 further comprises rinsing nozzle 1182, which is operable to apply deionized water or other cleaning or rinsing liquid globally or locally onto substrate surface 1181. Module 1177 further comprises PFSM head 1183, which is operable to conduct proximity focusing scanning microplating operations at substrate surface 1181. Module 1177 includes end surface probe 1184, which is operable to measure one or more surface properties (e.g., chemical composition, reflectivity) of substrate 1179. Module 1177 further comprises EFIE-SEAR head 1185, which is operable to conduct selective accelerator removal at substrate surface 1181. Module 1177 includes EFSE inlet nozzle 1186, which is operable to apply SEAR EFSE liquid or other medium locally to substrate surface 1181. Module 1177 further comprises etching liquid dispenser boom 1187, embodiments of which are discussed in more detail below with reference to FIGS. 52 and 53. Dispenser boom 1187 comprises an applicator nozzle (not shown here) for directing a stream or spray of liquid etching solution to a localized portion of substrate surface 1181. Dispenser boom 1187 typically also comprises a quench nozzle (not shown here) which is operable to direct a diluent or quenching liquid at a quenchant impact area of substrate surface 1181. Alternatively to dispenser boom 1187, or additionally, module 1177 includes MMEP head 1188, which is operable to conduct membrane-mediated electropolishing of metal on substrate surface 1181. International Publication No. WO/2005/042810, by Mazur et. al., which is incorporated by reference, teaches methods and systems for non-contact membrane-mediated electropolishing of metal. Module 1177 further comprises power supply 1190 for polarizing substrate 1179, PFSM 1183, SEAR unit 1185 and MMEP unit 1188 and for providing current for electrochemical operations. Module 1177 further comprises infrared heater 1192 and inert gas inlet nozzle 1193. It is understood that some wafer processing modules in accordance with the invention do not include all of the elements depicted in and described with reference to FIG. 63. Similarly, it is understood that some wafer processing modules in accordance with the invention include elements in addition to those depicted in and described with reference to FIG. 63.

Figure 64:
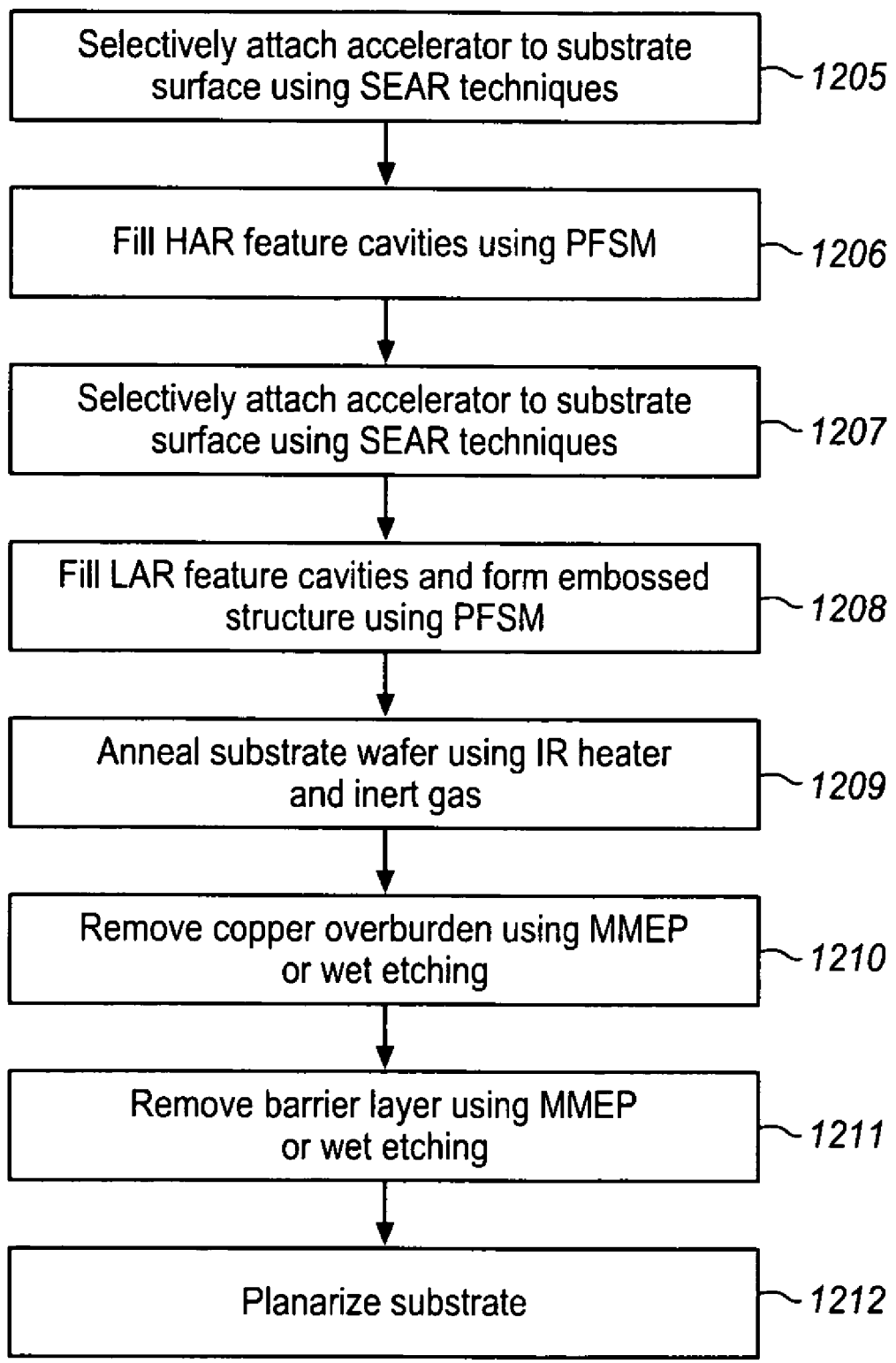
FIG. 64 depicts a process flow sheet of an exemplary generalized method in accordance with the invention for forming metal features embedded in a dielectric substrate, preferably using a single tool module.

FIG. 64 depicts a process flow sheet of an exemplary generalized method 1200 in accordance with the invention for forming metal features embedded in a dielectric substrate. Method 1200 is described with reference to module 1177, which was described with reference to FIG. 63. It is understood that some methods in accordance with the invention are conducted using equipment that is different from that described with reference to FIG. 63. In steps 1205, accelerator is selectively attached to narrow feature cavities in substrate surface 1181 using SEAR techniques. Typically, accelerator solution is globally applied to surface 1181 using accelerator inlet nozzle 1180, and thereafter electrolytic EFSE liquid is applied locally to surface 1181 using EFSE inlet nozzle 1186 or a dispenser integral with EFIE-SEAR head 1185. Next, accelerator is selectively removed by electrochemical action using EFIE head 1185 (e.g., using a SMMART process). Then the wafer is (optionally) rinsed using rinse nozzle 1182. Steps 1206 include filling narrow feature cavities using PFSM techniques in accordance with the invention. Steps 1207 include selectively attaching accelerator to LAR features of substrate surface 1181 using SEAR techniques, as described above. Steps 1208 include filling wide feature cavities and then typically forming a near planar or an embossed structure (FIG. 13) using PFSM techniques in accordance with the invention. Steps 1209 include annealing substrate 1179 after plating operations have been completed, using infrared heater 1192 in an inert (or forming gas) atmosphere created in module 1177 by injecting inert gas (or forming gas) through nozzle 1193. Steps 1210 include removing the metal overburden, typically copper overburden, from the substrate surface. Some embodiments utilize localized wet etching techniques in which dispenser boom 1187 is utilized to dispense liquid etching solution onto substrate surface 1181 to form a localized etching portion. Alternatively or additionally, steps 1210 include utilizing MMEP head 1188 to remove the metal overburden. Steps 1211 include removing the barrier layer from substrate surface 1181. Steps 1211 typically include using liquid wet etching techniques that are selective to barrier layer material; that is, remove barrier material without substantially removing metal (copper) or dielectric material. In some embodiments, in which the barrier layer material is sufficiently electrically conductive, steps 1211 include utilizing MMEP head 1188 to remove barrier layer material. Steps 1212 include planarizing substrate using a scanning membrane-mediated electropolishing head 1188, as described in International Publication No. WO/2005/042810, by Mazur et. al., which is incorporated by reference. Alternatively, steps 1212 include CMP techniques to planarize substrate 1179.

Single-Cell Apparatus for both SAR and SAP

Figure 65:
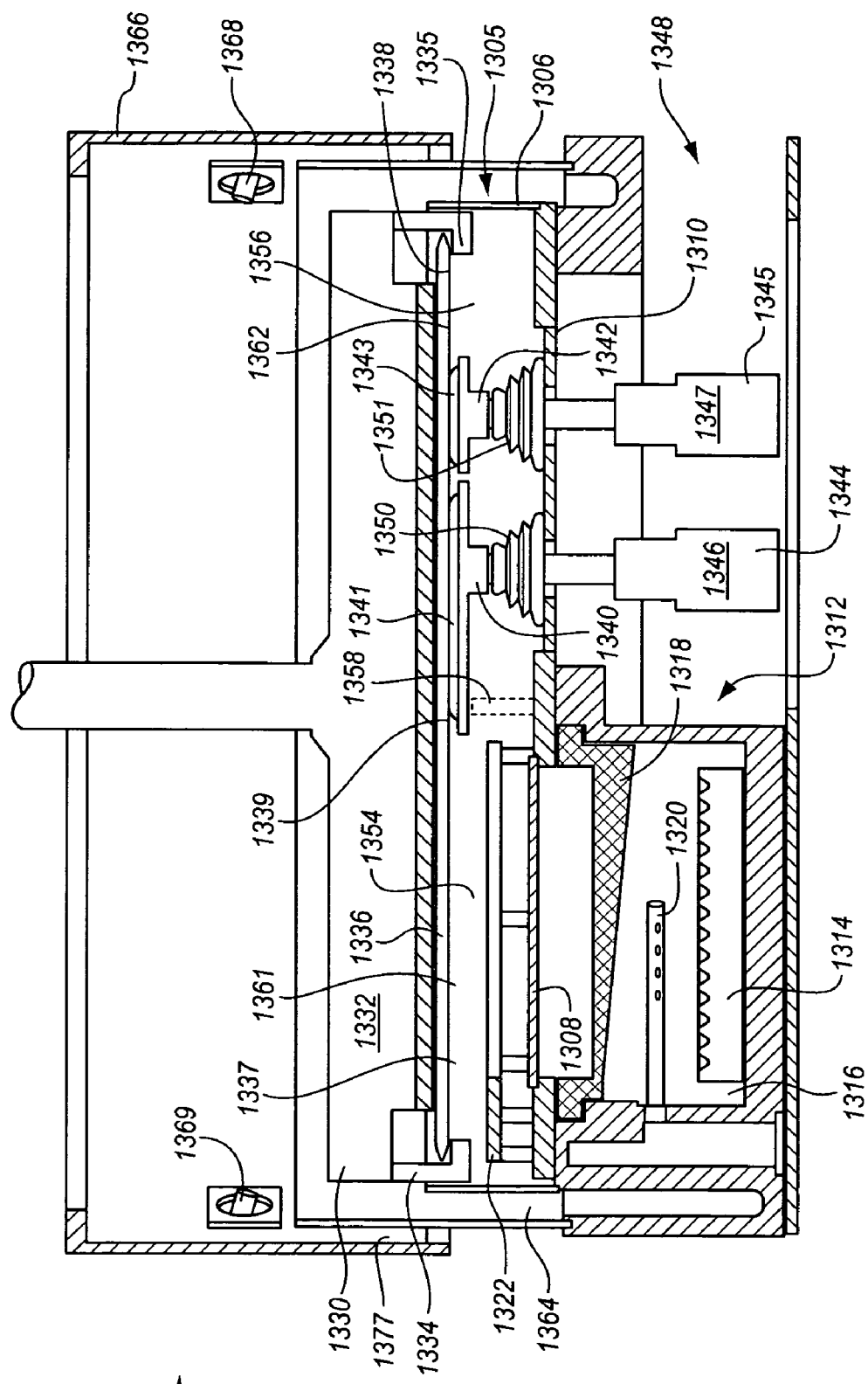
FIG. 65 depicts schematically a cross-sectional view of system in accordance with the invention for electroplating a first portion of a substrate and for selectively removing accelerator from a second portion of a substrate.

FIG. 65 depicts schematically cross-sectional view 1303 of system 1304 in accordance with the invention for electroplating a first portion of a substrate and for selectively removing accelerator from a second portion of a substrate in a single plating cell. System 1304 comprises a plating cell 1305, plating cell wall 1306, a substantially semicircular diffuser membrane 1308 that defines a first half bottom of plating cell 1305, and a substantially semicircular hard bottom 1310 that defines a second half bottom of plating cell 1305. System 1304 further comprises a substantially semicylindrical anode chamber 1312 located below semicircular diffuser membrane 1308. System 1304 further comprises anode electrode 1314 located at the bottom 1316 of anode chamber 1312. In some embodiments, anode 1314 comprises grooves, which increase surface area and reduce current density, known to be related to anode passivation. System 1304 further comprises porous anode membrane 1318 located between anode 1314 and diffuser membrane 1308. System 1304 further comprises inlet flute 1320, which is operable to inject electrolyte into anode chamber 1312. U.S. Pat. No. 6,527,920, issued Mar. 4, 2003, to Mayer et al., which is hereby incorporated by reference, teaches an electroplating apparatus comprising a separate anode chamber. System 1304 further comprises substantially semicircular edge shield 1322 located above semicircular diffuser membrane 1308 in plating cell 1305. System 1304 further comprises clamshell wafer holder 1330 comprising cone 1332 and cup 1334 having lip 1335. U.S. Pat. No. 6,156,167, issued Dec. 5, 2000 to Patton et al., which is hereby incorporated by reference, teaches a clamshell-type wafer holder. Wafer holder 1330 is operable to hold a substrate wafer 1336 having a substrate surface 1337 with a peripheral exposed edge 1338 and a center region 1339. System 1304 comprises center rubbing pad assembly 1340 supporting center rubbing pad 1341, edge pad assembly 1342 supporting edge rubbing pad 1343, pad motor assembly 1344 for driving pad assembly 1340, and pad motor assembly 1345 for driving pad assembly 1342. Pad motor 1346 of pad motor assembly 1344 and pad motor 1347 of pad motor assembly 1345 are located in substantially semicylindrical motor chamber 1348 located below substantially semicircular hard bottom 1310. Seal bellows 1350 and seal bellows 1351 of motor pad assemblies 1344 and 1345, respectively, enable vertical and horizontal movement of substrate pad assemblies 1340, 1342, respectively. In preferred embodiments, pad assemblies 1340, 1342 are operable to be moved vertically and horizontally. In preferred embodiments, movement in a substantially horizontal plane includes one or several of rotation, translation and linear and/or orbital reciprocation. A substantially semicylindrical plating zone 1354 of plating cell 1305 is located approximately between semicircular membrane 1308 and a wafer substrate 1336, and a substantially semicylindrical pad zone 1356 of plating cell 1305 is defined approximately by semicircular bottom 1310 and a wafer substrate 1336. In some embodiments, a vertical cell shield 1358 divides plating cell 1305 substantially in half, thereby further defining a plating zone 1354 and a pad zone 1356 of plating cell 1305 and serving to separate plating zone 1354 spatially from pad zone 1356. It is understood that in some embodiments, the relative shapes and dimensions of structures and elements (such as membrane 1308, anode chamber 1312, bottom 1310, plating zone 1354, pad zone 1356) of a system in accordance with the invention are other than semicircular and semicylindrical. A positive terminal of a power supply (not shown) is electrically connected to anode 1314. A negative terminal of the power supply is electrically connected via one or more electrical contact structures of wafer holder 1330 and is operable to generate a negative polarity on at least a portion of a substrate wafer 1336. In some embodiments in accordance with the invention, a system 1304 is utilized to plate metal onto a plating portion 1361 of substrate surface 1337 that is located in plating zone 1354 substantially opposite anode 1314, while accelerator is selectively removed by rubbing raised regions of rubbing portion 1362 of substrate surface 1337 located in pad zone 1356 of plating cell 1305. Typically, wafer holder 1330 is operable to rotate substrate wafer 1336 during plating and rubbing operations. As depicted in FIG. 65, system 1304 further comprises liquid overflow channel 1364 for collecting liquid and either discarding or recirculating it. System 1304 further comprises rinse shield 1366, rinsate collection channel 1377, and one or more rinse nozzles 1368. In this specification, a non-plating zone of the plating cell is generally designated as a pad zone. It is understood that some embodiments of a system 1304 in accordance with the invention include a plating zone, a pad zone in which pad rubbing is conducted, and a non-plating zone in which neither plating nor pad rubbing occurs. System 1304 further comprises one or more pad cleaning nozzles 1369.

In some embodiments in accordance with the invention, system 1304 as depicted in FIG. 65 is operable to conduct one or more of the following functions, among others: global application of an accelerator to a substrate surface before electroplating operations; selective removal of accelerator from raised surfaces of a substrate before electroplating operations; narrow-feature metal deposition processes in accordance with the invention, particularly filling of HAR features; wide-feature metal deposition processes in accordance with the invention, particularly filling of LAR features; and selective removal of accelerator from raised surfaces of the substrate during and between plating operations.

Figure 66:
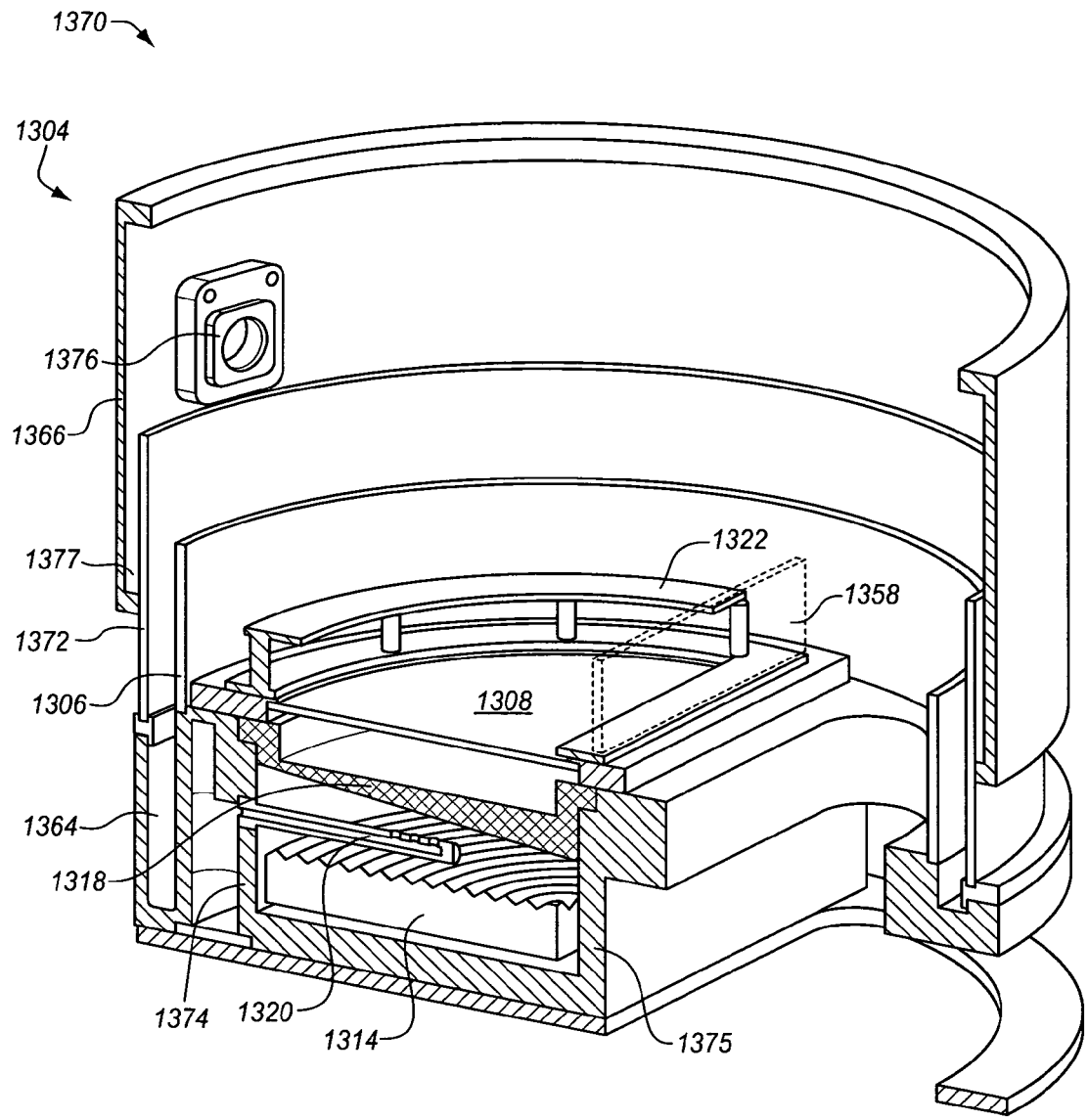
FIG. 66 depicts schematically a perspective view of selected elements and structures of the system depicted in FIG. 65.

FIG. 66 depicts schematically perspective view 1370 of selected elements and structures of system 1304 for extra clarity. FIG. 66 shows plating cell wall 1306, chamber wall 1372 and liquid channel 1364. FIG. 66 further depicts anode chamber walls 1374, 1375, anode 1314, inlet flute 1320, porous anode membrane 1318, diffuser membrane 1308, semicircular edge shield 1322, and vertical cell shield 1358. FIG. 66 further depicts rinse shield 1366, rinse nozzle inlet 1376 and rinsate collection channel 1377.

Figure 67:
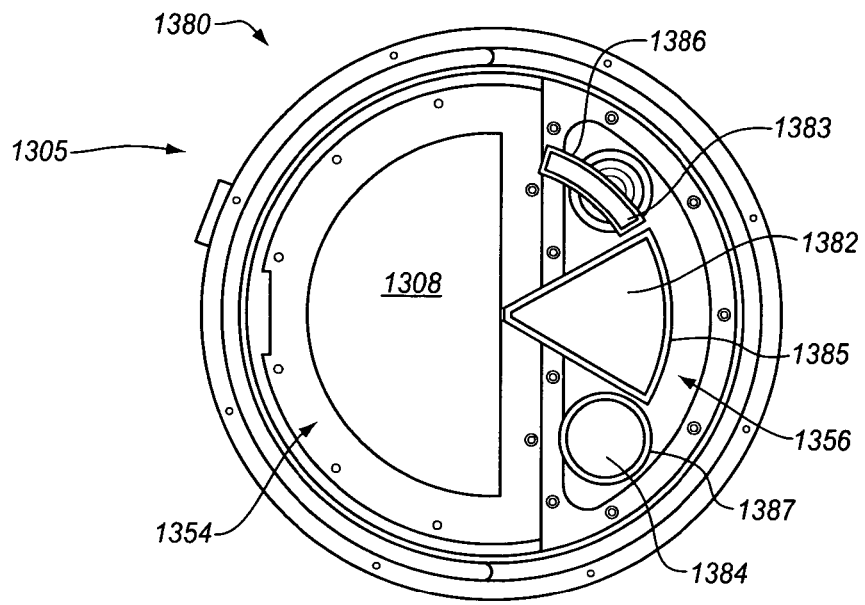
FIG. 67 depicts schematically a top-down view of a plating cell in accordance with the invention, including a semicircular diffuser membrane in a plating zone and rubbing pads in the pad zone.

FIG. 67 depicts schematically a top-down view 1380 of a plating cell 1305, including semicircular diffuser membrane 1308 in a plating zone 1354. FIG. 67 further depicts, in pad zone 1356, a rubbing pad 1382 for rubbing the center portions of a wafer, and rubbing pads 1383, 1384 for rubbing non-center and peripheral portions of a wafer. FIG. 67 also shows the top side edges of pad holder cups 1385, 1386 and 1387, which are operable to hold and to support pads 1382, 1383, and 1384, respectively. Generally, pad holder cups 1385, 1386, 1387 are shaped so that their vertical sidewalls physically and electrically shield the lateral sides of pads 1382, 1383, 1384.

Figure 68:
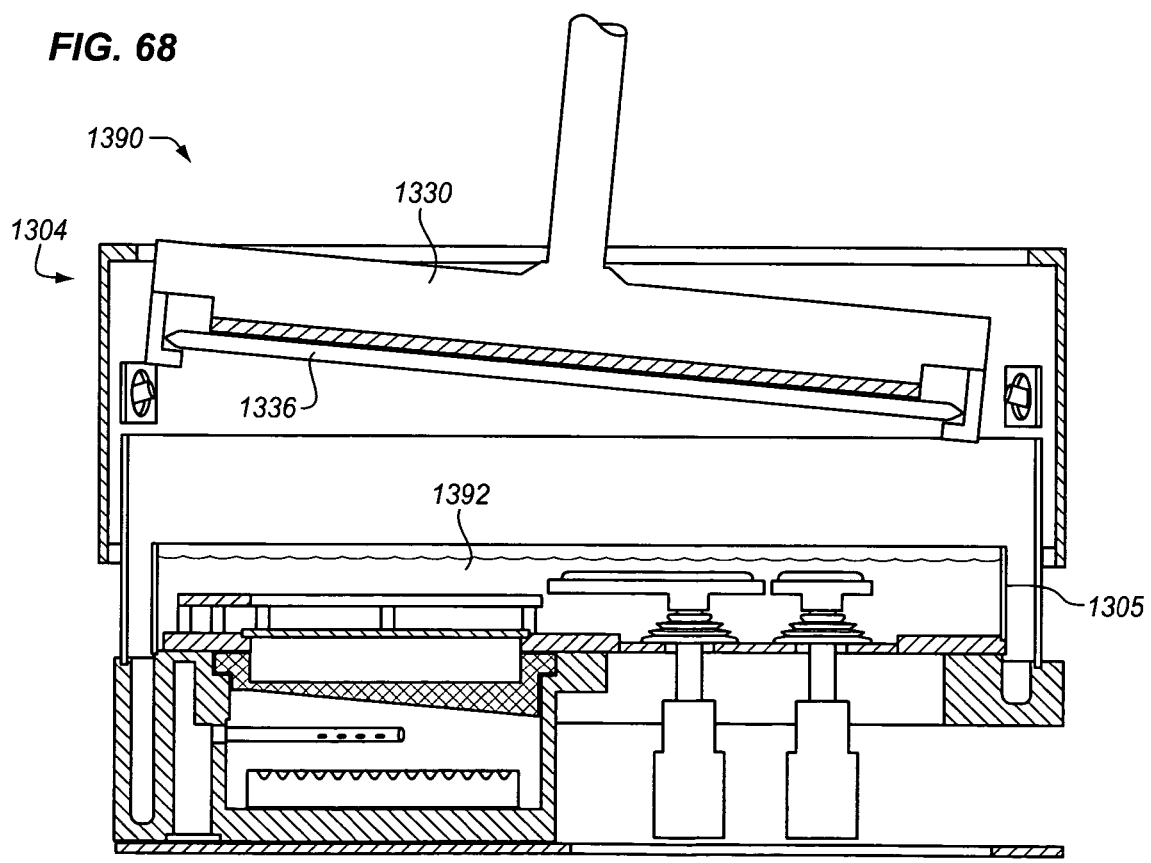
FIG. 68 depicts schematically a cross-sectional view of a system in accordance with the invention in which the wafer holder is positioned for angled immersion of a substrate wafer into a plating bath.

FIG. 68 depicts schematically a view 1390 of a system 1304 in which wafer holder 1330 is positioned for angled immersion of a substrate wafer 1336 into plating bath 1392 in plating cell 1305.

Figure 69:
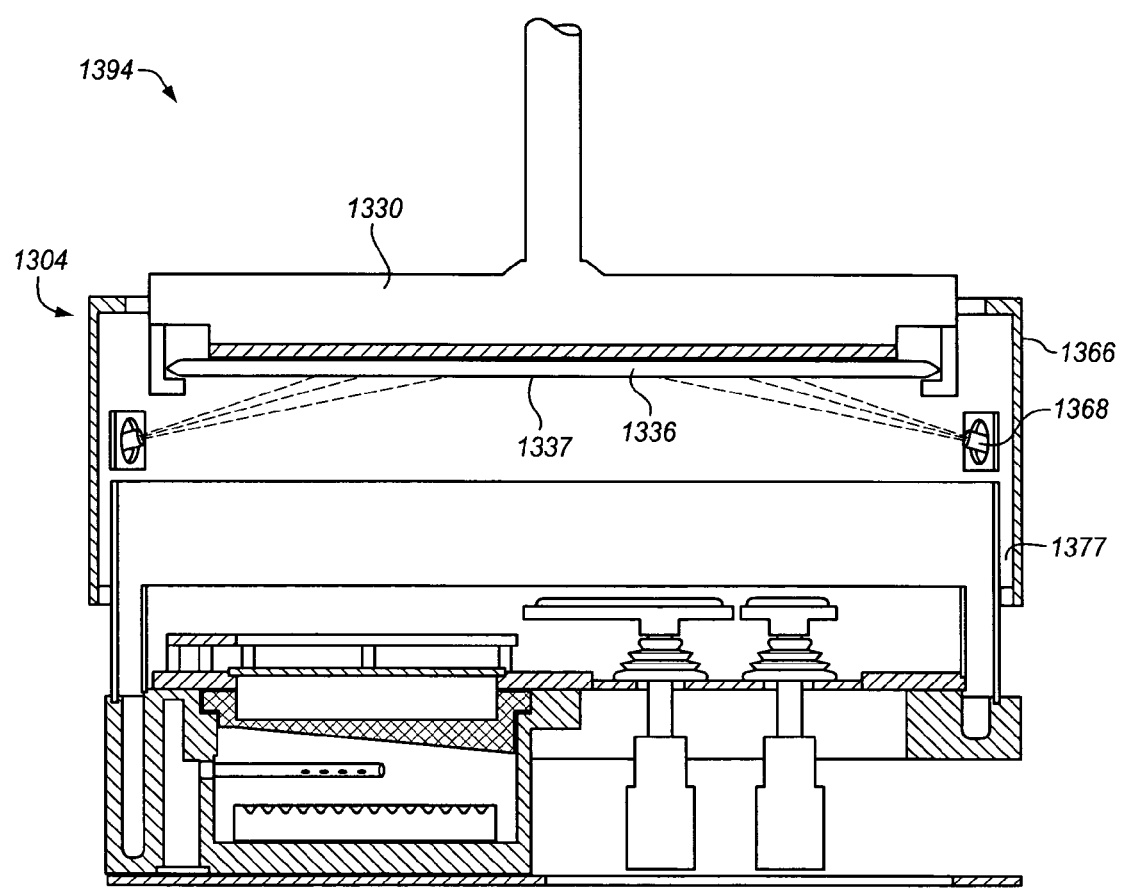
FIG. 69 depicts schematically a cross-sectional view of a system in accordance with the invention in which the wafer holder is located in a rinsing position in which rinsing nozzles direct a stream of rinsing liquid at substrate surface.

FIG. 69 depicts schematically a view 1394 of a system 1304 in accordance with the invention in which wafer holder 1330 is located in a rinsing position in which rinsing nozzles 1368 direct a stream of rinsing liquid, typically deionized water, at substrate surface 1337 of substrate wafer 1336. Rinse shield 1366 and rinsate collection channel 1377 are operable to collect rinsate.

Figure 70:
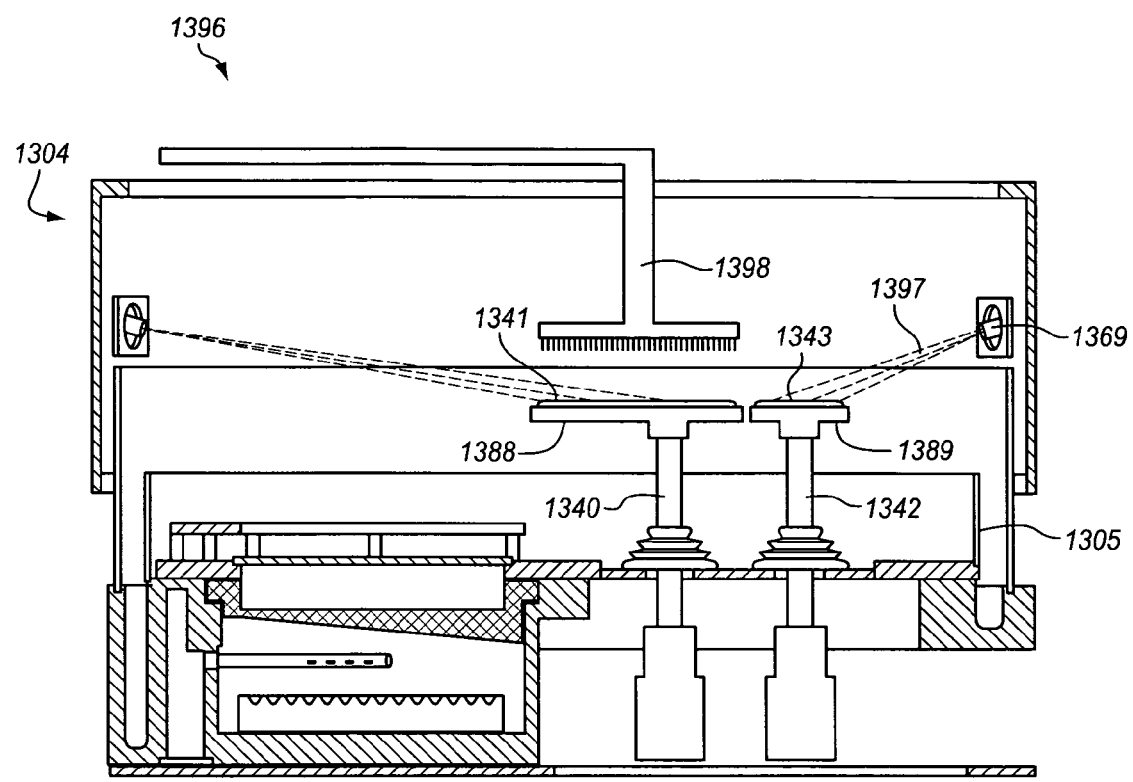
FIG. 70 depicts schematically a cross-sectional view of a system in accordance with the invention in which rubbing pads are in a raised position above the plating cell so that pad cleaning and reconditioning is conducted.

FIG. 70 depicts schematically a view 1396 of system 1304 in accordance with the invention in which rubbing pads 1341, 1343 are in a raised position above plating cell 1305 so that pad cleaning and reconditioning is conducted. As depicted in FIG. 70, pad cleaning nozzles 1369 direct streams of cleaning liquid 1397 at pads 1341, 1343. System 1304 further comprises cleaning brush assembly 1398 for scrubbing of pads 1341, 1343. FIG. 70 also depicts pad holder cups 1388, 1389 of pad assembly 1340 and 1342, respectively, which are operable to hold and support rubbing pad 1341 and 1343, respectively. Generally, pad holder cups 1388, 1389 are metallic or ceramic and are shaped so that their vertical sidewalls physically shield the lateral sides of pads 1341, 1343.

A problem encountered in practical utilization of system 1304 and similar pad rubbing and plating systems is the incorporation of metal particles into a pad. The problem is exacerbated when the substrate wafer is polarized (to a plating potential) simultaneously with pad rubbing/contact to the wafer. This problem generally is less acute when the operations of wafer rubbing and plating (with the wafer surface at a negative plating potential) are not performed at the same time. It is believed that metal particles originate primarily as growth initiation (nucleation) particles that break off the wafer surface and then grow (when a pad is connected to a negative terminal of a power supply via contact to a negatively polarized wafer). These particles scratch a substrate surface and cause other defects on the surface, particularly if they are allowed to grow during plating. A system 1304, which substantially separates wafer plating in plating zone 1354 from wafer rubbing in pad zone 1356 in time and space (FIG. 65), greatly reduces the propensity for undesired particle growth to occur. Nevertheless, further measures have been found useful to further alleviate these problems. It has been observed generally that metal particle accumulation and growth occurs primarily on pad edges. It is believed that these edge regions are the least resistively hindered locations for particles to grow. If a particle becomes attached to the outer regions of the pad and the pad particle is electrically connected to the power source via contact to the wafer, growth can occur, and this growth is most likely to occur at the greatest rates at points on the pad closest to the anode counter electrode. At points more centrally located in the pad, the highly tortuous and thin electrolytic film causes a much greater resistance and hinders growth there. Therefore, to further reduce growth of edge pad particles, the vertical side walls of pad holder cups 1388, 1389 provide extended pad surface shields that create a very thin electrolyte gap between the substrate wafer and the pad. This gap is typically 0.01 to 0.05", and extends from 0.25 to 2" beyond the pad edge.

Figure 71:
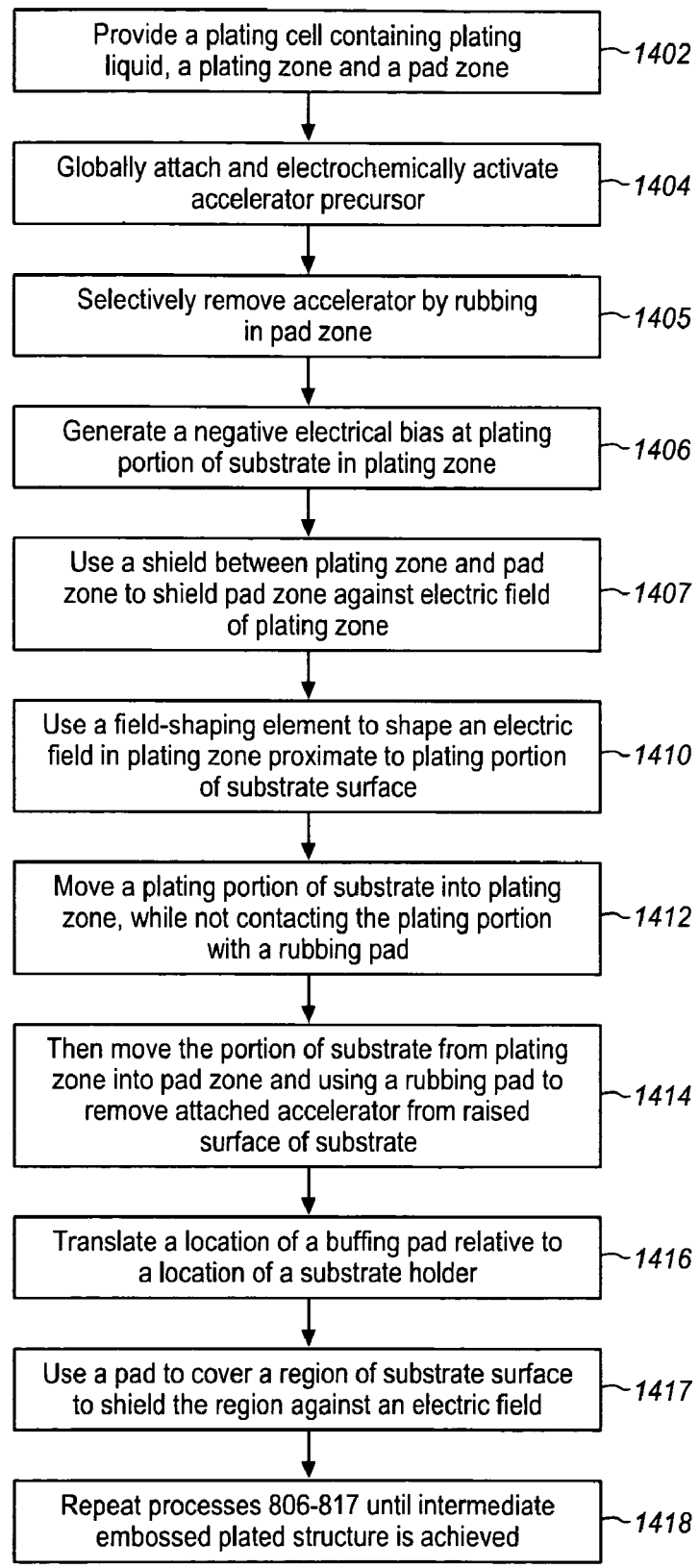
FIG. 71 contains a process flow sheet of a generalized method in accordance with the invention for selective accelerated plating (SAP) of metal, in particular, for selective accelerated plating of metal during fabrication of embedded metal features in an electronic device using techniques of topography reduction and control by selective pad-assisted accelerator removal (SAR)

FIG. 71 contains a process flow sheet of a generalized method 1400 in accordance with the invention for selective accelerated plating (SAP) of metal, in particular, for selective accelerated plating of metal during fabrication of embedded metal features in an electronic device using techniques of topography reduction and control by selective accelerator removal. Method 1400 is described herein with reference to FIGS. 27, 65-70. It is understood that SAP methods in accordance with the invention are conducted using and apparatuses different from those depicted in FIGS. 27, 65-70.

Steps 1402 comprise providing a plating cell 554, 1305 containing a plating bath 555, 1392, a plating zone 566, 1354, and a pad zone 568, 1356.

Steps 1404 include globally applying an accelerator to a substrate 104, 560, 1336. System 552 depicted in FIG. 27 having a plating zone 566 and system 1304 depicted in FIG. 65 having a plating zone 1354 are operable to expose a substrate surface to an electrochemically active accelerator precursor, such as DMPSA and DMESA, and to electrochemically activate the accelerator precursor.

Steps 1405 include selectively removing surface-attached accelerator from exposed and raised surfaces of a substrate to create an acceleration region 212 and a non-acceleration region 214 (FIG. 11), whereby acceleration region 212 comprises attached accelerator and non-acceleration region 214 comprises relatively little or no accelerator. System 552 depicted in FIG. 27 having a pad zone 568 and system 1304 depicted in FIG. 65 having a pad zone 1356 are operable to selectively remove accelerator from raised and exposed surfaces of a substrate by pad rubbing.

Steps 1406 include generating a negative electrical bias relative to the plating bath at least at plating portion 565, 1361 of the substrate in plating zone 566, 1354. Steps 1406 generally include generating an electric field in the plating bath in plating zone 566, 1354 between anode 556, 1314 and plating portion 565, 1361 of the substrate. In some embodiments, generating an electric field in the plating bath comprises anodizing the anode to generate in a controlled manner a nonuniform electric field in the plating bath. In some embodiments, anodizing the anode comprises generating an electric field in the plating zone and substantially no electric field in the pad zone. In some embodiments, the anode is an asymmetric anode, such as a semicylindrical anode. Co-owned U.S. Pat. No. 6,919,010, issued Jul. 19, 2005, to Mayer, which is hereby incorporated by reference, teaches shaped anodes operable to shape electric fields.

In some embodiments, steps 1408 include using a cell shield 1358 between plating zone 566, 1354 and pad zone 568, 1356 to shield pad zone 568, 1356 against electric fields.

Steps 1410 include using a a field-shaping element to shape an electric field in plating zone 566, 1354 proximate to plating portion 565, 1361 of the substrate surface. In some embodiments, steps 1410 include dynamically varying a variable field-shaping element to vary dynamically an applied electric field. Dynamically varying a variable field-shaping element may include, for example, varying dynamically: a quantity of shielded surface area of a substrate; a distance separating a shield from a substrate; a distance separating a substrate from an anode; and combinations thereof. Methods and apparatuses suitable for shaping and dynamically varying an electric field are disclosed in co-owned U.S. Pat. No. 7,070,686, issued Jul. 4, 2006, to Mayer et al., in co-owned U.S. Pat. No. 6,919,010, issued Jul. 19, 2005, to Mayer et al., in co-owned U.S. Pat. No. 6,402,923, issued Jun. 11, 2002, to Mayer et al., and in co-owned U.S. Pat. No. 6,755,954, issued Jun. 29, 2004, to Mayer et al., which are hereby incorporated by reference.

Steps 1412 include positioning or moving at least a portion of the substrate into plating zone 566, 1354. The portion of the substrate in the plating zone at any given time is designated as plating portion 565, 1361. Electroplating of metal occurs at plating portion 565, 1361. Typically, at least a part of one or more acceleration regions 212 on the substrate are included in a plating portion 565, 1361 in plating zone 566, 1354 at any given time. The accelerator in an acceleration region increases a rate of metal deposition in the acceleration region relative to a rate of metal deposition in a non-acceleration region (FIGS. 12-13). In accordance with the invention, generally there is no contacting a plating portion in a plating zone with a rubbing pad. Moving a portion of a substrate into a plating zone commonly is conducted by rotating the substrate. Typically, during SAP, a substrate is continuously rotating so that a given point on the exposed substrate surface has a given residence time in a plating zone for each complete rotation of a substrate depending on the diameter of the substrate, the radial position of the given point on the substrate, the dimensions of the plating zone, and the rotational speed up the substrate. In some embodiments, a given point on a substrate surface is moved into or out of a plating zone by translating the wafer holder with respect to the plating zone. Typically, this entails translating a portion of the substrate (e.g., the center of a wafer substrate) between the plating zone and the pad zone.

Steps 1414 include moving at least part of portion 565, 1361 described above with reference to steps 1412 from a plating zone into a pad zone, and rubbing the portion of the substrate in the pad zone using a rubbing pad to remove at least some of the attached accelerator from at least a raised surface of the substrate. The portion of the substrate in pad zone 568, 1356 at any given time is designated as rubbing portion 567, 1362. Pad rubbing is conducted at part or all of rubbing portion 567, 1362. Typically, at least a part of one or more acceleration regions 212 on the substrate are included in a rubbing portion 567, 1362 in pad zone 568, 1356 at any given time. Thus, at least some accelerator is removed by pad rubbing from raised surfaces of an acceleration region. In accordance with the invention, there is typically no substantial plating of metal in pad zone 568, 1356. As a result, there is no substantial plating of metal at any point of a substrate surface while it resides in a pad zone. Moving a portion of a substrate into a pad zone commonly is conducted by rotating the substrate. Typically, during SAP, a substrate is continuously rotating so that a given point on the exposed substrate surface has a given residence time in a pad zone for each complete rotation of a substrate depending on the diameter of the substrate, the radial position of the given point on the substrate, the dimensions of the pad zone, and the rotational speed of the substrate. In some embodiments, a given point on a substrate surface is moved into or out of a pad zone by translating the wafer holder with respect to the pad zone. Typically, this entails translating a portion of the substrate between the plating zone and the pad zone. In some embodiments, moving a portion of a substrate from a plating zone into a pad zone comprises reciprocating the portion of substrate between the plating zone and the pad zone. In some embodiments, a combination of rotation and translation results in orbital motion of the wafer. In this specification, a non-plating zone of the plating cell is generally designated as a pad zone. It is understood that some embodiments of a method 1400 in accordance with the invention include a plating zone, a pad zone in which pad rubbing is conducted, and a non-plating zone in which neither plating nor pad rubbing occurs.

Steps 1416 include translating a location of a rubbing pad relative to a location of a substrate holder, which includes essentially equivalent processes of translating a location of a substrate holder relative to a rubbing pad. Thus, a method in accordance with the invention typically comprises processes in which the relative positions of substrate holder 1330 (and thereby substrate face 1337) and one or more rubbing pads are adjusted during plating and/or rubbing of the substrate. Typically, a substrate wafer is rotated during SAP in accordance with the invention. In such embodiments, the movement of rotation of a given point on a substrate face relative to a rubbing pad generates rubbing work. In embodiments in which the substrate wafer is rotated, generally any particular point on the substrate face (except for the center of a wafer, which is a singularity) moves continuously between a plating zone and a pad zone, depending on the rotation rate and the working areas of the rubbing pad or pads, and on the dimensions of the plating and pad zones. In some embodiments (not described herein), the substrate is not rotated during electroplating and rubbing. In some of those embodiments, adjusting relative positions of the substrate face, a plating zone, and a rubbing pad is effected by translating an electroplating head and a rubbing pad parallel to the substrate face.

In some embodiments, a first rubbing pad 1343, 1383 located proximate to exposed edge 1338 of a substrate 1336 is moved back-and-forth in small reciprocating movements (e.g., 0.1 mm to 5 mm amplitude) linearly, orbitally, rotationally or a combination thereof at some frequency (e.g., 10 to 2000 cycles/min). As wafer 1336 is rotated, most of the work function of rubbing pad 1343, 1383 generally is obtained from the relatively fast rotational movement of substrate face 1336 at its outer-radial peripheral areas contiguous to lip 1335 of substrate holder 1330. When the substrate wafer is being rotated, the combination of the rotational motion of the wafer and the reciprocating motion of the rubbing pad results in an average relative velocity of the rubbing pad with respect to the wafer that is generally constant in magnitude, but which has a continuously changing direction. As a result, undesirable formation of a track or a groove under the rubbing pad is avoided, and uniformity of rubbing is enhanced.

In embodiments in which the substrate wafer is rotated during planarization, the center of the wafer is a singularity at which virtually no work is generated by rotation of the wafer and which does not rotate sequentially between electrochemical action in the plating zone and physical rubbing in the pad zone. For example, in embodiments in which a single rubbing pad is a semicircle having a footprint covering one half of the substrate wafer, and an immersed anode (e.g., anode 556, 1314) generates an electric field having a current density and electrochemical plating at the other half of the substrate wafer that is not under the rubbing pad, any point on the substrate face of a rotating substrate that is not at the center undergoes cathodic plating approximately one half of the time and is in the pad zone, where it can undergo physical rubbing, up to the other half of the time. The center of the wafer, however, does not rotate into and out of plating and pad zones sequentially. The singularity represented by the center of the wafer is accommodated using techniques to balance the dwell times of electrochemical action and physical rubbing. For example, in some embodiments, the location of a reciprocating rubbing pad and the amplitude of its reciprocating movements are selected so that the pad provides physical rubbing and shielding from cathodic plating during one part of its reciprocating cycle, and exposure to plating conditions during another part of its reciprocating cycle, so that the center experiences effective dwell times of electrochemical plating and physical rubbing similar to the dwell times of other points on the wafer substrate. Rubbing pad 1341, 1382 is useful for physically rubbing areas of substrate face 1337 that are located in and around the center of wafer 1339. When substrate 1336 is rotated, the linear speed of rotation of areas of substrate face 1337 at or near the center of substrate 1336 is relatively small compared to the linear speed of areas located further radially outward from the center. Therefore, only a relatively small amount of work is provided by rotation of the wafer near the center of substrate 1336 at center region 1339. Indeed, at the exact center of the wafer, zero work is provided by rotation of the wafer. On the other hand, by moving second rubbing pad 1341, 1382 quickly relative to substrate face 1337, sufficient work is provided between rubbing pad 1341, 1382 and relatively slow-moving center region 1339 of substrate 1336. For example, reciprocation of rubbing pad 1341, 1382 in linear or orbital movements of 0.1 to 5 mm amplitude at a frequency of 10 to 2000 cycles per minute provides sufficient work for uniform rubbing of center region 1339 and avoids formation of undesired plating tracks. A plating tack may be described as a line of protruded metal or group of particles not associated with a feature, believed to be associated with incomplete and selective removal of accelerator from raised regions. Generally, second rubbing pad 1341, 1382 and second pad assembly 1340 are electrically unbiased because, like first rubbing pad 1343 and pad assembly 1342, they do not function as an anode and do not serve to provide electrical bias to substrate 1336. Preferably, electrochemical plating at plating portion 565, 1361 and physical rubbing at rubbing portion 567, 1362 are conducted simultaneously. In accordance with the invention, however, plating and rubbing do not occur simultaneously at the same point on a substrate surface. The total working area of rubbing pads 1341, 1343 and of plating zone 1354 is generally less than the total exposed nominal surface area of wafer surface 1337. Typically, during SAP in accordance with the invention, center rubbing pad 1341, 1382 is moved (translated) one or several times away from the center region 1339 of substrate face 1337 to conduct electroplating at center region 1339. Alternatively, center rubbing pad 1341, 1382 stays in approximately the same position relative to the center of the wafer, but an amplitude of its reciprocating motion is selected so that center rubbing pad 1341, 1382 alternately and cyclically covers and uncovers the center of wafer 1336.

Thus, steps 1417 include using a pad to cover a region of a substrate surface to shield the region against an electric field, as described above. In particular, steps 1417 include using a pad to cover a center region of a substrate to shield the center against an electric field for certain amounts of time to control the amount of plating at the center. Shielding a portion of a substrate surface against an electric field effectively stops plating of metal in the shielded portion. In some embodiments in which a pad (or other shielding device) is operable to be translated to shield any point on the substrate surface (or equivalently, the substrate holder is operable to translate any point of the substrate to a shielding position of a pad), a pad is useful to adjust the amount of plating caused by the electric field at particular points or areas of the substrate. In some embodiments, in which the movement of pad or pads relative to the substrate surface is limited, as in system 1304 depicted in FIG. 65, shielding of a portion of a substrate surface by a pad in a plating zone generally is restricted to regions of the plating zone adjacent to a pad zone. For example, in some embodiments in accordance with the invention, a pad 1341 (FIG. 65) or a pad 1382 (FIG. 67) is useful for shielding a center region of the substrate against an electric field to stop plating during shielding and, thereby, to adjust the amount of plating occurring at the center and in the center region of the substrate.

Steps 1418 include repeating or continuing steps 1406-1417 until an intermediate embossed plated structure in accordance with the invention is achieved, such as depicted in FIG. 13.

An embodiment similar to apparatus 1304 includes two or more rubbing pads, as described above with reference to FIG. 65. For example, a first rubbing pad 1341 is useful for physically rubbing a region near the center of substrate 1336, especially when substrate 1336 is being rotated and a second rubbing pad 1343 is reciprocated or otherwise moved relative to substrate 1336 to provide sufficient work for physical rubbing. The field-blocking effect of shielding by a center pad 1341 as well as strong ohmic resistance in a thin ionic electrolyte film between a pad and substrate face 1337 typically substantially prevent electrochemical action at a portion shielded by pad 1341 as it physically rubs surface 1337. When the pad is translated parallel to the substrate face away from a particular portion, however, the shielding effect is removed and electrochemical plating may occur, depending on the current density at the particular portion. Similarly, when the reciprocating motion of a rubbing pad moves the pad cyclically away from a particular point on the substrate face, the shielding effect of the pad is removed and electrochemical plating may occur at the particular point, depending on the current density at the particular point.

Multi-Modular System

Figure 72:
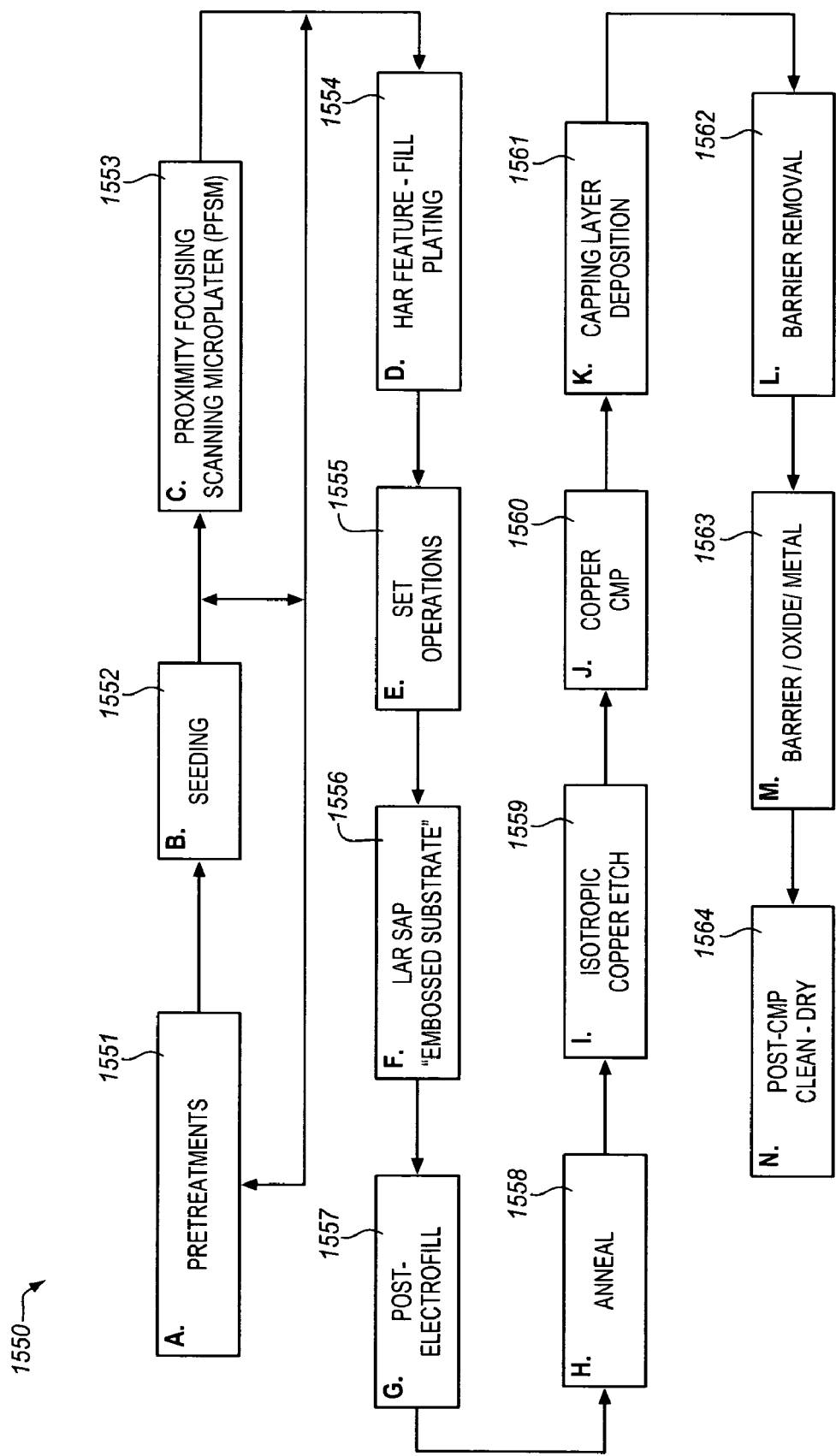
FIG. 72 depicts a block diagram of a generalized system in accordance with the invention for fabricating embedded metal features in an electronic device using techniques of topography reduction and control by selective accelerator removal.

FIG. 72 depicts a block diagram of a generalized system 1550 in accordance with the invention for fabricating embedded metal features in an electronic device using techniques of topography reduction and control by selective accelerator removal. Each block represents at least one operational module in system 1550 for conducting one or more fabrication processes. As depicted in FIG. 72, system 1550 comprises 14 modules, having reference numbers 1551 through 1564, operable to process a substrate during fabrication of embedded metal features. It is understood, however, that some embodiments in accordance with the invention do not include all of the system modules described with reference to system 1550 of FIG. 72. It is also understood that some embodiments of systems in accordance with the invention include processes and corresponding system modules additional to those described herein. It is further understood that some embodiments in accordance with the invention utilize two or more modules to conduct the functions and operations described herein with reference to only one module. Similarly, some embodiments combine the functions and operations of two or more modules described herein in a single module. Also, some modules and/or operations may be used/performed more than once in a fabrication sequence.

A basic embodiment of a system for conducting topography reduction and control by selective accelerator removal (SAR) to fabricate embedded metal structures in an electronic device comprises four basic modules, namely, a first electroplating module 1554, a surface-and-edge-treatment (SET) module 1555, a second electroplating module 1556, and an isotropic metal removal module 1559. First electroplating module 1554 serves to conduct metal plating to fill HAR features, as described above with reference to FIG. 6 and to steps 422 of method 400. Hardware for conducting bottom-up filling of small features is known in the art. Typically, first plating module 1554 conducts plating of copper metal. In some embodiments, first electroplating module 1554 comprises a proximity focusing scanning microplater that is operable to fill a narrow feature cavity with deposited metal. SET module 1555 is operable to treat a substrate surface after a narrow-feature metal deposition in first electroplating module 1554. SET operations typically performed in SET module 1555 were described above in the discussion of steps 430 of method 400. SET module 1555 is operable at least to cause an accelerator to become attached selectively to a substrate at least in a wide feature cavity, thereby forming an acceleration region at least in the wide feature cavity, with relatively little or no accelerator attached to a non-acceleration region of the substrate, whereby the non-acceleration region comprises at least a field region of the substrate surface. Some embodiments include a plurality of SET modules. Typically, a SET module is operable to apply a liquid to a substrate surface. Examples of a liquid agent applied to a substrate surface in a SET module include an accelerator, an accelerator deactivating agent (such as a plating bath leveler), an etchant, a metal reducing agent (reduction of metal oxide), a rinsing agent and deionized water. In some embodiments, a SET module is operable to rub mechanically a substrate surface and to remove accelerator from exposed regions of the surface (e.g., from raised portions of the wafer and from the wafer edge). In some embodiments, a SET module is operable to remove selectively an accelerator species from an edge region of a substrate surface, as explained above with reference to FIGS. 23-26. In some embodiments, a SET module is operable to rinse and dry a substrate surface. Drying in a SET module makes it possible to store a substrate before further processing. In some embodiments, a SET module is operable to remove a thin layer of metal from a substrate. In some embodiments, a SET module is operable to remove a thin layer of metal from a substrate without physically rubbing the substrate (e.g., via selective membrane-mediated electrochemical accelerator removal technology, SMMART, as explained above with reference to FIGS. 60-61). In some embodiments, a SET module comprises a selective agitation cell operable to remove a thin layer of metal from a substrate by electrochemical anodization with selective abrasion; for example, as described in U.S. Pat. No. 6,709,565, titled "Method And Apparatus For Uniform Electropolishing of Damascene IC Structures By Selective Agitation," issued Mar. 23, 2004, to Mayer et al., which is incorporated by reference.

Second electroplating module 1556, located operationally after SET module 1555, is operable to conduct selective accelerated plating (SAP) in accordance with the invention to deposit metal on the substrate surface at least in the wide feature cavity. SAP was described above with reference to FIGS. 11-13, in the discussion of steps 440 of method 400, in the discussion of SAP systems and methods with reference to FIGS. 27, 65-71, and in the discussion of subsystem 600 of FIG. 28. Typically, second, LAR plating module 1556 conducts plating of copper metal. In some embodiments in accordance with the invention, the first, HAR plating module contains a HAR plating liquid with a composition that is different from the composition of a LAR plating liquid contained in second, LAR plating module 1556 because the plating properties desired for filling narrow feature cavities typically are different from the plating properties desired for filling wide feature cavities. In some embodiments, however, the same plating liquid is used in both HAR plating module 1554 and LAR plating module 1556.

After plating of metal in second, LAR module 1556, a substrate wafer is characterized by an embossed metal structure as depicted in FIG. 13. Isotropic metal removal module 1559 is operable to remove deposited metal isotropically from the substrate after the second, SAP metal deposition in LAR plating module 1556. Typically, isotropic metal removal module 1559 is operable to remove substantially all deposited metal from a field region of an embossed substrate while leaving some deposited metal in a feature region at a height equal to or greater than a dielectric field height. Isotropic metal removal techniques conducted in module 1559 in accordance with the invention were described above with reference to FIGS. 14-16 and 18, and in the discussion of steps 450, 452 and 460 of method 400. In some embodiments, isotropic metal removal module 1559 is also operable to make a recess in deposited metal in a feature, the recess having a metal level below a dielectric field height of a substrate, as depicted in FIG. 18. Typically, isotropic metal removal module 1559 is operable to etch copper metal. Some systems and methods typically utilized in module 1559 for isotropic etching of metal were described above with reference to FIGS. 60, 61, 44-57. In some embodiments, isotropic metal removal module 1559 comprises a wet etching cell. In some embodiments, isotropic metal removal module 1559 comprises a localized wet etching cell that is operable to conduct chemical wet etching of metal in an etching area of the substrate, while not conducting wet etching of metal in a non-etching area of the substrate. Typically, during localized wet etching, the etching area is substantially less than a total exposed surface area of the substrate. In some embodiments that comprise localized wet etching, the isotropic metal removal module is also operable to apply a rinsing liquid to a rinsing area. Typically, the rinsing area is substantially less than a total exposed surface area of the substrate and does not include the etching area at any given moment in time. In some embodiments that are operable to apply a rinsing liquid to a rinse area during localized wet etching, the rinsing liquid comprises a quenching liquid that serves to stop substantially etching reactions. Some embodiments include apparatuses for conducting MMEP.

Some embodiments of a system in accordance with the invention further comprise, in addition to the at least four basic modules described above, a seeding module 1552 located operationally before first, HAR plating module 1554 and being operable to form a thin metal-containing layer on a substrate surface. Typically, a seeding module is operable to deposit a thin metal-containing layer, such as a barrier layer, an adhesion layer, a seed layer, and a barrier/seed layer, on a substrate surface. In some embodiments, a seeding module is operable to deposit a layer comprising copper. In some embodiments, a seeding module is operable to deposit a layer comprising ruthenium. In some embodiments, a seeding module is operable to deposit a layer comprising a metal nitride. In some embodiments, a seeding module comprises an atomic layer deposition (ALD) cell. In some embodiments, a seeding module comprises a wet atomic layer deposition cell. In some embodiments, a seeding module comprises a physical vapor deposition (PVD) cell. Some embodiments in accordance with the invention comprise two seeding modules 1552, one of the seeding modules serving to form a barrier layer, and another seeding module serving to form a metal seed layer on the barrier.

Some embodiments of a system in accordance with the invention further comprise, in addition to the at least four basic modules described above, a pretreatment module 1551. Generally, pretreatment module 1551 is operable to pretreat a substrate having a metal-containing layer, such as a seed layer, at its substrate surface. Therefore, the pretreatment module is operationally located before HAR plating module 1554. Some embodiments of a system in accordance with the invention are designed to process a substrate initially possessing neither a barrier layer nor a seed layer. In such embodiments, pretreatment module 1551 is operable to process a substrate before seeding module 1552 and before PFSM module 1553 (if present), as depicted in FIG. 72. Some embodiments of a system in accordance with the invention are designed to process a substrate already possessing a barrier layer, but no seed layer. In such embodiments, pretreatment module 1551 is operable to process a substrate before seeding module 1552, as depicted in FIG. 72, but is also typically operable to process a substrate either after seeding module 1552 or after PSFM module 1553 or after both, and before HAR plating module 1554. Some embodiments of a system in accordance with the invention are designed to process a substrate already possessing both a barrier layer and a seed layer. In such embodiments, there are no seeding modules 1552 or PFSM modules 1553, and pretreatment module 1551 typically is operationally located immediately before HAR feature filling module 1554. A metal-containing seed layer typically has a tendency to form a metal oxide that can interfere with metal plating and with attachment of an accelerator to a substrate surface. For this reason, in some embodiments, a pretreatment module is operable to reduce a metal oxide in a metal-containing layer. In some embodiments, a pretreatment module comprises an anneal chamber. In some embodiments, a pretreatment module comprises a wet processing cell to apply a reducing agent. In some embodiments, a pretreatment module is operable to apply a liquid reducing agent, such as dimethyl amine borane, borane complexes, morpholine borane, formaldehyde, or glyoxylic acid. In some embodiments, a pretreatment module is operable to reduce a non-cuprous oxide in a metal-containing layer. In some embodiments, a pretreatment module is operable to reduce a ruthenium-containing oxide using hydrogen iodide. In some embodiments, a pretreatment module is operable to sensitize by wet processing a metal-containing layer for subsequent electroplating. For example, in some embodiments, a pretreatment module is operable to apply a liquid comprising a sensitizing agent, such as tin chloride or palladium chloride. In some embodiments, a pretreatment module is operable to apply an accelerator on a metal-containing layer to accelerate a subsequent electroplating. For example, in some embodiments, a pretreatment module is operable to apply a liquid comprising an accelerating agent, such as mercaptopropane sulfonic acid (MPSA) or mercaptoethane sulfonic acid (MESA).

Some embodiments of a system in accordance with the invention further comprise, in addition to the at least four basic modules described above, a proximity focusing scanning microplater module (PFSM) 1553 located before first, HAR plating module 1554. Typically, a proximity focusing scanning microplater module is operable to deposit a metal seed layer. Some embodiments of a system in accordance with the invention are designed to process a substrate initially possessing neither a barrier layer nor a seed layer. In such embodiments, PFSM module 1553 is operationally located after a seeding module 1552 and before a pretreatment module 1551 that precedes HAR feature filling module 1554. The seeding module 1552 typically forms a barrier on the substrate, and then PFSM module 1553 forms a metal seed layer on the barrier. Some embodiments of a system in accordance with the invention are designed to process a substrate already possessing a barrier layer, but no seed layer. In such embodiments, PFSM module 1553 typically functions as the sole seeding module and is operationally located before a pretreatment module 1551 that precedes HAR feature filling module 1554. Some embodiments of a system in accordance with the invention are designed to process a substrate already possessing both a barrier layer and a seed layer. Such embodiments typically comprise neither seeding module 1552 nor PFSM module 1553. As mentioned above, in some embodiments of a system in accordance with the invention, HAR plating module 1554 comprises a PFSM that is operable to fill a narrow feature cavity. Some embodiments in accordance with the invention comprise two PFSM modules 1553, one of the PFSM modules serving to form a barrier layer, and another PFSM module serving to form a metal seed layer on the barrier.

Some embodiments of a system in accordance with the invention further comprise, in addition to the at least four basic modules described above, a post-electrofill module (PEM) 1557, located operationally after second, LAR plating module 1556. In some embodiments of a system in accordance with the invention, post-electrofill module 1557 comprises an edge bevel removal (EBR) cell, the EBR cell being operable to remove deposited metal from an edge bevel region of a substrate. Systems and methods for edge bevel removal (EBR) of copper from silicon wafers are described in U.S. Pat. No. 6,586,342, issued Jul. 1, 2003. to Mayer et al., and in U.S. Pat. No. 6,309,981, issued Oct. 30, 2001, to Mayer et al., which are incorporated by reference. In some embodiments of a system in accordance with the invention, post-electrofill module 1557 comprises a conventional spin-rinse-dry (SRD) cell known in the art that is operable to rinse and to dry a substrate.

Some embodiments of a system in accordance with the invention further comprise, in addition to the at least four basic modules described above, an anneal module 1558 located operationally after second, LAR plating module 1556, and after post-electrofill module 1557 if present. Anneal module 1558 is operable to anneal a substrate having deposited metal. In some embodiments, anneal module 1558 comprises a dry annealing cell containing a reducing atmosphere to reduce oxides. An exemplary dry annealing cell utilizes forming gas (e.g., $N_2/H_2$ mixture) at a temperature in a range of about from 300° to 400° C. In some embodiments, anneal module 1558 comprises a wet annealing cell. A wet annealing cell typically functions as a pressure cooker containing deionized water, or as a boiler containing a high-temperature solvent or oil, such as propylene carbonate or high molecular-weight hydrocarbons (e.g., having a carbon chain longer than 20). Desired properties to be considered in the choice of annealing conditions include: low reactivity with copper and other dissolved metals; low-cost. Some embodiments do not include anneal module 1558. Some embodiments include an anneal module, but it is located to perform annealing after other fabrication operations have been performed.

Some embodiments of a system in accordance with the invention further comprise, in addition to the at least four basic modules described above, a feature-metal polishing module 1560 located operationally after isotropic metal removal module 1559, feature-metal polishing module being operable selectively to remove deposited metal from feature regions of a substrate. Since deposited metal in and above filled features typically comprises copper, feature-metal polishing module 1560 typically is designed to polish copper from a substrate face. As indicated in FIG. 72, feature-metal polishing module 1560 typically comprises a chemical mechanical polishing (CMP) cell. Typically, feature-metal polishing module 1560 is operable to make deposited metal in a feature substantially planar with a field region height. In some embodiments, feature-metal polishing module 1560 is operable to make a recess in deposited metal in a feature so that the recess acquires a metal level below a dielectric field height of a substrate, as depicted in FIG. 18. In such embodiments, feature-metal polishing module 1560 utilizes a metal removal technique that is different from or in addition to CMP; for example, a wet etching technique or a SMMART technique.

Some embodiments of a system in accordance with the invention further comprise, in addition to the at least four basic modules described above, a metal capping layer module 1561 located operationally after isotropic metal removal module 1559, and located operationally after feature-metal polishing module 1560 if present. A metal capping layer module 1561 is operable to deposit a conductive, metal-containing capping layer in a feature region of a substrate. Systems and methods typically utilized in module 1561 for depositing a metal-containing capping layer were described above with reference to FIGS. 18-19, and in the discussion of steps 462 of method 400. In some embodiments, metal capping layer module 1561 is operable to deposit a capping layer using a non-electrochemical technique. In some embodiments, metal capping layer module 1561 is operable to deposit metal atoms, such as tantalum and tungsten, using standard techniques. In some embodiments, metal capping layer module 1561 comprises an electroless plating cell that is operable to deposit cobalt atoms. In some embodiments, metal capping layer module 1561 is operable to deposit a capping layer using an electrolytic technique. For example, in some embodiments, metal capping layer module 1561 comprises a proximity focusing scanning microplater (PFSM).

Some embodiments of a system in accordance with the invention further comprise, in addition to the at least four basic modules described above, a barrier removal module 1562 located operationally after isotropic metal removal module 1559, and located operationally after feature-metal polishing module 1560 and after metal capping layer module 1561 if present. Barrier removal module 1562 is operable to remove a barrier layer from a field region of a substrate. Systems and methods typically utilized in a barrier removal module for removing a barrier layer from a field region of a substrate were described above with reference to FIG. 20, and in the discussion of steps 470 of method 400. In some embodiments, barrier removal module 1562 comprises a dry processing cell. For example, in some embodiments, barrier removal module 1562 comprises a conventional reactive ion etching (RIE) cell. In some embodiments, barrier removal module 1562 comprises a dry processing cell that is operable to conduct ionic bombardment of a substrate. In some embodiments, barrier removal module 1562 comprises a dry processing cell containing a gas such as sulfur hexafluoride and borane tetrafluoride. In some embodiments, barrier removal module 1562 comprises a wet processing cell. An exemplary wet processing cell comprises an alkaline liquid, such as sodium hydroxide or potassium hydroxide. Such alkaline liquid containing no oxidizer is useful when heated (e.g., T=80° C.) for removing a metal barrier layer. For example, heated NaOH or KOH is selective to copper over TaN by a ratio of about 100:1.

Some embodiments of a system in accordance with the invention further comprise, in addition to the at least four basic modules described above, a barrier/oxide/metal polishing module 1563 located operationally after isotropic metal removal module 1559, and located operationally after feature-metal polishing module 1560 and after metal capping layer module 1561 and after barrier removal module 1562 if present. Barrier/oxide/metal polishing module 1563 is operable to remove barrier material and metal oxide from a substrate surface and to planarize metal features and the base layer in which they are embedded. Accordingly, barrier/oxide/metal polishing module 1563 is operable to remove a small amount of deposited metal from a substrate surface. Typically, barrier/oxide/metal polishing module 1563 comprises a chemical mechanical polishing (CMP) cell. Systems and methods typically utilized in a barrier/oxide/metal polishing module were described above with reference to FIG. 21, and in the discussion of steps 480 of method 400.

Some embodiments of a system in accordance with the invention further comprise, in addition to the at least four basic modules described above, a cleaning-and-drying module 1564 located operationally after isotropic metal removal module 1559, and located operationally after feature-metal polishing module 1560 and after metal capping layer module 1561 and after barrier removal module 1562 and after barrier/oxide/metal polishing module 1563 if present. Cleaning-and-drying module 1564 is operable to clean and to dry a substrate. Systems and methods typically utilized in a cleaning and drying module 1564 were described above in the discussion of steps 490 of method 400. In some embodiments, cleaning-and-drying module 1564 is operable to remove particles from a prior CMP operation. An exemplary cleaning-and-drying module 1564 comprises an advanced vapor-dry module (AVD). In some embodiments, cleaning-and-drying module 1564 comprises a wet cleaning cell. An exemplary wet cleaning cell comprises a plurality of liquid dispensing nozzles to apply liquid to a substrate. In some embodiments, a cleaning cell comprises a mechanical scrubber to rub a substrate. In some embodiments, a cleaning cell is operable to apply megasonic energy to a substrate. In some embodiments, a cleaning cell is operable to apply megasonic energy to a liquid being applied to a substrate.

Typically, a system module as described above is one of a plurality of modules in a system tool. Typically, a system in accordance with the invention comprises one or more tools, each tool comprising a plurality of system modules.

Figure 73:
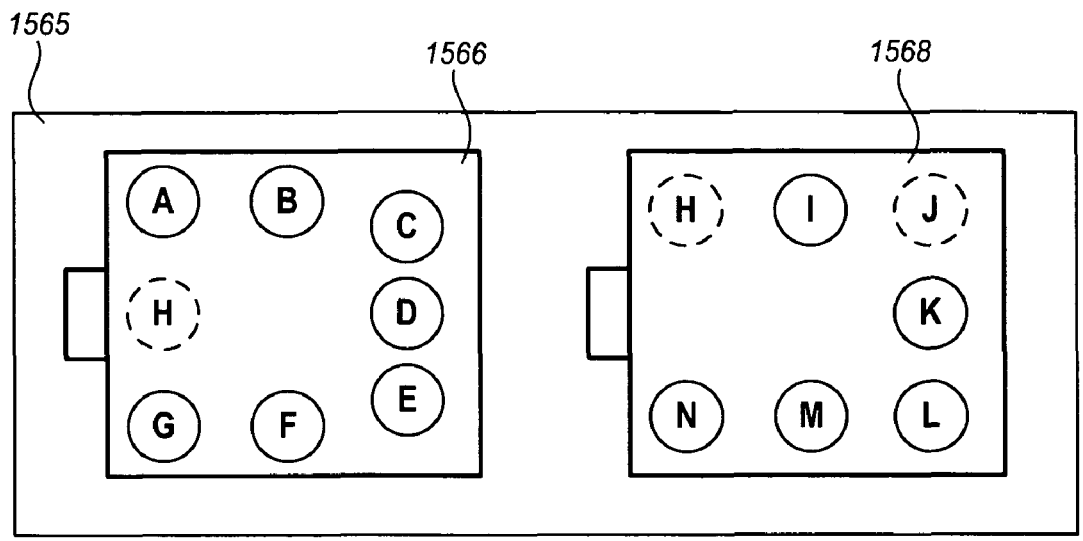
FIG. 73 depicts a system in accordance with the invention for fabricating embedded metal features in an electronic device using techniques of topography reduction and control by selective accelerator removal, comprising a first tool and a second tool.

FIG. 73 depicts a system 1565 in accordance with the invention for fabricating embedded metal features in an electronic device using techniques of topography reduction and control by selective accelerator removal. System 1565 comprises a first tool 1566 and a second tool 1568. Each circle labeled with a letter selected from A through N represents at least one operational module corresponding in design and function to a module bearing the same letter and described above with reference to system 1550 in FIG. 72. System 1565 is characterized in that there is a so-called "dry break" between first system tool 1566 and second system tool 1568. In this context, the term "dry break" means that normal processing of a substrate in first system tool 1566 results in the substrate being removed from first tool 1566 in a dry condition. An advantage of a substrate being in a dry condition, and therefore an advantage of a system in which a substrate exits a system tool in a dry condition, is that the substrate is more easily handled than a wet wafer, is less likely to cause contamination of system hardware than a wet wafer, and in some cases can be stored before subsequent processing.

System 1565 represents several variations of potential embodiments having numerous combinations and permutations of system modules. The dashed circle surrounding the letter H in both first tool 1566 and second tool 1568 indicates that an anneal module H is included either in first tool 1566 or in second tool 1568. The dashed circle surrounding the letter J in second tool 1568 indicates that feature-metal polishing module J is optionally included in second tool 1568. As depicted in FIG. 73, first tool 1566 comprises: a pretreatment module A; a seeding module B; a proximity focusing scanning microplater module (PFSM) C; a first, HAR electroplating module D; a surface-and-edge-treatment (SET) module E; a second, LAR electroplating module F; a post-electrofill module (PEM) G; and, in some embodiments, an anneal module H. Second tool 1568 comprises: an anneal module H (if it is not present in tool 1566); an isotropic metal removal module I; an optional feature-metal polishing module J; a metal capping layer module K; a barrier removal module L; a barrier/oxide/metal polishing module M; and a cleaning-and-drying module N. Generally, a substrate is processed in accordance with the invention in the modules located in tools 1566 and 1568 in alphabetical order, as shown in FIG. 73. An obvious exception are pre-treatments conducted in pretreatment module A, in which pre-treatments may be conducted one or several times in one or more different pretreatment modules before seeding module B, between seeding module B and PFSM module C, and immediately before HAR plating module D.

Figure 74:
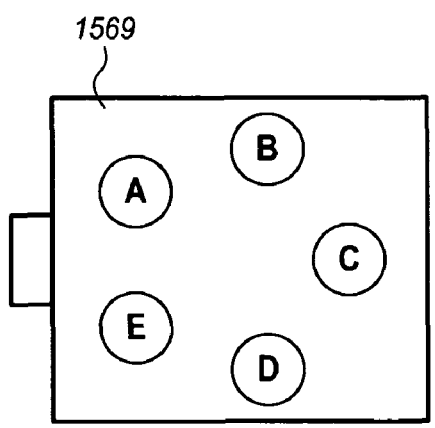
FIG. 74 depicts schematically a tool in accordance with the invention comprising a pretreatment module A, a seeding module B, a proximity focusing scanning microplater (PFSM) module, C; a first, HAR electroplating module D, and a surface-and-edge-treatment (SET) module E, characterized be being operable to provide a dry break after SET module E.

FIG. 74 depicts schematically a tool 1569 in accordance with the invention comprising: a pretreatment module A; a seeding module B; a proximity focusing scanning microplater module (PFSM) C; a first, HAR electroplating module D; and a surface-and-edge-treatment (SET) module E. A characteristic of tool 1569 is that it is typically operable to provide a dry break after SET module E. As explained above with reference to FIG. 72, a SET module E typically is operable to dry a substrate. As a result, after partial or complete filling of HAR features in HAR electroplating module D, and surface-and-edge treatments in SET module E, a substrate wafer in an intermediate stage of fabrication may be stored before conducting SAP electroplating in another tool to fill LAR features and thereby make an intermediate embossed structure in accordance with the invention.

Figure 75:
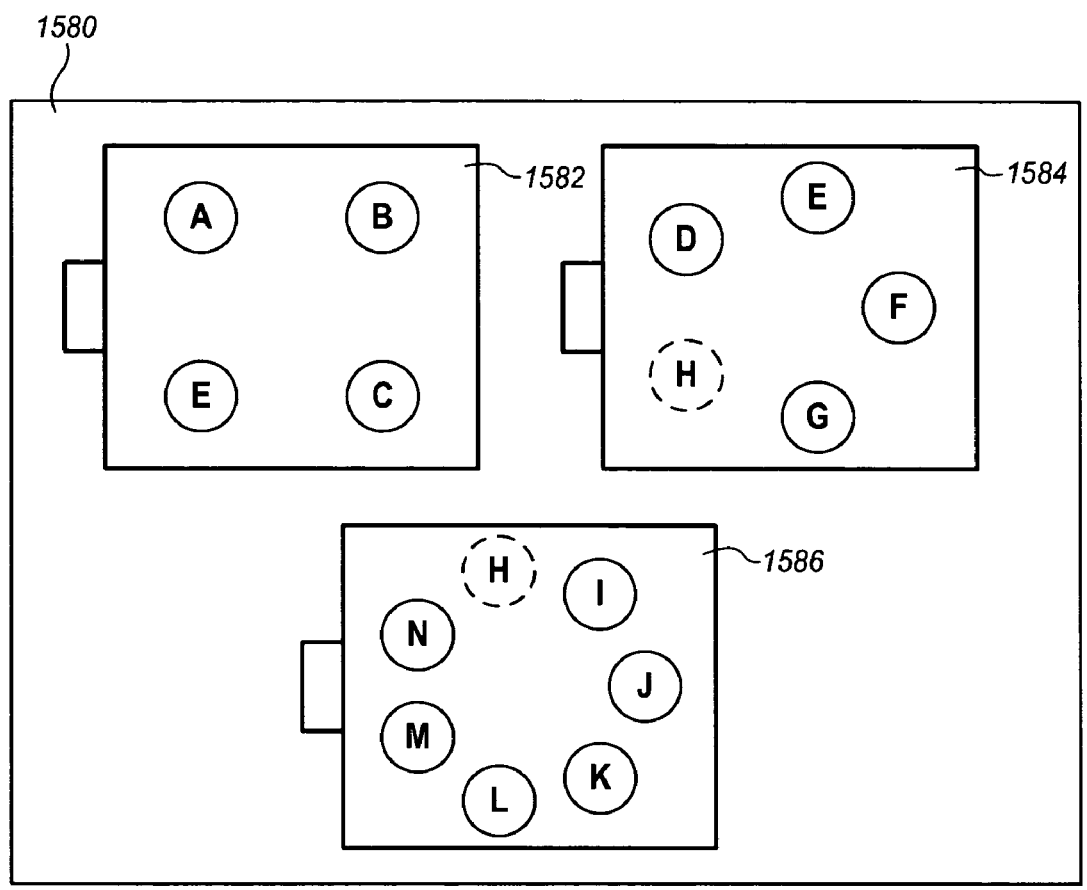
FIG. 75 depicts schematically a system comprising a first tool, a second tool, and a third tool, characterized in that it enables a dry break in substrate processing between the first and second tools, and between the second tool and third tools.

FIG. 75 depicts schematically a system 1580 comprising a first tool 1582, a second tool 1584, and a third tool 1586. System 1580 is characterized in that it enables a dry break in substrate processing between first tool 1582 and second tool 1584, and between second tool 1584 and third tool 1586. First tool 1582 comprises: a pretreatment module A; a seeding module B; a proximity focusing scanning microplater module (PFSM) C, and a surface-and-edge-treatment (SET) module E. Second tool 1584 comprises: a first, HAR electroplating module D; a surface-and-edge-treatment (SET) module E; a second, LAR electroplating module F; a post-electrofill module (PEM) G; and, in some embodiments, an anneal module H. Third tool 1586 comprises: an anneal module H (if it is not present in tool 1584); an isotropic metal removal module I; an optional feature-metal polishing module J; a metal capping layer module K; a barrier removal module L; a barrier/oxide/metal polishing module M; and a cleaning-and-drying module N.

Figure 76:
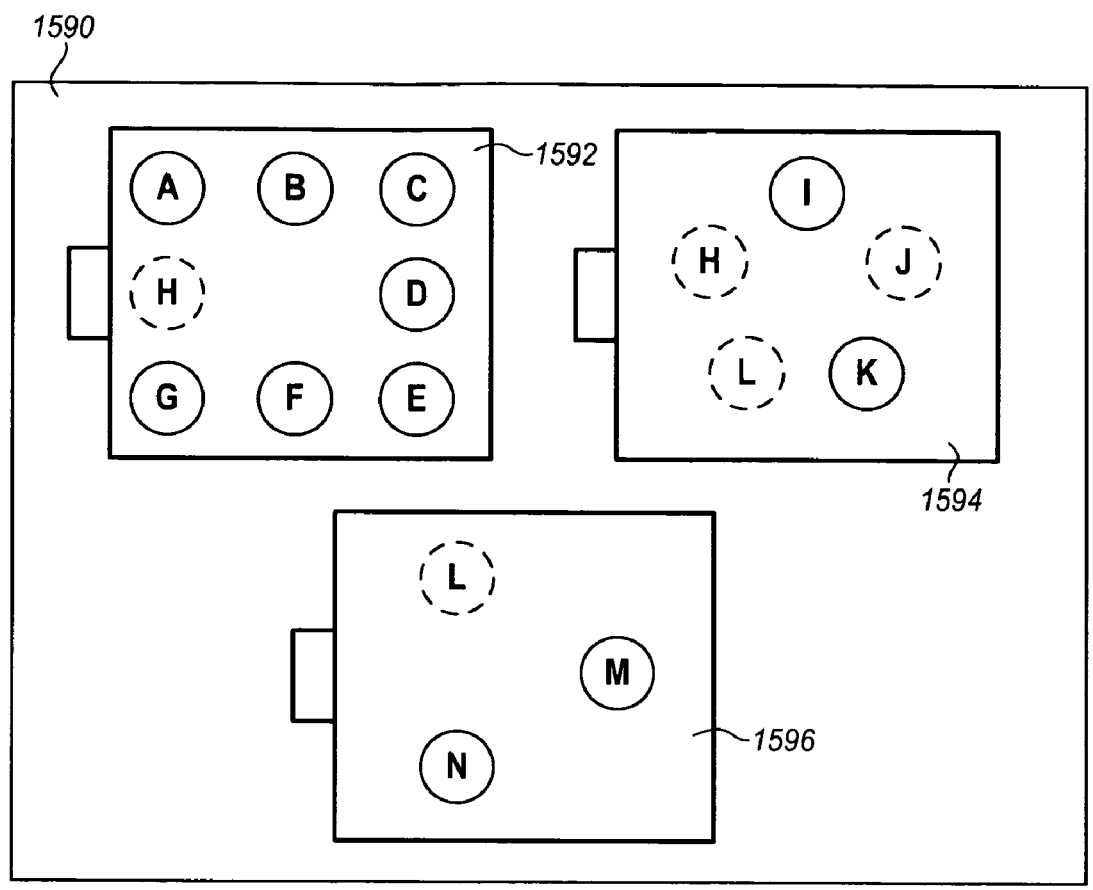
FIG. 76 depicts schematically a system comprising a first tool, a second tool, and a third tool, characterized in that it enables a dry break in substrate processing between the first and second tools, and between the second tool and third tools.

FIG. 76 depicts schematically a system 1590 comprising a first tool 1592, a second tool 1594, and a third tool 1596. System 1590 is characterized in that it enables a dry break in substrate processing between first tool 1592 and second tool 1594, and between second tool 1594 and third tool 1596. First tool 1592 comprises: a pretreatment module A; a seeding module B; a proximity focusing scanning microplater module (PFSM) C; a first, HAR electroplating module D; a surface-and-edge-treatment (SET) module E; a second, LAR electroplating module F; a post-electrofill module (PEM) G; and, in some embodiments, an anneal module H. Second tool 1594 comprises: an anneal module H (if it is not present in first tool 1592); an isotropic metal removal module I; an optional feature-metal polishing module J; a metal capping layer module K; and in some embodiments, a barrier removal module L. Third tool 1586 comprises: a barrier removal module L (if not present in second tool 1594); a barrier/oxide/metal polishing module M; and a cleaning-and-drying module N.

The particular systems, designs, methods and compositions described herein are intended to illustrate the functionality and versatility of the invention, but they should not be construed to limit the invention to those particular embodiments. Systems and methods in accordance with the invention are useful in a wide variety of circumstances and applications to fabricate metal features embedded in a base layer of an electronic device. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods, devices and compositions described in the claims below and by their equivalents.

The invention claimed is:

1. A method of forming a metal structure, comprising steps of:
    (a) providing a substrate having a base layer and a substrate surface, said base layer including a wide feature cavity and a field, said wide feature cavity defining a wide-feature region, said field being adjacent to said wide feature cavity and defining a field region;
    (b) exposing said substrate to a deposition accelerator so that both the field region and the wide-feature region are exposed to the deposition accelerator, without simultaneously depositing metal;
    (c) ceasing exposing said substrate to a deposition accelerator;
    (d) selectively removing at least a portion of said deposition accelerator from said field region using a spacially selective electrochemical reaction;
    (e) then after all of steps (b), (c) and (d), exposing said substrate to a metal deposition solution;
    (f) then conducting a wide-feature metal deposition, wherein said deposition accelerator increases a rate of metal deposition in said wide-feature region relative to a rate of metal deposition in said field region.

2. A method as in claim 1, characterized by:
not removing metal from said substrate during said wide-feature metal deposition of step (f).

3. A method as in claim 1, wherein:
said accelerator comprises accelerator species selected from the group consisting of 2-mercaptoethane sulfonic acid (MESA), 3-mercapto-1-propane sulfonic acid (MPSA), 3-mercaptopropionic acid, mercaptopyruvate, 3-mercapto-2-butanol, 2,3 dimercaptopropane sulphonic acid, 1-thioglycerol, salts thereof, and derivatives thereof.

4. A method as in claim 1 wherein said step (b) of exposing said substrate to the deposition accelerator comprises:
contacting said substrate with a phase containing an accelerator species, said phase selected from the group consisting of a liquid, a solution, and a vapor.

5. A method as in claim 1 wherein:
substantially no metal deposition occurs during said steps (b) and (d).

6. A method as in claim 1 further characterized in that:
substantially no accelerator becomes attached to said substrate during said wide-feature metal deposition of step (f).

7. A method as in claim 1 wherein:
said step (d) of causing an accelerator to become attached selectively to said substrate is conducted in a processing chamber in which metal deposition is not conducted.

8. A method as in claim 1, wherein:
said step (f) of conducting said wide-feature metal deposition includes cathodizing said substrate surface; and
said selectively removing at least a portion of said deposition accelerator is not conducted during cathodizing said substrate surface.

9. A method of claim 1 wherein said wide-feature metal deposition step (f) comprises:
not simultaneously contacting said substrate with a rubbing pad.

10. A method of claim 1 wherein said wide-feature metal deposition step (f) comprises:
simultaneously contacting said substrate with a rubbing pad.

11. A method as in claim 1 wherein:
said base layer has a base field height; and further comprising:
continuing said wide-feature metal deposition so that deposited metal in said wide-feature region comprises a wide-feature protrusion;
removing metal substantially completely from said field region; and
removing deposited metal from said wide-feature region until a metal level in said wide-feature region is lower than said base field height.

12. A method as in claim 1 wherein said substrate comprises a barrier layer on said base layer and a metal seed layer on said barrier layer, and further comprising:
continuing said wide-feature metal deposition so that said wide-feature region contains a wide-feature metal protrusion;
then isotropically removing deposited metal and said metal seed layer from said field region;
then removing said barrier film from said field region of said base layer.

13. The method as in claim 1, wherein said selectively removing at least a portion of said deposition accelerator comprises selective electrochemical accelerator removal.

14. The method as in claim 1, wherein said selectively removing at least a portion of said deposition accelerator comprises selective membrane-mediated accelerator removal.

15. A method as in claim 1 wherein said step (b) of exposing said substrate to a deposition accelerator comprises:
contacting said substrate with an accelerator solution containing accelerator species.

16. A method as in claim 15, wherein:
said precursor solution comprises an accelerator concentration substantially greater than an accelerator concentration in said deposition solution.

17. A method as in claim 1 wherein applying an accelerator film on said substrate comprises:
contacting said substrate with a precursor solution containing accelerator precursor molecules; and
transforming said accelerator precursor molecules to accelerator species.

18. A method as in claim 17, wherein:
said precursor solution comprises accelerator precursor species selected from the group consisting of dimercaptopropane sulfonic acid (DMPSA), dimercaptoethane sulfonic acid (DMESA), salts thereof, and derivatives thereof.

19. A method as in claim 17, wherein said transforming said accelerator precursor molecules to accelerator species comprises:
applying sufficient electric current to said substrate to transform said accelerator precursor molecules to accelerator species.

20. A method as in claim 1, further comprising:
continuing said wide-feature metal deposition so that deposited metal in said wide-feature region comprises a wide-feature protrusion;
then isotropically removing deposited metal from said substrate
until metal is substantially completely removed from said field region, and a wide-feature protrusion of metal remains in said wide-feature region.

21. A method as in claim 20, further comprising:
performing chemical mechanical polishing (CMP) of said substrate surface to planarize said substrate surface.

22. A method as in claim 1, wherein said selectively removing at least a portion of said deposition accelerator comprises:
contacting said substrate with a pad that selectively removes said accelerator film from at least said field region.

23. A method as in claim 22, wherein contacting said substrate with said pad is performed for a period of time and then stopped prior to conducting said wide-feature metal deposition.

24. A method as in claim 22, characterized in that said contacting said substrate with a pad further comprises contacting said substrate and said pad with a lubricant that is different from said metal deposition solution.

25. A method as in claim 1, wherein said selectively removing at least a portion of said deposition accelerator comprises:
using a contact-less technique.

26. A method as in claim 25, wherein said selectively removing at least a portion of said deposition accelerator comprises:
selective electrochemical accelerator removal.

27. A method as in claim 25, wherein said selectively removing at least a portion of said deposition accelerator comprises:
conducting selective membrane-mediated accelerator removal.

28. A method as in claim 25, wherein said selectively removing at least a portion of said deposition accelerator comprises:
electropolishing.

29. A method as in claim 1, wherein: said wide feature cavity has a width at least three times greater than its depth, so that said wide feature cavity has an aspect ratio not exceeding about 0.33.

30. A method as in claim 29, further comprising:
continuing depositing metal on said substrate until deposited metal in said wide-feature region comprises a wide-feature protrusion having a wide-feature protrusion height above said base layer that is greater than a thickness of deposited field metal in said field region, thereby forming an embossed structure.

31. A method as in claim 30, wherein:
said deposited field metal in said field region has a thickness less than one-half of the width of said wide feature cavity.

32. A method as in claim 30, wherein:
said deposited field metal in said field region has a thickness less than ⅕ of the width of said wide feature cavity.

33. A method as in claim 30, further comprising:
after said forming an embossed structure, removing deposited metal from said field region.

34. A method as in claim 33 wherein said removing deposited metal from said substrate comprises removing deposited metal from said substrate at a uniform removal rate.

35. A method as in claim 34 wherein said removing deposited metal from said substrate at a uniform removal rate comprises:
removing deposited metal from said wide-feature protrusion at a metal removal rate and removing deposited metal from said field region substantially at said metal removal rate.

36. A method as in claim 35 wherein said removing deposited metal from said wide-feature region and from said field region selectively removes deposited metal at a removal rate greater than removing other substrate material from said substrate.

37. A method as in claim 35 wherein said removing deposited metal from said substrate comprises:
isotropically removing deposited metal from said substrate until deposited metal in said field region is substantially completely removed and a wide-feature protrusion of deposited metal remains in said wide-feature region.

38. A method as in claim 37 wherein said isotropically removing deposited metal from said substrate comprises:
isotropically removing deposited metal from said substrate until a thin conductive metal seed layer in said field region is substantially completely removed and a wide-feature protrusion of deposited metal is located in said wide-feature region.

39. A method as in claim 33 wherein:
said removing deposited metal comprises isotropic wet etching said substrate.

40. A method of forming a metal structure, comprising:
(a) providing a substrate having a base layer and a substrate surface, said base layer including a wide feature cavity and a field, said wide feature cavity defining a wide-feature region, said field being adjacent to said wide feature cavity and defining a field region;
(b) exposing at least said wide-feature region of said substrate to a deposition accelerator, without simultaneously depositing metal;
(c) ceasing exposing said substrate to the deposition accelerator;
(d) causing said deposition accelerator to become attached selectively to said substrate in said wide-feature region relative to said field region, without simultaneously depositing metal in said wide-feature region;
(e) then after all of steps (b), (c) and (d), exposing said substrate to a metal deposition solution;
(f) then conducting a wide-feature metal deposition, wherein said accelerator increases a rate of metal deposition in said wide-feature region relative to a rate of metal deposition in said field region;
(g) continuing said wide-feature metal deposition so that deposited metal in said wide-feature region comprises a wide-feature protrusion;
(h) isotropically removing deposited metal from said substrate until metal is substantially completely removed from said field region, and a wide-feature protrusion of metal remains in said wide-feature region;

(i) performing chemical mechanical polishing (CMP) of said substrate surface to planarize said substrate surface; and, wherein said base layer has a base field height of metal; and (j) after said CMP, isotropically removing deposited metal from said substrate until deposited metal in said wide-feature region is lower than said base field height, thereby forming a recess in said wide feature cavity.

41. A method as in claim 40, further comprising:
forming a metal capping layer in said wide-feature region to cover deposited metal in said wide feature cavity.

42. A method as in claim 41, further comprising:
after forming said metal capping layer, performing chemical mechanical polishing (CMP) of said substrate surface to remove a small amount of capping layer metal from said capping layer.

43. A method of forming a metal structure, comprising:

(a) providing a substrate having a base layer and a substrate surface, said base layer including a wide feature cavity and a field, said wide feature cavity defining a wide-feature region, said field being adjacent to said wide feature cavity and defining a field region;

(b) exposing at least said wide-feature region of said substrate to a deposition accelerator, without simultaneously depositing metal;

(c) ceasing exposing said substrate to the deposition accelerator;

(d) causing said deposition accelerator to become attached selectively to said substrate in said wide-feature region relative to said field region, without simultaneously depositing metal in said wide-feature region;

(e) then after all of steps (b), (c) and (d), exposing said substrate to a metal deposition solution;

(f) then conducting a wide-feature metal deposition, wherein said accelerator increases a rate of metal deposition in said wide-feature region relative to a rate of metal deposition in said field region; wherein:

said base layer further includes a narrow feature cavity defining a narrow-feature region, said narrow feature cavity having a higher aspect ratio than said wide feature cavity; and further comprising:

before said step (b), exposing said substrate to a narrow-feature deposition solution;

then before said step (b), conducting a narrow-feature metal deposition using said narrow-feature deposition solution to deposit metal on said substrate in at least said narrow feature cavity; and then before said step (b), ceasing exposure of said substrate to said narrow-feature deposition solution.

44. A method as in claim 43 wherein said removing deposited metal from said substrate comprises:
removing deposited metal from said substrate until deposited metal in said field region is substantially completely removed and a protrusion of deposited metal remains in each of said narrow-feature region and said wide-feature region.

45. A method as in claim 43 further characterized in that:
substantially no accelerator becomes attached to said substrate during said narrow-feature metal deposition.

46. A method as in claim 43, wherein:
said step of conducting said narrow-feature metal deposition and said step (f) of conducting said wide-feature metal deposition include cathodizing said substrate surface; and
said selectively removing at least a portion of said accelerator film is not conducted during cathodizing said substrate surface.

47. A method as in claim 43, wherein:
said base layer has a base field height; and further comprising:
continuing said wide-feature metal deposition so that deposited metal in said narrow-feature region comprises a narrow-feature protrusion and deposited metal in said wide-feature region comprises a wide-feature protrusion;
removing metal substantially completely from said field region; and
removing deposited metal from said narrow-feature region and from said wide-feature region until a metal level in said narrow-feature region and a metal level in said wide-feature region are lower than said base field height.

48. A method as in claim 43 wherein said substrate comprises a barrier layer on said base layer and a metal seed layer on said barrier layer, and further comprising:
continuing said wide-feature metal deposition so that said narrow-feature region contains a narrow-feature metal protrusion and said wide-feature region contains a wide-feature metal protrusion;
then isotropically removing deposited metal and said metal seed layer from said field region;
then removing said barrier film from said field region of said base layer.

49. A method as in claim 43, further comprising:
conducting edge accelerator removal (EAR) processes after said exposing at least said wide-feature region of said substrate to the deposition accelerator in step (b).

50. A method as in claim 43, further comprising:
applying an initial accelerator to said substrate at least in said narrow-feature region before said step of exposing said substrate to a narrow-feature deposition solution.

51. A method as in claim 50, further comprising:
deactivating said initial accelerator before said step (d) of causing an accelerator to become attached selectively in said wide feature cavity.

52. A method as in claim 43, further comprising:
removing deposited metal from said substrate after said step (f).

53. A method as in claim 52 wherein:
said removing deposited metal initially is substantially uniform.

54. A method as in claim 52 wherein:
said removing deposited metal comprises isotropic wet etching said substrate.

55. A method as in claim 43, further comprising:
conducting a surface and edge treatment (SET) operation after ceasing exposure to narrow-feature deposition solution and before said exposing at least said wide-feature region of said substrate to the deposition accelerator in step (b).

56. A method as in claim 55 wherein said SET operation comprises:
deactivating accelerator that is present in said narrow-feature region to avoid excessive overplating in said narrow-feature region during said wide-feature deposition in step (f).

57. A method as in claim 55 wherein said SET operation comprises:
cleaning said substrate surface.

58. A method as in claim 57 wherein said wherein said cleaning comprises:
removing a thin layer of metal from metal deposited during said narrow-feature metal deposition; and wherein removing a thin layer of metal comprises:

removing a thin layer having a thickness in a range of about from 1 nm to 10 nm; and wherein said removing a thin layer of metal comprises:
conducting a chemical wet etch.

59. A method as in claim 43, further comprising:
continuing said narrow-feature metal deposition until deposited metal in said narrow feature cavity has an adjusted aspect ratio less than 1.

60. A method as in claim 59, further comprising:
continuing said narrow-feature metal deposition until deposited metal in said narrow-feature region comprises a narrow-feature protrusion.

61. A method as in claim 60, further comprising:
continuing said wide-feature metal deposition of step (f) until deposited metal in said wide-feature region comprises a wide-feature protrusion.

62. A method as in claim 61, further comprising:
continuing said wide-feature metal deposition until a narrow-feature protrusion height of said narrow-feature protrusion and a wide-feature protrusion height of said wide-feature protrusion are substantially equal.

63. A method as in claim 59, further comprising:
continuing said wide-feature metal deposition so that deposited metal in said narrow-feature region comprises a narrow-feature protrusion.

64. A method as in claim 63, further comprising:
continuing said wide-feature metal deposition until deposited metal in said wide-feature region comprises a wide-feature protrusion.

65. A method as in claim 64, further comprising:
continuing said wide-feature metal deposition until a narrow-feature protrusion height of said narrow-feature protrusion and a wide-feature protrusion height of said wide-feature protrusion are substantially equal.

66. A method as in claim 43, further comprising:
continuing said wide-feature metal deposition so that deposited metal in said narrow-feature region comprises a narrow-feature protrusion and deposited metal in said wide-feature region comprises a wide-feature protrusion;
then isotropically removing deposited metal from said substrate
until metal is substantially completely removed from said field region, and a narrow-feature protrusion of metal remains in said narrow-feature region and a wide-feature protrusion of metal remains in said wide-feature region.

67. A method as in claim 66, further comprising:
performing chemical mechanical polishing (CMP) of said substrate surface to planarize said substrate surface.

68. A method as in claim 67, wherein:
said base layer has a base field height; and further comprising:
after said CMP, isotropically removing deposited metal from said substrate until deposited metal in said narrow-feature region and in said wide-feature region is lower than said base field height, thereby forming a recess in said narrow feature cavity and a recess in said wide feature cavity.

69. A method as in claim 68, further comprising:
forming a metal capping layer in said recess in said narrow-feature cavity to cover deposited metal in said narrow feature cavity and a metal capping layer in said recess in said wide-feature cavity to cover deposited metal in said wide feature cavity.

70. A method as in claim 69, further comprising:
after forming metal capping layers, performing chemical mechanical polishing (CMP) of said substrate surface to remove a small amount of capping layer metal from said capping layers.

* * * * *